United States Patent [19]
Oae et al.

[11] Patent Number: 5,920,077
[45] Date of Patent: Jul. 6, 1999

[54] CHARGED PARTICLE BEAM EXPOSURE SYSTEM

[75] Inventors: Yoshihisa Oae; Tomohiko Abe; Soichiro Arai; Shigeru Maruyama; Hiroshi Yasuda; Kenichi Miyazawa; Junichi Kai; Takamasa Satoh; Keiichi Betsui, all of Kawasaki; Hideki Nasuno, Kasugai, all of Japan

[73] Assignee: Fujitsu Limited, Kanagawa, Japan

[21] Appl. No.: 09/022,881

[22] Filed: Feb. 12, 1998

Related U.S. Application Data

[62] Division of application No. 08/745,632, Nov. 8, 1996.

[30] Foreign Application Priority Data

| Mar. 15, 1994 | [JP] | Japan | 6-044468 |
| Mar. 17, 1994 | [JP] | Japan | 6-047521 |
| Mar. 17, 1994 | [JP] | Japan | 6-047522 |
| Mar. 17, 1994 | [JP] | Japan | 6-047523 |
| Mar. 18, 1994 | [JP] | Japan | 6-049491 |
| Mar. 18, 1994 | [JP] | Japan | 6-049496 |
| Mar. 29, 1994 | [JP] | Japan | 6-059301 |
| Apr. 26, 1994 | [JP] | Japan | 6-088753 |
| Jun. 3, 1994 | [JP] | Japan | 6-122436 |
| Nov. 28, 1994 | [JP] | Japan | 6-292762 |

[51] Int. Cl.⁶ .................................................. H01J 37/302
[52] U.S. Cl. .................................................. 250/492.22
[58] Field of Search .......................... 250/492.2, 492.22, 250/398

[56] References Cited

U.S. PATENT DOCUMENTS

| 4,433,384 | 2/1984 | Berrian et al. | 250/492.22 |
| 4,511,980 | 4/1985 | Watanabe . | |
| 4,541,115 | 9/1985 | Werth | 282/14 |
| 4,641,252 | 2/1987 | Tokita . | |
| 4,661,709 | 4/1987 | Walker et al. | 250/398 |
| 5,041,764 | 8/1991 | Midland et al. . | |
| 5,262,341 | 11/1993 | Fueki et al. . | |
| 5,369,282 | 11/1994 | Arai et al. . | |
| 5,430,304 | 7/1995 | Yasuda et al. | 250/396 R |
| 5,444,257 | 8/1995 | Satoh et al. . | |
| 5,448,075 | 9/1995 | Fueki et al. | 250/492.22 |
| 5,500,930 | 3/1996 | Fueki | 250/492.22 |

FOREIGN PATENT DOCUMENTS

| 64-20619 | 1/1989 | Japan . |
| 2-1111 | 1/1990 | Japan . |

*Primary Examiner*—Bruce Anderson
*Attorney, Agent, or Firm*—Armstrong, Westerman, Hattori, McLeland & Naughton

[57] ABSTRACT

A charged particle beam exposure method including the steps of creating dot pattern data indicative of a pattern to be exposed, storing the dot indicative of a pattern to be exposed, storing the dot pattern data in a first storage device having a first access speed, transferring the dot pattern data from the first storage device to a second storage device having a second, higher access speed, reading the dot pattern data out from the second storage device; and producing a plurality of charged particle beams in response to the dot pattern data read out from the second storage device by means of a blanking aperture array. The blanking aperture array includes a plurality of apertures each causing turning-on and turning-off of a changed particle beam pertinent to the aperture in response to the dot pattern data.

17 Claims, 109 Drawing Sheets

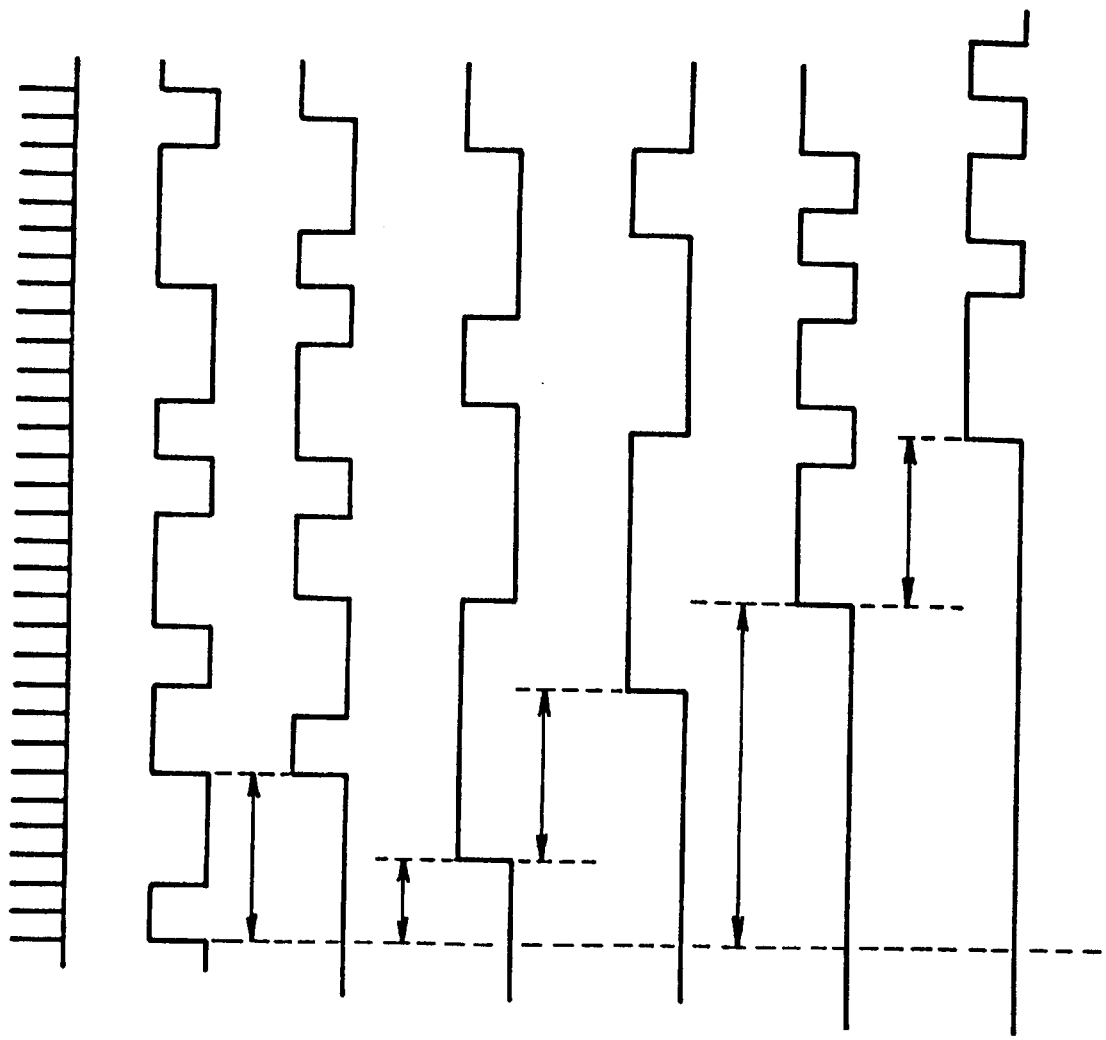

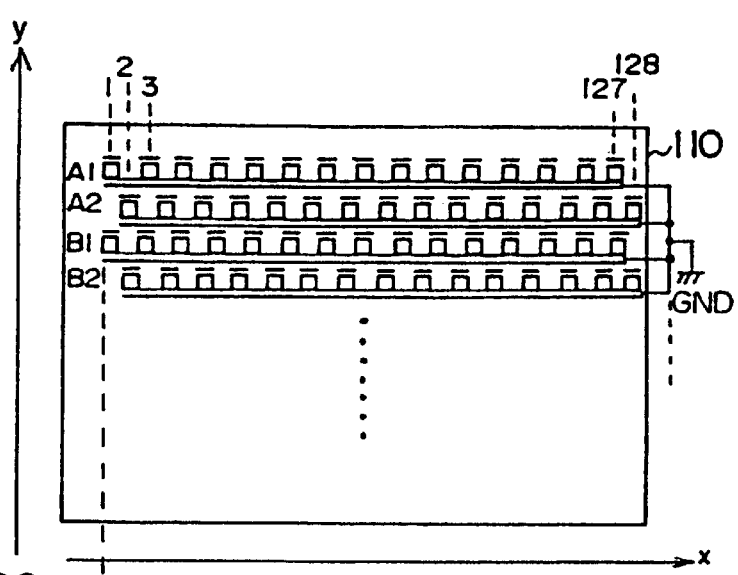
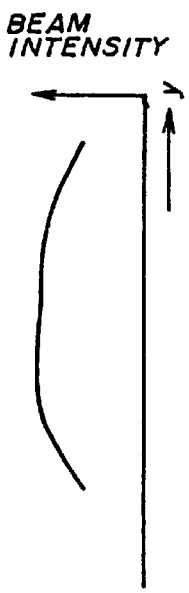
FIG. 22A  FIG. 22B
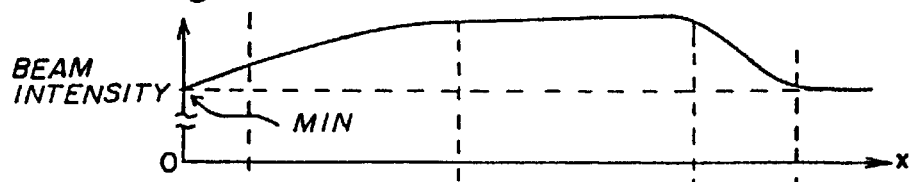
FIG. 22C
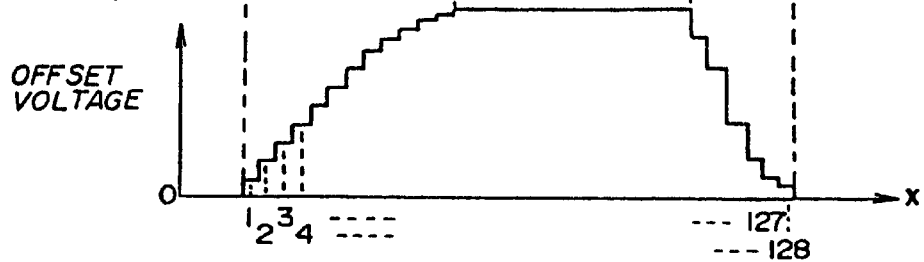
FIG. 22D
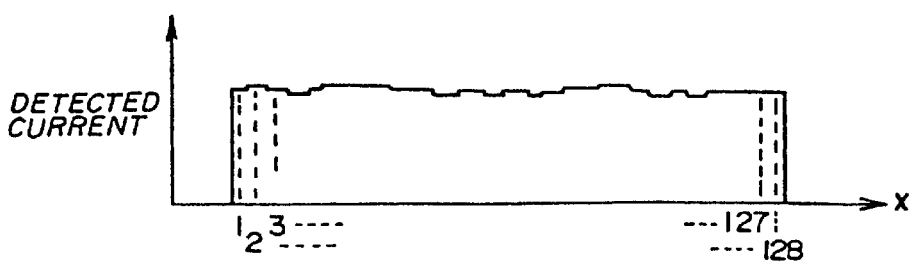
FIG. 22E

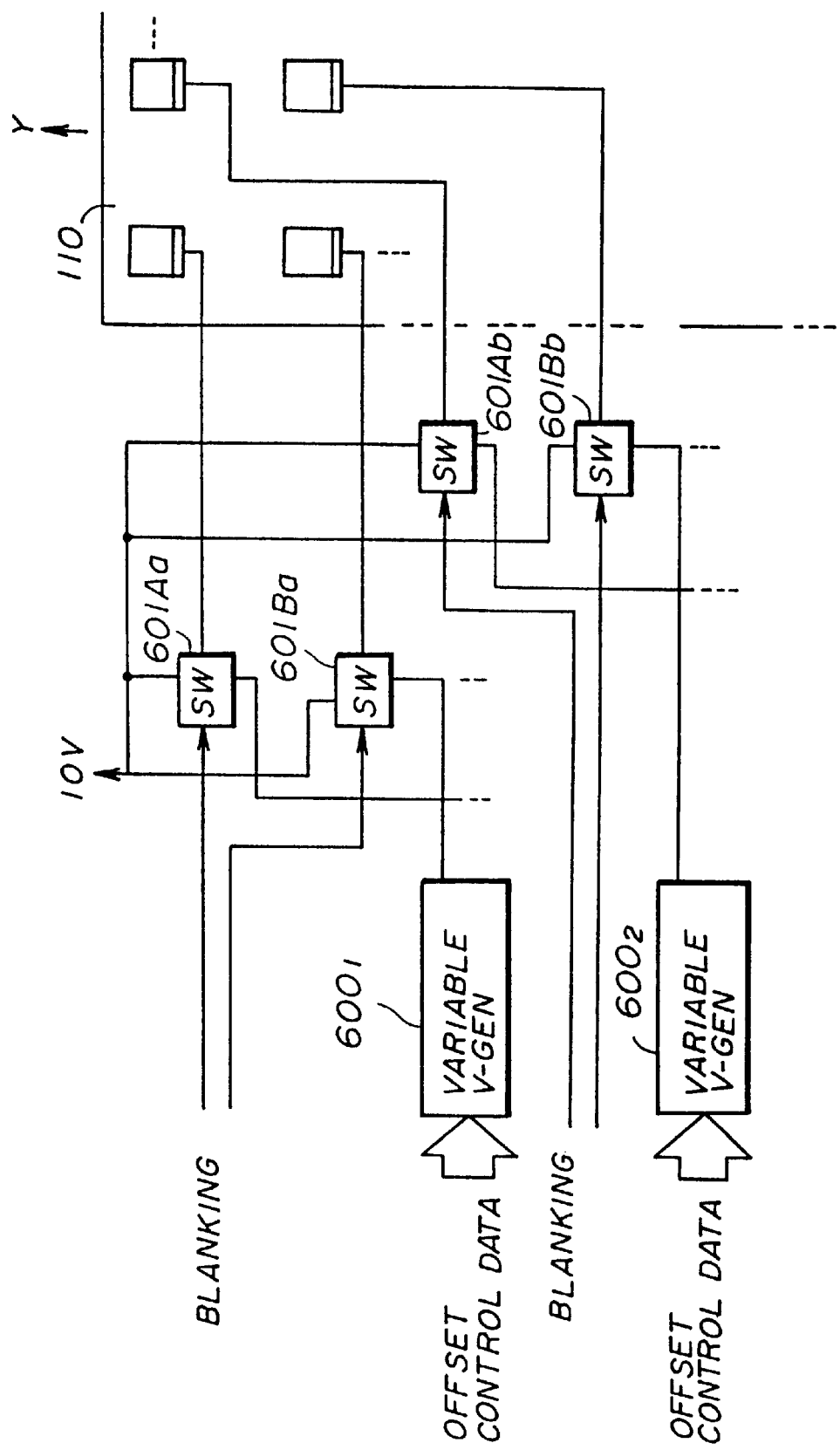

A0: SINGLE SHOT AREA
A1, A10~A13: CELL STRIPE
A2: BAND
A3: CELL o : BEAM SPOT POINT
● : BIT DATA AQUISITION POINT

○ :BEAM SPOT POINT
● :BIT DATA AQUSITION POINT

○:BEAM SPOT POINT
●:BIT DATA AQUSITION POINT

■:BEAM SPOT CENTER

○:BEAM SPOT POINT
●:BIT DATA AQUSITION POINT

■:BEAM SPOT CENTER

○:BEAM SPOT POINT
●:BIT DATA AQUSITION POINT

■:BEAM SPOT CENTER

○: BEAM SPOT POINT
●: BIT DATA AQUSITION POINT

■: BEAM SPOT CENTER

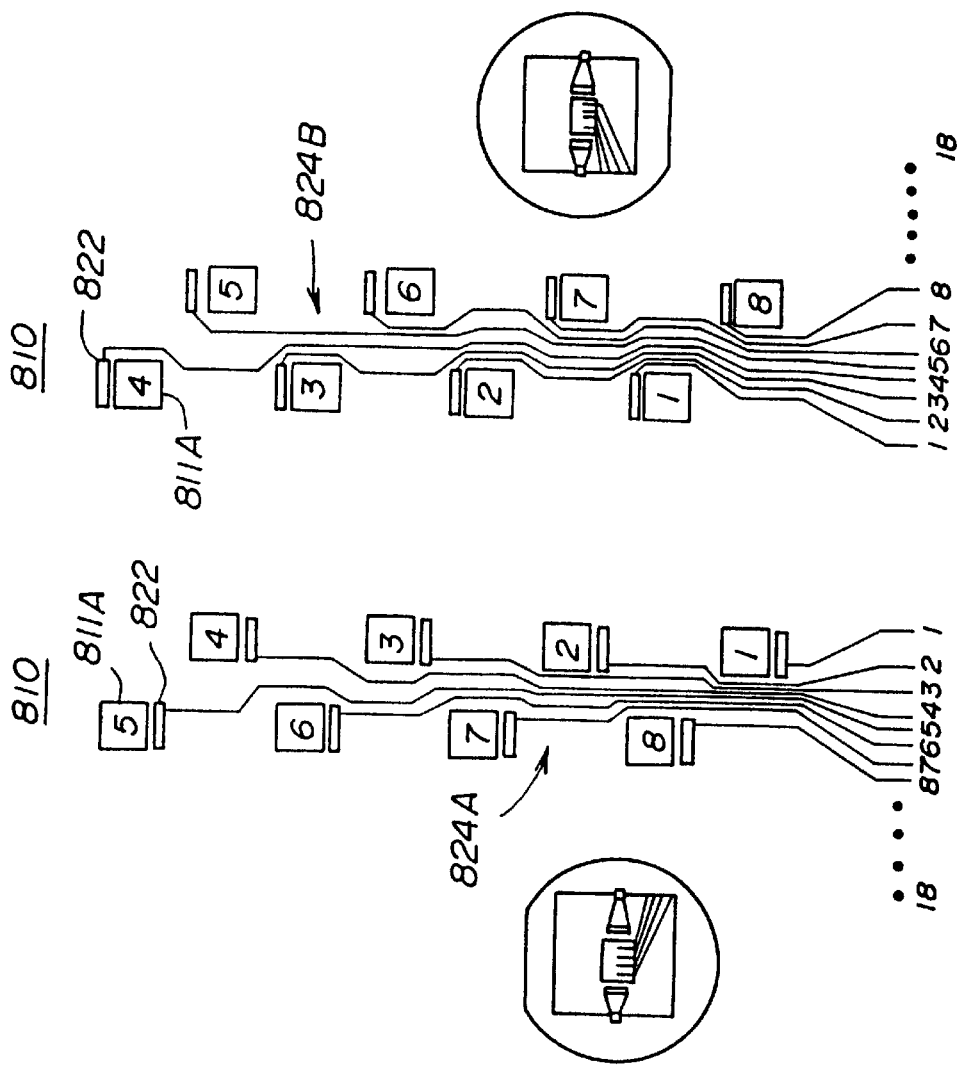

| FIG.75A | FIG.75B | FIG.75C | FIG.75D |
|---|---|---|---|
| 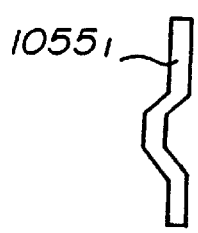 | 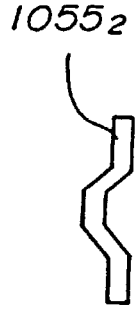 | 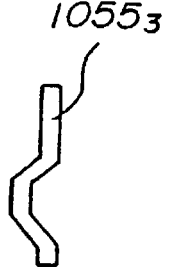 | 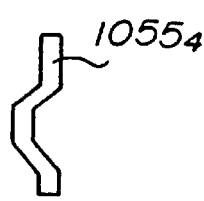 |
| DEF 1052 ON | OFF | ON | OFF |
| DEF 1053 ON | ON | OFF | OFF |

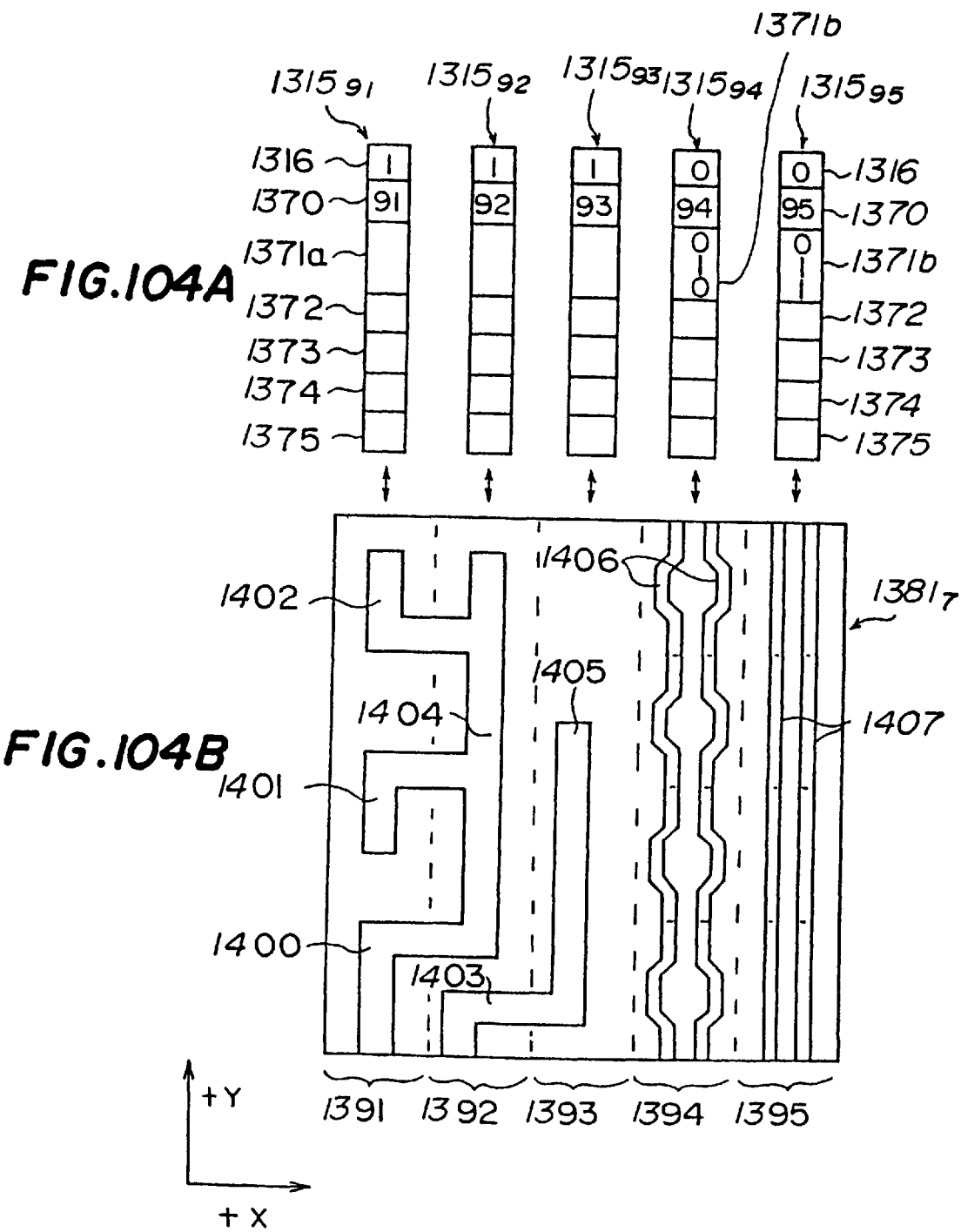

CHARGED PARTICLE BEAM EXPOSURE SYSTEM

This application is a Divisional of prior application Ser. No. 08/745,632 filed on Nov. 8, 1996.

BACKGROUND OF THE INVENTION

1. Field of the Invention

The present invention relates to charged particle beam exposure systems and methods and, more particularly, to a charged particle beam exposure system and method for exposing a desired pattern on a surface of an object as a result of raster scanning of charged particle beams, while controlling each of the plurality of charged particle beams such that the charged particle beams as a whole form a beam bundle having the desired exposure pattern.

2. Description of the Related Art

The present invention uses some of the teachings of the U.S. Pat. No. 5,369,282 and the U.S. patent application Ser. No. 08/241,409 filed May 11, 1994, which are herein incorporated by reference.

With the advancement in the art of fine lithographic patterning, recent integrated circuits are formed with such a high integration density that they are now used commonly and widely in industries including computers, telecommunications, system control, and the like. Looking back at the history of dynamic random access memories, for example, it will be noted that the dynamic random memories have increased the integration density as represented in terms of storage capacity of information, from 1 Mbits to 4 Mbits, from 4 Mbits to 16 Mbits and from 16 Mbits to 64 Mbits. Currently, dynamic random access memories having a storage capacity of 256 Mbits or 1 Gbits are studied intensively. In correspondence to such an increase in the integration density, extensive studies are in progress for developing the art of so-called charged particle beam exposure that uses a charged particle beam such as an electron beam for exposing fine patterns on an object. By using such a charged particle beam, it is possible to expose a pattern having a size of 0.05 $\mu$m or less, with an alignment error of 0.02 $\mu$m or less.

On the other hand, conventional charged particle beam exposure systems have suffered from the problem of low throughput of exposure, and there has been a pessimistic atmosphere prevailing among those skilled in the art about the production of integrated circuits by means of such a charged particle beam exposure system. It should be noted that the conventional charged-particle-beam exposure systems have used a single charged particle beam for the exposure and it has been necessary to draw a desired pattern on the object such as a substrate by a single stroke of the charged particle beam.

On the other hand, most of such pessimistic observations addressing negative predictions about the future of charged-beam-exposure system and method, are not well founded, as is typically demonstrated by the inventors of the present invention who have succeeded in constructing a block exposure system and a BAA (blanking aperture array) exposure system that provide a throughput of as much an 1 cm$^2$/sec. With the high throughput of 1 cm$^2$/sec thus achieved, the main disadvantage of the charged-particle-beam exposure system and method in substantially eliminated. Now, it is thought that the charged-particle-beam exposure system and process are superior to any other conventional exposure systems in terms of high resolution, small alignment error, quick turn around time, and reliability.

An already noted, it is particularly essential for a charged-particle-beam exposure system to have a high exposure throughput, and block exposure process or BAA process has been developed for clearing the requirement of high exposure throughput. Hereinafter, a BAA exposure system proposed previously by the inventors of the present invention will be described briefly. For the sake of simplicity, the description hereinafter will be made for an electron beam exposure system, while the present invention is by no means limited to an electron beam exposure system but in applicable to any other charged particle beam exposure systems such as an ionic beam exposure system that uses a focused ionic beam.

In a BAA exposure system, a plurality of electron beams are produced such that the plurality of electron beams as a whole form a desired electron beam bundle with a shape corresponding to a pattern to be exposed on an object. Thereby, each of the plurality of electron beams is turned on and off individually according to the desired pattern to be exposed. Thus, each time the exposure pattern is changed, different set of electron beams are turned on. While being exposed by the electron beams on the object, which may be a substrate, the object is moved, together with a stage on which the object is supported while deflecting the electron beams back and forth by activating a deflector.

In order to produce the foregoing plurality of electron beams, the BAA exposure system employs a BAA mask that is a plate formed with a number of rectangular apertures arranged in rows and columns for shaping a single electron beam incident thereto. Each of the apertures carries a pair of electrodes on opposing edges, wherein one of the electrodes is set to a ground potential level while the other of the electrodes is supplied with a control signal that changes the level between the ground level and a predetermined energization level. In response to the energization of the electrodes on the BAA mask, the path of the electron beam through the aperture is deflected and the arrival of the electron beam upon the object is controlled accordingly. In other words, the electron beams are turned on and off on the object in response to the control signal applied to the electrodes of the apertures on the BAA mask. It should be noted that the control signals applied to the apertures on the BAA mask represent a pattern of the electron beams produced by the BAA mask, and the control signals are changed in synchronization with a raster scanning of the surface of the object by the electron beam bundle. As a result of the raster scanning, the object is exposed along a band or zone.

In such conventional BAA exposure systems and methods, there are still various problems to be overcome, such as further improvement of the exposure throughput including improvement of data transfer rate and data compression, improvement in the precision of the exposed patterns including optimization of exposure dose and improvement of resolution when expanding exposure data into bit map data, uniform distribution of the electron beam intensity throughout the substrate, improved data processing such as expansion and transfer of the exposure dot data, positive on-off control of the electron beam, easy maintenance of the BAA mask, exposure of large diameter wafers, improvement of electron optical systems, and easy switching between a BAA exposure mode and a block exposure mode, and the like.

SUMMARY OF THE INVENTION

Accordingly, it is an object of the present invention to provide a novel and useful charged-particle-beam exposure system and method wherein the foregoing problems are eliminated.

Another and more specific object of the present invention is to provide a charged-particle-beam exposure method and system for exposing versatile patterns on an object by means of a charged particle beam that forms an exposure dot pattern, in which the creation of dot pattern data representing the exposure dot pattern and the exposure of the object by means of the charged particle beam can be achieved separately.

Another object of the present invention is to provide a charged-particle-beam exposure method and system that is capable of holding a large amount of dot pattern data representing the exposure dot pattern and that can control a blanking aperture array based upon the dot pattern data at a high speed for producing a charged particle beam bundle including a number of charged particle beams in correspondence to each dot of the exposure dot pattern.

Another object of the present invention is to provide a method for exposing a pattern on an object by means of a charged particle beam, comprising the steps of:

shaping a charged particle beam into a plurality of charged particle beam elements forming collectively a charged particle beam bundle having a desired pattern in response to exposure data;

calculating a beam correction to be applied upon said charged particle beam elements for compensating for a beam distortion when exposing said desired pattern on said object, as a function of said exposure data, said step of calculation being conducted in response to a correction clock; and exposing said desired pattern upon said substrate by radiating said charged particle beam bundle upon said object in response to an exposure clock;

said step of exposing comprising the steps of:

setting a frequency of said exposure clock based upon a sensitivity of a resist provided on said object and a current density of said charged particle beam elements; and emitting said charged particle beam elements forming said charged particle beam bundle upon said object in response to said exposure clock, with said beam correction applied to said charged beam elements;

wherein said correction clock is synchronized to said exposure clock and held at a substantially constant, predetermined frequency when changing the frequency of said exposure clock in said step of setting the frequency of said exposure clock.

Another object of the present invention is to provide a charged particle beam exposure system for exposing a desired pattern on an object, comprising:

a charged particle beam source for producing a charged particle beam and emitting the same along a predetermined optical axis;

beam shaping means provided on said optical axis so as to interrupt said charged particle team, said beam shaping means carrying thereon a plurality of apertures for shaping said charged particle beam into a plurality of charged particle beam elements collectively forming a charged particle bundle, each of said apertures carrying switching means for selectively turning off said charged particle beam element in response to exposure data;

beam focusing means for focusing each of said charged particle beam elements forming said charged particle beam bundle upon said object;

deflection means for deflecting said charged particle beam elements collectively over a surface of said object in response to a deflection control signal supplied thereto;

deflection control means supplied with deflection data for producing said deflection control signal;

beam correction means for calculating a beam correction to be applied to said electron beam element as a function of said exposure data for compensating for a beam distortion, said beam correction calculation means carrying out said calculation in response to a correction clock;

exposure control means for conducting an exposure of said charged particle elements in response to an exposure clock; and clock control means supplied with control data indicative of a current density of said charged particle beam elements and a sensitivity of said electron beam resist, for producing said exposure clock and said correction clock, such that said exposure clock has a clock speed determined as a function of said control data, said clock control means further holding said correction clock substantially constant at a predetermined frequency irrespective of the frequency of said exposure clock.

According to the present invention, it is, possible to conduct the development of exposure data into exposure dot data and the exposure of the pattern on the object at respective timings. Thereby, the exposure throughput is no longer limited by the data expansion of the exposure data to the exposure dot data and a high exposure throughput can be achieved. Further, it is possible to hold or save a large amount of exposure dot data in the primary storage device that may be a hard disk device. By using a non-volatile storage device such as a hard disk for the primary storage device, it is possible to examine the exposure data in the form of exposure dot data. Further, such exposure dot data can be used repeatedly in the production of a semiconductor device. Although the primary storage device may have a limited access speed, it should be noted that the exposure dot data is supplied to the beam shaping means, which is a blanking aperture array, at high speed from the secondary storage device.

In a preferred embodiment of the present invention, two or more high speed memory devices are used for the secondary storage device each having a storage capacity smaller than the primary storage device.

Another object of the present invention is to provide a charged particle beam exposure system and method wherein a high precision exposure is guaranteed even when the setting for the current density of the electron beam or the sensitivity of the electron beam resist is changed.

Another object of the present invention is to provide a method for exposing a pattern on an object by means of a charged particle beam, comprising the steps of:

shaping a charged particle beam into a plurality of charged particle beam elements forming collectively a charged particle beam bundle having a desired pattern in response to exposure data;

calculating a focusing error correction and an aberration correction to be applied upon said charged particle beam elements when exposing said desired pattern on said object, as a function of said exposure data, said step of calculation being conducted in response to a correction clock; and exposing said desired pattern upon said object by radiating said charged particle beam-bundle upon said object;

said step of exposing comprising the steps of:

setting an exposure clock speed based upon a sensitivity of an electron beam resist provided on said object and a current density of said charged particle beam elements; and emitting said charged particle beam elements forming said charged particle beam bundle upon said object in response to said exposure clock, with said focusing error correction and said aberration correction;

wherein said correction clock is held in the vicinity of a predetermined clock speed when changing a clock speed of said exposure clock in said stop of setting the exposure clock speed.

Another object of the present invention is to provide a charged particle beam exposure system for exposing a desired pattern on an object, comprising:

a charged particle beam source for producing a charged particle beam and emitting the same along a predetermined optical axis;

beam shaping means provided on said optical axis so as to interrupt said charged particle beam, said beam shaping means carrying thereon a plurality of apertures for shaping said charged particle beam into a plurality of charged particle beam elements collectively forming a charged particle bundle, each of said apertures carrying switching means for selectively turning off said charged particle beam element in response to exposure data;

beam focusing means for focusing each of said charged particle beam elements forming said charged particle beam bundle upon said object;

deflection means for deflecting said charged particle beam elements collectively over a surface of said object in response to a deflection control signal supplied thereto;

deflection control means supplied with deflection data for producing said deflection control signal;

beam correction means for calculating a correction to be applied to said electron beam element as a function of said exposure data, said beam correction calculation means carrying out the calculation in response to a correction clock;

exposure control means for conducting an exposure of said charged particle elements in response to an exposure clock; and clock control means supplied with control data indicative of a current density of said charged particle beam elements and a sensitivity of said electron beam resist, for producing said exposure clock and said correction clock, such that said exposure clock has a clock speed determined as a function of said control data, said clock control means further holding said correction clock substantially constant irrespective of said exposure clock.

According to the invention of the present embodiment, one can guarantee a necessary exposure dose by changing the exposure clock as a function of the resist sensitivity and the current density. On the other hand, the analog signal supplied to the deflection means, which includes a main deflector and a sub-deflector, changes generally linearly with time, and the problem of the exposure beam failing to hit the desired point on the substrate is effectively eliminated.

Another object of the present invention is to provide a charged particle beam exposure system and method that is capable of exposing an object by charged particle beams produced by a BAA mask with a uniform electron beam intensity irrespective of the location of the apertures on the BAA mask that are used for shaping the electron beams.

Another object of the present invention is to provide a method for exposing a pattern on an object, comprising the steps of:

shaping a charged particle beam into a plurality of charged particle beam elements forming collectively a charged particle beam bundle having a desired pattern in response to exposure data;

exposing a desired pattern upon said object by radiating said charged particle beam bundle upon said object;

said step of beam shaping comprising the steps of:

activating a plurality of apertures provided on a beam shaping mask for shaping said charged particle beam, such that a predetermined number of said apertures are activated each time as a unit, each of said apertures including a deflector for deflecting a charged particle beam element passing therethrough in response to an activation of said aperture, said predetermined number of apertures thereby producing a plurality of charged particle beam elements equal in number to said predetermined number; and detecting the intensity of said predetermined number of charged particle beam elements on said object;

said step of activating said plurality of apertures being conducted such that the intensity of said charged beam elements, produced as a unit, is equal to the intensity of said charged particle beam elements of other units, by optimizing an energization of said deflectors on said predetermined number of apertures.

Another object of the present invention is to provide a charged particle beam exposure system for exposing a pattern on an object, comprising:

a charged particle beam source for producing a charged particle beam and emitting the same along a predetermined optical axis;

beam shaping means provided on said optical axis so as to interrupt said charged particle beam, said beam shaping means carrying thereon a plurality of apertures for shaping said charged particle beam into a plurality of charged particle beam elements collectively forming a charged particle bundle;

switching means for selectively turning off said charged particle beam element in response to a control signal;

driving means for driving said switching means on said beam shaping means by supplying thereto said control signal in response to exposure date;

beam focusing means for focusing each of said charged particle beam elements forming said charged particle beam bundle upon said object;

detection means for detecting the intensity of said charged particle beam elements on said object;

correction means for controlling said driving means such that said driving means supplies said control signal to said switching means with an offset added thereto, said correction means evaluating said offset in response to the intensity of said charged particle beam elements detected by said detection means, such that a group of charged particle beam elements including a predetermined number of charged particle beam elements therein has an intensity that is substantially identical to the intensity of other charged particle beam elements forming other groups, each of said other groups including said charged particle beam elements in number identical to said predetermined number.

According to the present invention as set forth above, the intensity of the charged particle beam elements is detected for each unit or group including a predetermined number of charged particle beam elements, wherein the intensity of the charged particle beam elements is adjusted for each unit in response to the detected beam intensity on the object, by adjusting the energization of the switching means or deflectors cooperating with each of the apertures, such that the beam intensity is substantially uniform over the entire surface of the object. Thereby, the problem of the exposure dots shaped by the apertures on the marginal area of the BAA mask is substantially eliminated, and a high precision exposure becomes possible.

Another object of the present invention is to provide a charged particle beam exposure system and method that improves the data transfer rate and hence the exposure throughput by compressing the dot pattern data during the process of data transfer.

Another object of the present invention is to provide a method for exposing a pattern on an object by means of a charged particle beam, comprising the steps of:

producing a plurality of charged particle beam elements in the form of dot pattern data, said plurality of charged particle beam elements be ng produced simultaneously as a result of shaping of a single charged particle beam by a mask, said mask carrying a plurality of beam shaping apertures arranged in rows and columns on a mask area;

focusing said plurality of charged particle beam elements upon an object; and scanning a surface of said object by means of said plurality of charged particle beam elements in a first direction;

said step of producing the plurality of charged particle beam elements includes the steps of:

dividing said dot pattern data into a plurality of data blocks each corresponding to a rectangular area on said beam shaping mask, said rectangular area having a size in a second direction perpendicular to said first direction such that said size is smaller than a size of said mask area in said second direction;

providing identification codes to said data blocks for discriminating said data blocks from each other, such that identical data blocks have an identical identification code;

storing said data blocks respectively in corresponding dot memories, together with said discrimination codes corresponding to said data blocks;

reading out said data blocks from said dot memories consecutively by specifying said identification codes consecutively; and shaping said single charged particle beam by said beam shaping mask into said plurality of beam shaping beam elements in response to said data blocks read out from said dot memories.

Another object of the present invention is to provide a charged particle beam exposure system for exposing a pattern on an object, comprising:

beam source means for producing a charged particle beam and for emitting the same along an optical axis in the form of a charged particle beam toward an object;

beam shaping means disposed on said optical axis so as to interrupt said primary charged particle beam, said beam shaping means carrying on a mask area thereof a plurality of apertures each supplied with exposure dot data representing a dot pattern to be exposed on said object, said apertures thereby shaping said charged particle beam into a plurality of charged particle beam elements in response to said exposure dot data, said plurality of charged particle beam elements as a whole forming a charged particle beam bundle;

focusing means for focusing each of said charged particle beam elements in said charged particle beam bundle upon said object with a demagnification;

scanning means for scanning a surface of said object by said charged particle beam elements in a first direction;

a dot memory for storing dot pattern data for data blocks each corresponding to a group of exposure dots to be formed on a rectangular area on said object, said rectangular area having a size on said object, in a second direction perpendicular to said first direction, to be equal to or smaller than a size of said mask area projected upon said object and measured in said second direction;

a code memory for storing codes each specifying one of said data blocks;

block addressing means for addressing, based upon said codes read out from said code memory, said dot memories consecutively from a first address to a last address of a data block specified by said code; and code memory control means for reading said codes from said code memory consecutively in the order of exposure.

According to the present invention set forth above, the same exposure data is used repeatedly by specifying the codes. It should be noted that the same data block has the same code. Thereby, the amount of the dot pattern data is substantially reduced. It should be noted that such a reduction in the amount of data decreases the duration of data transfer, and the throughput of exposure is improved substantially.

Another object of the present invention is to provide a charged particle beam exposure method and system that are capable of exposing a pattern on an object at a high speed, without requiring particular data processing with respect to pattern width or contour of the exposed pattern when conducting a minute adjustment of the exposed pattern.

Another object of the present invention is to provide a method and system for exposing an exposure pattern on an object by a charged particle beam, comprising the steps of:

shaping a charged particle beam into a plurality of charged particle beam elements in response to first bitmap data indicative of an exposure pattern, such that said plurality of charged particle beam elements are selectively turned off in response to said first bitmap data;

focusing said charged particle beam elements upon a surface of an object; and scanning said surface of said object by said charged particle beam elements;

said step of shaping including the steps of:

expanding pattern data of said exposure pattern into second bitmap data having a resolution of n times ($n \geq 2$) as large as, and m times ($m \geq 1$) as large as, a corresponding resolution of said first bitmap data, respectively in X- and Y- directions;

dividing said second bitmap data into cells each having a size of 2n bits in said X-direction and 2m bits in said Y-direction; and creating said first bitmap data from said second bitmap data by selecting four data bits from each of said cells, such that a selection of said data bits is made in each of said cells with a regularity in said X- and Y-directions and such that the number of rows in said X-direction and the number of columns in said Y-direction are both equal to 3 or more.

According to the present invention, it becomes possible to achieve a fine adjustment of the exposure pattern by using the first bitmap data without considering the effect of pattern width or conducting a processing along the contour of the pattern boundary. Thereby, the processing speed and hence the exposure throughput increases substantially.

Another object of the present invention is to provide a BAA exposure system having a BAA mask wherein the deflection of the electron beam elements is made in the Same direction throughout the BAA mask.

Another object of the present invention is to provide a BAA exposure system having a BAA mask wherein the resistance and capacitance of wiring used for carrying drive signals to the electrostatic deflectors provided on the BAA mask, are optimized with respect to the timing of turning on and turning off the apertures of the BAA mask.

Another object of the present invention is to provide a charged particle beam exposure system for exposing a pattern on an object, comprising:

beam source means for producing a charged particle beam;

beam shaping means for shaping said charged particle beam to produce a plurality or charged particle beam elements in accordance with exposure data indicative of a dot pattern to be exposed on said object;

focusing means for focusing said charged particle beam elements upon a surface of said object; and deflection means for deflecting said charged particle beam elements over said surface of said object;

said beam shaping means comprising:
  a substrate formed with a plurality of apertures for shaping said charged particle beam into said plurality of charged particle beam elements;
  a plurality of common electrodes provided on said substrate respectively in correspondence to said plurality or apertures, each of said plurality of common electrodes being provided in a first side of a corresponding aperture; and
  a plurality of blanking electrodes provided on said substrate respectively in correspondence to said plurality of apertures, each of said plurality of blanking electrodes being provided in a second, opposite side of a corresponding aperture on said substrate.

Another object of the present invention is to provide a beam shaping mask for shaping a charged particle beam into a plurality of charged particle beam elements, comprising:

a substrate formed with a plurality of apertures for shaping said charged particle beam into said plurality of charged particle beam elements;

a plurality of common electrodes provided on said substrate respectively in correspondence to said plurality of apertures, each of said plurality of common electrodes being provided in a first side of a corresponding aperture; and a plurality of blanking electrodes provided on said substrate respectively in correspondence to said plurality of apertures, each of said plurality of blanking electrodes being provided in a second, opposite side of a corresponding aperture on said substrate.

Another object of the present invention is to provide a process for fabricating a beam shaping mask for shaping a charged particle beam into a plurality of charged particle beam elements, comprising the steps of:

providing a plurality of conductor patterns on a surface of a substrate with respective thicknesses such that at least one of said conductor patterns has a thickness that is different from the thickness of another conductor pattern; and providing a ground electrode and a blanking electrode on said substrate respectively in electrical contact with said conductor patterns, said ground electrode and said blanking electrode forming a deflector for deflecting said charged particle beam elements.

According to the present embodiment set forth above, the beam shaping mask causes a uniform deflection when turning off the charged particle beam, over entire area of the mask, and the problem of leakage of the deflected charged particle beam elements upon the reversal deflection upon the blanking of the charged particle beam is successfully eliminated. Further, by optimizing the thickness and hence the resistance of the conductor patterns on the beam shaping mask, it is possible to adjust the timing of activation of the individual electrostatic deflectors formed on the beam shaping means for selectively turning off the charged particle beam elements.

Another object of the present invention is to provide a BAA exposure system in which maintenance of the BAA mask is substantially facilitated.

Another object of the present invention is to provide a charged particle beam exposure system for exposing a pattern on an object by a charged particle beam, comprising:

beam source means for producing a charged particle beam, said beam source means emitting said charged particle beam toward an object on which a pattern is to be exposed, along an optical axis;

beam shaping means for shaping said charged particle beam to produce a plurality of charged particle beam elements in accordance with exposure data indicative of a dot pattern to be exposed on said object;

focusing means for focusing said charged particle beam elements upon a surface of said object; and deflection means for deflecting said charged particle beam elements over said surface of said object;

said beam shaping means comprising:
  a beam shaping mask carrying thereon a plurality of apertures for producing a charged particle beam element by shaping said charged particle beam and a plurality of deflectors each provided in correspondence to one of said plurality of apertures, said beam shaping means further including a plurality of electrode pads each connected to a corresponding deflector on said beam shaping means;
  a mask holder provided on a body of said charged particle beam exposure system for holding said beam shaping mask detachably thereon, said mask holder comprising: a stationary part fixed upon said body of said charged particle beam exposure system; a movable part provided movably upon said stationary part such that said movable part moves in a first direction generally parallel to said optical axis and further in a second direction generally perpendicular to said optical axis, said movable part carrying said beam shaping mask detachably; a drive mechanism for moving said movable part in said first and second directions; and
  a contact structure provided on said body of said charged particle beam exposure system for contacting with said electrode pads on said beam shaping mask, said contact structure including base body and a plurality of electrode pins extending from said base, said of said electrode pins having a first end connected to said base body of said contact structure and a second, free end adapted for engagement with said electrode pads on said beam shaping mask.

According to the construction of the present embodiment, particularly the construction of the beam shaping mask held on the mask holder and the construction of the cooperating contact structure, it is possible to dismount the BAA mask easily, without breaking the vacuum inside the electron beam column. Thus, the time needed for maintenance of the BAA mask is substantially reduced, and the throughput of exposure increases substantially. Further, the BAA exposure system of the present embodiment is advantageous in the point that one can use various beam shaping masks by simply dismounting an old mask and replacing with a new mask. Thereby, the charged particle beam exposure system of the present invention is not only useful in the BAA exposure system but also in the block exposure system.

Another object of the present invention is to provide a BAA exposure system capable of exposing a pattern on a large diameter substrate without increasing the size of the control system excessively.

Another object of the present invention is to provide a charged particle beam exposure system for exposing a pattern on an object, comprising:
 a base body for accommodating an object to be exposed;
 a plurality of electron optical systems provided commonly on said base body, each of said electron optical systems including:
  beam source means for producing charged particle beam, said beam source means emitting said charged particle beam toward an object on which a pattern is to be exposed, along an optical axis;
  beam shaping means for shaping said charged particle beam to produce a plurality of charged particle beam elements in accordance with exposure data indicative of a dot pattern to be exposed on said object, said beam shaping means comprising a beam shaping mask carrying thereon a plurality of apertures for producing a charged particle beam element by shaping said charged particle beam;
  focusing means for focusing said charged particle beam elements upon a surface of said object;
  deflection means for deflecting said charged particle beam elements over said surface of said object; and
  a column for accommodating said beam source means, said beam shaping means, said focusing means, and said deflection means;
  said electron optical system thereby exposing said charged particle beam element upon said object held in said base body;
 exposure control system supplied with exposure data indicative of a pattern to be exposed on said object and expanding said exposure data into dot pattern data corresponding to a dot pattern to be exposed on said object, said exposure control system being provided commonly to said plurality of electron optical systems and including memory means for holding said dot pattern data;
 said exposure control system supplying said dot pattern data to each of said plurality of electron optical systems simultaneously, such that said pattern is exposed on said object by said plurality of electron optical systems simultaneously.

According to the foregoing embodiment of the present invention, the size of the BAA exposure system is substantially reduced, even when exposing a large diameter wafer by using a plurality of electron optical systems simultaneously.

Another object of the present invention is to provide a charged particle beam exposure system that uses an immersion electron lens, wherein the compensation of beam offset caused by the eddy current is successfully achieved with a simple construction of the electron optical system.

Another object of the present invention is to provide a charged particle beam exposure system for exposing a pattern on an object by a charged particle beam, comprising:
 a stage for holding an object movably;
 beam source means for producing a charged particle beam and emitting said charged particle beam toward said object held on said stage along an optical axis; and
 a lens system for focusing said charged particle beam upon said object held on said stage;
 said lens system including an immersion lens system comprising: a first electron lens disposed at a first side of said object closer to said beam source means, a second electron lens disposed at a second, opposite side of said object, said first and second electron lenses creating together an axially distributed magnetic field penetrating through said object from said first side to said second side; and a shield plate of a magnetically permeable conductive material disposed between said object and said first electron lens, said shield plate having a circular central opening in correspondence to said optical axis of said charged particle beam.

According to the present embodiment as set forth above, the electric field inducted as a result of the eddy current is successfully captured by the magnetic shield plate and guided therealong while avoiding the region in which the electron beam passes through. Thereby, adversary effects upon the electron beam by the eddy current is effectively eliminated.

Another object of the present invention in to provide a charged beam exposure process capable of exposing both a BAA exposure process and a block exposure process on a common substrate.

Another object of the present invention is to provide a charged particle beam exposure system for exposing a pattern on an object, comprising:
 a stage for holding an object thereon;
 beam source means for producing a charged particle beam such that said charged particle beam is emitted toward said object on said stage along a predetermined optical axis;
 a blanking aperture array provided in the vicinity of said optical axis for shaping an electron beam incident thereto, said blanking aperture a ray including a mask substrate, a plurality of apertures of identical size and shape disposed in rows and columns on said mask substrate and a plurality of deflectors each provided in correspondence to an aperture on said mask substrate;
 a block mask provided in the vicinity of said optical axis, said block mask carrying thereon a plurality of beam shaping apertures of different shapes for shaping an electron beam incident thereto;
 selection means for selectively deflecting said electron beam from said beam source means to one of said blanking aperture array and said block mask;
 focusing means for focusing an electron beam shaped by any of said blanking aperture array and said block mask upon said object on said stage.

According to the construction of the present embodiment set forth above, it is possible to switch the BAA exposure and block exposure by using the single electron exposure system. Thereby, the addressing deflector, used in the block exposure process for selecting an aperture on the block mask, is used also as the selection beams for selecting the BAA exposure process and the block exposure process. Thereby, no extraneous fixture is needed for implementing the selection of the exposure mode.

Other objects and further features of the present invention will become apparent from the following detailed description when read in conjunction with the attached drawings.

BRIEF DESCRIPTION OF THE DRAWINGS

FIGS. 8A–8G are diagrams showing the timing chart for explanation of the operation of the BAA exposure system of the first embodiment;

FIGS. 22A–22E are diagrams showing the operation of the BAA exposure system of FIG. 17;

FIG. 23 is a diagram showing the construction of a D/A converter used in the BAA exposure system of FIG. 17;

FIGS. 59A and 59B are diagrams showing the construction of wiring patterns provided on the BAA mask of the present embodiment;

FIGS. 75A–75D show various patterns that can be exposed on a substrate by using the mask of FIG. 74;

FIGS. 104A and 104B are diagrams showing an example of exposing a sub-field;

DETAILED DESCRIPTION OF THE PREFERRED EMBODIMENTS

[first embodiment]

Figure 1:
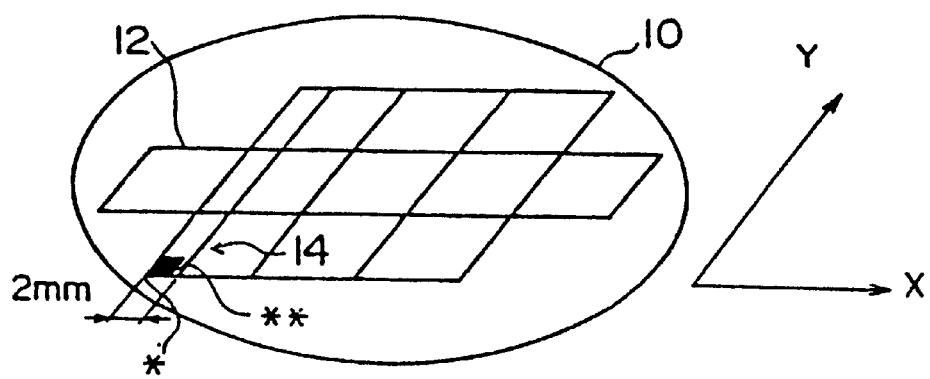
FIG. 1 is a diagram showing the scanning employed in a BAA exposure system.

Hereinafter, the scanning of electron beam employed conventionally as well as in a first embodiment of the present embodiment, will be described with reference to FIG. 1, wherein FIG. 1 shows a scanning of a single wafer 10 by means of electron beams forming together an electron beam bundle. The wafer 10 corresponds to the foregoing object and includes a plurality of regions corresponding to the chips to be formed. It should be noted, however, that the scanning scheme of the BAA exposure system is not limited to the one described in FIG. 1 but other scanning schemes are also possible. Some of the embodiments of the present invention described later uses a different scanning scheme.

Referring to FIG. 1, the wafer 10 is moved continuously in a Y-direction while exposing the surface of the wafer 10 by electron beams shaped by a BAA mask and forming an electron beam bundle.

In such an exposure process, the scanning of the electron beam bundle to be described is achieved in each cell defined on the wafer 10, wherein an example of such a cell is shown in FIG. 1 by a reference numeral 14. In the illustrated example, the cell 14 has a size of 2 mm in the X-direction that corresponds to the coverage area of a main deflector used in the electron beam exposure system. On the other hand, the cell 14 has a size smaller than the chip area 12 in the Y-direction. Thereby, the electron beam bundle formed of the plurality of electron beams is deflected in the Y-direction to scan the surface of the wafer 10 while the wafer 10 is transported continuously in the Y-direction. Further, the scanning of the electron beam bundle is repeated while deflecting the same in the X-direction.

As the stage carrying the wafer 10 moves in the Y-direction continuously, it is not necessary, in principle, to limit the size of the cell 14 in the Y-direction. However, it is desired to suitably limit the size of the cell in the Y-direction in view of necessity of various processings for beam compensation as well as other necessary data processings of the exposure data. Typically, the size of the cell in the Y-direction is set equal to the chip size in the maximum. When it is desired to carry out more accurate beam compensation, on the other hand, one may reduce the cell size in the Y-direction.

Here, the concept of cell stripe will be defined. A cell stripe is a region of the substrate 10 that can be exposed by a maximum deflection of the electron beams by a sub-deflector of the electron beam exposure system. Typically, the sub-deflector is formed of an electrostatic deflector and can cover an area of about 100 μm. In the case the sub-deflector can cover the area of about 100 μm by way of beam deflection, the cell stripe has a size of 100 μm in the Y-direction. Further, when the width of the electron beam bundle in the X-direction is set to 10 μm, the cell stripe has a size of 10 μm in the X-direction.

Figure 2:
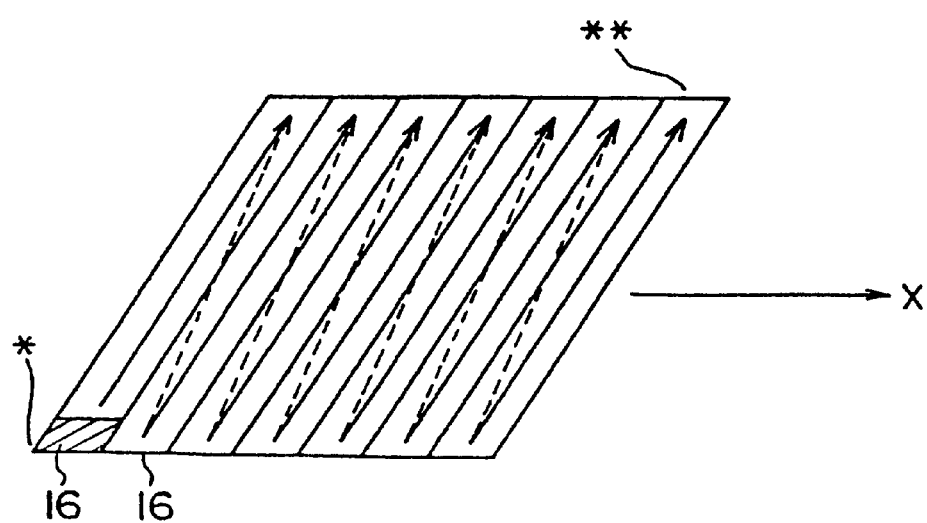
FIG. 2 is a diagram showing a part of FIG. 1 in an enlarged scale.

FIG. 2 shows the black-painted region of FIG. 1 in an enlarged scale.

Referring to FIG. 2, it will be noted that there are formed a number of cell stripes 16 each extending in the Y-direction and repeated a number of times in the X-direction, wherein the electron beam bundle is deflected in each cell stripe 16 in the Y-direction by the sub-deflector such that the substrate is scanned by the electron beams forming the electron beam bundle. In the case each of the cell stripes 16 has a size of 10 μm in the X-direction and 100 μm in the Y-direction, a region including ten cell stripes 16 disposed in parallel may be scanned by the sub-deflector without energizing the main deflector or moving the stage. Thereby, the sub-deflector scans the area having a size of 10 μm×100 μm, and it should be noted that a plurality of such sub-deflector areas form the cell region 14. As already noted, the cell region 14 has a size of about 2 mm in the X-direction in correspondence to the coverage area of the main deflector.

The cell stripe 16 may have a size smaller than the foregoing size of 10 μm×100 μm. Such a reduction in the cell stripe 16 is achieved easily by turning off the electron beams from the edge region of the BAA mask. In order to reduce the size of the cell stripe in the Y-direction, one may reduce the stroke of scanning in the Y-direction or turn off the beams from the part of the BAA mask corresponding to the edge part of the cell stripe. It is advantageous to set the length of the cell stripe coincident to the pitch of repetition for the exposure pattern when the exposure pattern includes a repetition.

Next, the general construction of a conventional electron beam exposure system used for the BAA exposure will be described with reference to FIG. 3 together with problems thereof.

Figure 3:
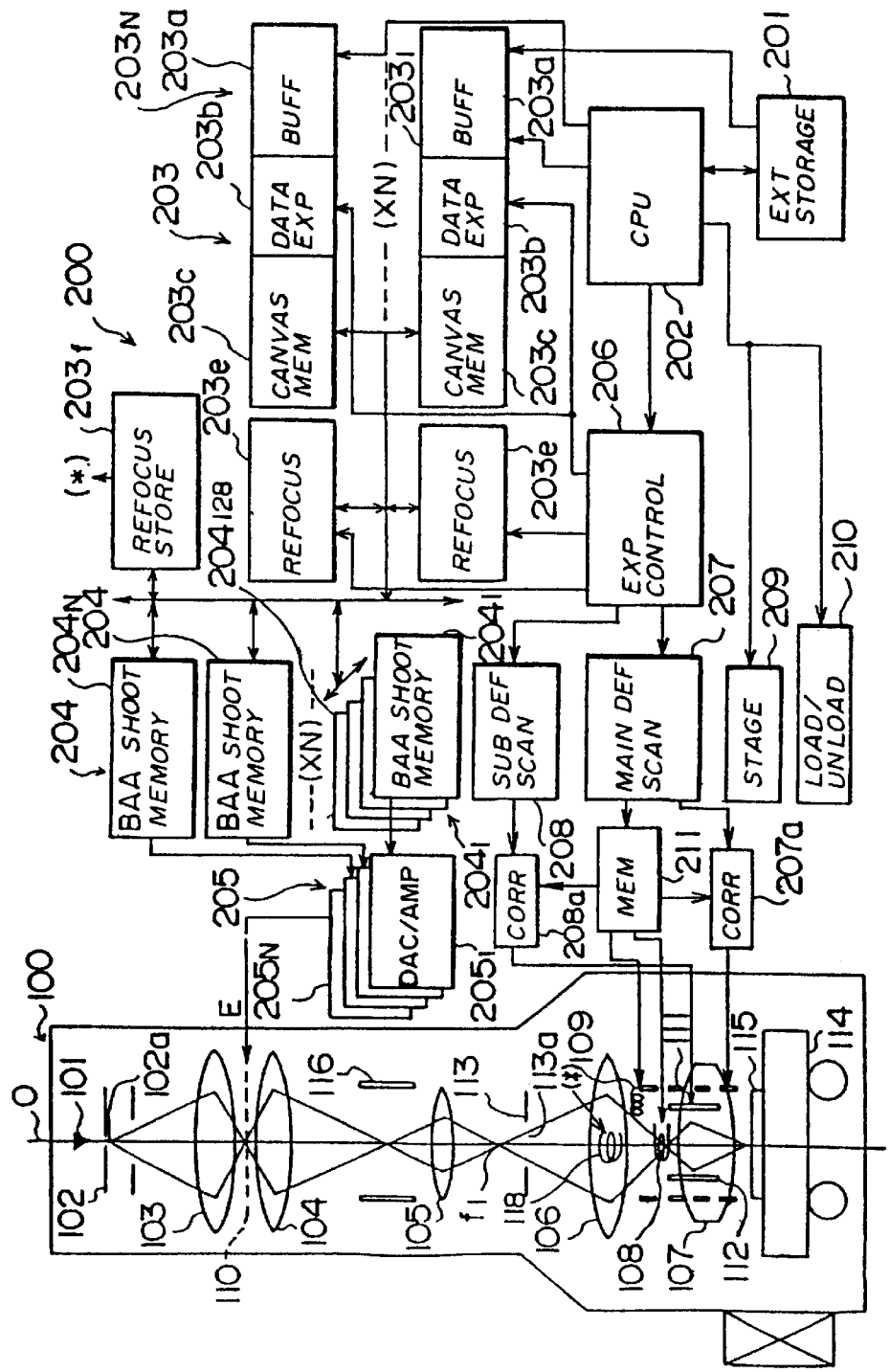
FIG. 3 is a diagram showing the overall construction of a conventional BAA exposure system.

Referring to FIG. 3, the electron beam exposure system comprises generally an electron optical system 100 that produces a focused electron beam and a control system 200 for controlling the electron optical system 100. The electron optical system 100 includes an electron gun 101 as an electron beam source, and the electron gun 101 emits the electron beam as a divergent electron beam along a predetermined optical axis O.

The electron beam thus produced by the electron gun 101 is shaped by an aperture 102a provided on an aperture plate 102, wherein the aperture 102a shapes the electron beam upon passage therethrough. The aperture 102a is in alignment with the optical axis O, and shapes the incident electron beam to have a rectangular cross section.

The shaped electron beam thus formed is focused on a BAA mask 110 by an electron lens 103, wherein the BAA mask carries thereon a blanking aperture array. Thus, the electron lens 103 projects the image of the aforementioned rectangular aperture 102a on the BAA mask 110. On the mask 110, there are formed a plurality of small apertures corresponding to the exposure dots to be exposed on a semiconductor substrate, and an electrostatic deflector is provided on the BAA mask 110 in correspondence to each of the apertures. The electrostatic deflector is controlled by a driving signal E to pass the electron beam directly in a non-activated state, or to deflect the passing electron beam in an activated state, so that the direction of the passing electron beam deviates from the optical axis O. As a result, and as will be described below, an exposure dot pattern corresponding to the non-activated apertures on the BAA mask 110 is formed on the semiconductor substrate.

The electron beam passed through the BAA mask 110 in focuses at a focal point $f_1$ on the optical axis O after passing through the electron lenses 104 and 105 that form a demagnifying optical system, and the image of the selected apertures is projected at the focal point $f_1$. The focused electron beam is further focused on a semiconductor substrate 115 held on a movable stage 114 by electron lenses 106 and 107 that form another demagnifying optical system, after passing through a round aperture 113a provided on a blanking plate 113. Thus, an image of the BAA mask 110 is projected on the substrate 115. Here, the electron lens 107 acts as an objective lens and includes therein various correction coils 108 and 109 for correcting focal point and aberrations as well as deflectors 111 and 112 for moving the focused electron beam over the surface of the substrate 115.

Further, there is provided an electrostatic deflector 116 between the lens 104 and lens 105, wherein the path of the electron beam is deviated from the optical axis 0, which is set to pass through the round aperture 113a on the plate 113, upon activation of the electrostatic deflector 116. As a result, it becomes possible to switch the electron beam on/off at a high speed on the semiconductor substrate 115. Furthermore, the electron beams, which have been deflected by the electrostatic deflectors on the apertures on the BAA mask 110 described above, deviate also from the round aperture 113a. Therefore, the electron beams thus deflected do not reach the semiconductor substrate and it becomes possible to control the exposure dot pattern on the substrate 115.

The electron-beam exposure system of FIG. 3 uses a control system 200 for controlling such exposure operations. The control system 200 includes an external storage device 201, such as a magnetic disk drive or a magnetic tape drive for storing data relating to the patterns of the semiconductor device to be exposed.

The data stored in the storage device 201 is read out by a CPU 202, and the data compression thereof is removed by a data expansion unit 203. Thereby, the data is converted to the exposure dot data which switches the individual apertures on the BAA mask 110 on/off according to the desired exposure pattern. In order to enable a delicate correction of the exposure pattern, the electron-beam exposure system of FIG. 3 carries out a multiple exposure of exposure dots on the substrate 115, wherein N independent exposure patterns are superposed. Accordingly, the data expansion unit 203 includes N circuits $203_1$ to $203_N$, wherein the circuits $203_1$ to $203_N$ generate N sets of mutually independent exposure dot pattern data used for carrying out the foregoing multiple exposures superposed N times, based upon the exposure data provided from the external storage 201.

Each of the circuits $203_1$ to $203_N$ is composed of a buffer memory 203a for holding exposure data supplied from the external storage 201, a data expansion section 203b which generates the dot pattern data representing the exposure dot pattern based upon the exposure data held in the buffer memory 203a, and a canvas memory 203a for holding the dot pattern data expanded by the data expansion section 203b, wherein the data expansion unit 203 supplies the dot pattern data held in the canvas memory 203a to a corresponding shoot memory 204. More specifically, the output shoot memory 204 includes N memory circuits $204_1$–$204_N$ corresponding to the N data expansion circuits $203_1$ to $203_N$, and each of the memory circuits, e.g, the circuit $204_1$, includes 128 memory circuits each formed of a dynamic random access memory, in correspondence to the total of 128 apertures aligned in the X-direction on the BAA mask 110. Thus, each of the 128 memory circuits is supplied with one-bit data that switches the aperture on the BAA mask 110 on/off, from said canvas memory 203c. The memory circuits $204_1$ to $204_N$, in turn, supply the one-bit data held therein to the BAA mask 110 after converting the same into analog signals by means of corresponding D/A converters $205_1$ to $205_N$. As a result, the electrostatic deflectors aligned in the Y-direction on said BAA mask 110 in correspondence to the apertures are activated sequentially.

Furthermore, the electron-beam exposure system of FIG. 3 includes an exposure control unit 206 which is supplied with a control signal from the CPU 202 based upon the control program stored in the external storage device 201, wherein the exposure control unit 206 controls the operation of the data expansion circuit 203 and the shoot memory 204, the transfer of data from the data expansion circuit 203 to the shoot memory 204, and the activation of the BAA mask 110 by means of the D/A converter 205. Furthermore, the exposure control unit 206 controls the main deflector 111 and the sub-deflector 112 via a main deflector control circuit 207 and a sub-deflector control circuit 208, such that the electron beam scans over the surface of the substrate 115.

The system of FIG. 3 further includes correction circuits 207a and 208a for compensation of beam distortion respectively caused by the main deflector and the sub-deflector, wherein the correction circuit 208a is supplied with correction coefficients GX and GY for gain, RX and RY for pattern rotation, OX and OY for pattern offset and HX and HY for trapezoidal pattern deformation, from a deflection correction memory 211, wherein the memory 211 stores the foregoing correction coefficients at respective addresses that correspond to the main deflection data supplied from the main deflector control circuit 207. Thus, in response to the main deflection data from the main deflector control circuit 207, the memory 211 supplies the foregoing correction coefficients GX and GY, RX and RY, OX and OY and HX and HY to the correction circuit 208a for correction of the sub-deflection data supplied from the sub-deflector control circuit 208. The sub-deflection data thus corrected is then supplied to the sub-deflector 112. Similarly, the memory 211 stores correction coefficients DX and DY for pattern distortion at respective addresses corresponding to the main deflection data and supplies the same to the correction circuit 207a in response to the main deflection data from the main deflector control circuit 207. Thereby, deflection data supplied from the main deflector control circuit 207 to the correction circuit 207a is corrected, and the deflection data thus corrected is supplied further to the main deflector 111.

Further, the memory 211 stores correction data SX and SY for dynamic astigmatic correction as well as correction data F for dynamic focusing correction at respective addresses corresponding to the main deflector data. Thereby, the dynamic astigmatic compensation is in response to the main deflection data achieved by way of the correction circuit 208a similarly as before. Further, the dynamic focusing control is achieved in response to the main deflection data by the memory 211 that drives the compensation coil 108.

The electron beam exposure system of FIG. 3 further includes a refocus control circuit 203e and a refocus data memory 203f for compensating for the divergence of electron beam caused by the Coulomb repulsion of electrons forming the focused electron is beam. The refocus control circuit 203e thereby produces a drive signal of a refocus compensation coil 118 in response to the exposure pattern.

Next, the construction of the BAA mask 110 will be described briefly.

Figure 4:
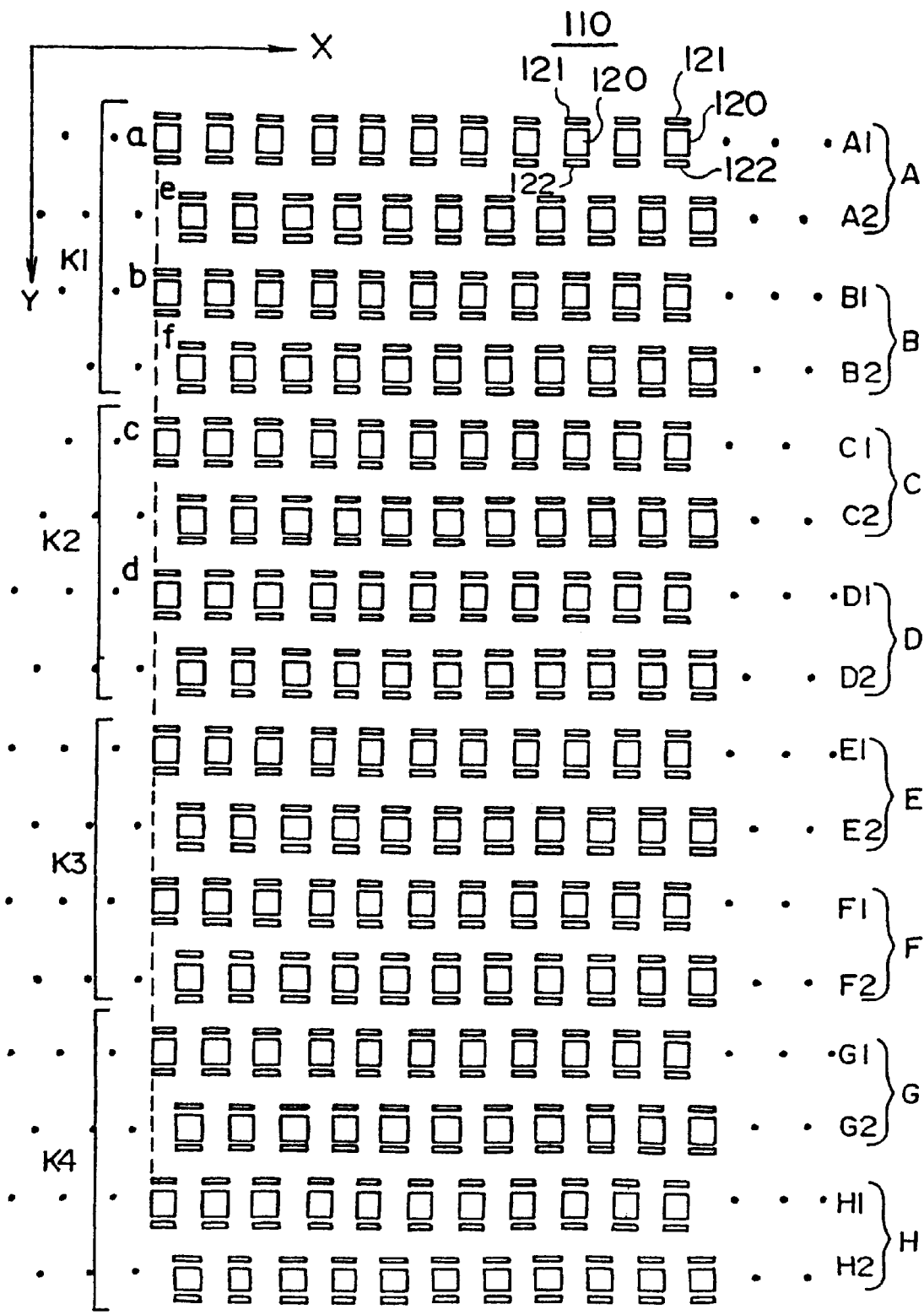
FIG. 4 is a diagram showing an example of a BAA mask used in the exposure system of FIG. 3.

Referring to FIG. 4 showing a part of the BAA mask 110 in a plan view, the BAA mask 110 is formed of a thin silicon substrate or metal plate and carries a number of apertures 120 arranged in rows and columns, wherein each of the apertures 120 includes a drive electrode 121 and a ground electrode 122 at respective, mutually opposing edges of the aperture. In the illustrated example, eight of such apertures 120 are aligned in the Y-direction to form a column, and such aperture columns extending in the Y-direction are repeated 128 times in the X-direction. As a result, there are formed eight aperture rows A–H each extending in the X-direction, wherein each aperture row in fact is formed of two aperture rows. For example, the aperture row A is formed of an aperture row $A_1$ and an aperture row $A_2$, the aperture row B is formed of an aperture row $B_1$ and an aperture row $B_2$, .... Thereby, it will be noted that there is formed a pattern of apertures arranged in a row and column formation in a staggered relationship on the BAA mask 110. In all, 1024 apertures are formed on the BAA mask 110, each in fact including two apertures.

Upon illumination of the BAA mask 110 of FIG. 4 by an electron beam produced by the electron gun 101 and shaped by the aperture 102a, it will be noted that a bundle of electron beam including a row and column formation of electron beam elements is produced as a result of beam shaping at the apertures on the BAA mask 110. The electron beam elements thus produced are then focused upon the substrate 115 after demagnification by the electron lenses 104 and 105 as well as the electron lenses 106 and 107, and an exposure dot pattern including 1024 exposure dots in maximum, each having a size of 0.08 μm×0.08 μm, is exposed on the substrate 115. In such an exposure, all the exposure dots on the substrate 115 are exposed simultaneously.

It should be noted that the electron beam elements forming the electron beam bundle scans the surface of the substrate 115 in the Y-direction as a result of energization of the deflector 112, and each point on the substrate 115 experiences a multiple exposure of the exposure dots in correspondence to the foregoing apertures forming the aperture rows A–H, wherein such a multiple exposure is repeated eight times in the maximum.

More specifically, a row of exposure dots corresponding to the aperture row A1 are exposed on the substrate 115, followed by an exposure of the exposure dots corresponding to the aperture row B1, such that the exposure dots corresponding to the aperture row B1 are superposed upon the exposure dots corresponding to the aperture row A1. Further, the exposure dots corresponding to the aperture rows C1, D1, ... are superposed thereon. A similar situation holds also in the exposure of dots by using the aperture rows A2, B2, C2, .... As the apertures in the row A1 and the apertures in the row A2 are formed with a staggered relationship as already noted, the exposure dots formed by the aperture rows A2 fill the gap between the exposure dots formed by the aperture rows A1, and there is formed a single exposure line extending in the X-direction as a result of such a multiple exposure of the exposure dots. By forming the apertures on the BAA mask with a staggered relationship as indicated in FIG. 4, it is possible to reduce the Coulomb repulsion between the electron beam elements by avoiding excessive approaching of the electron beam elements. When such a Coulomb repulsion occurs in the electron beam elements, the effective focal length of the electron lens increases.

In the simplest case of exposure, the same exposure data is supplied consecutively from the aperture row A1 to the aperture rows B1, C1, D1, E1, F1, G1 and H1, or from the aperture row A2 to the aperture rows B2, C2, D2, E2, F2, G2 and H2, and there occurs a multiple exposure of the exposure dots with a desired dose. Further, it should be noted that it is possible to achieve an extremely delicate control of the exposure pattern by changing the exposure data in each aperture group such as a group K1, K2, K3 and K4, wherein, in the illustrated example, the aperture group K1 includes the aperture rows A and B, the aperture group K2 includes the aperture rows C and D, the aperture group K3 includes the aperture rows E and F, and the aperture group K4 includes the aperture rows G and H. As a result of such a multiple exposure process, it should be noted that different patterns are superposed. Such a multiple exposure process is extremely useful for compensating for the proximity effect that is an unwanted exposure caused by the electrons back-scattered from the substrate. By using the foregoing multiple exposure process, it is possible to compensate for the proximity effect efficiently by a single scanning of the electron beam bundle.

Figure 5:
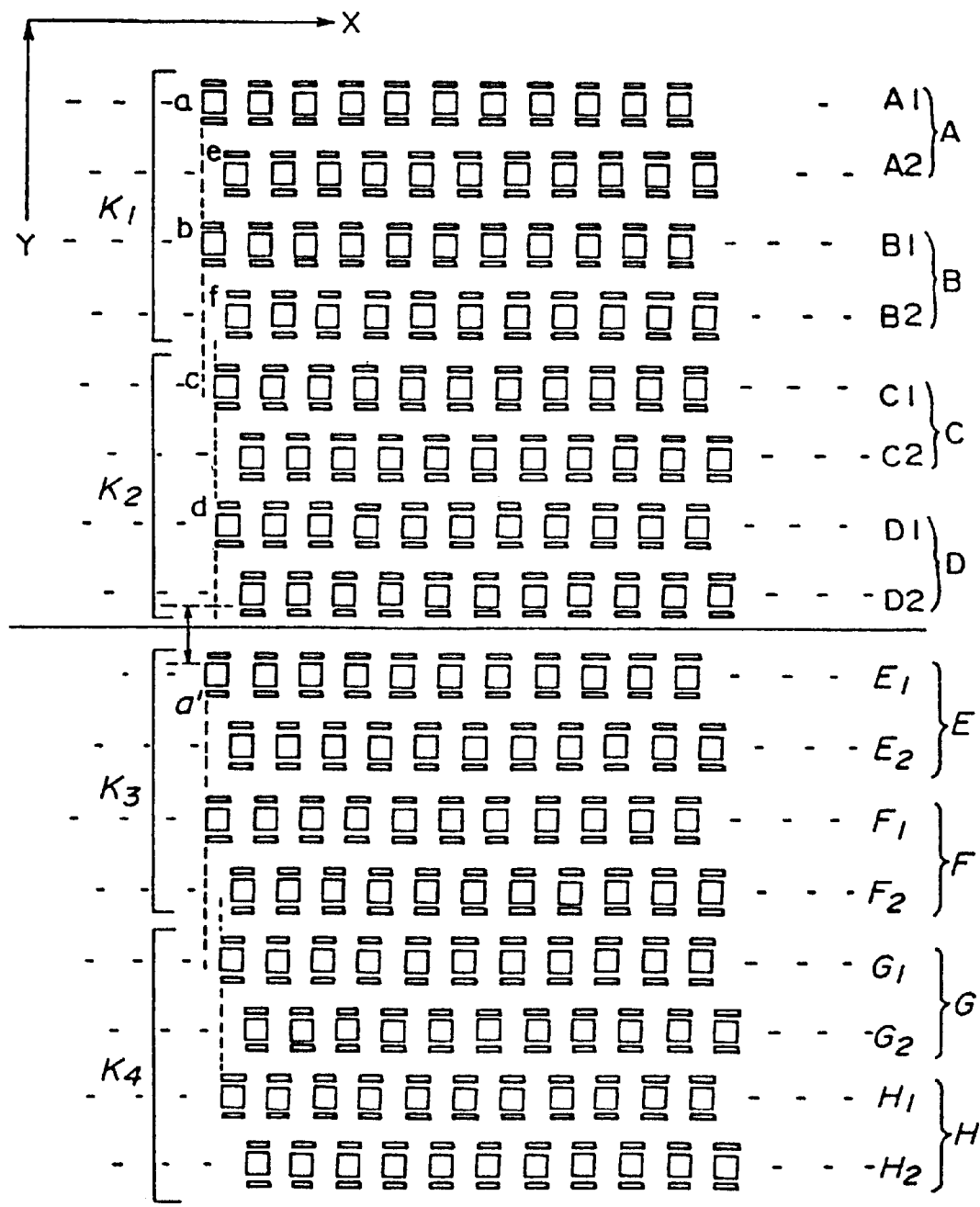
FIG. 5 is a diagram showing another example of the BAA mask.

FIG. 5 shows another conventional example of the BAA mask 110, wherein it will be noted that the apertures forming the groups K1–K4 are formed with a positional offset with respect to the apertures of other groups. For example, the aperture a of the group K1 is offset with respect to the corresponding aperture c of the group K2 in the X-direction with a quarter of the pitch of the apertures on the BAA mask 110. Similarly, the aperture a' of the group K3 is offset with respect to the corresponding aperture a of the group K1 in the Y direction by a quarter pitch. Generally, by providing the apertures on the BAA mask 110 with a mutual offset of M/N pitch (M<N) in one or both of the X- and Y-directions, it is possible to achieve the desired modification of the exposure pattern with increased precision. More detailed description of the M/N pitch shift of the BAA mask is given in the U.S. Pat. No. 5,369,282, which is incorporated herein as reference.

In such a conventional BAA exposure system, it will be noted that the data transfer rate of the dot pattern data to the BAA exposure system is a critical factor, wherein such a data transfer of the dot pattern data includes decompression or expansion of pattern data in the data expansion unit 203b to form dot pattern data and storage of the dot pattern data thus expanded in the canvas memory 203a. In order to achieve a fast data transfer, conventional BAA exposure system has to use a very large memory for the shoot memories $204_1$–$204_N$, while it is difficult, at least at the present juncture, to have a shoot memory that can store the dot pattern data of whole chip or several chips.

Thus, in the conventional BAA exposure system, it has been practiced to interrupt the exposure after exposing the dot pattern data held in the canvas memory 203c for carrying out a data expansion of next pattern data. After the data expansion of the next pattern data, the exposure is resumed based upon the newly expanded data in the canvas memory 203c. In order to facilitate the exposure process, it is also practiced to carry out exposure while expanding the pattern data in the data expansion unit 203b.

It should be noted, however, that the exposure throughput is limited in such a conventional exposure process by the capacity of the shoot memory 204 and the rate of data expansion in the unit 203b, Further, such a conventional exposure process that overwrites the exposure data in the canvas memory by the next data, is disadvantageous in the point that it is not possible to inspect the exposure dot data in the event there occurred anomaly or defect in the result of exposure. Further, currently available dynamic random access memories suitable for canvas memory are volatile in nature and cannot save the expanded dot pattern for repeated use.

In addition, the conventional BAA exposure system has a drawback in that the throughput for exposing a whole area on the substrate 115 decreases substantially as compared with the conventional variable-shaped beam exposure process, unless the transfer of the dot pattern to the exposure system is achieved at very high speed.

In the BAA exposure system described above, it should further be noted that the aperture b in FIG. 4 is separated from the aperture a in the Y-direction by a distance corresponding to six apertures. Thus, the aperture a is given with the exposure data identical to the data supplied to the aperture a with a delay of six clocks. In such a construction, the number of channels for supplying the dot pattern data to each of the apertures aligned on the BAA mask 110 in the Y-direction is reduced to one half as compared with the case of supplying independent exposure dot data to the apertures a and b. Further, independent activation of the aperture groups K1–K4 increases the number of channels by four. Similarly, respective dot pattern data are supplied to the aperture e, which is separated on the BAA mask 110 from the aperture a in the Y-direction by a distance of three apertures, with a delay of three clocks. Thereby, the timing of exposure has to be set extremely stringently in order to achieve exact alignment of the exposure dot formed by the aperture a and the exposure dot formed by the aperture e on the BAA mask 110.

Conventionally, such a stringent timing control of the dot pattern data has been achieved in each channel by controlling the timing of reading the data based upon the predicted delay or the channel, while such a timing control, requiring a precision of within several nanoseconds, has been extremely difficult. It is also proposed to provide an offset to the exposure data so as to compensate for the delay caused in the dot pattern data, while such a modification of the original exposure data has to be changed depending upon the exposed pattern and such a process increases the complexity of preparing the exposure pattern.

Thus, the present embodiment has an object to provide a charged particle exposure system and method for exposing versatile patterns on an object by means of a charged particle beam that forms an exposure dot pattern, in which the creation of dot pattern data representing the exposure dot pattern and the exposure of the object by means of the charged particle beam can be achieved separately.

Further, the present embodiment provides a charged-particle-beam exposure method and system that is capable of holding a large amount of dot pattern data representing the exposure dot pattern and that can control a blanking aperture array based upon the dot pattern data at a high speed for producing a charged particle beam bundle including a number of charged particle beams in correspondence to each dot of the exposure dot pattern.

Hereinafter, the construction of the BAA exposure system according to a first embodiment of the present invention will be described.

Figure 6:
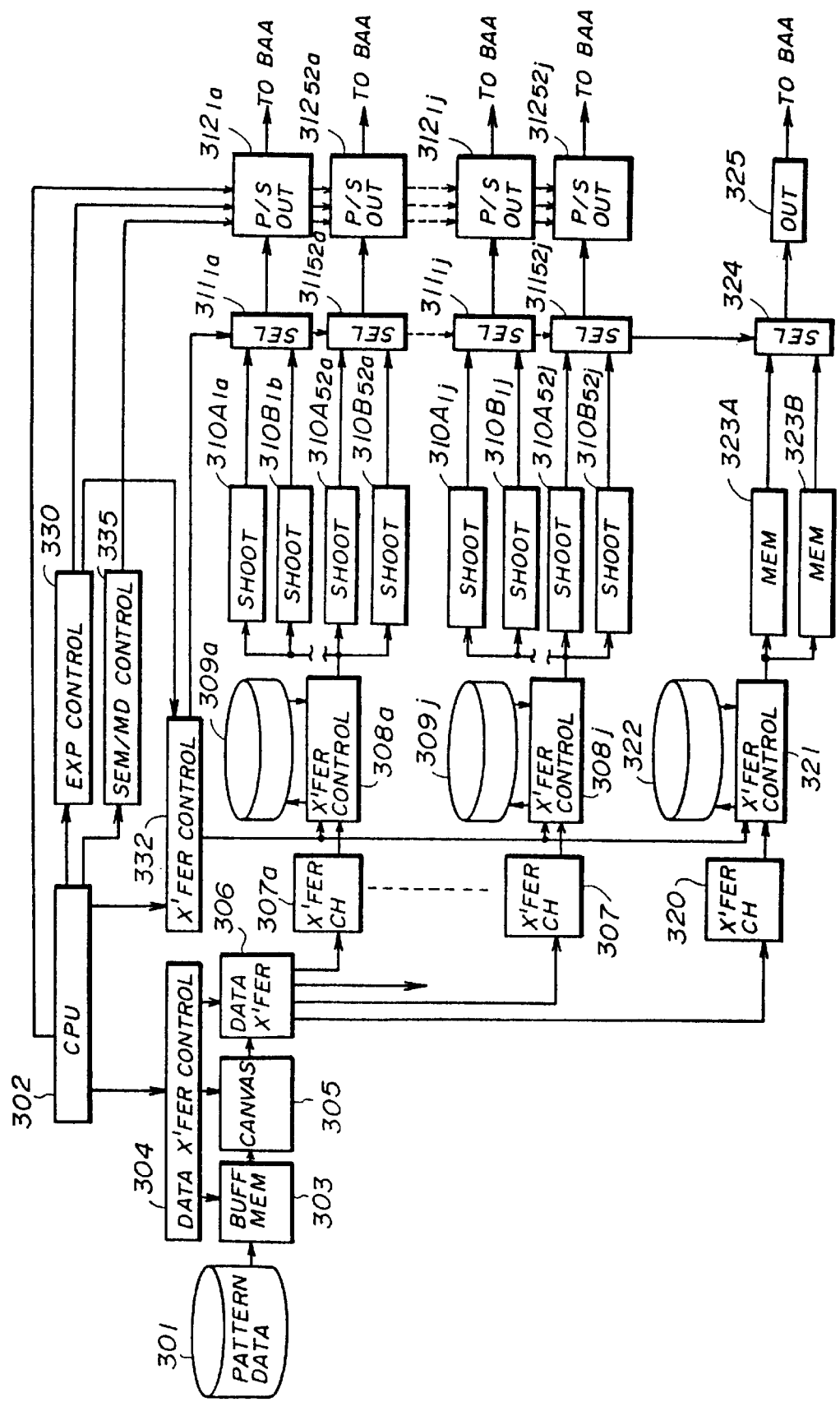
FIG. 6 is a block diagram showing the construction of the BAA exposure system according to a first embodiment of the present invention.

FIG. 6 is a block diagram showing a part of the charged particle beam exposure system according to a first embodiment of the present invention.

Referring to FIG. 6, there is provided a hard disk device 301 corresponding to the external storage device 201 of FIG. 3 for storing pattern data to be exposed. The pattern data in the hard disk device 301 is read out therefrom under control of a central controller 302 corresponding to the CPU 202, wherein the exposure data thus read out is stored in a buffer memory 303 corresponding to the buffer memory 203a of FIG. 2. The exposure data in the buffer memory 303 is then transferred under control of a data transfer controller 304 to a data expansion unit 305 corresponding to the expansion unit 203b and a canvas memory 203c, wherein the exposure data is expanded in the expansion unit 305 to bitmap data or dot pattern data that represents the exposure pattern on the substrate 115 in the form of exposure dots. Hereinafter, the expansion unit 305 will be referred to as a canvas memory.

The dot pattern data thus obtained in the canvas memory 305 is then supplied, by means of a data transfer unit 306, to a number of hard disk drives 309a–309j under control of the foregoing transfer control circuit 304, wherein the transfer of the dot pattern data is achieved via transfer channels 307a–307j and transfer controllers 308a–308j respectively cooperating with the hard disk drives 309a–309j.

In the exposure system that uses the BAA mask 110 of FIG. 4, which includes 1024 apertures (=128×8), it should be noted that one has to provide 512 channels (=1024÷2) for driving the BAA mask 110 when the same dot pattern data is supplied to the aperture a and further to the aperture b with a delay of six clocks for the aperture b. In the event the accuracy of exposure is negotiable, one may supply the dot pattern data of the aperture a of the group K1 to the corresponding aperture c of the group K2 after a delay of three exposure clocks, further to the corresponding aperture of the group K3 after a delay of additional three clocks, and further to the corresponding aperture of the group K4 after a delay of additional three clocks. In this case, one can reduce the independent channels to 256 (=1024÷4).

When exposing an eight-inch wafer with a throughput of 20 wafers per hour, it is necessary to expose one wafer with a duration of 180 seconds. Defining a frame on the wafer as a stripe region having a width of 2 mm and extending in the Y-direction for a length covered by the movement of the stage 114 as indicated in FIG. 1, exposure of ten such frames is required in order to complete the exposure of one chip having a size of 20 mm for each edge. In each chip, the frame forms a limited strip or single chip fame" having a limited size of 2×20 mm, while exposure of such a single chip frame requires exposure dot data of 25 Gbits, assuming that four channels are used in the exposure.

As there are 10 chip frames in one chip, it is necessary to transfer the dot pattern data for one chip frame in 18 seconds for achieving the foregoing exposure of a single chip, while this means that a data transfer rate of 174 Mbyte/sec (=25 Gbit/18 sec) is required for transferring the exposure dot data to the BAA exposure system. Here, it should be noted that the same exposure dot data is used in the BAA exposure system for exposing the same chips on the wafer. Such a data transfer rate is achieved by arranging 10 hard disk drives 309a–309j each having a data transfer rate of 20 Mbyte/sec in parallel, such that the data transfer occurs in parallel in these hard disk drives.

As there are 512 independent channels for the apertures on the BAA mask 110, each of the hard disk drives 309a–309j store dot pattern data for about 52 channels.

Meanwhile, it should be noted that the exposure control system of FIG. 6 achieves a refocus control such that the amount of refocus compensation increases with increasing number of the apertures that are turned on the BAA mask 10, in order to avoid the divergence of the electron beams as a result of the Coulomb interaction of the electrons in the beams. In order to achieve such a refocus control, the canvas memory 305 creates refocus data when expanding the dot pattern data, based upon the number of bits forming the dot pattern data, wherein such refocus data is transferred from the data transfer unit 306 to another separate hard disk drive 312 via a transfer channel 320 and a transfer control circuit 312. Thereby, the hard disk drive 322 constitutes the refocus data memory 203f.

It should be noted that the foregoing dot data pattern is expanded and transferred to the hard disk drives 309a–309j for each of the cell stripes shown in FIG. 2. In such a data transfer of the refocus data, the number of the turned-on apertures in an exposure cycle is evaluated, and the refocus data is produced for each cell region 14 called also "band," based upon the same. The refocus data thus produced is then transferred to the disk drive 312. Thereby, the disk drives 309a–309j and the disk drive 312 store the dot pattern data for one chip as well as the refocus data.

In the construction of FIG. 6, each of the disk drives such as the disk drive 309a cooperates with a number of high speed shoot memories such as $310A_{1a}, 310B_{1a}, \ldots 310A_{52a}, 310B_{52a}$, wherein the shoot memories 310A correspond to the shoot memory 204 of FIG. 3. There are in all 104 such shoot memories (=52 channels×2) connected to each of the disk drives via the foregoing transfer controller such as the controller 308a. Each of the shoot memories 310 may be formed of a high speed bitmap memory such as a dynamic random access memory. Thereby, it should be noted that the shoot memories are arranged to form memory pairs such that the memories $310A_{1a}$ and $310B_{1a}$ form a pair, . . . the memories $310A_{52a}$ and $310B_{52a}$ form a pair, wherein the memories forming a memory pair such as the memories $310A_{1a}$ and $310B_{1a}$ are connected to a corresponding selector such as a selector $311_{1a}$. Thereby, the selector $311_{1a}$ selects the output of one of the cooperating memories $310A_{1a}$ and $310A_{1b}$ and transfers the same to a corresponding parallel-to-serial converter $312_{ij}$. A similar construction exists also for other hard disk drives such as the hard disk drive 309j or 322. Thereby, it will be noted that the hard disk drives 309a–309j are disposed between the canvas memory 305 corresponding to the canvas memory 203c and the shoot memories $310A_{1a}, 310B_{1a}–310A_{52j}, 310B_{52j}$. Further, there are provided also high speed shoot memories 323A and 323B cooperating with the hard disk drive 322 for storing the refocus data transferred thereto via the transfer controller 321, wherein the memories 323A and 323B form a part of the refocus data memory 203f. The memories 323A and 323B are thereby connected to an output circuit 325 via a selector 324.

In order to control the foregoing various elements, there is provided an exposure controller 330 corresponding to the exposure controller 206 of FIG. 3, wherein the exposure controller 330 controls the data transfer of the dot pattern data for one chip frame from all of the hard disk drives 308a–308i to the respective memory pairs by way of a transfer controller 322, such that the dot pattern data is stored, in each memory pair, in one of the memories such as the memories $310A_{1j}–310A_{52j}$ or the memories $310B_{1j}–310B_{52j}$. Further, the exposure controller 330 controls the transfer controller 332 such that the refocus data in the hard disk drive 322 is transferred to one of the memories 323A and 323B that holds the refocus data.

In order to guarantee the synchronization of data transfer, each of the transfer controllers 308a–308j and 321 issues a completion signal indicative of completion of data transfer to the exposure controller 330 via the transfer controller 332, such that any delay in data transfer caused for example by defects in the hard disk medium is compensated for.

Upon reception of the completion signal, the exposure controller 330 carries out reading of the dot pattern data as well as the refocus data from the memories $310A_{1j}–310A_{52j}$ or from the memories $310B_{1j}–310B_{52j}$, wherein the transfer controller 332 reads out the dot pattern data, under control of the exposure controller 330, from the memories $310A_{1a}–310A_{52a}$ or from the memories $310B_{1a}–310B_{52a}$ substantially simultaneously and transfers the same to the parallel-to-serial converters $312_{1a}–312_{25a}, \ldots 312_{1j}–312_{52j}$. Further, the refocus data is read out from one of the memories 323A and 323B and is transferred to the output circuit 325 via the selector 324.

After the foregoing data transfer is completed, the exposure controller 330 activates a similar data transfer from the other memories such as the memories $310B_{1a}–310B_{52a}, \ldots 310B_{1j}–310B_{52j}$ as well as from the other memory 323B, assuming that the data transfer has been made in the previous step from the memories $310A_{1a}–310A_{52a}, \ldots 310A_{1j}–310A_{52j}$ and from the other memory 323A.

It will be noted that the system of FIG. 6 further includes a SEM/MD controller 335, while this controller 335 is used for controlling the SEM operation or marker detection of the electron beam exposure system. As the controller 335 is outside the scope of the present invention, further description thereof will be omitted.

According to the exposure system of FIG. 6, it will be noted that the expansion of the dot pattern data can be achieved separately to the exposure operation. This in turn means that the throughput of exposure is not influenced by the rate of the data expansion. By using such pre-expanded dot pattern data stored in the hard disk drives, it is possible to expose the pattern of integrated circuits repeatedly on or more wafers by merely reading out the dot pattern data from the hard disk drives. As such hard disk drives are not volatile in nature, it is possible to examine the dot pattern data held in the hard disk drive in the event there occurred an anomaly in the exposed pattern for any defects. As the actual exposure is achieved by transferring the dot pattern data from each of the hard disk drives to a number of high speed memories cooperating with each of the hard disk drives in parallel, it is possible to read out and transfer the dot pattern data from such high speed memories, and a high exposure throughput can be attained as a result. As the reading of the dot pattern data is achieved from the memories $310A_{1a}–310B_{52j}$ in synchronization under control of an exposure clock, the exposure dots are formed on the substrate 115 with exact alignment. One may use high speed volatile memories such as a dynamic random access memory or static random access memory for the memories $310A_{1a}–310B_{52j}$ as well as for the memories 323A or 323B.

In the construction of FIG. 6, it should be noted that the exposure controller 330 controls the transfer of the dot pattern data such that the reading of the dot pattern data is carried out from the first memory set that includes the memories $310A_{1a}, \ldots 310A_{52a}, \ldots 310A_{1j}, \ldots 310A_{52j}$, while simultaneously writing the dot pattern data into the second memory set that includes the memories $310B_{1a}, \ldots 310B_{52a}, \ldots 310B_{1j}, \ldots 310B_{52j}$, or vice versa. Thereby, it is possible to eliminate the interruption of the exposure that may occur while rewriting the memories by next dot pattern data or refocus data.

Figure 7:
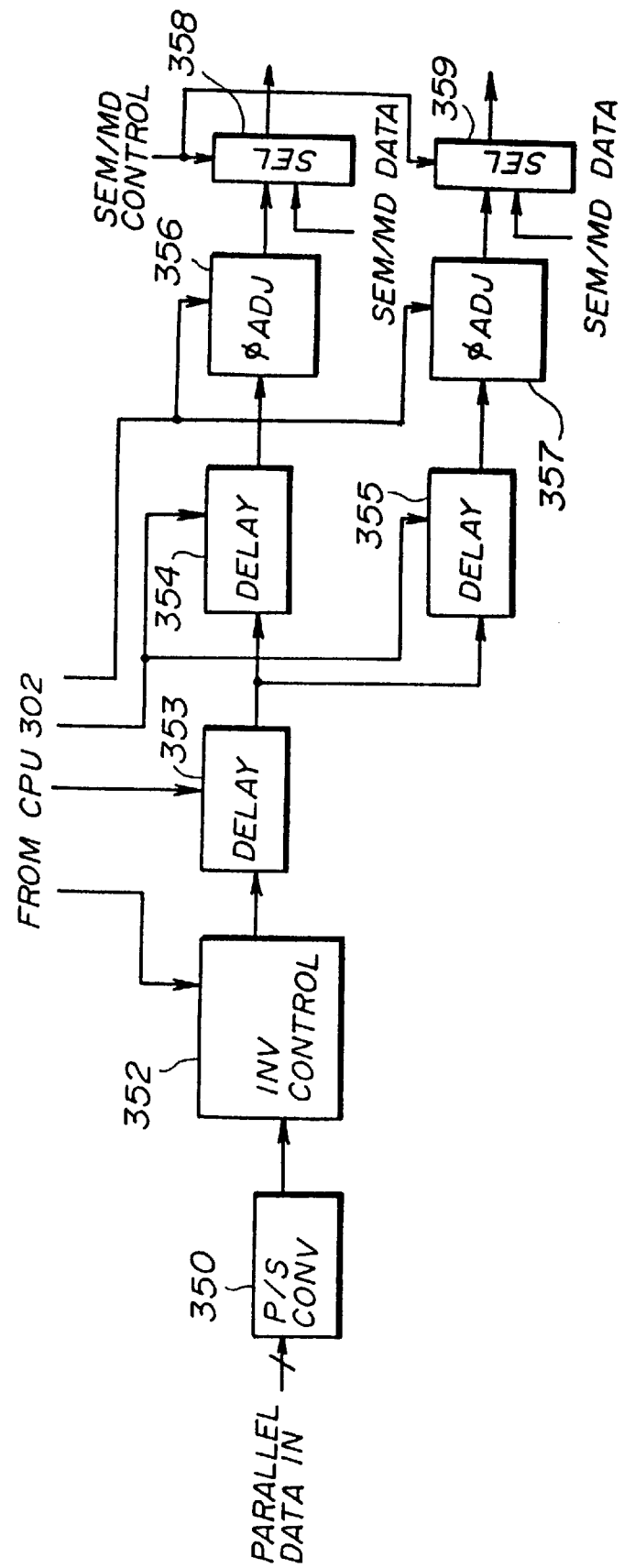
FIG. 7 is a block diagram showing a part of the circuit of FIG. 6.

FIG. 7 shows the construction of the parallel-to-serial converter such as the converter $312_{1a}$ in a block diagram.

Referring to FIG. 7, the parallel dot pattern data of 64 bits read out form a corresponding high speed memory such as the memory $310A_{1a}$ and is supplied, via a corresponding selector such as the selector $311_{1a}$, to a parallel-to-serial conversion unit 350 that includes a register. Thereby, the register holds the parallel dot pattern data supplied thereto and outputs the same as serial dot pattern data with a clock speed of 400 MHz.

The serial dot pattern data thus obtained is then supplied from the conversion unit 350 to an inversion switching circuit 352 for causing a selective data inversion, wherein the inversion switching circuit 352 supplies the serial dot pattern data to a delay circuit 353 that causes a delay in the serial data supplied thereto, with an inversion in the polarity of the serial dot data in response to a control signal from the central controller 302. By providing the inversion switching circuit 352, it is possible to select the positive exposure and negative exposure of the exposure dot on the substrate 150 simply under control of the central controller 302, while such a negative/positive control of the exposure dot pattern is extremely effective for compensating for the proximity effect.

The serial dot pattern data thus delayed in the delay circuit 353 is then supplied to next delay circuits 354 and 355 in parallel for delaying, wherein the serial dot pattern data thus delayed in the circuits 354 and 355 are supplied further to phase correction circuits 356 and 357, respectively for timing correction. Thereby, the serial dot pattern that has experienced timing correction in the phase correction circuit 356 is supplied to the drive electrode 121 on the BAA mask 110 via a selector 358 and the D/A converter 205 described in FIG. 3, wherein the selector 358 selects either the serial dot pattern data or the SEM/MMD data in response to a SEM/MD control signal supplied from the control circuit 335. Similarly, the serial dot pattern processed by the phase correction circuit 357 is supplied to the BAA mask 110 after passing through a selector 359 similar to the selector 358 and after a D/A conversion in the D/A converter 205.

Here it should be noted that the delay circuit 353 provides a delay to the serial dot pattern data based upon a control signal from the central controller 302, wherein the amount of delay of the delay circuit 353 is changed with respect to the delay of other channels. For example, the delay circuit 353 or a parallel-to-serial conversion circuit 312 that is included in one of the circuits $312_{1a}$–$312_{52j}$ and controls the apertures A and b on the BAA mask 110 or FIG. 4 or FIG. 5, provides a delay of three clocks to the serial dot pattern data, wherein the delay circuits 354 and 355 provide respectively a zero clock delay and 6 clock delay. similarly, the parallel-to-serial conversion circuit 312 for the apertures c and d causes a delay of 12 clocks. Here, the clocks have a frequency of 400 MHz and are used as the data transfer clock as will be described below. In each of the parallel-to-serial conversion circuits 312, it should be noted that the delay circuits 354 and 355 are set, by the central controller 302, to have a predetermined delay correspondence to the distance between the apertures exposed consecutively by the same dot pattern data. For example, the delay circuit 355 for the aperture b provides a delay of 6 clocks with respect to the delay circuit 354 in correspondence to the separation from the aperture a of 6 clocks.

AB a result of the setting of the delay as set forth above, the dot pattern data shown in .FIG. SB is supplied to the aperture a in synchronization to the data transfer clock of FIG. 3A. Further, the same dot pattern data as the one shown in FIG. 8B is supplied to the aperture b after a delay of 6 clocks as indicated in FIG. 8C. Further, the next dot pattern data different from the one shown in FIG. 8B is supplied to the aperture e as indicated in FIG. 8D with a delay of three clocks from the data of FIG. 8B, and the same dot pattern data as indicated in FIG. 8D is supplied to the aperture f as indicated in FIG. 8E with a delay of 6 clocks. Similarly, the next dot pattern data different from any of the foregoing dot pattern data is supplied to the aperture c with a delay of 12 clocks with respect to the data of FIG. 8B as indicated in FIG. 8F, and the same dot pattern data as the data of FIG. 8F is supplied to the aperture d with a delay of 6 clocks from the data of FIG. 8F, as indicated in FIG. 8G.

It should be noted that the phase correction circuits 356 and 357 are used to correct the timing of the data and provides a minute delay to the serial dot pattern data supplied thereto under control of the central controller 302, wherein the timing correction is made with a division of 1/10 the interval of the data transfer clock shown in FIG. 8A.

In the exposure system described above, the delay of the dot pattern data is made in each of the channels. Thus, there is no need to adjust the timing of the dot pattern data when transferring the dot pattern data, and the control of the data transfer to the BAA mask is substantially simplified. Thereby, it should be noted that the relative timing between the channels is determined by the delay circuit 353 while the relative timing within the channel is determined by the delay circuits 354 and 355. As the timing of the dot pattern data is further adjusted by means of the phase correction circuits 356 and 357, it is possible to align the exposed dots exactly on the substrate 115.

As already noted, the selectors 358 and 359 are supplied with one bit data indicative of the SEM/MD data as well as a selection control signal from the SEM/MD controller 335. Thus, the selectors 358 and 359 selectively outputs the SEM/MD data in response to the selection control signal when operating the electron beam exposure system in the SEM/MD mode, while in the normal exposure mode, the selectors 358 and 359 selectively supply the serial dot pattern data from the phase correction circuits 356 and 357 to the BAA mask 110.

It should be noted that the output circuit 325 of FIG. 6 supplies the refocus data supplied thereto via the selector 324 to the electron lens 109 in synchronization to the dot data from the output circuits $312_{1a}$–$312_{52a}$, . . . , $312_{1f}$–$312_{52j}$ for controlling the intensity of the electron lens 109.

Next, the operation of the exposure controller 330 will be described with reference to FIGS. 9A–9C.

Figures 9A, 9B, 9C:
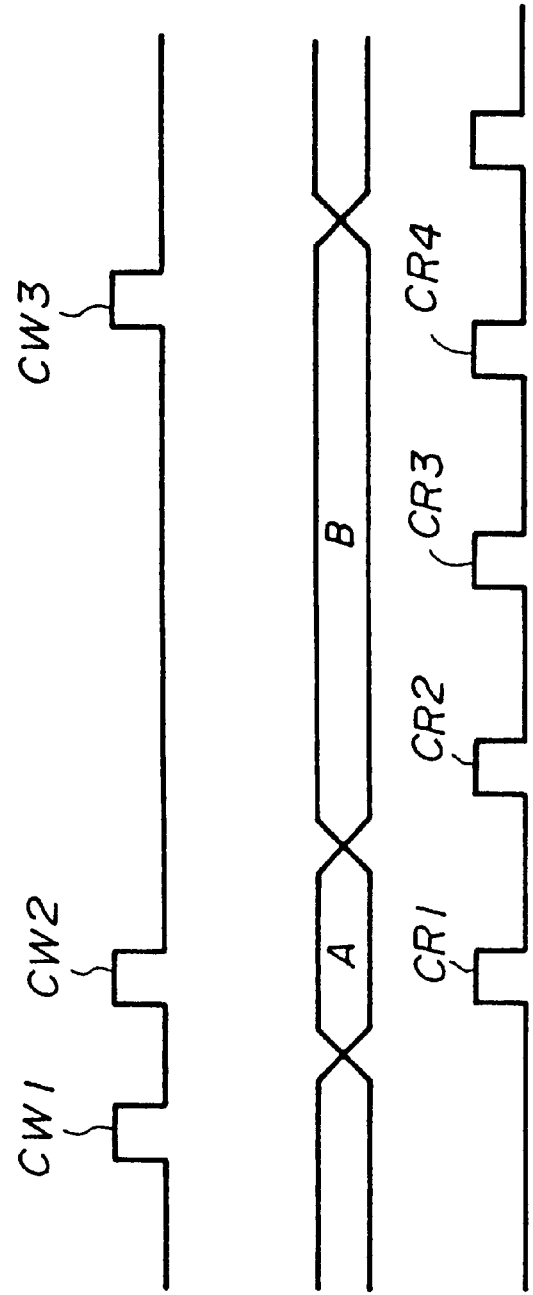
FIGS. 9A–9C show another timing charts for explaining the operation of the BAA exposure system of the first embodiment.

Referring to FIG. 9A, the exposure controller 330 reads the dot pattern A shown in FIG. 9B from a memory such as the memory $310A_{1a}$, . . . by issuing a read control signal CW1 shown in FIG. 9A and transfers the dot pattern data A thus read out to the parallel-to-serial conversion unit 350 of a corresponding parallel-to-serial converter such as $312_{1a}$ by issuing a transfer control signal $CR_1$ shown in FIG. 9C. Similarly, the dot pattern data B shown in FIG. 9B is subsequently read out from a different memory such as the memory $310B_{1a}$ in response to the read control signal $CW_2$ shown in FIG. 9A, wherein the exposure controller 330 causes a transfer of the data B thus read out to the parallel-to-serial conversion unit 350 of the corresponding parallel-to-serial converter by issuing a transfer control signal $CR_2$.

In the event the same dot pattern data B is used repeatedly in the exposure, it should be noted that the exposure controller 330 issues the transfer control signals $CR_2$–$CR_4$ without issuing the read control signal. Thereby, the same dot pattern data held in the memory $310B_{2a}$, . . . are repeatedly transferred to the corresponding parallel-to-serial converts $312_{1a}$ . . . . As the same dot pattern data is used for such a repetitive exposure of dot patterns already held in the memories 310A or 310B, it should be noted the step for expanding the data in the hard disk drive such as the hard disk 309a for each exposure can be omitted. Here, the memories 310A and 310B includes the foregoing memories $310A_{1a}$–$310A_{52j}$ and $310B_{1a}$–$310B_{52j}$.

[second embodiment]

Next, a second embodiment of the present invention will be described.

In the conventional electron beam exposure systems that carry out variable beam shaping or block exposure, an example of which is described in the U.S. Pat. Nos. 5,173,582 or 5,194,741, the exposure and deflection of the electron beam are generally conducted repeatedly and alternately.

More specifically, the electron beam is deflected to a desired position on the substrate prior to the exposure or "shot," and various corrections such as beam position correction, focusing correction, aberration correction, and the like, are carried out for exposing a sharply defined pattern on the substrate. It should be noted that the calculation of such a correction has to be completed during the deflection process conducted before the electron beam is actually irradiated upon the substrate, wherein such a deflection process of the electron beam includes the setting of beam trajectory and cancellation of beam blanking, in addition to the energization of the deflectors. Once the deflection of the electron beam is thus completed, actual exposure of the electron beam is conducted force suitable duration, which is determined by the current density and the sensitivity of the electron beam resist on the substrate.

It should be noted that such an exposure is controlled in response to the exposure clock. In other words, the exposure clock is set so as to provide a desired exposure duration based upon the current density and the resist sensitivity. The exposure clock is generally produced by dividing a system clock with an optimum divisional ratio with respect to the current density and the resist sensitivity, while the same exposure clock is used also for driving the aberration correction systems or refocusing systems. It should be noted that the correction coils and deflectors are activated only when the exposure of a pattern in made on the wafer.

Figure 10:
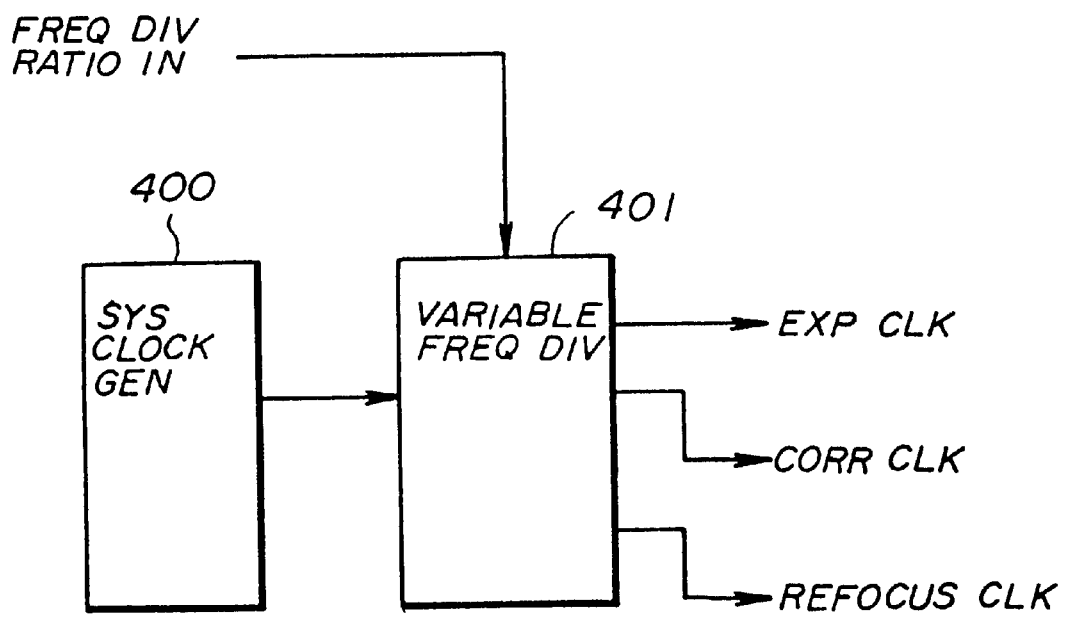
FIG. 10 is a diagram showing the construction of a clock generator used in a conventional BAA exposure system of FIG. 3.

FIG. 10 shows the block diagram of a conventional clock generator.

Figures 11A, 11B, 11C, 11D, 11E:
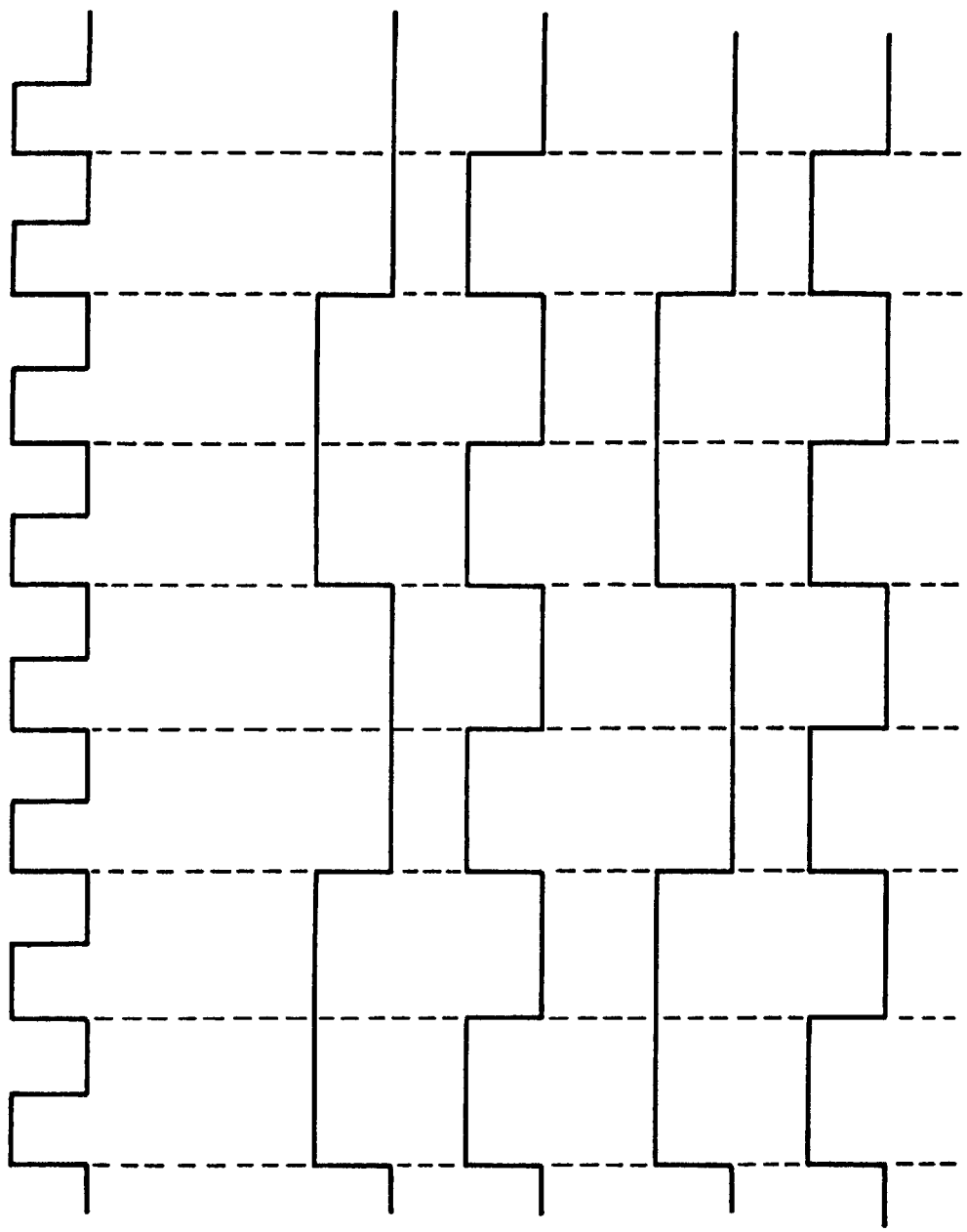
FIGS. 11A–11E are diagrams showing the clocks used in the conventional BAA exposure system of FIG. 3.

Referring to FIG. 10, a system clock, an example of which is shown in FIG. 11, is produced by a system clock generator 400 wherein the system clock thus produced is supplied to a frequency divider 401. The frequency divider 401, in turn, is supplied further with a control signal specifying the frequency divisional radio, which is determined based upon the current density of the electron beams and the sensitivity of the electron beam resist, and carries out a frequency-division of the foregoing system clock to produce various clocks such as the exposure clock, the correction clock, refocusing clock, and the like. For example, FIG. 11B shows the exposure clock obtained by dividing the system clock of FIG. 11A by four, while FIG. 11D shows a correction clock corresponding to the exposure clock of FIG. 11B. Similarly, FIG. 11C shows the exposure clock obtained by dividing the system clock of FIG. 11A by two, while FIG. 11 shows a correction clock corresponding to the exposure clock of FIG. 11C.

In the BAA exposure system of FIG. 3, on the other hand, the exposure and the deflection of the electron beam are conducted simultaneously. In such an exposure process, a high frequency is used for the exposure clock when each of the electron beam elements has a high current density or when a high sensitivity electron beam resist is used for reducing the dose. On the other hand, the frequency of the exposure clock is reduced when the current density of the electron beam element is low or the electron beam resist has a low sensitivity for increasing the dose.

When the exposure clock is changed in the conventional BAA exposure system in correspondence to the current density of the electron beam or the sensitivity of the electron beam resist, it will be noted that the correction clocks for the calculation of the beam position correction, focusing correction, aberration correction, and the like, have to be changed also. Associated therewith, there arises problems as will be explained below.

Figures 12A, 12B:
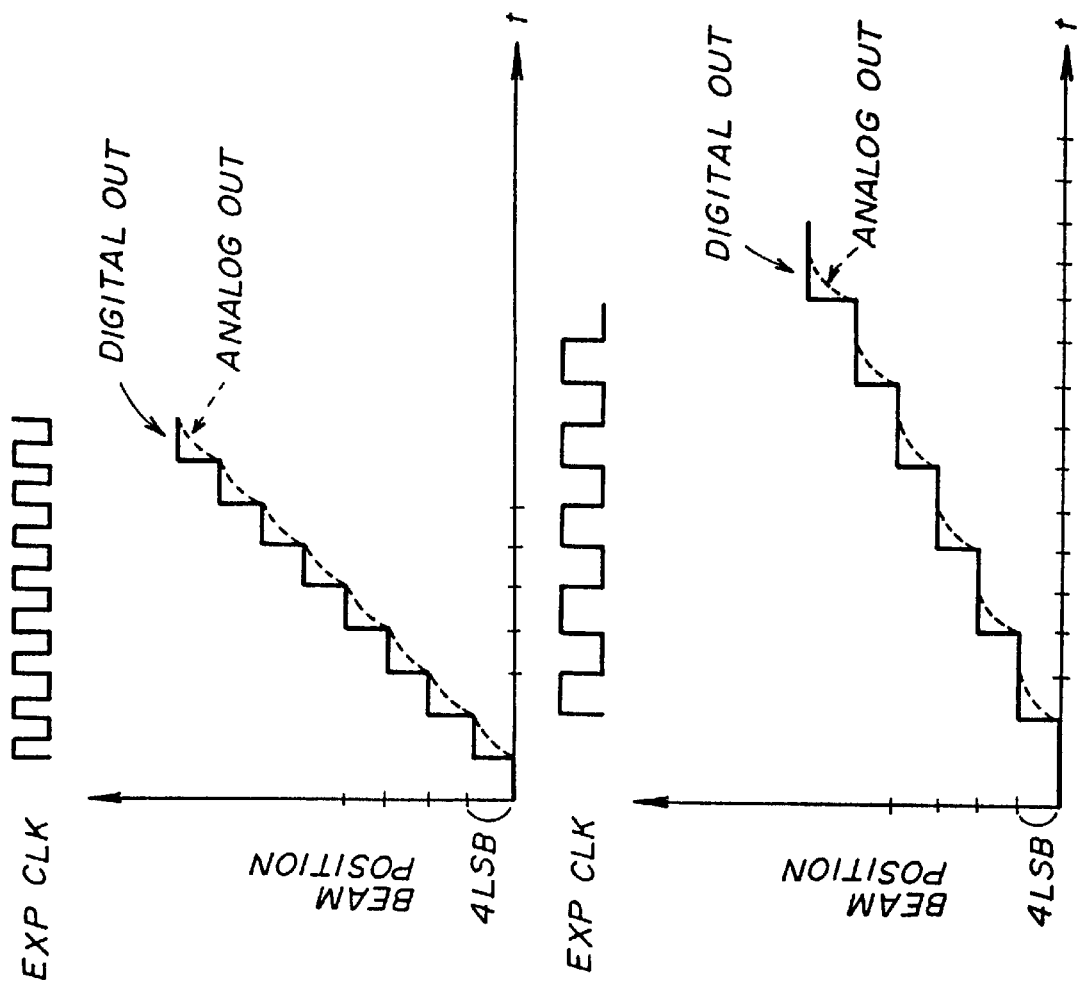
FIGS. 12A and 12B are diagrams showing the deflector output of the conventional BAA exposure system of FIG. 3.

FIG. 12A shows a digital output of a deflection control circuit corresponding to the sub-deflector control circuit 208 of FIG. 3, for the case wherein a high speed exposure clock of 400 MHz is used together with a beam correction calculated in response to a correction clock of the same frequency. In this case, it will be noted that the digital output of the deflection control circuit, which uses the deflection data subjected to the correction, changes with a substantial rate, and a D/A conversion unit cooperating with the deflection control circuit produces a generally linear analog output as indicated by a broken line. In response to the analog output thus produced, the electron beam is deflected and scans the surface of the substrate.

When the exposure clock is reduced to 200 MHz, on the other hand, the digital output of the deflection control circuit changes with much reduced rate as indicated in FIG. 12B, and the analog output of the cooperating D/A converter shows a conspicuous saturation as indicated by a broken line in FIG. 12B. With such a saturation in the analog output of the deflection control circuit, the analog output of the deflection control circuit does not reach the predetermined level and the electron beam can no longer hit the intended point on the substrate.

Accordingly, the object of the present embodiment is to provide a charged particle beam exposure system and method wherein a high precision exposure is guaranteed even when the setting for the current density of the electron beam or the sensitivity of the electron beam resist is changed.

More specifically, the present invention provides a method for exposing a pattern on an object by means of a charged particle beam, comprising the steps of:

shaping a charged particle beam into a plurality of charged particle beam elements forming collectively a charged particle beam bundle having a desired pattern in response to exposure data;

calculating a focusing error correction and an aberration correction to be applied upon said charged particle beam elements when exposing said desired pattern on said object, as a function of said exposure data, said step of calculation being conducted in response to a correction clock; and exposing said desired pattern upon said object by radiating said charged particle beam bundle upon said object;

said step of exposing comprising the steps of:

setting an exposure clock speed based upon a sensitivity of an electron beam resist provided on said object and a current density of said charged particle beam elements; and emitting said charged particle beam elements forming said charged particle beam bundle upon said object in response to said exposure clock, with said focusing error correction and said aberration correction;

wherein said correction clock is held in the vicinity of a predetermined clock speed when changing a clock speed of said exposure clock in said step of setting the exposure clock speed.

Further, the present invention provides a charged particle beam exposure system for exposing a desired pattern on an object, comprising:

a charged particle beam source for producing a charged particle beam and emitting the same along a predetermined optical axis;

beam shaping means provided on said optical axis so as to interrupt said charged particle beam, said beam shaping means carrying thereon a plurality of apertures for shaping said charged particle beam into a plurality of charged particle beam elements collectively forming a charged particle bundle, each of said apertures carrying switching means for selectively turning off said charged particle beam element in response to exposure data;

beam focusing means for focusing each of said charged particle beam elements forming said charged particle beam bundle upon said object;

deflection means for deflecting said charged particle beam elements collectively over a surface of said object in response to a deflection control signal supplied thereto;

deflection control means supplied with deflection data for producing said deflection control signal;

beam correction means for calculating a correction to be applied to said electron beam element as a function of said exposure data, said beam correction calculation means carrying out the calculation in response to a correction clock;

exposure control means for conducting an exposure of said charged particle elements in response to an exposure clock; and clock control means supplied with control data indicative of a current density of said charged particle beam elements and a sensitivity of said electron beam resist, for producing said exposure clock and said correction clock, such that said exposure clock has a clock speed determined as a function of said control data, said clock control means further holding said correction clock substantially constant irrespective of said exposure clock.

According to the invention of the present embodiment, one can guarantee a necessary exposure dose by changing the exposure clock as a function of the resist sensitivity and the current density. On the other hand, the analog signal supplied to the deflection means, which includes a main deflector and a sub-deflector, changes generally linearly with time, and the problem of the exposure beam failing to hit the desired point on the substrate is effectively eliminated.

Figure 13:
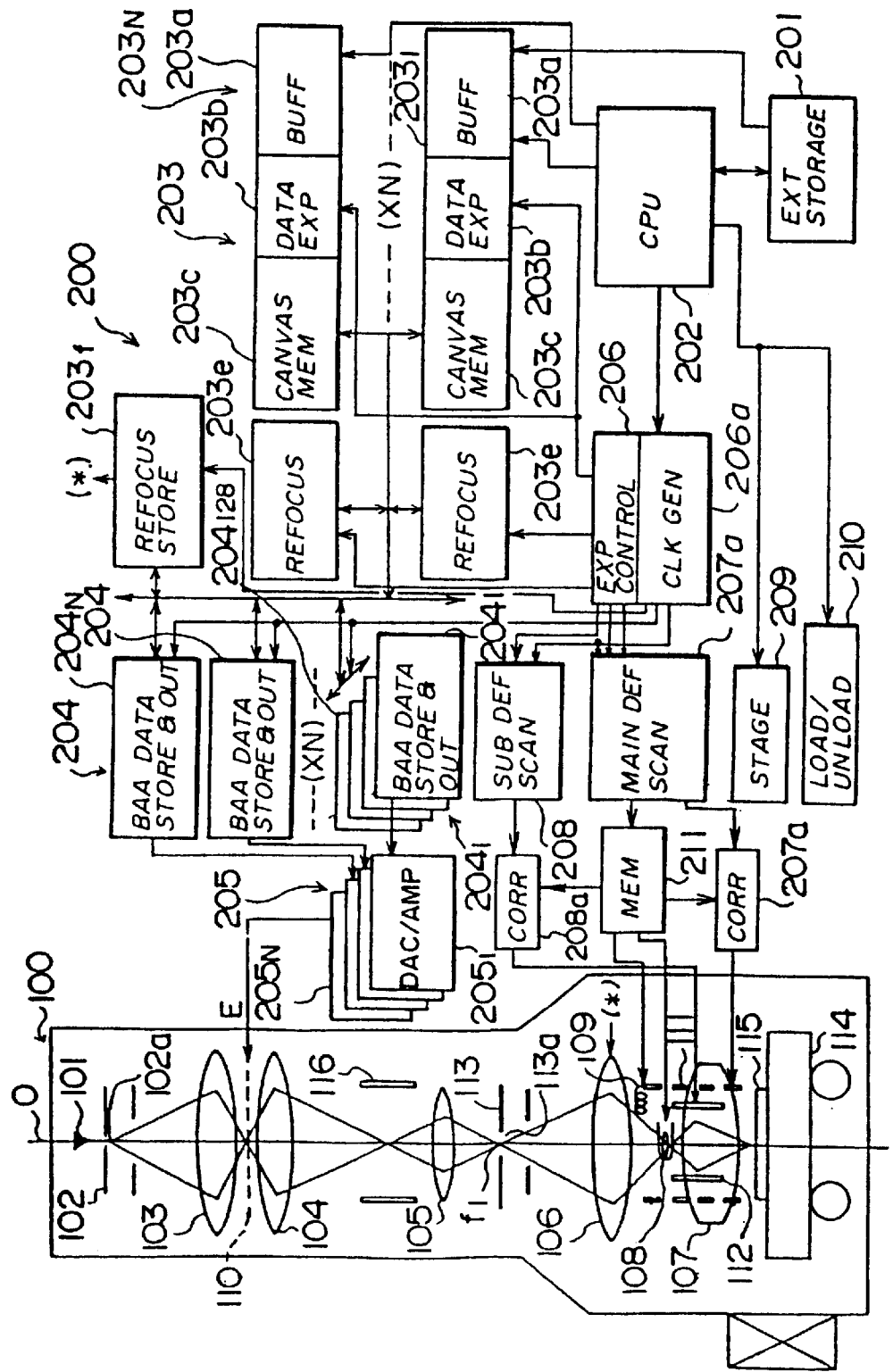
FIG. 13 is a block diagram showing the overall construction of the BAA exposure system according to a second embodiment of the present invention.

FIG. 13 shows the construction of the electron beam exposure system according to the present embodiment, wherein those parts corresponding to the parts described already are designated by the same reference numerals and the description thereof will be omitted.

Referring to FIG. 13, it will be noted that the exposure controller 206 includes a clock generator 206a, wherein the exposure controller 206 controls the clock generator 206a in response to the exposure condition such as the current density on the substrate 115 or the resist sensitivity from the CPU 206.

Figure 14:
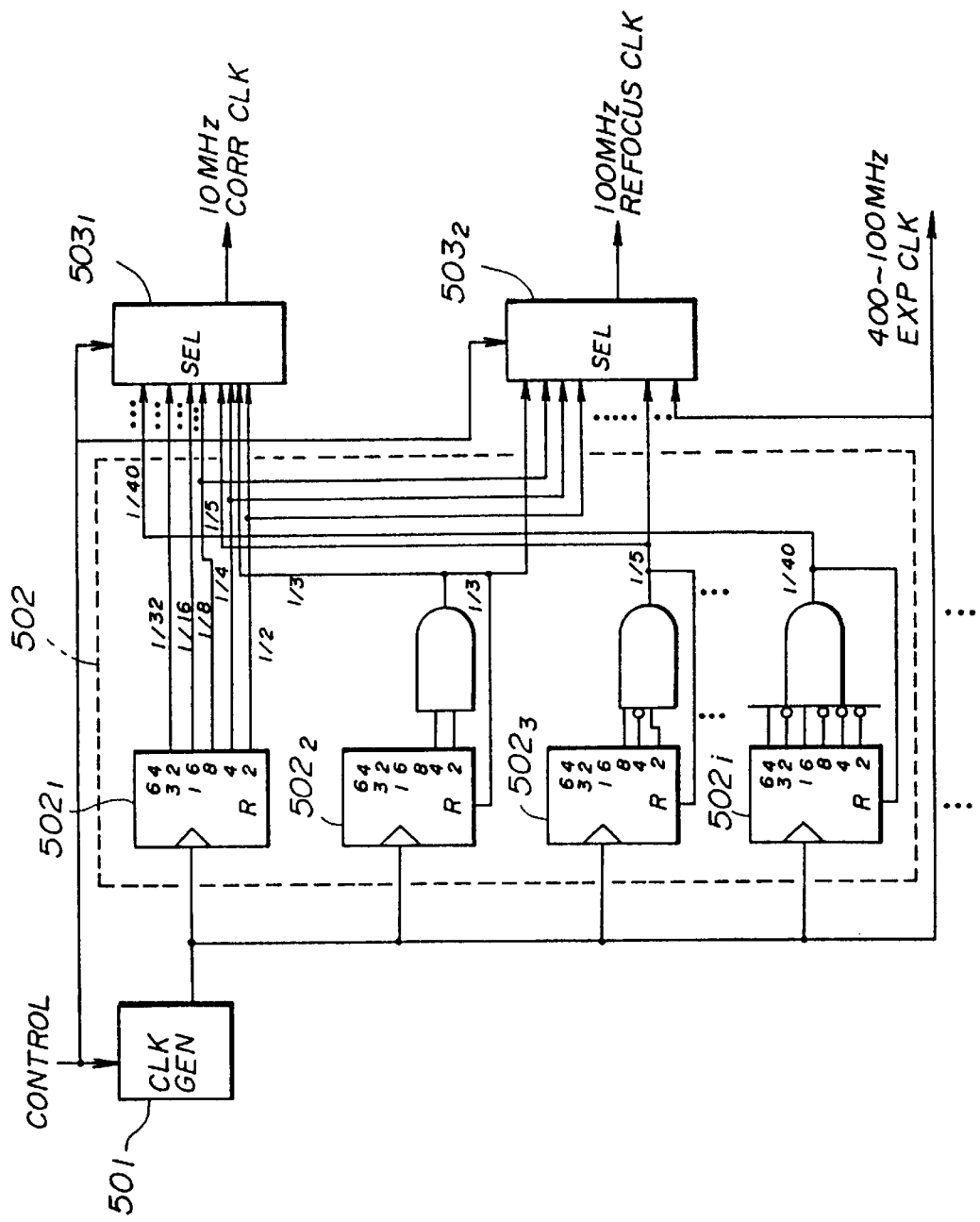
FIG. 14 is a block diagram showing the construction of a clock generator used in the BAA exposure system of FIG. 13.

FIG. 14 shows the construction of the clock generator 206a.

Referring to FIG. 14, the clock generator 206a includes a clock oscillator 501 and a frequency divider 502, wherein the clock oscillator 501 produces a system clock in the range of 400–500 MHz as an exposure clock in response to a control signal supplied from the exposure controller 206. Further, the clock oscillator 301 supplies the system clock thus produced to the foregoing frequency divider 502 as well as selectors $503_1$ and $503_2$.

It should be noted that the frequency divider 502 is formed of a counter $502_1$ as well as counters $502_2$–$502_i$, wherein each of the counters $502_2$–$502_i$ cooperates with an AND gate. Thereby, the counters $502_1$–$502_i$ divides the frequency of the system clock with various divisional ratios such as ½, ⅓, ¼, . . . and produces clocks of respective frequencies, wherein the counter $502_1$ divides the system clock with a ratio of ½, ¼, ⅛, 1/16, 1/32, . . . , while the counter $502_2$ cooperating with an AND gate divides the system clock with a ratio of ⅓. Similarly, the counter $502_3$ cooperating with an AND gate divides the system clock with a ratio of ⅕, and so on.

The clocks thus produced as a result of the division of the system clock are supplied to the selector $503_1$ as well as to the selector $503_2$, wherein each of the selectors $503_1$ and $503_2$ is supplied with a control signal from the exposure controller 206. Thereby, the selector $501_1$ selects one of the clocks supplied thereto such that the selected clock has a frequency of about 10 MHz. Thus, the selector $501_1$ selects a clock divided by a ratio of 1/40 when the system clock produced by the oscillator 501 has a frequency of 400±5 MHz, while the selector $501_1$ selects a clock divided by a ratio of 1/39 when the system clock has a frequency of 390±5 MHz. Similarly, when the system clock has a frequency of 100±5 MHz, the selector $501_1$ selects a clock divided by a ratio of 1/10. When the system clock has a frequency of 50±5 MHz, the selector $501_1$ selects a clock divided by a ratio of ⅕. In any case, the selector $501_1$ produces a clock signal having a frequency of approximately 10 MHz, wherein the clock signal thus obtained is supplied to the main deflector control circuit 207 and the sub-deflector control circuit 208 of FIG. 13 as a correction clock of substantially constant frequency.

The selector $503_2$, on the other hand, selects a clock signal of the frequency in the range of 100–50 MHz by dividing the system clock of the frequency of 400–200 MHz by a ratio of ¼. When the system clock has a frequency of 200–100 MHz, the selector $503_2$ selects a clock signal of the frequency in the range of 100–50 MHz by dividing the system clock by a ratio of ½. Further, when the system clock is set below 100 MHz, the selector $503_2$ outputs the system clock directly, without dividing the frequency. The output of the selector $503_2$ is thereby used as a refocus correction clock and stored in the data memory 203f of FIG. 13.

Figure 15:
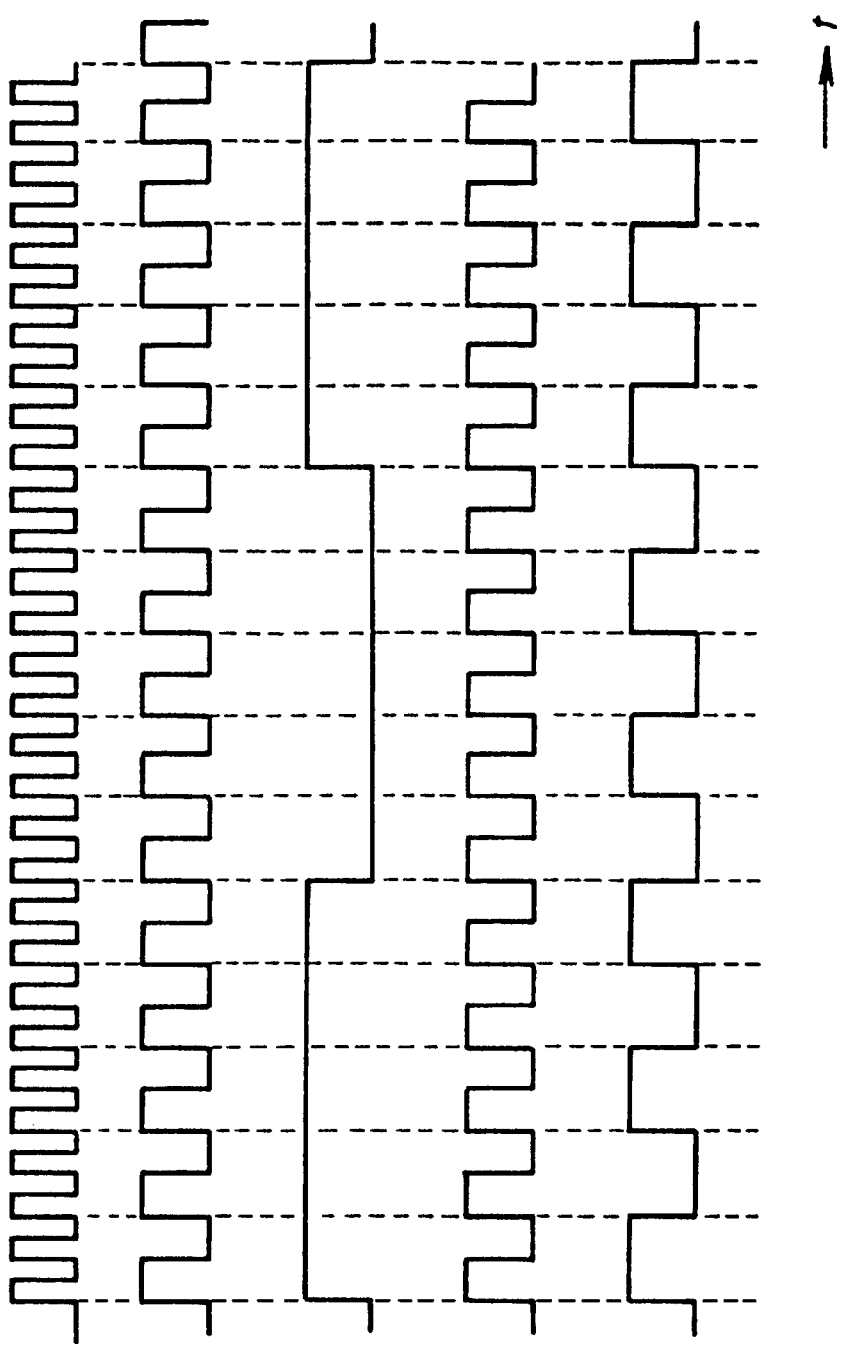
FIGS. 15A–15E are diagrams showing various clocks including the exposure clock and correction clock used in the BAA exposure system of FIG. 13.

In the construction set forth above, the correction clock maintains a substantially constant frequency even when the system clock and hence the exposure clock is changed in correspondence to the current density and the resist sensitivity as indicated in FIGS. 15A and 15B, wherein FIG. 15A shows a system clock of 200 MHz while FIG. 15B shows a system clock of 100 MHz. It should be noted that the correction clock obtained from the selector 503 maintains a constant frequency as indicated in FIG. 15C, even when the system clock has changed from the one shown in FIG. 15A to the one shown in FIG. 15B, while the correction clock obtained from the selector $503_2$ changes from the one shown in FIG. 15D to the one shown in FIG. 15E, wherein the clock of FIG. 15D has a frequency of 100 MHz while the clock of FIG. 15E has a frequency of 50 MHZ. Thus, it will be noted that the selector $503_1$ produces a correction clock with a substantially constant frequency, while the selector $503_2$ produces a correction clock with a semi-fixed frequency.

In the exposure system of FIG. 13, the shoot memory 204 supplies the blanking data to the cooperating D/A converter 205 in response to the exposure clock. Further, the main deflector control circuit 207 and the sub-deflector control circuit 208 calculates the main deflection data and the sub-deflection data in synchronization to the foregoing correction clock of 10 MHz based upon the exposure data supplied thereto, wherein the main deflection data and the sub-deflection data are converted to respective analog signals by corresponding D/A converters. As the correction clock has a fixed frequency of about 10 MHz, it will be noted that the correction in the correction circuits 207a and 208a is carried out with a proper timing.

Figure 16:
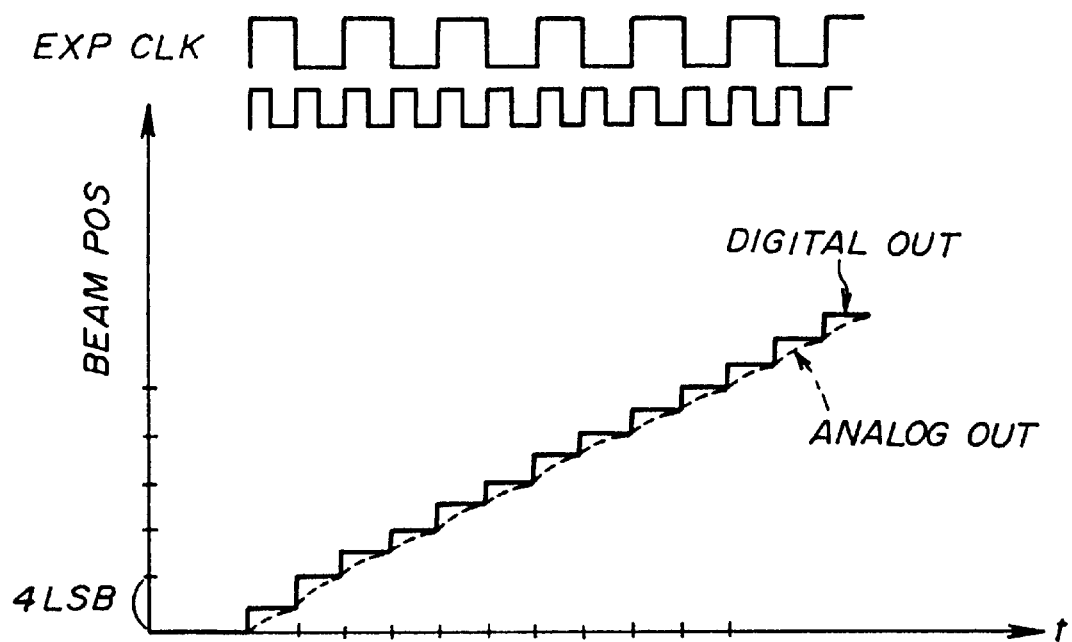
FIG. 16 is a diagram showing the deflector output of the BAA exposure system of FIG. 13.

As the correction clock is fixed to the frequency of approximately 10 MHz irrespective of the exposure clock, it should be noted that the digital output of the deflector control circuits changes generally linearly as indicated in FIG. 16 by a continuous line, and the corresponding analog output changes generally linearly as indicated in FIG. 16 by a broken line. In other words, the beam position changes generally linearly with time, and one can hit the desired point on the substrate 115 by a focused electron beam with high precision.

On the other hand, the refocus data memory 203f is supplied with the refocus clock of the foregoing semi-fixed frequency of 100 MHz and reads out the refocus control data therefrom in synchronization with the refocus clock, wherein the refocus control data thus read out is used to drive the electron lens 106. As the refocus control is conducted such that the amount of correction increases with the current density and hence the number of turned-on apertures on the BAA mask 110, such a refocus control, in principle, has to be conducted in synchronization with the exposure clock. On the other hand, increase of the refocus correction clock Above 100 MHz does not result in the desired correction effect, as the electron lens 106, having a relatively slow response, cannot follow the high frequency correction clock. As the number of the turned-on apertures on the BAA mask 110 does not change substantially within several periods of the exposure clock, the use of the correction clock of 100 MHz does not cause any serious problem in the refocus control. As already noted, the refocus clock, derived by the frequency division of the system clock and hence the exposure clock, is synchronized with the exposure clock, and is advantageously used for the desired refocus control.

In the event the exposure clock frequency is reduced below 10 MHz, the exposure clock produced by the clock generator 501 may be supplied directly to the selector $501_1$ in addition to the frequency-divided clocks such that the selector $501_1$ selects one of the clocks supplied thereto including the system clock itself.

[third embodiment]

Next, a third embodiment of the present invention will be described.

In the BAA exposure system described heretofore, it will be noted that the electron beam produced by the electron gun 101 and shaped by the aperture 102a has to cover a substantial area on the BAA mask 110 with a uniform intensity of beam radiation.

It should be noted that the BAA mask 110 is formed such that the apertures thereon have a size of 25 $\mu$m for each edge, wherein the size of the apertures is determined in view of the damage to the substrate of the BAA mask by the electron beam and the easiness for the formation of conductor patterns thereon. Thus, a BAA mask including thereon 128×8 apertures arranged in staggered row and column formation, inevitably has a size of 3200 $\mu$m (=35 $\mu$m×128) in the column direction, while this size is substantially larger than the size of the aperture used in the conventional variable-shaped beam exposure systems. Thus, the BAA exposure system is required to have a capability of illuminating a wide area of the beam shaping mask or BAA mask as compared with the conventional electron beam exposure systems.

In order to achieve such a uniform illumination of the BAA mask by the electron beam over an extended area, it is necessary to improve the electron gun as well as the electron optical system. Further, efforts have been made to optimize the pixel size of the BAA mask.

As a result of such efforts including the improvement in the tip shape of the electron gun, substantial improvement has been achieved with respect to the coverage area of the electron beam over the BAA mask, while the uniformity of the beam radiation intensity is still insufficient. Currently, the beam intensity decreases in the marginal area of the BAA mask by a factor of 20% as compared with the central area of the BAA mask. While this figure is a substantial improvement, the uniformity in the beam intensity is still insufficient as already noted. Because of the poor beam intensity distribution, the exposure dots formed on the substrate in correspondence to the marginal part of the BAA mask tend to have a reduced size due to the insufficient exposure dose or current density, and there is tendency that a band of exposure dots is formed on the substrate with a width of about 10 $\mu$m in correspondence to the foregoing size of the BAA mask demagnified by a factor of 1/300.

With the improvement of the electron optical system, it is now possible to cover an area on the BAA mask that is four times as large as the area conventionally covered by the electron beam, by increasing the magnification of the electron optical system that focuses the electron beam upon the BAA mask, while this is still insufficient in view of the area of the BAA mask that is twelve times as large as the area of the conventional beam shaping mask. While it is possible to increase the magnification further, excessive increase in the magnification raises a problem in that the magnification of the image at the round aperture on the blanking plate decreases inevitably and the turning on and turning off of the electron beam at the round aperture becomes incomplete.

Even when the variation in the electron current density is suppressed within 10% as a result of improvement of the electron gun and the electron optical system, the foregoing band of the exposure dots on the substrate persists.

In order to eliminate the foregoing problem of formation of the bands of exposure dots on the substrate, it is also possible to change the size of the individual apertures on the BAA mask such that the reduction in size of the exposure dots is compensated for. Thus, the apertures on the BAA mask is formed with an increased size at the marginal area thereof as compared with the central area. However, such a compensation tends to be lost when the electron gun is replaced or the electron column is subjected to maintenance.

Accordingly, the present embodiment addresses the foregoing problems and provides a charged particle beam exposure system and method that is capable of exposing an object by charged particle beams produced by a BAA mask with a uniform electron beam intensity irrespective of the location of the apertures on the BAA mask that are used for shaping the electron beams.

More specifically, the present embodiment provides a method for exposing a pattern on an object, comprising the steps of:

shaping a charged particle beam into a plurality of charged particle beam elements forming collectively a charged particle beam bundle having a desired pattern in response to exposure data;

exposing a desired pattern upon said object by radiating said charged particle beam bundle upon said object;

said step of beam shaping comprising the steps of:

activating a plurality or apertures provided on a beam shaping mask for shaping said charged particle beam, such that a predetermined number of said apertures are activated each time as a unit, each of said apertures including a deflector for deflecting a charged particle beam element passing therethrough in response to an activation or said aperture, said predetermined number of apertures thereby producing a plurality of charged particle beam elements equal in number to said predetermined number; and detecting the intensity of said predetermined number of charged particle beam elements on said object;

said step of activating said plurality of apertures being conducted such that the intensity of said charged beam elements produced as a unit, is equal to the intensity of said charged particle beam elements of other units, by optimizing an energization of said deflectors on said predetermined number of apertures.

The present embodiment further provides a charged particle beam exposure system for exposing a pattern on an object, comprising:

a charged particle beam source for producing a charged particle beam and emitting the same along a predetermined optical axis;

beam shaping means provided on said optical axis so as to interrupt said charged particle beam, said beam shaping means carrying thereon a plurality of apertures for shaping said charged particle beam into a plurality of charged particle beam elements collectively forming a charged particle bundle;

switching means for selectively turning off said charged particle beam element in response to a control signal;

driving means for driving said switching means on said beam shaping means by supplying thereto said control signal in response to exposure data;

beam focusing means for focusing each of said charged particle beam elements forming said charged particle beam bundle upon said object;

detection means for detecting the intensity of said charged particle beam elements on said object;

correction means for controlling said driving means such that said driving means supplies said control signal to said switching means with an offset added thereto, said correction means evaluating said offset in response to the intensity of said charged particle beam elements detected by said detection means, such that a group of charged particle beam elements including a predetermined number of charged particle beam elements therein has an intensity that is substantially identical to the intensity of other charged particle beam elements forming other groups, each of said other groups including said charged particle beam elements in number identical to said predetermined number.

According to the present invention as set forth above, the intensity of the charged particle beam elements is detected for each unit or group including a predetermined number of charged particle beam elements, wherein the intensity of the charged particle beam elements is adjusted for each unit in response to the detected beam intensity on the object, by adjusting the energization of the switching means or deflectors cooperating with each of the apertures, such that the beam intensity is substantially uniform over the entire surface of the object. Thereby, the problem of the exposure dots shaped by the apertures on the marginal area of the BAA mask is substantially eliminated, and a high precision exposure becomes possible.

Figure 17:
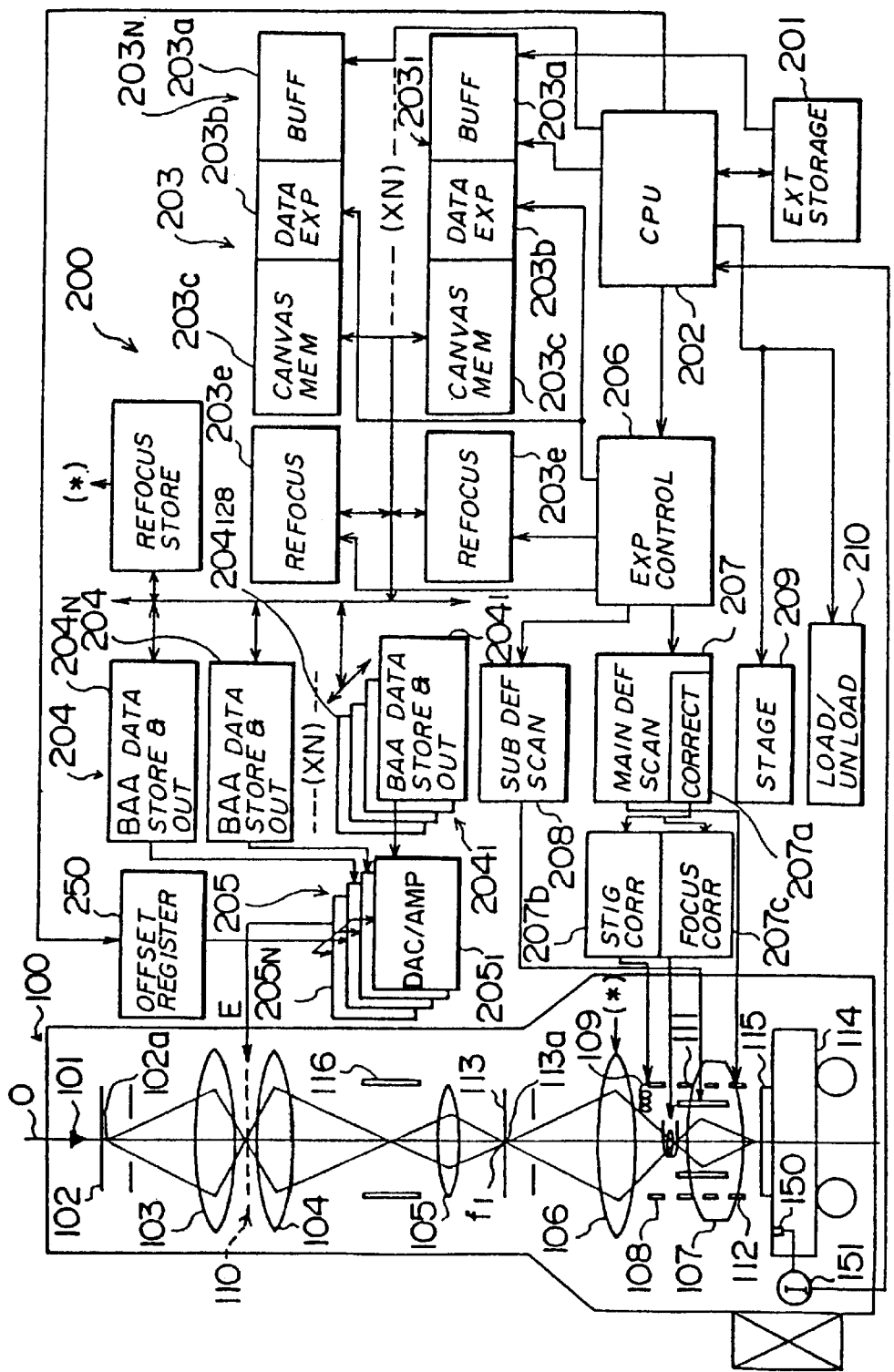
FIG. 17 is a diagram showing the overall construction of the BAA exposure system according to a third embodiment of the present invention.

FIG. 17 shows the overall construction of the electron beam exposure system according to the present embodiment, wherein those parts identically constructed to the parts described previously are designated by the same reference numerals.

Referring to FIG. 17, it will be noted that the exposure system includes a current detector 151 for detecting the substrate current produced as a result of irradiation of the electron beams, wherein the detector 151 is connected to a Faraday cup 150 provided on the stage 114 and produces an output indicative of the electron beam current. The output of the current detector 151 is supplied to the CPU 202. Further, there is provided an offset register 250 controlled by the CPU 202, wherein the register 250 stores offset control data provided by the CPU 202 for each of the apertures on the BAA mask 110 in response to the output of the current detector 151. Thereby, the offset register 250 controls the D/A converter 205 such that the analog output of the D/A converter 205 is offset by an amount corresponding to the offset control data.

In operation, the Faraday cup 150 is aligned to the optical axis 0 of the electron optical system 100 and the apertures on the BAA mask are turned on one by one, while monitoring for the electron beam current produced by the electron beam captured in Faraday cup 150 by means of the current detector 151. Thereby, it will be noted that the electron beam current for each aperture on the BAA mask 110 is obtained.

Figure 18:
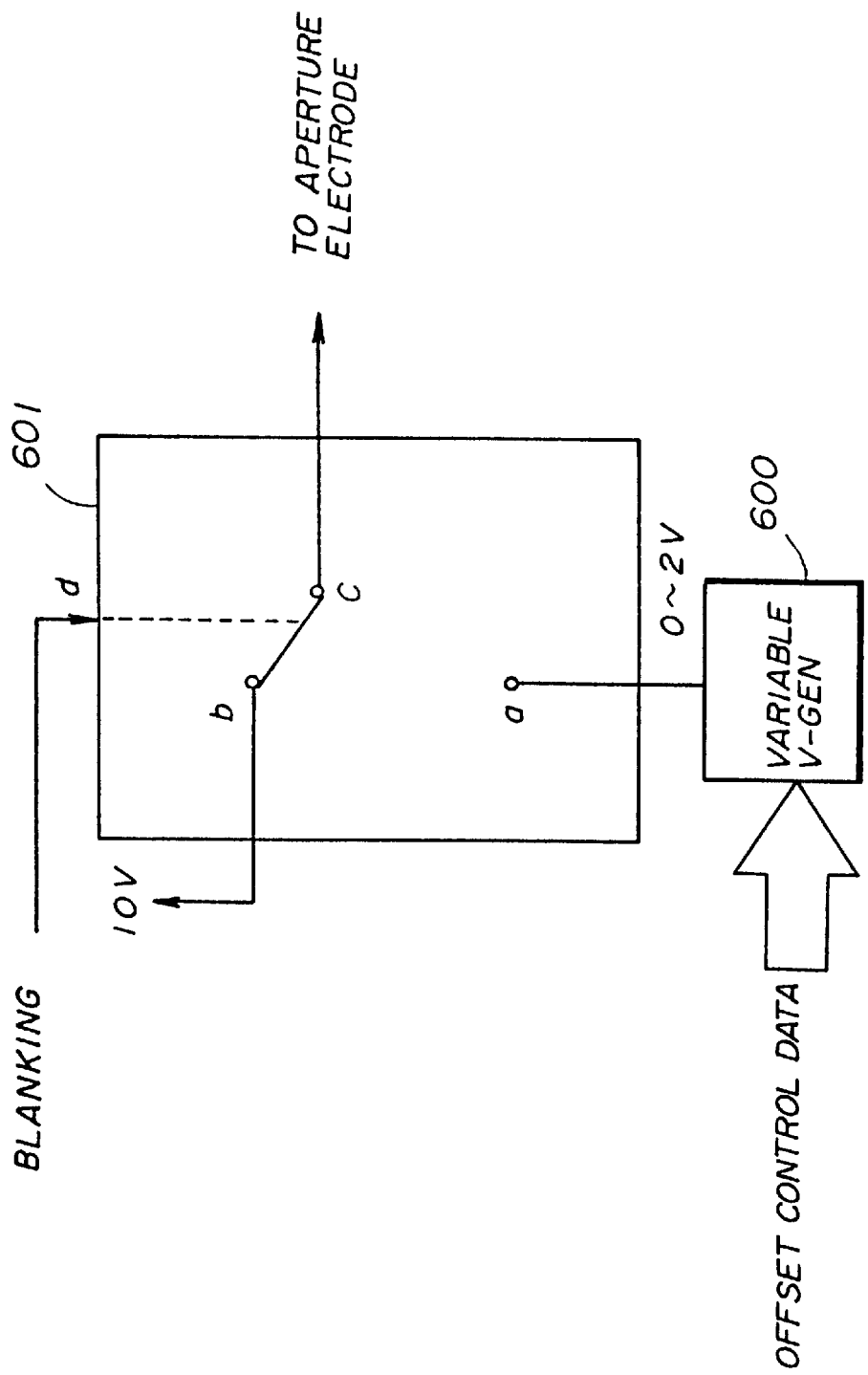
FIG. 18 is a diagram showing the construction of a D/A converter used in the BAA exposure system of FIG. 17.

FIG. 18 shows the construction of a D/A converter unit included in the D/A converter 205 for driving a BAA aperture in the form of a block diagram.

Referring to FIG. 17, the D/A converter unit includes a variable voltage generator 600 to which the offset control data is supplied from the offset register 250 typically in the form of four bit data, wherein the voltage generator 600 selectively produces one of sixteen level offset voltages in response to the foregoing four bit offset control data and supplies the offset voltage to a terminal A of a switch 601. Typically, the output voltage of the voltage generator 600 falls in the range between 0–2 volts.

The switch 601 further includes a terminal b to which a constant voltage of 10 volts is supplied. Further, the switch 601 includes a control terminal d to which the blanking data of one bit is supplied from the shoot memory 204. Thereby, the switch 601 connects the terminals a and c when the content of the blanking data is "1," and the output voltage of the variable voltage generator 600 is supplied to the aperture electrode 121 on the BAA mask 110. On the other hand, the foregoing voltage of 10 volts on the terminal b is supplied to the aperture electrode 121 when the content of the blanking data is "0." Thereby, the electron beam element produced by the aperture is turned off.

Figure 19:
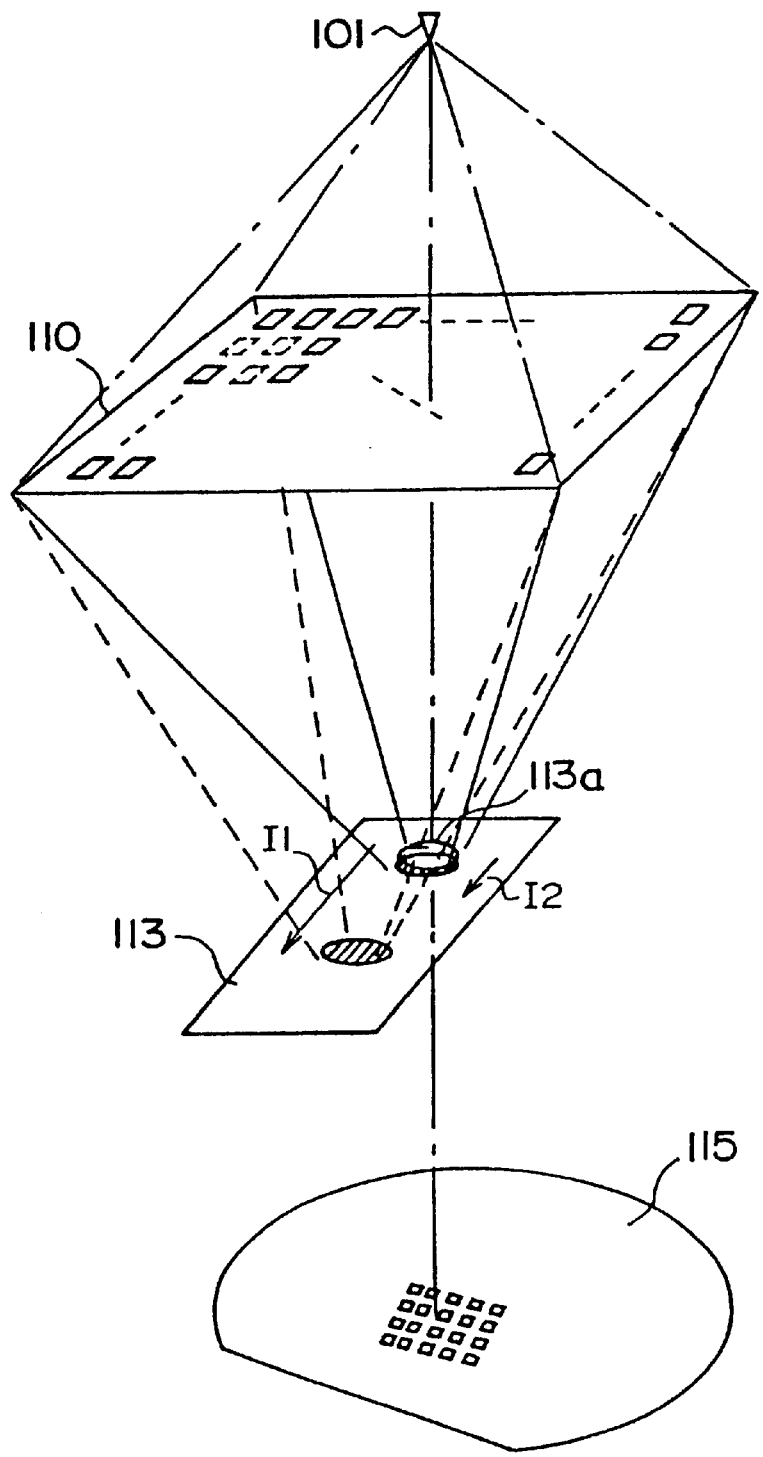
FIG. 19 is a diagram showing the principle of the third embodiment.

FIG. 19 shows the shaping and focusing of the electron beam elements produced by the BAA mask 110.

Referring to FIG. 19, the electron beam produced by the electron gun 101 is shaped by the BAA mask 110 as already described, and the electron beam elements produced as a result of the beam shaping are focused upon the focal point $f_1$ that corresponds to the blanking plate 113 that carries the round aperture 113a thereon. After passing through the round aperture 113a, the electron beam elements are focused upon the substrate 115 by the electron lenses 105–107 (see FIG. 17).

When the aperture electrode 121 on the BAA mask 110 is applied with the voltage of 10 volts, the electron beam element misses the round aperture 113a as indicated by an arrow $I_1$ and is interrupted by the blanking plate 113. Thereby, the electron beam element is turned off on the substrate 115.

In the case the voltage applied to the aperture electrode 121 is zero, on the other hand, the electron beam element passes straight through the round aperture 113a and reaches the surface of the substrate 115. On the other hand, when a voltage is applied to the aperture electrode 121 within the magnitude of about 2 volts, the electron bean element experiences an offset in the direction shown by an arrow $I_2$, and the electron beam element is partially interrupted by the round aperture 113a. Thereby, the intensity of the electron beam element arriving at the substrate 115 is diminished as a function of the offset voltage applied to the aperture electrode 121.

In the construction of FIG. 19, it should further be noted that the offset voltage is applied with a polarity such that the electron beam element shifts in the same direction as the arrow $I_1$ upon the application of the offset voltage as indicated by the arrow $I_2$. As a result, one can avoid the problem of transitional leakage of the electron beam to the substrate 115 when switching the electron beam element on and off.

Figure 20:
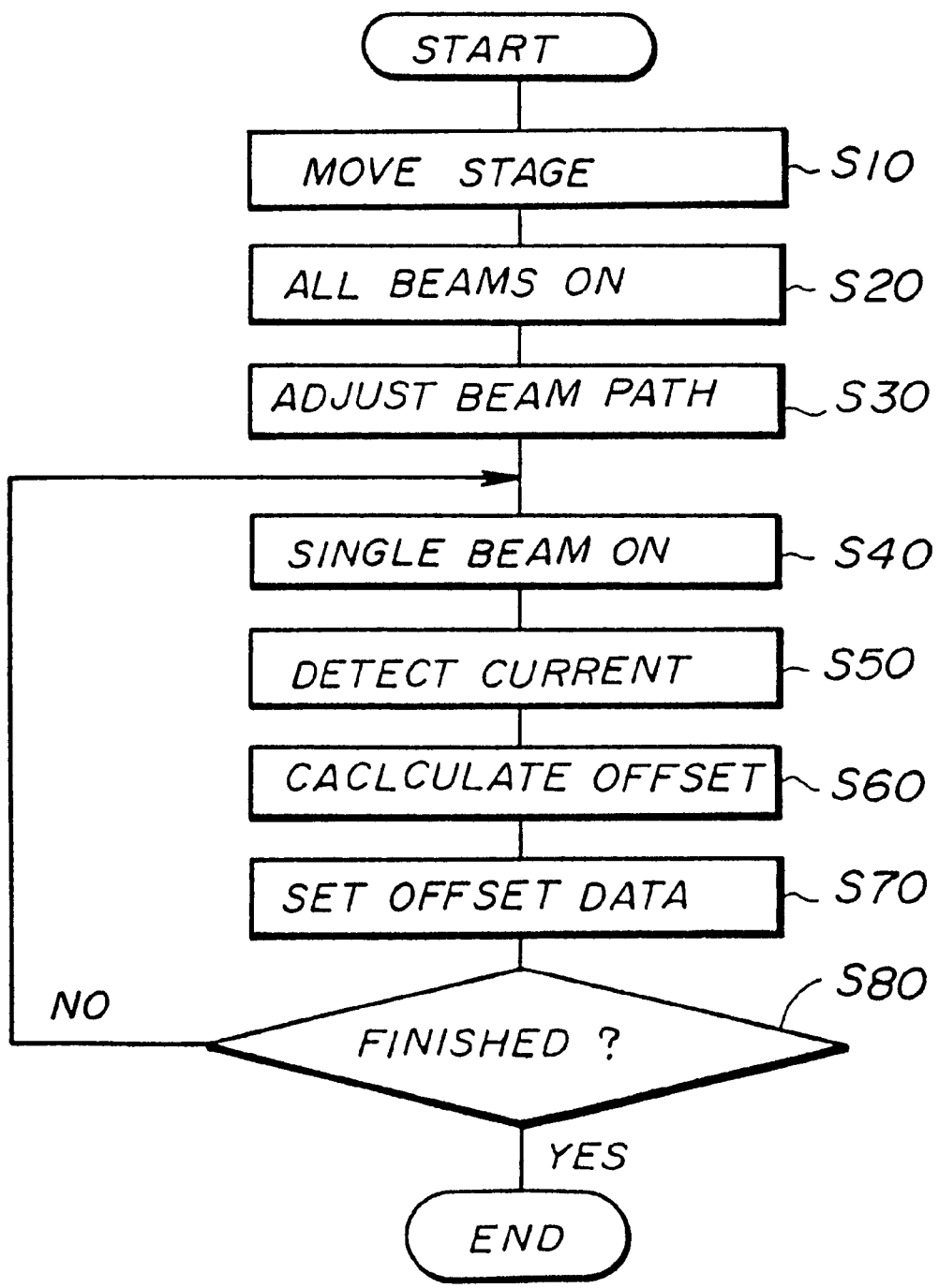
FIG. 20 is a block diagram showing the process of setting voltage offset in the BAA exposure system of FIG. 17.

FIG. 20 shows the flowchart for setting the amount of voltage offset to be applied to the aperture electrode 121. It should be noted that the process of FIG. 20 is typically conducted after a maintenance operation such as a replacement of the electron gun or periodical maintenance, under control of the CPU 202.

Referring to FIG. 20, a step 810 is conducted first, wherein the stage 114 is moved to a position in which the Faraday cup 150 is aligned with the optical axis O.

Next, in the step of S20, all the apertures on the BAA mask 110 are turned on, and a step S30 is carried out wherein the electron beam path is optimized such that the electron beam current detected by the detector 151 becomes maximum.

Figure 21:
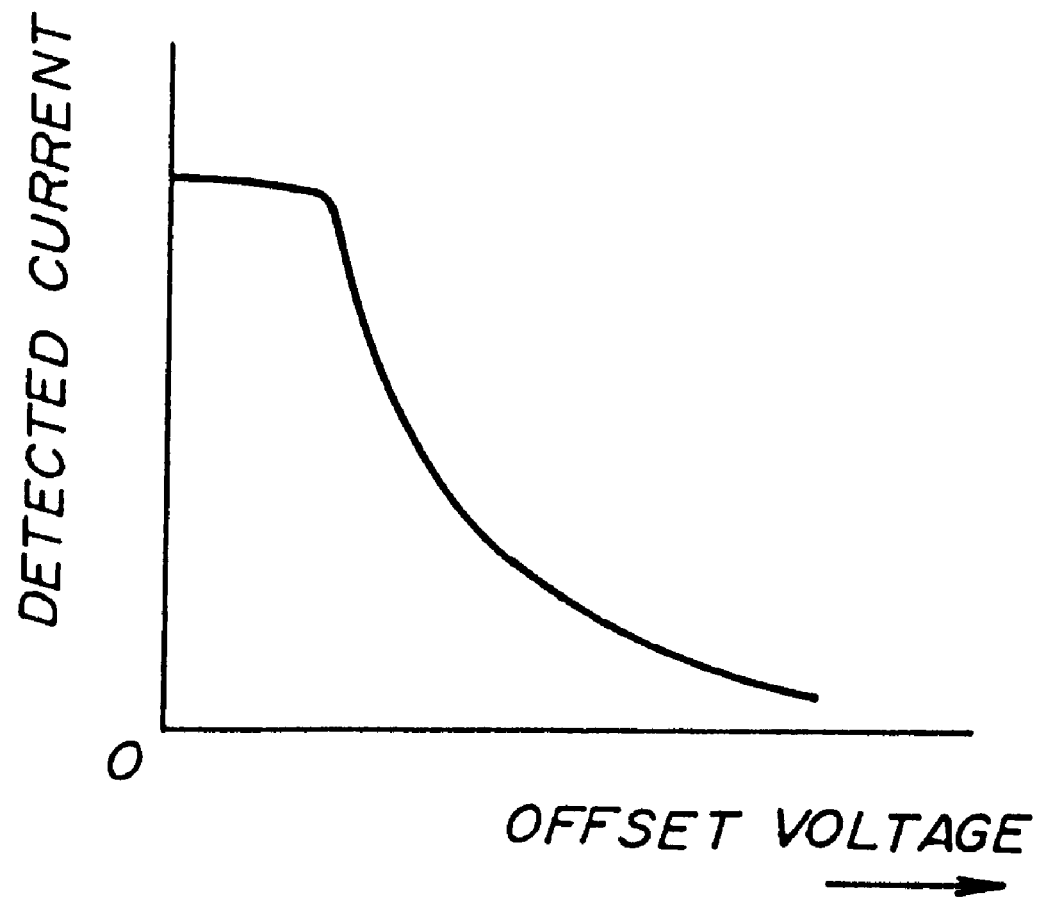
FIG. 21 is a diagram showing the relationship the detected current and the offset voltage used in the BAA exposure system of FIG. 17.

Next, in the step of S40, a predetermined number of the apertures on the BAA mask 110, which may also be a single aperture, are turned on, and the electron beam current for this state is detected in the step of S50. Further, a. step S60 is conducted wherein the CPU 202 obtains an offset voltage for the currently turned-on aperture by referencing to a map of FIG. 21 showing the relationship between the detection current and the voltage offset. Further, a step S70 is conducted wherein the offset control data corresponding to the offset voltage obtained in the step S70 is stored in a register forming a part of the register 250 and corresponding to the foregoing aperture currently turned on.

Next, in the step S80, a discrimination is made whether the setting of the offset voltage is complete for all of the 8×128 apertures, wherein if the result of discrimination is No, the process returns to the step S40 and the steps S40–S80 are repeated for the next aperture, until the setting of the offset control data is completed for all of the apertures.

FIG. 22A shows the BAA mask 110 while FIG. 22C shows the distribution profile of the electron beam for the aperture row $A_1$. As will be noted in FIG. 22C, the electron beam intensity decreases at the both end regions of the BAA mask 110 with respect to the X-direction. Associated with this, the detection current shows a pattern analogous to the curve shown in FIG. 22C.

FIG. 22D shows the offset voltage obtained from the map of FIG. 21, wherein the offset voltage is low ($\approx 0$ V) in the end regions of the BAA mask 110 in the X-direction and is high in the central region thereof (about 2 V). Thus, the offset control data is set for each of the apertures on the BAA mask 110 in the register 250 in accordance with the offset voltage of FIG. 22D. Thus, by applying the offset voltage of FIG. 22D to the electrodes of the apertures aligned on the BAA mask 110, one can compensate for the variation of the beam intensity profile on the substrate 115 as indicated in FIG. 22E. In FIG. 22E, it will be noted that the electron beam intensity is uniform in the X-direction.

It should be noted that a similar intensity distribution of the electron beam intensity in the X-direction appears not only in the aperture row $A_1$ but also in the aperture rows $A_2$, $B_1$, $B_2$, . . . . Further, such a distribution profile appears also in the Y-direction as indicated in FIG. 22B.

In the present embodiment, it will be noted the one can set the intensity of the electron beam elements arriving at the surface of the substrate 115 substantially uniform, by compensating for the intensity distribution profile by providing an intentional offset. Thereby, it is possible to carry out the exposure of desired pattern with high precision.

The process of FIG. 20 is also advantageous in the point that the electron optical system is adjusted in the step 30 for maximizing the detection current. This is particularly important, as the adjustment of the electron beam intensity is made so as to diminish the intensity of the strong electron beam elements by way of providing an offset on the BAA mask.

It should be noted that the present embodiment does not require any modification of the BAA mask 110 itself and does not bring any complexity in the fabrication of the BAA mask. Further, one can connect the ground electrodes 122 on the BAA mask commonly as indicated in FIG. 22A.

Of course, it is possible to provide the offset voltage to the ground electrodes 122 in the BAA mask 110 shown in FIG. 4 or FIG. 5, wherein the ground electrodes 122 are separated from each other. In this case, however, it is necessary to invert the polarity of the offset voltage such that the electron beam is offset in the direction $I_2$ that is the same beam deflection direction $I_1$ for turning off the electron beam element.

It should be noted that the distribution of the electron beam intensity in the Y-direction shown in FIG. 22B may not be compensated for, as the exposure of the dots is made on the substrate 115 repeatedly in the Y-direction. For example, a point on the substrate 115 may be exposed by an electron beam element formed by an aperture in the aperture row $A_1$, followed by an electron beam element formed by another aperture aligned in the Y-direction with respect to the foregoing aperture and included in the aperture row $B_2$. Similarly, the exposure in repeated in the Y-direction by the apertures in the aperture rows $C_1$ and $C_2$ not illustrated in FIG. 22A.

In such a multiple exposure process, it is obvious that the variation of the electron beam intensity in the Y-direction does not cause any substantial problem in the exposed dot pattern on the substrate 115, as long as the variation in the X-direction is successfully compensated for. This in turn means that one may repeatedly use the offset control data stored in the offset register 250 also for other aperture rows each extending in the X-direction and repeated in the Y-direction.

FIG. 23 shows the construction of the D/A converter 205 in the form of a block diagram.

Referring to FIG. 23, it will be noted that the D/A converter 205 includes variable voltage generators $600_1$, $600_2$, . . . each supplied with offset control data of four bits from the offset register 250, wherein each of the variable voltage generators produces an offset voltage signal that changes in 16 levels in response to the four bit data supplied thereto. Thereby, the offset voltage produced by the variable voltage generator $600_1$ is supplied to the switches 601A$a$ and 601B$a$ commonly, while the offset voltage produced by the variable voltage generator $600_2$ is supplied to the switches 601A$b$ and 601B$a$ commonly.

It will be noted that the switches 601A$a$, 601B$a$, . . . are connected to the drive electrode of respective apertures aligned on the BAA mask 110 in the Y-direction. Similarly, the switches 601A$b$, 601B$b$, . . . are connected to the drive electrode of respective apertures also aligned on the BAA mask 110 in the Y-direction. The switches 601A$a$, 601B$a$, 601A$b$, 601B$b$, . . . thereby produce an output voltage of 10 volts in response to the blanking data when turning off the electron beam element for the pertinent aperture, similarly to the switch 301 of FIG. 18. Further, the switches produce the offset voltage for causing the desired offset of the electron beam element on the aperture plate 113. Thereby, by supplying the same offset voltage to the switches such as the switches 601Aa, 601Ab, . . . aligned in the Y-direction, such that the apertures aligned in the Y-direction are supplied with the same offset voltage, it is possible to reduce the number of the variable voltage generators substantially.

In the construction of FIG. 23, it should further be noted that the same offset voltage may be applied to two or there apertures aligned in the X-direction, as it is expected that the offset voltage does not change substantially in two or three successive apertures aligned in the X-direction. Further, one may group the apertures on the BAA mask 110 into a number of groups each including a plurality of apertures aligned in the X- and Y-directions and to supply the offset voltage to each of such groups, such that the same offset voltage is applied to the apertures belonging to the same group.

Of course, the present embodiment may be used in combination with the construction of the BAA mask in which the size of the apertures is changed in the central area and in the marginal area of the mask.

[fourth embodiment]

Next, a fourth embodiment of the present invention will be described.

In the BAA exposure system and method described heretofore, it will be noted that the exposure data held in the external storage device such as a disk drive is transferred to the bit map memory or shoot memory at a high speed, wherein the bit map data of the exposure pattern is read out from the shoot memory for exposure also at a high speed, wherein the writing and reading of the shoot memory is conducted alternately or in parallel.

In the conventional BAA exposure system, however, the speed of data transfer from the external storage device to the shoot memory cannot be increased as desired and the process of data transfer is becoming a bottle neck of the high throughput exposure.

Thus, the present embodiment addresses the problem of improving the data transfer rate and hence the exposure throughput of the BAA exposure system by compressing the dot pattern data during the process of data transfer.

More specifically, the present embodiment provides a method for exposing a pattern on an object by means of a charged particle beam, comprising the steps of:

producing a plurality of charged particle beam elements in the form of dot pattern data, said plurality of charged particle beam elements being produced simultaneously as a result of shaping of a single charged particle beam by a mask, said mask carrying a plurality of beam shaping apertures arranged in rows and columns on a mask area;

focusing said plurality of charged particle beam elements upon an object; and scanning a surface of said object by means of said plurality of charged particle beam elements in a first direction;

said step of producing the plurality of charged particle beam elements includes the steps or:

dividing said dot pattern data into a plurality of data blocks each corresponding to a rectangular area on said beam shaping mask, said rectangular area having a size in a second direction perpendicular to said first direction such that said size is smaller than a size of said mask area in said second direction;

providing identification codes to said data blocks for discriminating said data blocks from each other, such that identical data blocks have an identical identification code;

storing said data blocks respectively in corresponding dot memories, together with said discrimination codes corresponding to said data blocks;

reading out said data blocks from said dot memories consecutively by specifying said identification codes consecutively; and shaping said single charged particle beam by said beam shaping mask into said plurality of beam shaping beam elements in response to said data blocks read out from said dot memories.

Further, the present embodiment provides a charged particle beam exposure system for exposing a pattern on an object, comprising:

beam source means for producing a charged particle beam and for emitting the same along an optical axis in the form of a charged particle beam toward an object;

beam shaping means disposed on said optical axis so as to interrupt said primary charged particle beam, said beam shaping means carrying on a mask area thereof a plurality of apertures each supplied with exposure dot data representing a dot pattern to be exposed on said object, said apertures thereby shaping said charged particle beam into a plurality of charged particle beam elements in response to said exposure dot data, said plurality of charged particle beam elements as a whole forming a charged particle beam bundle;

focusing means for focusing each of said charged particle beam elements in said charged particle beam bundle upon said object with a demagnification;

scanning means for scanning a surface of said object by said charged particle beam elements in a first direction;

a dot memory for storing dot pattern data for data blocks each corresponding to a group of exposure dots to be formed on a rectangular area on said object, said rectangular area having a size on said object, in a second direction perpendicular to said first direction, to be equal to or smaller than a size of said mask area projected upon said object and measured in said second direction;

a code memory for storing codes each specifying one of said data blocks;

block addressing means for addressing, based upon said codes read out from said code memory, said dot memories consecutively from a first address to a last address of a data block specified by said code; and code memory control means for reading said codes from said code memory consecutively in the order of exposure.

According to the present invention set forth above, the same exposure data is used repeatedly by specifying the codes. It should be noted that the same data block has the same code. Thereby, the amount of the dot pattern data is substantially reduced. It should be noted that such a reduction in the amount of data decreases the duration of data transfer, and the throughput of exposure is improved substantially.

Figure 24:
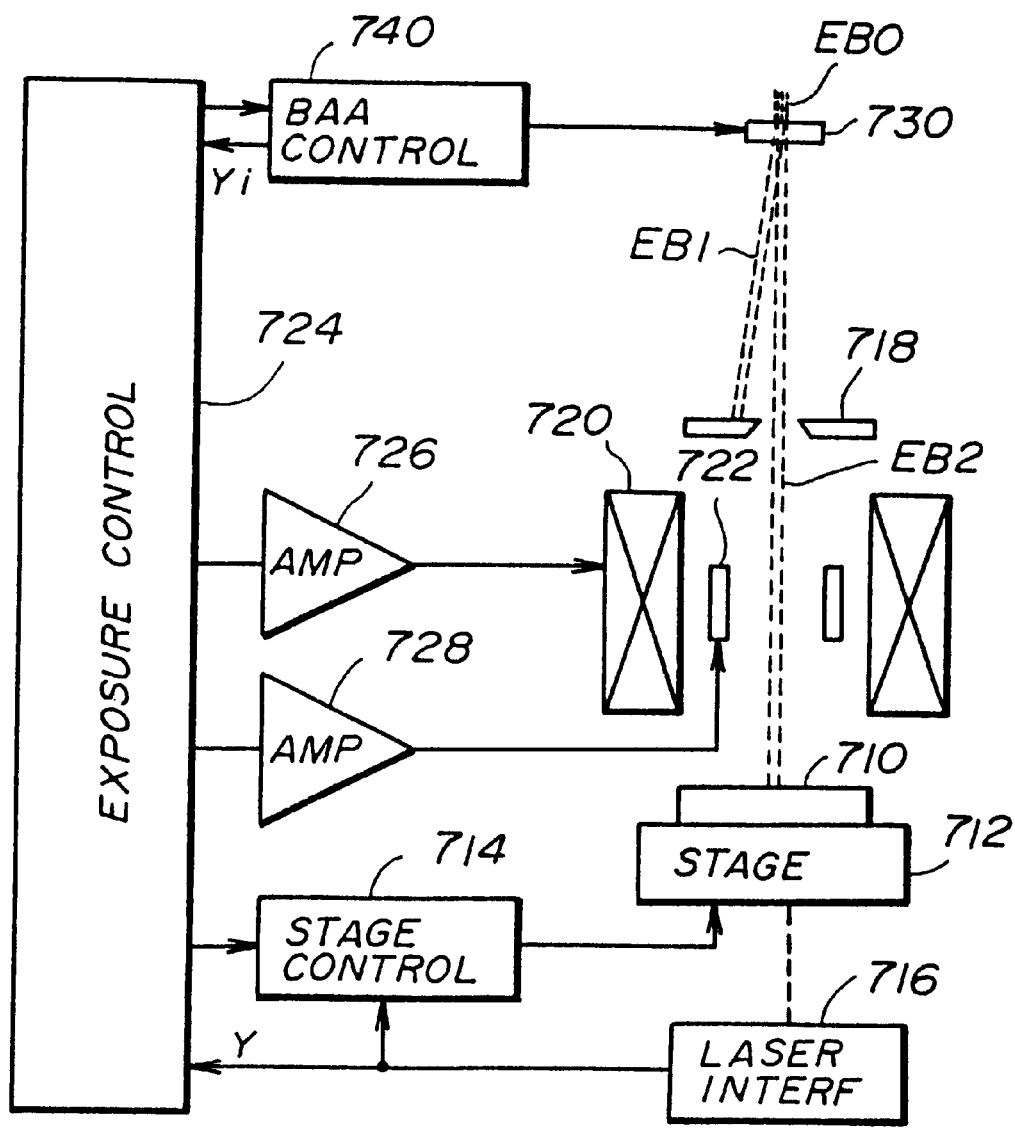
FIG. 24 is a block diagram showing the construction of a BAA exposure system according to a fourth embodiment of the present invention.

FIG. 24 shows the BAA exposure system according to the present embodiment.

Referring to FIG. 24, an electron beam EB0 produced by an electron gun is passed through a BAA mask 730 to form a plurality of electron beam elements collectively represented as an electron beam EB2. Similarly as before, the electron beam elements to be turned off are interrupted by a blanking plate 718 as indicated by a beam EB0 by experiencing a deflection at the BAA mask 730. Further, a substrate 710 to be exposed is held on a movable stage 712 that is moved under control of a stage control circuit 714, wherein the position of the stage 712 is detected by a laser interferometer 716 that feeds back the result of detection to the stage control circuit 714. The substrate 710 carries thereon a resist film on which the foregoing electron beam EB2 impinges after passing through a round aperture provided on the foregoing blanking plate 718.

The electron beam EB2 thus arrived at the substrate 710 is deflected by a magnetic main deflector 720 and an electrostatic sub-deflector disposed above the movable stage 712 while moving the substrate 710 by driving the movable stage 712, wherein the electron beam EB2 means over the surface of the substrate 710. It should be noted that the movable stage 712 provides the largest area of scanning while the speed of the scanting is smallest in the stage 712. On the other hand, the sub-deflector 722 provides the fastest scanning speed while the area that is covered by the sub-deflector 722 is the smallest. Further, main deflector 720 provides an intermediate scanning speed and intermediate area of scanning.

Figure 28:
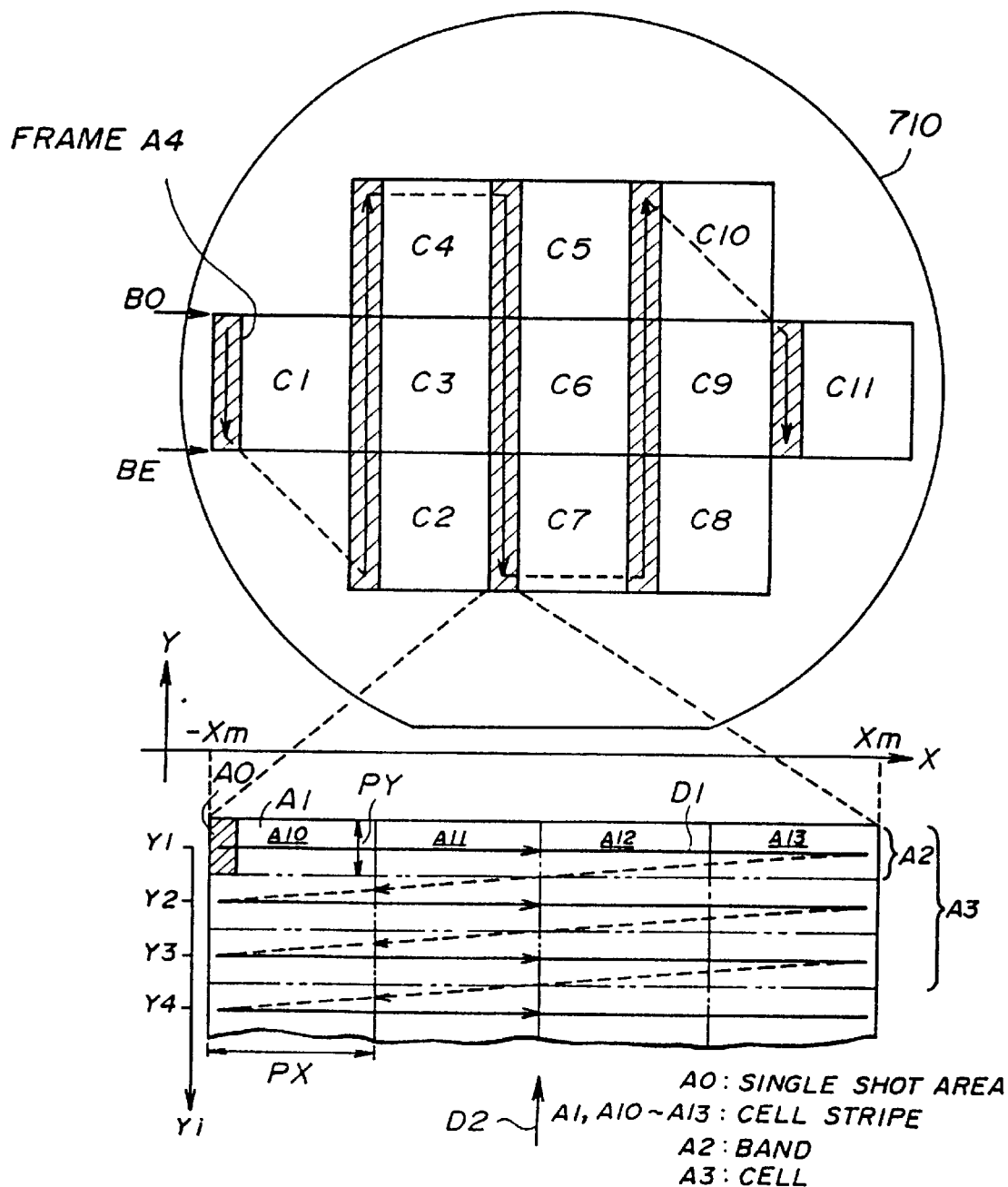
FIG. 28 is a diagram showing the scanning scheme used in the BAA exposure system of FIG. 24.

FIG. 28 shows the scanning conducted on the surface of the substrate 710, wherein it should be noted that the scanning of the present embodiment is different from the scanning described in FIGS. 1 and 2 with reference to the first embodiment.

Referring to FIG. 28, the main deflector 720 deflects the electron beam EB2 continuously in a principal scanning direction D1 while moving the stage 712 and hence the substrate 710 thereon continuously in a secondary direction D2. Further, the sub-deflector 722 is activated such that the electron beam EB2 follows continuously the movement of the substrate 710 in the direction D2. Thereby, an exposed area AO that is the area of the substrate 710 exposed by a single shot of the beam EB2 forms a band extending in the direction D1. Typically, the band has length of 2 mm in the elongate direction and a width of 10 $\mu$m and is scanned with a duration of 100 $\mu$s. In this case, the stage 712 is moved in the Y-direction with a speed of 100 mm/s (=10 $\mu$m/100 $\mu$s).

Figure 29A:
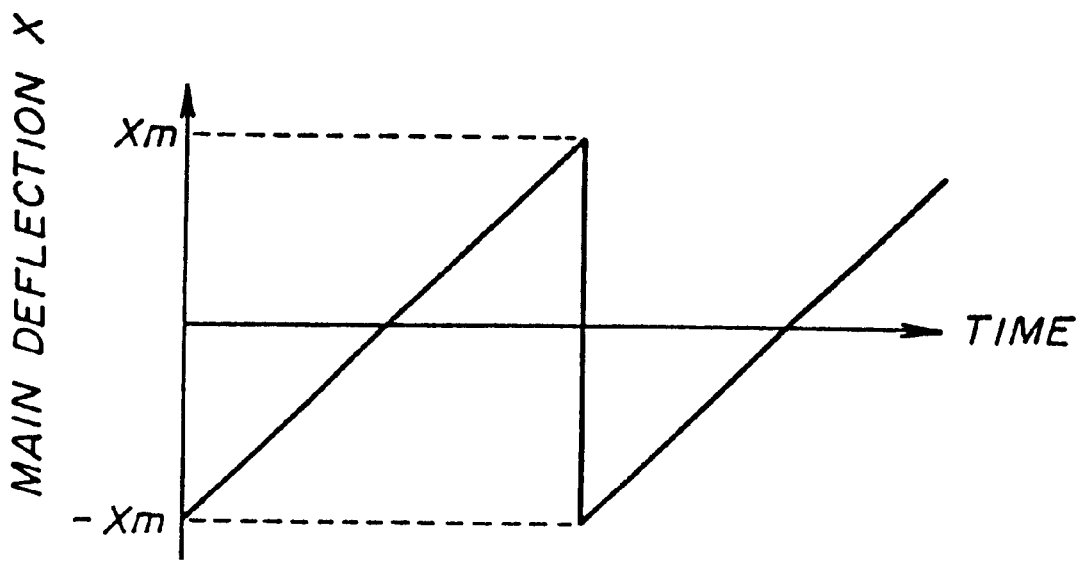
FIGS. 29A and 29B are diagrams showing the main deflection and stage movement employed in the BAA exposure system of FIG. 24 as a function of time.
Figure 29B:
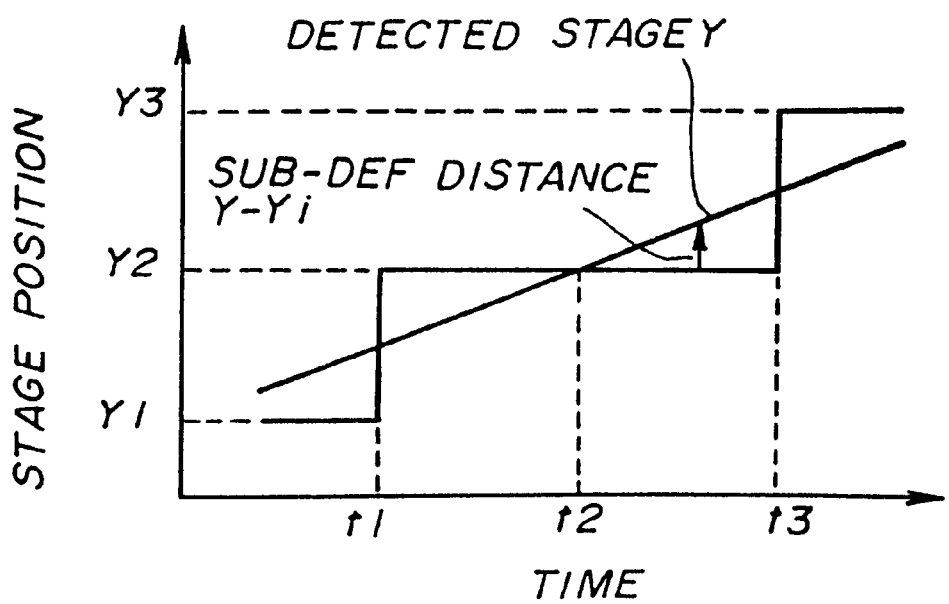

FIG. 29A shows movement of the electron beam EB2 on the substrate 710 caused by the main deflector 720, wherein the electron beam position is designated by X. Further, FIG. 29B shows the position Y of the stage 712 as detected by the laser interferometer 716 as well as the amount of deflection of the electron beam EB2 caused by the sub-deflector 722 represented as $Y-Y_1$.

Referring to FIG. 28, the same pattern is exposed on the chip areas C1–C11, wherein the stage 712 is moved such that the same frame such as a frame A4 is exposed repeatedly as indicated by arrows, while using the same dot pattern data of the frame $A4_1$.

In order to achieve such a control of the exposure, the BAA exposure system of FIG. 24 uses a main control circuit 724 that supplies a target stage position to the stage control circuit 714 as well as a periodical sawtooth signal to an amplifier 726. The circuit 724 thereby receives a signal Y indicative of the current stage position from the laser interferometer 716 and a band coordinate Yi to be described later from a BAA control circuit 740 and supplies a signal proportional to the quantity Y–Yi indicative of the sub-deflection distance, to an amplifier 728. The amplifiers 726 and 728 in turn produces respective drive signals as a result of current amplification and a voltage amplification, wherein the drive signals thus produces are supplied to the main deflector 720 and to the sub-deflector 722.

As already noted, the BAA mask 730 is disposed above the aperture plate 718 as indicated in FIG. 24, wherein the BAA mask 730 includes a number of apertures 733 within a BAA area 732 of a thin substrate 731 with a staggered relationship. Similarly to the embodiments before, each aperture 733 includes a common electrode 734 and a blanking electrode 735 at both sides thereof, wherein the common electrode 734 is connected to the ground commonly to the electrodes 734 of other apertures.

Thus, the BAA mask 730 shapes the electron beam EB0 supplied thereto and covering the BAA area 732 with a generally uniform current density to form the foregoing electron beam EB2, wherein the beam EB2 passes through the round aperture on the aperture plate 18 and reaches the substrate 10 when the blanking electrode 35 of the BAA mask 30 is set to the zero or ground voltage level. When a voltage Vs of a predetermined level is applied to the blanking electrode 35, on the other hand, the electron beam EB2 experiences a deflection and is interrupted by the blanking plate 718 as indicated by the beam EB0. Thus, it is possible to expose a desired fine exposure pattern on the substrate 10 by applying selectively the voltage level Vs to the electrode 735 in response to the dot pattern data of single bit.

Typically, the aperture 733 has a square shape having a size of 25 $\mu$m for each edge, wherein the electron beam element shaped by the aperture 733 exposes a square dot on the substrate 710 with a size of 0.08 $\mu$m for each edge. In the description hereinafter, two of the aperture columns extending in the Y-direction are treated as a single aperture column. Although the illustrated BAA mask 730 includes only 3×20 apertures, the actual BAA mask 730 includes 8×128 apertures similarly to the previous embodiments. In the description hereinafter, it is assumed that the apertures 733 are formed in m×n formation, wherein m represents the column extending in the Y-direction while n represents the row extending in the X-direction. Thereby, the aperture 733 at the column j and row i will be designated as 733 (i,j). Similarly, FIG. 25 shows the corresponding electrode designated as 35(i,j).

Figure 25:
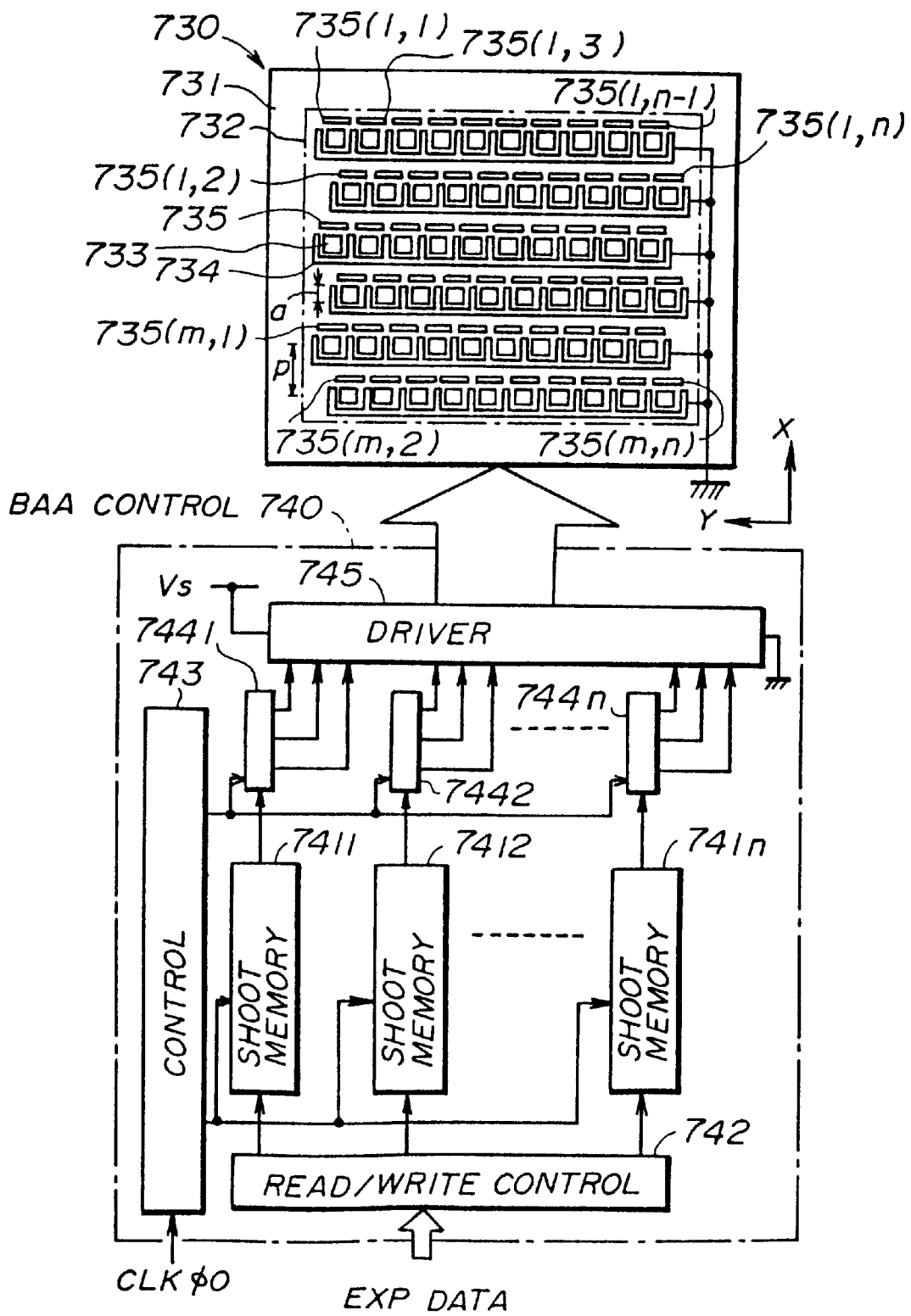
FIG. 25 is a block diagram showing the construction of a BAA mask used in the BAA exposure system of FIG. 24 together with a BAA control circuit cooperating with the BAA mask.

In the construction of FIG. 25, it will be noted that the apertures 33 are formed with a pitch p in the X-direction such that the area for providing electrodes 34 and 35 as well as the corresponding conductor pattern is secured. Typically, the pitch p is set three times as large as a length a of the aperture 733.

Figure 30:
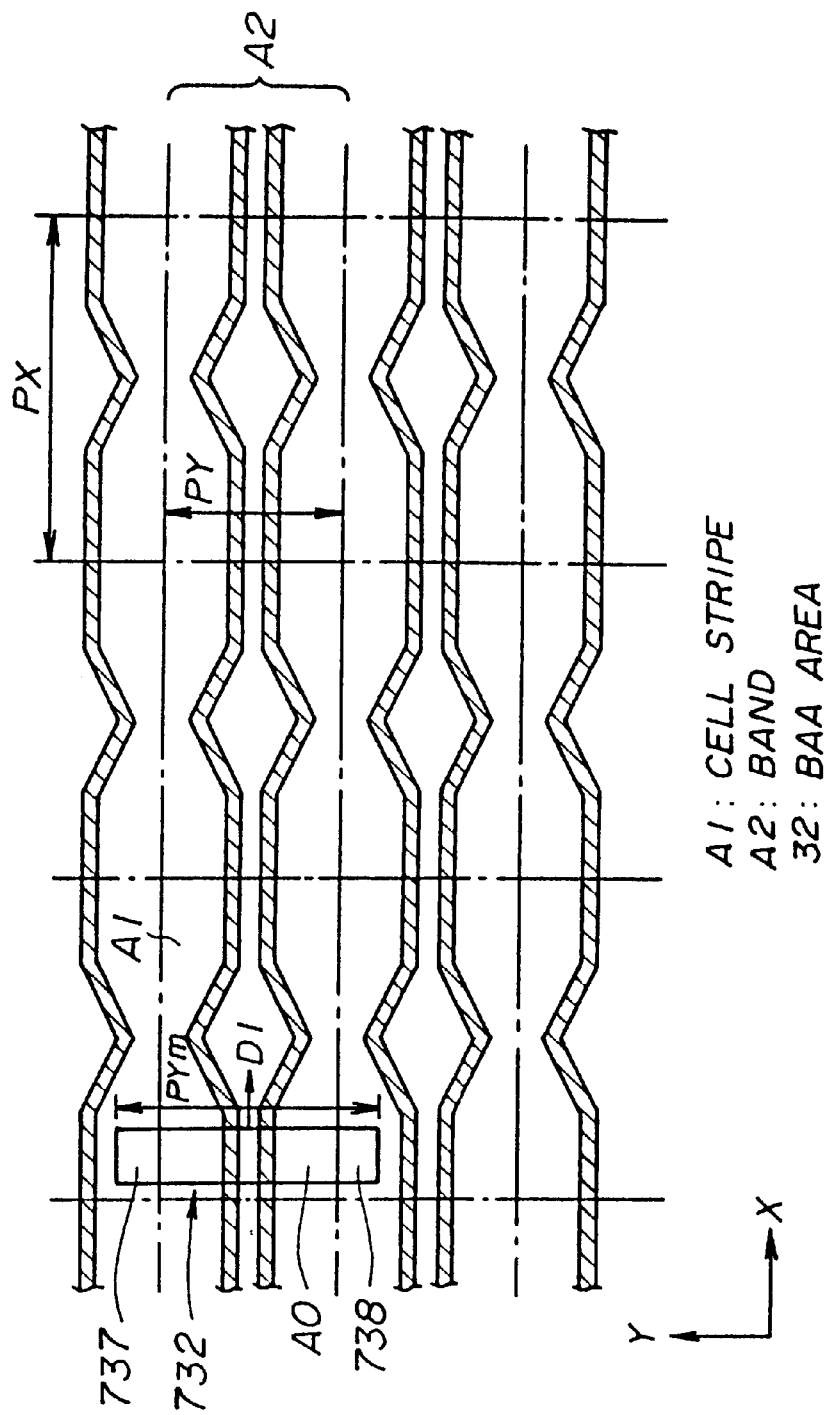
FIG. 30 is a diagram showing an example of a pattern to be exposed on a substrate in the BAA exposure system of FIG. 24.

FIG. 30 shows a part of the conductor pattern of a random access memory to be formed on the substrate 710 together with the size of the BAA area 732.

Referring to FIG. 30, the dot pattern data of the frame A4 is divided into a number of block data each corresponds to the dot pattern data of a block having a size PX in the X-direction and a size PY in the Y-direction, wherein the foregoing division of the dot pattern data is advantageously made in correspondence to the patterns that are repeated in the frame A4. The pitch PY of the block should be taken as large as possible but not exceeding the size PYm of the BAA region 732 in the Y-direction. Further, the pitch PX is set to be an integer fraction of the length of the band A2 such that the exposure of the block A2 is achieved by repeating the exposure of the block a plurality of times. The block herein corresponds to a cell stripe A1 shown in FIG. 28. In the random access memory of the illustrated example, the cell stripe A1 defined in FIG. 30 by the one-dotted-chain corresponds to a single memory cell, wherein such a memory cell 1B repeated a number of times. The cell stripe defined herein differs from the previous definition of the cell stripe given in FIG. 1 in that the cell stripe in the present embodiment serves as a unit of data expansion and data compression. In other words, the data expansion and compression are conducted in the present invention for each cell strip such as the one defined in FIG. 28.

In FIG. 30, it should be noted that the BAA area 732 is divided into the area A0 falling inside the cell stripe A1 and regions 737 and 738 outside the cell stripe A1, wherein the voltage Vs is supplied to the blanking electrodes 735 for the apertures on the BAA mask 730 corresponding to the regions 737 and 738.

Next, the construction of the BAA control circuit 740 will be described with reference to FIG. 25.

Referring to FIG. 25, the BAA control circuit 740 includes a number of dot memories 741j (j=1–n) in correspondence to the blanking electrode 735 of the j-th row for storing single bit data, wherein the dot memories 741j have the same storage capacity.

In cooperation with the dot memories 7411–741n, there is provided a control circuit 743 operating in synchronization with a clock φ0, wherein the circuit 743 controls a read/write circuit 742 that writes the dot pattern data supplied from the rain control circuit 724 into the dot memories 741j as well as reads out the dot pattern data therefrom. Each of the dot memories 7411–741n has a memory area divided into a plurality of areas, wherein one of the memory area is used for the writing the dot pattern data by way of direct memory access process while the other of the memory areas is used for the reading the dot pattern data. Thereby, each time the reading and writing for one frame, the frame A4, in completed, the memory area for wiring and the memory area for reading are switched with each other. Further, it should be noted that the data corresponding to the areas 737 and 738 of FIG. 30 are all set to "0."

In operation, the control circuit 743 supplies the read/write control signals to the dot memories 7411–741n, wherein the dot pattern data read out from a shoot memory such as the memory 741j is supplied to the lowermost bit of a corresponding shift register 744j. The dot pattern data is thereby forwarded to an upper bit in response to a clock from the control circuit 743, wherein the clock is set to have a period T identical to the period of the clock used for reading the shoot memory 741j. It should be noted that the shoot memory collectively designated by 741 is a bitmap memory typically formed of a dynamic random access memory.

Figure 26:
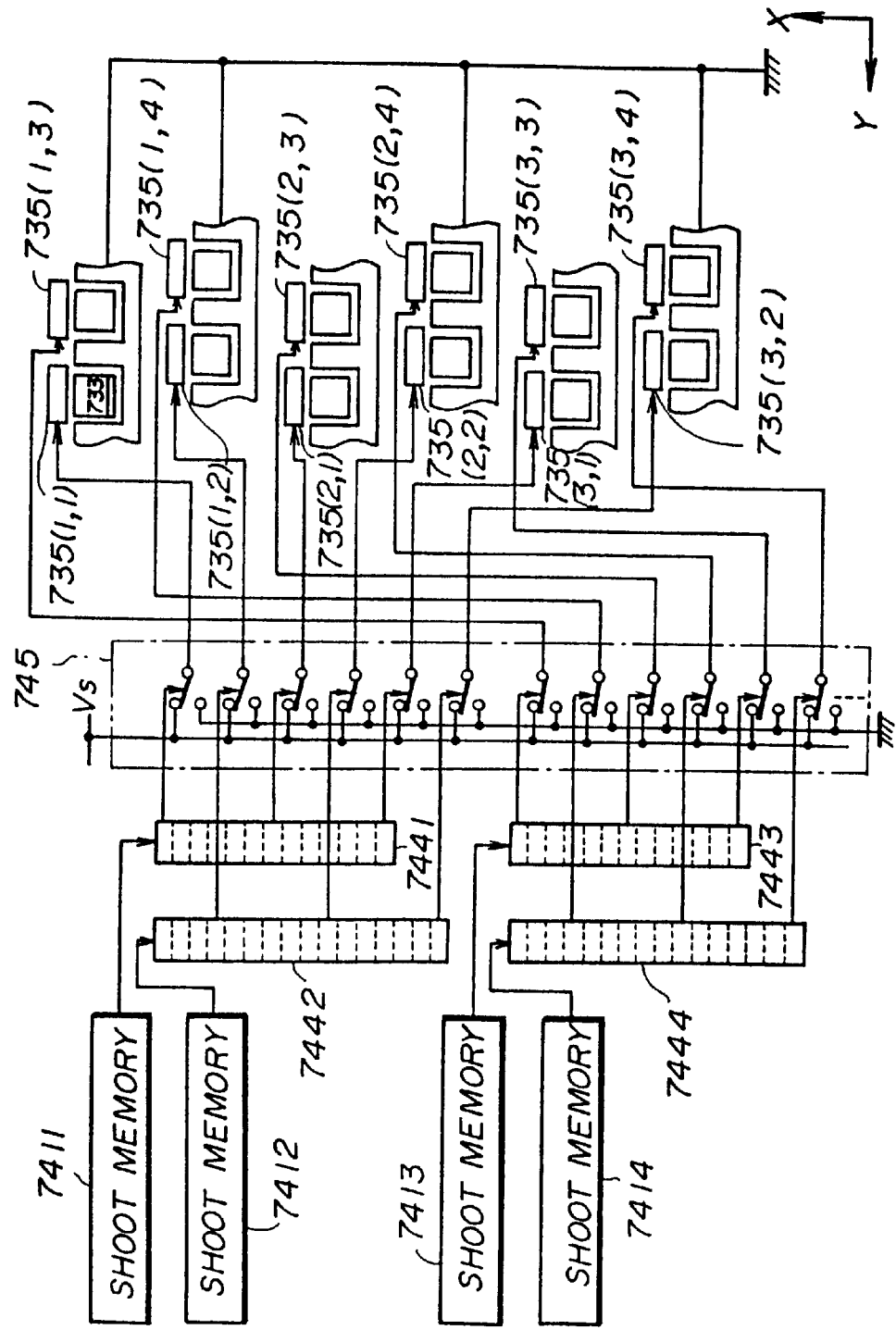
FIG. 26 is a block diagram showing the construction of the BAA control circuit of FIG. 25 in detail.

As will be apparent from FIG. 26, each of the blanking electrodes 735(i,j) is supplied either with the drive voltage of the level Vs or the ground level voltage via a switch 745 forming a buffer circuit, wherein each of the switches 745 is controlled by a data output of a corresponding shift register 744j (j=1–4) that stores the output dot pattern data of the dot memories 7411–7414, wherein the outputs of the shift registers are supplied to respective control terminals of the switches 745.

More specifically, it should be noted that the k-th bit measured from the lowest, zero-th bit of the shift register 744j is supplied to the blanking electrode 735(i,j), wherein the bit k is determined as k=2(p/a)(i−1) when j is odd, or k=(p/a) (2i−1) when j is even, wherein the parameters p and a are defined already. Thus, only when the foregoing k-th bit of the shift register 744j stored the data "1," the ground or zero voltage is applied to the corresponding blanking electrode 735(i,j), and the aperture 733(i,j) corresponding to the blanking electrode 735(i,j) allows the passage of the electron beam. Further, the scanning speed of the electron beam in the X-direction is set such that the electron beams passed through the apertures 733(2,j), 733(3,j), . . . 733(m,j) hit a common point P on the substrate 710 consecutively at the respective timings of t=2(p/a)T, t=4(p/a)T, . . . , t=2(m−1)(p/a)T, wherein the point P is the same point that has been scanned by the electron beam passed through the aperture 733(1,j) at the timing t=0.

By setting the scanning as such, the same point on the substrate 710 experiences exposure repeatedly by the same data for m times. Further, the areas on the substrate 710 located between the points exposed at a time t by the beams passed through the apertures 733(i,j), j=1, 3, 5, . . . , n−1, are exposed by the electron beams respectively passed through the apertures 733(i,j), j=2, 4, 6, . . . , n, at a timing of t+(p/a)T.

Next, the construction of a read circuit 7421 included in the read/write circuit 742 will be described with reference to FIG. 27.

Figure 27:
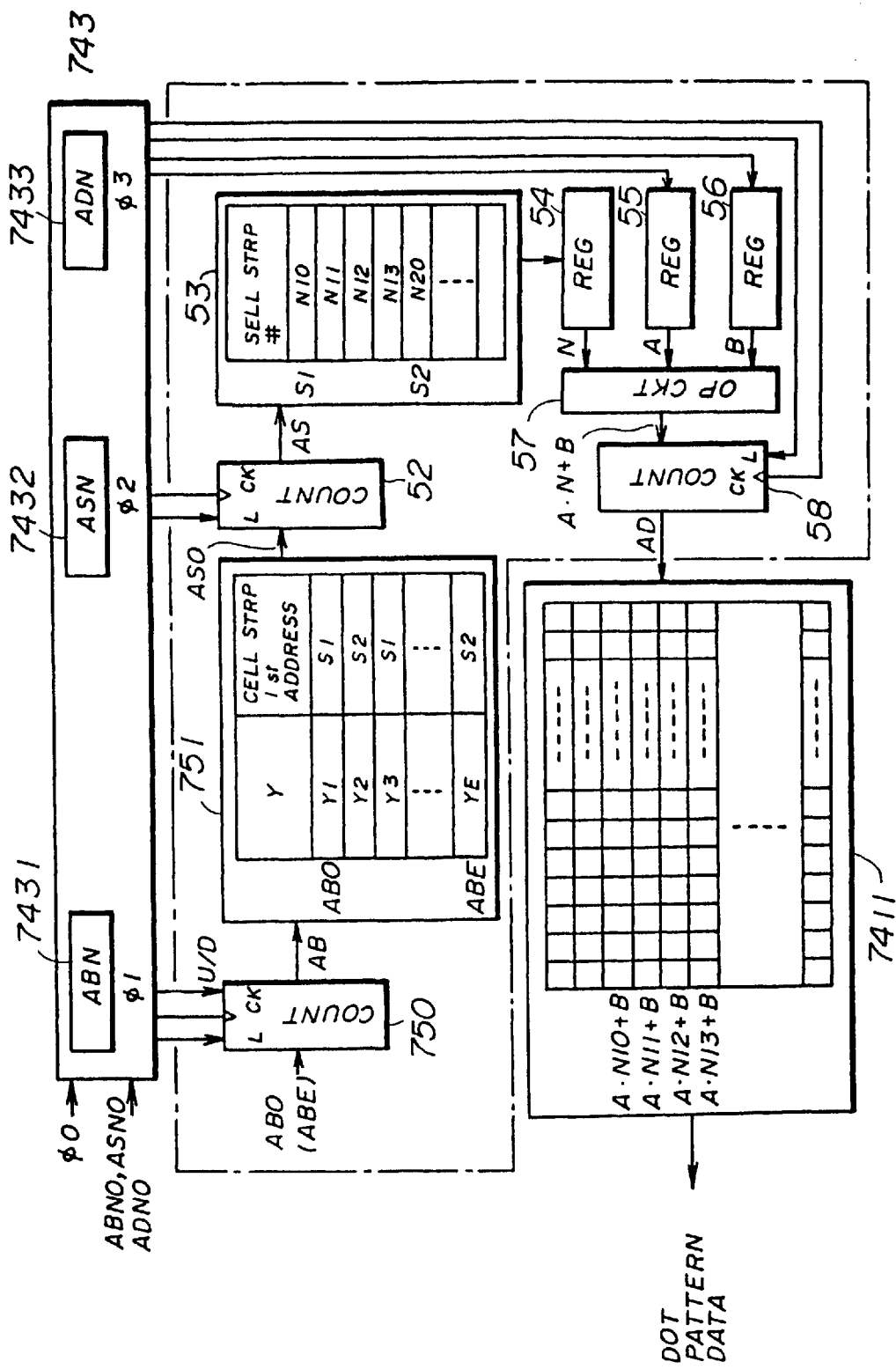
FIG. 27 is a block diagram showing the construction of a read/write control circuit in the circuit of FIG. 25.

Referring to FIG. 27, the read circuit 7421 includes an up/down counter 750, a band memory 751, an up counter 752, a cell stripe memory 753, registers 754–56, an operational circuit 57, and an up counter 58, wherein the band memory 751 stores the Y-coordinate of the band A2 shown in FIG. 28 as well as the corresponding first address AS0. It should be noted that the first address AS0 of the cell stripe represents the address of the cell stripe memory 753 for the first cell stripe A1 of the band A2. Further, the address of the band memory 751 is specified by a count AB of the up/down counter 750.

It should be noted that the control circuit 743 supplies a load control signal, a clock φ1 and an up/down control signal respectively to a load control terminal L, a clock terminal CK and an up/down control terminal U/D of the up/down counter 750, wherein the up/down counter 750 is loaded with an initial value when the load control terminal L is set active. Thereby, the initial value is given as the first address AS0 of the first band of the band memory 751 when the up/down counter 750 is operating in the up-counting mode in response to the high level input supplied to the up/down control terminal U/D. When the up/down counter 750 is operating in the down-counting mode in response to the low level input to the input terminal U/D, on the other hand, an address ABE of the last band on the band memory 751 is used for the foregoing initial value. It should be noted that the first address AB0 and the last address ABE correspond respectively to positions B0 and Be of the frame A4 shown in FIG. 28.

When the initial value is thus loaded upon the up/down counter 750, the number of the bands ABN0 (=E+1) is loaded on a down counter 7431 provided in the control circuit 743, wherein the count ABN of the down counter 7431 is reduced one by one in response to each occurrence of the clock φ1. When the count ABN of the down counter 7431 has reached zero, the exposure of one frame A4 is completed.

The first address AS0 of the cell stripe read out from the band memory 751 is then loaded on the up counter 752 to set the initial value thereof, in response to the load control signal from the control circuit 743. Further, the address data Yi of the Y-coordinate of the band read out concurrently to the foregoing first address AS0, is supplied to the main control circuit 724 of FIG. 24, Thereby, the up-counter 752 calculates the number of the clocks φ2 supplied from the control circuit 743 to produce a count AS indicative of the result of the counting, wherein the count As thus obtained is used for specifying the address of the cell stripe memory 753.

When the initial value AS0 is loaded upon the up-counter 752, a value ASN0 indicative of the number of the cell stripes in a band is loaded in a down-counter 7431, wherein the down-counter 7431 decreases the number of the count ASN one by one in response to each occurrence of the clock φ2. When the count ASN has reached zero, the exposure for one band A2 is completed. Further, simultaneously to the completion of the exposure of the band A2, the clock φ1 rises and the first address AS0 of the next cell stripe is loaded upon the up-counter 752.

It should be noted that the cell stripe memory 753 stores the cell stripe numbers as the identification of the cell stripes A1. Thus, when the address AS0 is Set S1, the count AS increases from the first address S1 of the cell stripe to the address S2-1 one by one consecutively, and cell stripe numbers N10–N13 corresponding to the cell stripes A10–A13 of FIG. 24 are read out from the cell stripe memory 753.

The output N of the cell stripe memory 753 is held in a register 754. On the other hand, the register 755 holds data A indicative of the number of the dots of a cell stripe Al in the X-direction, while the register 756 holds a base address B. The operational circuit 757 in turn calculates the first address A·N+B and supplies the same to the up-counter 758. Thereby, the first address A·N+B is loaded upon the up-counter 758 in response to the load control signal from the control circuit 743. The up-counter 758 then counts the number of clocks φ3 supplies from the control circuit 743 and specifies the address of the shoot memory 7411 based upon the count AD thus obtained.

When the initial value A·N+B is loaded upon the up-counter 758, data ADN0 indicative of the number of the dots of one cell stripe in the X-direction is loaded upon the down-counter 7433 in the control circuit 743. Thereby, the count ADN or the down-counter 7433 is decreased one by one in response to each clock φ3. When the count ADN of the down-counter 7433 has reached zero, the exposure of one cell stripe A1 is completed.

Simultaneously to the completion of-the exposure of the cell stripe A1, the clock φ2 is activated, and data A·N+B indicative of the next stripe is loaded upon the up-counter 758.

It should be noted that the data of the foregoing band memory 751 and the cell stripe memory 753 form a part of the exposure data and are stored in the external storage device similarly to the dot pattern data for the dot memories 7411–741*n* and are loaded from the external storage device.

According to the present embodiment, one can reduce the amount of exposure data by repeatedly using the same dot pattern data for the case when the same dot pattern such as the pattern for the cell stripe A1 is exposed repeatedly. In such a case, the same block is specified by specifying the cell stripe number N. As a result, the time needed for transferring the exposure data from the external storage device to the dot pattern memory is substantially reduced and the throughput of the exposure is improved accordingly.

Further, the present embodiment, which uses the band memory 751, is advantageous in the point that it does not require storage of the same cell stripe numbers a number of times in the cell stripe memory 753. It is only required to specify the first address of the cell stripe in the band A2 as long as the same exposure dot pattern is exposed. Thereby, further reduction of the exposure data is achieved.

While there occurs a case in which the direction of scanning is opposite in the first exposure and in the second exposure as in the case of exposing the chip area C1 and the chip area C2 as indicated in FIG. 24, such a change in the scanning direction is easily attended to by changing the up/down counting mode of the up/down counter 750 as well as the initial value thereof.

In order to exploit the advantage of the present embodiment, it in desired to divide the dot pattern data into the frames A4 such that there occurs repetition of patterns as much as possible and such that the pitch PY is increased as much as possible. For this purpose, it is desired that the pitches PX and PY are variable, while it should be noted that there exists a constraint that the width of the band A2 has to be held constant. Thus, the present embodiment achieves the desired change of the pitch PY while using the cell A3 as a unit, wherein the cell A3 that includes therein a plurality of bands A2. Thereby, one may define the cell A3 as being coincident to the frame A4. As the number of the dots and hence the number of the bits of one cell stripe A1 in the X-direction changes with the pitch PX of the cell stripe A1, the value of N has to be changed appropriately such that the address space A·N+B–A·(N+1)+B–1 does not overlap with each other. It should be noted that such a change of the pitch causes a change in the number of value A of the register 755. For example, the number N is changed to N+1. Alternatively, the base address may be changed.

[first modification of the fourth embodiment]

Figure 31:
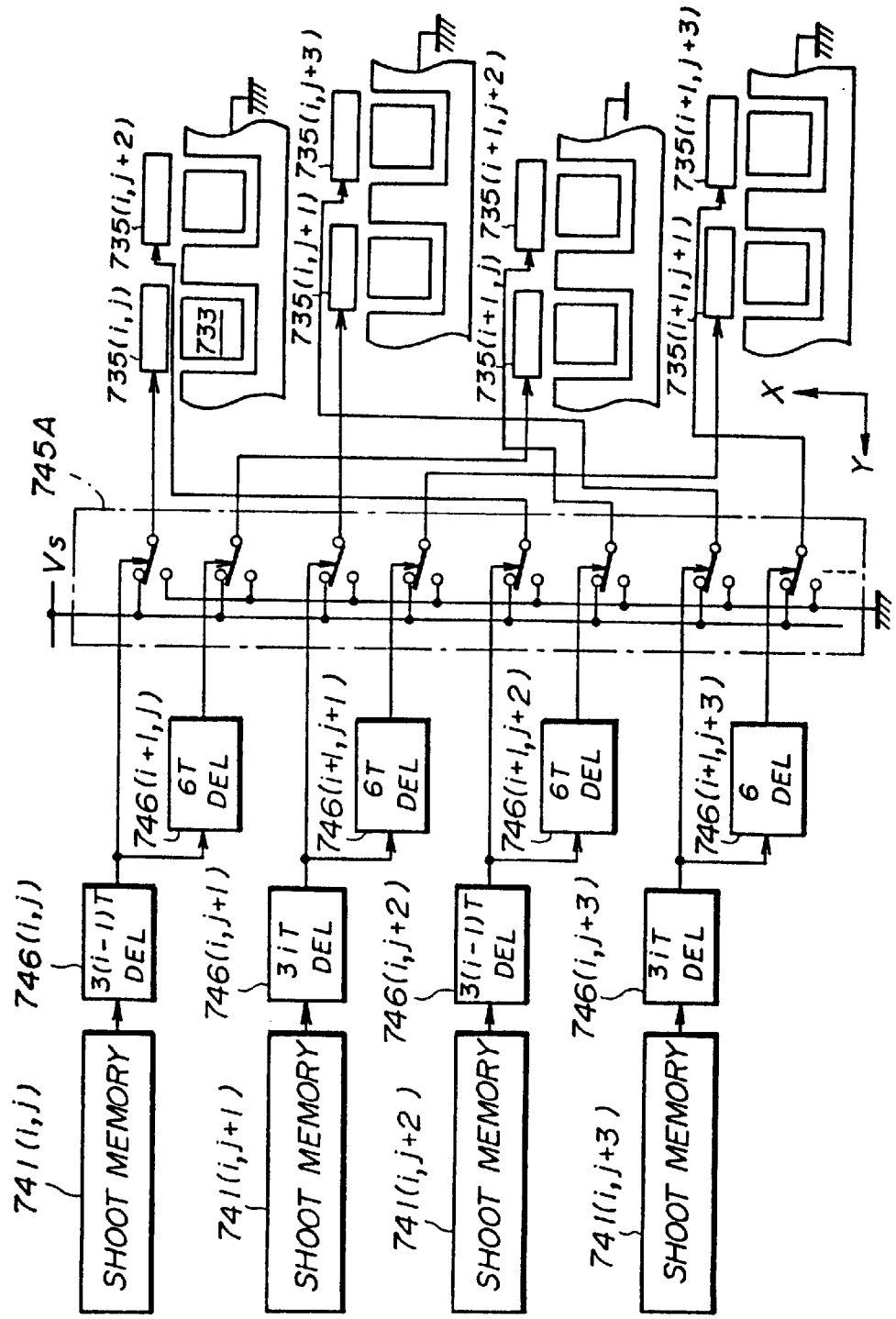
FIG. 31 is a diagram showing the construction of a BAA control circuit used in a first modification of the fourth embodiment of the present invention.

FIG. 31 shows the construction of the BAA control circuit according to a modification of the present embodiment in detail.

It should be noted that the present modification relates to the compensation of the proximity effect or other minute adjustment of the exposure pattern by changing the exposure dot pattern in each shot in place of exposing the same pattern repeatedly m times.

For this purpose, the present embodiment represents the same exposure point on the substrate 710 by independent data of m/2 bits and uses the data of 1 bit twice, repeatedly. As the exposure of one dot column is achieved by n apertures each using the m/2 bit data for each exposure point, the exposure or one column requires the data of m×n/2 bits. Further, the use of the one-bit data twice indicates that the shoot memory of m×n/2 is required for supplying the m×n/2 bit data simultaneously to the m×n apertures 733.

Thus, the construction of FIG. 31 uses mutually independent dot memories 741($i,j$) for each of the odd column apertures 733($i,j$) ($i$=1–n, $j$=1, 3, 5, . . . , m–1). Thereby, the output of the shoot memory 741($i,j$) for the odd value of j is passed through a delay circuit 746($i,j$) for a delay time of (p/a) (i–j)T. The data thus delayed is then used for controlling the switch element of a buffer circuit 745A such that one of the blanking voltage Vs and the ground voltage is supplied to the blanking electrode 734($i,j$) of the BAA mask 730. Further, the same data is passed through another delay circuit 746($i$+1,$j$) for a delay of 2(p/a)T, wherein the data thus delayed is used for controlling another switch element of the buffer circuit 745A such that one of the voltage Vs and the ground voltage 0 is supplied to the blanking electrode 735($i$+1,$j$). In the case of i–1, the delay time (p/a) (i–1) is zero, and thus, there is no delay circuit 746(1,$j$).

Generally, a kT delay circuit delays the input signal supplied thereto by a delay time that is k times as large as the period T for reading the bits from the shoot memory 741($i,j$), and may be formed of a k-bit shift register.

The output of the dot memories 741($i,j$) for the even value of the suffix j is used similarly as before, except that the delay caused by the delay circuit 746($i,j$) is longer than the case of odd value of the suffix j by a duration of (p/a)T and that there exists the delay circuit 746(1,$j$) for i=1.

By using the delay circuit 746($i,j$) as set forth above, each of the dot memories stores the dot data of the same exposure column at the same address, and the processing of the dot pattern data to be supplied to the BAA control circuit 740 is simplified substantially.

In the event the dot pattern data is not compressed as set forth above, it will be noted that one requires the exposure dot of m/2 times as compared with the case of the fourth embodiment of the present invention. In the modification of the present embodiment, a further compression of the exposure data becomes possible.

[second modification of the fourth embodiment]

Figure 32A:
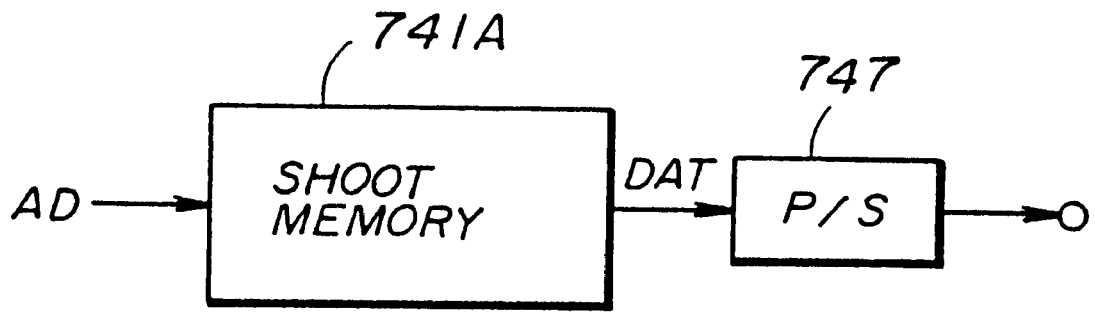
FIGS. 32A and 32B are diagrams respectively showing the construction of a BAA control circuit and exposure dot data used in the BAA exposure system of FIG. 24 as a second modification of the fourth embodiment.
Figure 32B:
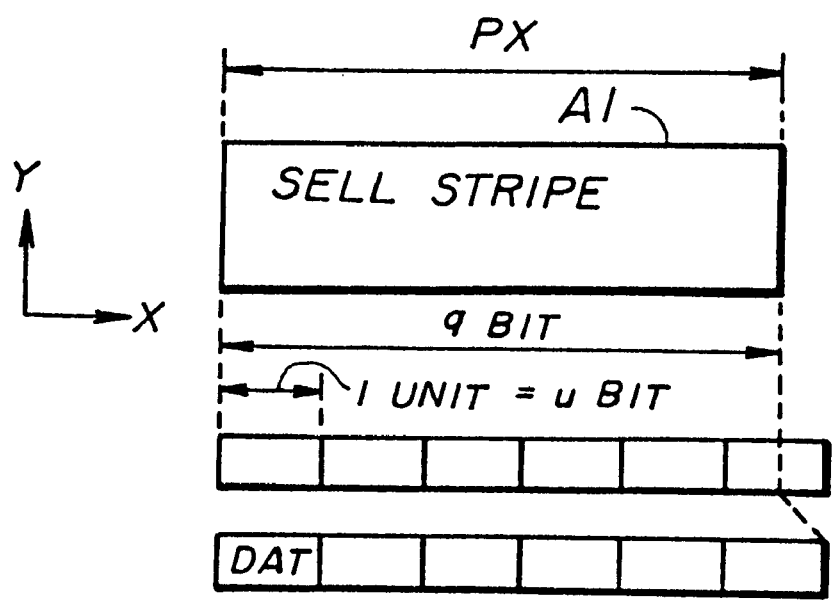

FIG. 32A shows a part of the BAA control circuit according to a second modification of the present embodiment.

According to the fourth embodiment or the modification thereof, it will be noted that the reading of the dot pattern data with a high clock speed such as 400 MHz is possible. In such a high throughput exposure process, however, the speed of the memory operation may become a bottle neck.

Thus, the present modification of the fourth embodiment uses a shoot memory 741A that allows the reading of the dot pattern data for each u-bits of the data. The output data DAT of the shoot memory 741A is then converted to serial data d in a parallel-to-serial converter 747 and is supplied to the shift register 744$i$ of FIG. 25 or to the 3(i−1)T delay circuit 746($i,j$) of FIG. 31. It should be noted that the parallel-to-serial converter 747, producing one bit output in response to a single clock, operates at a higher speed as compared with the shoot memory 741A. By setting the size u to be 20, for example, the dot pattern data is read out from the shoot memory 741A with a speed of 20 MHz (=400 MHz/20).

In the event a single aperture 733 on the BAA mask 730 is used for exposing a pattern of the size of ds×ds on the substrate 710, it will be noted that the number of the bits q of the dot pattern data in the X-direction of a cell stripe having the pitch PX, is given as q=PX/ds in the foregoing fourth embodiment. In the case of the foregoing modification of the fourth embodiment, this value q is given as q=4PX/ds. On the other hand, when the quantity q is not an integer multiple of the quantity u, continuous exposure is no longer possible.

Thus, in order to avoid this problem, the present modification employs the following processes.

(1) Expand the q-bit to ([q/u]+1), wherein [q/u] represents the integer part of the quantity q/u. This expansion may be conducted by carrying out a linear interpolation. Thereby, the dot memories store the dot pattern data thus expanded.

(2) Increase the dot density on the substrate 710 by σ times, wherein σ is given as σ=([q/u]+1)u/q. In order to increase the dot density in the X-direction by σ times, the ratio of (speed of reading the dot pattern data)/ (electron beam scanning speed) is increased by σ times. This means that one may increase the speed of reading the dot pattern data σ times while holding the electron beam scanning speed constant, or decrease the electron beam scanning speed by 1/σ times while holding the speed of reading the dot pattern data constant. In any case, the stripe memory 753 of FIG. 27 stores the parameter such as 1/σ, σ or q together with the cell stripe number, such that the speed of reading the dot pattern data or the electron beam scanning speed is changed in response to the parameters 1/σ, σ or q.

When increasing the electron beam scanning speed by 1/σ times, it is necessary to increase the scanning speed by 1/σ times for each of the movable stage 712, the main deflector 720 and the sub-deflector 722, wherein such an increase of the scanning operation, caused in synchronization to a clock, is achieved by supplying a variable clock by means of a PLL circuit. It should be noted that the signals supplied to the amplifiers 726 and 728 are converted to analog signals by a D/A conversion after the digital processing.

[third modification of the fourth embodiment]

Figure 33:
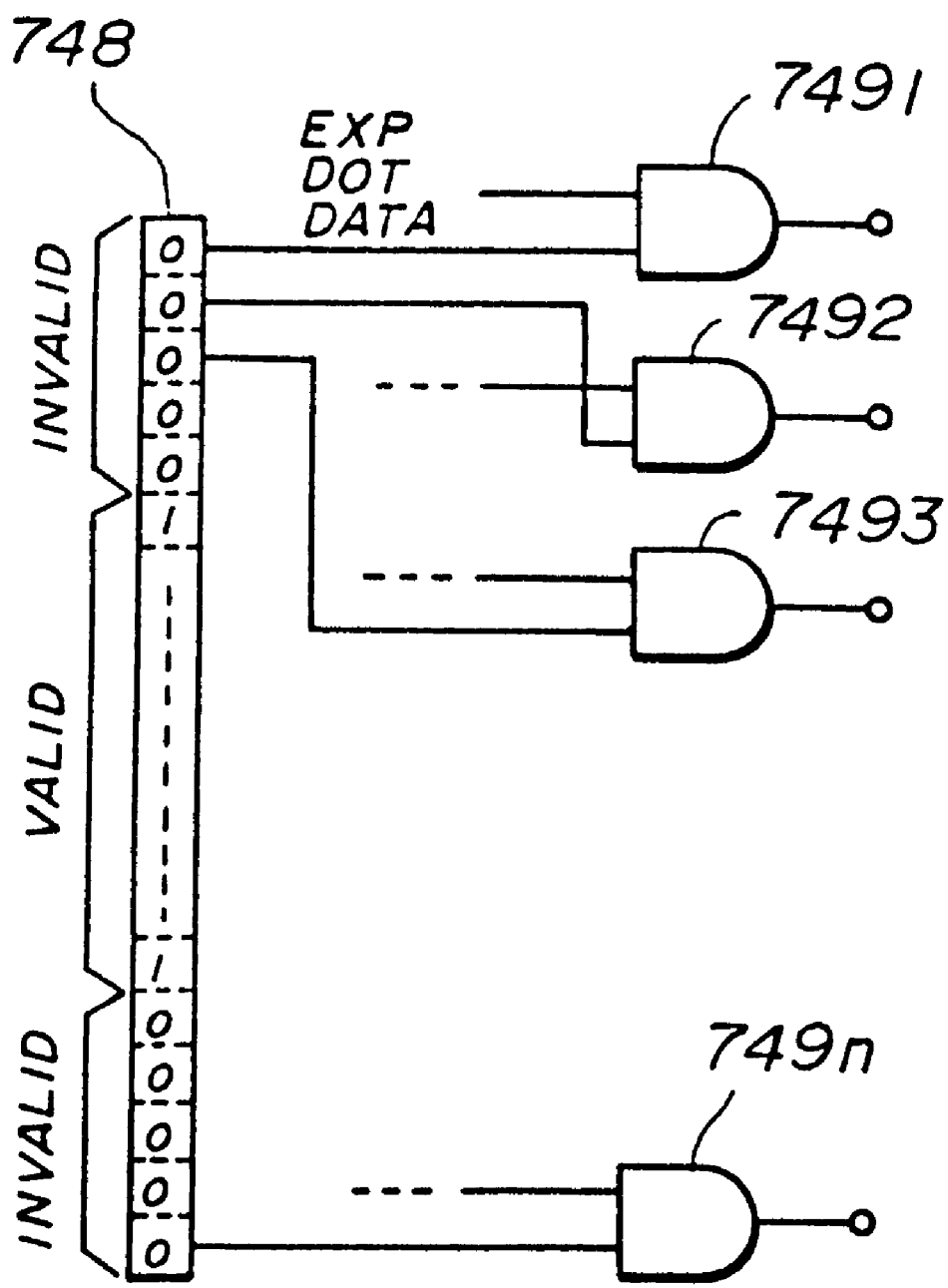
FIG. 33 is a block diagram showing a part of the BAA control circuit used in the BAA exposure system of FIG. 24 as a third modification of the fourth embodiment.

FIG. 33 shows a part of the BAA control circuit according to a third modification of the fourth embodiment.

Referring to FIG. 33, it will be noted that the exposure dot data for the regions 737 and 738 of the BAA area 732 are zero (0) in correspondence to the region outside the valid exposure area. While such dot data may be written into the dot memories, it is also possible to set the corresponding output of the dot memories forcedly to zero.

Thus, in the present modification of the fourth embodiment, there is provided a BAA valid/invalid register 748 of n-bit length for storing the dot pattern data for the exposure dots aligned in the Y-direction, such that the register 748 includes an invalid field corresponding to the foregoing regions 737 and 738 and a valid field corresponding to the region A0, wherein the data of the invalid field are all set to "0," while the data of the valid field are all set to "1." Further, there are provided n AND gates 7491–749$n$, wherein each of the AND gates such as the AND gate 749$j$ (j=1−n) has a first input terminal to which the i-th bit of the register 748 is supplied and a second input terminal to which the output of the shoot memory 741$j$ of FIG. 25 is supplied. Thereby, the AND gate 749$j$ supplies the output thereof to the lowermost bit of the shift register 744$j$ of FIG. 25.

According to the present embodiment, the need for writing the invalid data "0" to the shoot memory is eliminated, and the dot pattern data is created easily.

It should be noted that there are may other modifications in the present embodiment.

For example, one may eliminate the band memory 751 and store the cell stripe number N in the cell stripe memory 753 in the order of exposure. It is also possible to store the first relative address A·N or first absolute address A·N+B directly in the cell stripe memory 753.

Further, the circuit of FIG. 33 is applicable also to the first and second modifications of the present embodiment.

Figure 34:
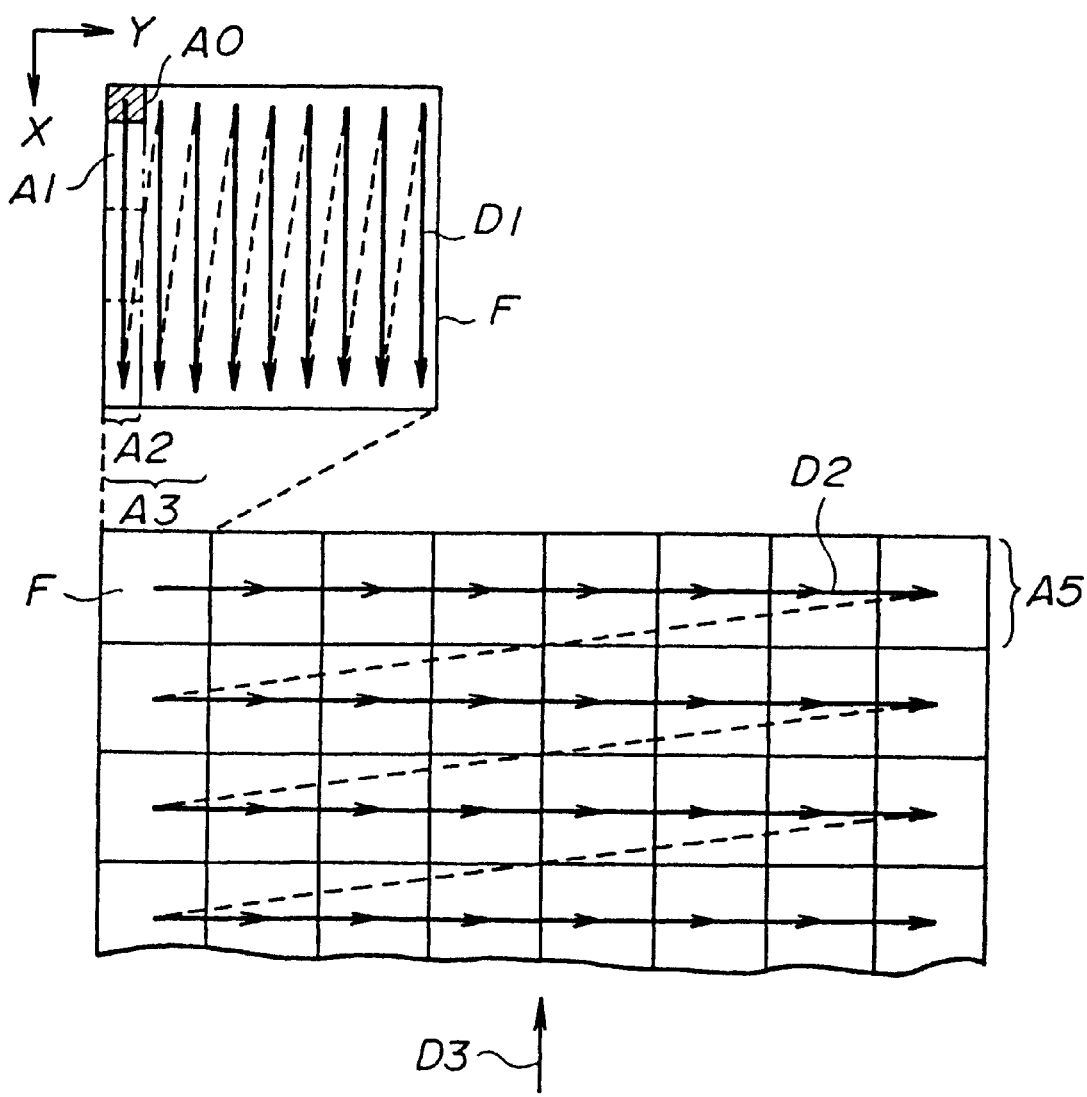
FIG. 34 is a diagram showing another example of the scanning of the substrate by an electron beam used in the fourth embodiment of the present invention.

Further, the data compression of the i exposure data of the present embodiment is not limited to the BAA exposure system described heretofore, but may be applicable also to other charged particle beam exposure systems such as the one that uses the electron beam scanning scheme shown in FIG. 34.

In the system of FIG. 34, it will be noted that the electron beam is deflected in the direction D1 within a sub-field F1 and is moved stepwise in the direction D2, which is perpendicular to the primary scanning direction D1, by the main deflector 720 by a width of the sub-field F1, wherein the direction D2 is coincident to the elongating direction of the stripe A5. Further, the stage 712 is driven continuously in a direction D3 perpendicular to the direction D2. For example, the stripe may have a length of 2 mm and the sub-field F may have a size of 100 $\mu$m for each edge.

[fifth embodiment]

In the BAA exposure system described heretofore, it is necessary to expand the exposure data in the form of dot pattern data by software, while there are numerous exposure dots on the surface of the object. Thus, expansion of the dot pattern data requires substantial time, and it is necessary to increase the speed of data expansion as much as possible. This problem of data expansion becomes particularly acute when adjusting the boundary of exposure pattern with a minute amount as in the case of compensating for the proximity effect by using a BAA mask such as the one shown in FIG. 5, wherein the BAA mask carries thereon a plurality of aperture groups shifted in pitch by M/N, wherein N is the number of the aperture groups on the mask and M is an integer smaller than N.

Conventionally, such a fine adjustment of the pattern boundary has been achieved by canceling exposure of one or more dots in the vicinity of the pattern boundary, while such a cancellation of the exposure dots requires a substantial processing at the time of bitmap expansion. For example, such a calculation of the canceled exposure dots has to be conducted by taking the effect of pattern width and requires a processing conducted along the contour of the pattern boundary. About the fine adjustment of the exposure pattern by the BAA exposure system that has the foregoing M/N pitch-shift aperture groups, reference should be made to the U.S. Pat. No. 5,369,282, which is incorporated herein as reference.

Accordingly, the present embodiment has an object of providing a charged particle beam exposure method and system that are capable of exposing a pattern on an object at a high speed, without requiring particular data processing with respect to pattern width or contour of the exposed pattern.

More specifically, the object of the present embodiment is to provide a method and system for exposing an exposure pattern on an object by a charged particle beam, comprising the steps of:

shaping a charged particle beam into a plurality of charged particle beam elements in response to first bitmap data indicative of an exposure pattern, such that said plurality of charged particle beam elements are selectively turned off in response to said first bitmap data;

focusing said charged particle beam elements upon a surface of an object; and scanning said surface of said object by said charged particle beam elements;

said step of shaping including the steps of:

expanding pattern data of said exposure pattern into second bitmap data having a resolution of n times (n≧2) as large as, and m times (m≧1) as large as, a corresponding resolution of said first bitmap data, respectively in X- and Y- directions;

dividing said second bitmap data into cells each having a size of 2n bits in said X-direction and 2m bits in said Y-direction; and creating said first bitmap data from said second bitmap data by selecting four data bits from each of said cells, such that a selection of said data bits is made in each of said cells with a regularity in said X- and Y-directions and such that the number of rows in said X-direction and the number of columns in said Y-direction are both equal to 3 or more.

According to the present invention, it becomes possible to achieve a fine adjustment of the exposure pattern by using the first bitmap data without considering the effect of pattern width or conducting a processing along the contour of the pattern boundary. Thereby, the processing speed and hence the exposure throughput increases substantially.

In the description hereinafter, those parts described already with reference to previous embodiments are designated by the same reference numerals and the description thereof will be omitted.

Figure 35:
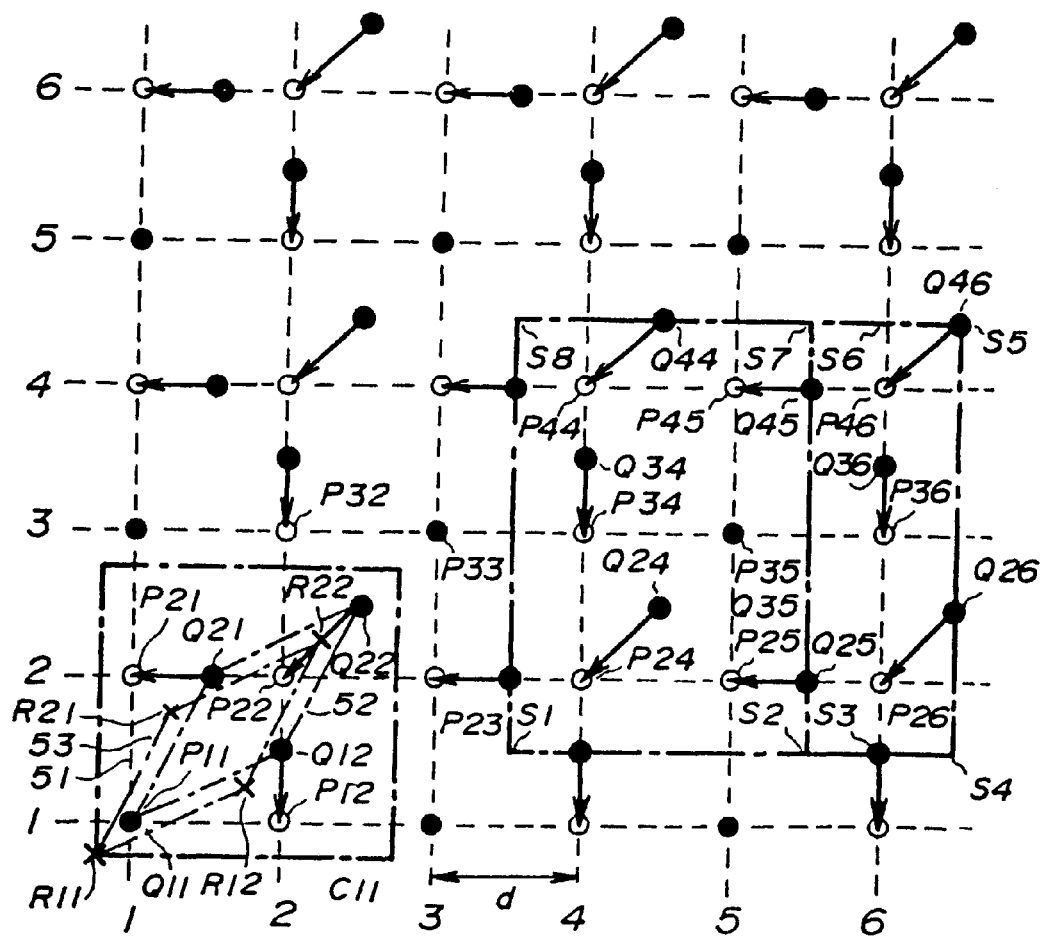
FIG. 35 is a map showing the relationship between a bit data acquisition point and a corresponding beam spot point according to a fifth embodiment of the present invention.

FIG. 35 shows the relationship between a bit data acquisition point and a corresponding beam spot point formed on the surface of the substrate 710.

Referring to FIG. 35, a beam spot point is formed at the intersection of a horizontal broken line and a vertical broken line and is designated by an open circle. In the description hereinafter, the beam spot point will be designated as $P_{ij}$, wherein the suffix i represents the number of the horizontal broken line, while the suffix j represents the number of the vertical broken line. It should be not d the beam spot point corresponds to the center of the exposure dot formed on the surface of the substrate 710. Thus, the exposure dots formed with a pitch of d form corresponding rectangular exposure dots each having a size of 2d for each edge.

Conventionally, the dot pattern data for a single exposure dot or "bit data" is set to assume a logic value "1" in the interior of an exposure pattern, while the dot pattern data takes a logic value "0" in the outside the exposure pattern. For example, the dot pattern data for a polygonal pattern having apex at points S1, S2, S7 and S8 includes therein the dot pattern data of logic value "1" at lattice points P24, P25, P34. P35, and P45.

In the present embodiment, on the other hand, the bit data for a bit data acquisition point $Q_{ij}$ represented by a solid circle, is used for the beam spot point $P_{ij}$, wherein the point $Q_{ij}$ is shifted with respect to the point $P_{ij}$. Thereby, the shifting relationship between the point $Q_{ij}$ and $P_{ij}$ is repeated for each cell C11. It will be noted that the cell C11 includes the exposure points P11, P12, P22 and P21 respectively locating at the four corners of a square 51 having a size d for each edge, while the points Q11, Q12, Q22 and Q21 are located at the apex of a rhomboid 52. Thereby, the point Q12 is set at an intermediate point between the points P12 and P22, while the point Q21 is set an intermediate point between the point P21 and P22. Further, the point Q22 is set at a center of the points P22, P23, P33 and P32.

As the distance d is very small, typically 0.08 μm, the deformation of the pattern caused by deforming the square pattern 51 to rhombic pattern 52 is negligible, While the deformation of the pattern appears at the pattern boundary, such a deformation includes a translational component that does not cause any substantial effect. After removing the effect of such a translation, one obtains the actual effect of deformation that corresponds to a deformation from the rhombic pattern 52 to another rhombic pattern 53. The amount of translation, on the other hand, is given by a distance between any of the points R11, R12, R22 and R21 on the rhomboid 53 and a corresponding apex of the square 51, wherein the distance is equal for each of the foregoing points R11, R12, R22 and R21 and is given by √2d/4= 0.35d=0.028 μm. Thus, it will be noted that the effect of the translational component associated with such an exposure is negligible, particularly in view of the blur caused in the photoresist as a result of scattering within the resist.

FIG. 35 further shows another rectangular pattern defined by corners S1, S2, S7 and S8, wherein the rectangular pattern includes the points P24, P25, P34, P35, P44 and P45 as the exposure dots. In the exposure or the rectangular pattern, the data "1" for the bit data acquisition points Q24, Q25, Q34, Q44 and Q45 are used for exposing the forgoing points P24, P25, P34, P35, P44 and P45 respectively. Thereby, the rectangular pattern is exposed similarly as before.

On the other hand, when the width of the rectangular pattern is increased by d/2, the rectangular pattern is now defined by the corners S1, S3, S6 and S8, and the data "0" for the points Q26 and Q46 are used for the points P26 and P46, respectively. Thereby, the rectangular pattern thus formed have a reduced width as compared with the case of conventional exposure in which the points P26 and P46 are both exposed with the data "1."

With further increase in the width of the rectangular pattern by d/2, the rectangular pattern is defined by the corners S1, S4, S5 and S8, and the data "1" for the bit data acquisition points Q26 and Q46 is used for exposing the dots for the points P26 and P46. Thereby, the width of the rectangular pattern increases as compared with the pattern defined by the corners S1, S3, S6 and S8.

Summarizing above, the present embodiment enables a fine adjustment of the exposure pattern by increasing or decreasing the exposure dots each time the width of the rectangular pattern is changed by an amount of d/2. Further, the present embodiment eliminates the necessity of adjusting the pattern in view of the pattern width or processing along the contour of the pattern.

Figure 36:
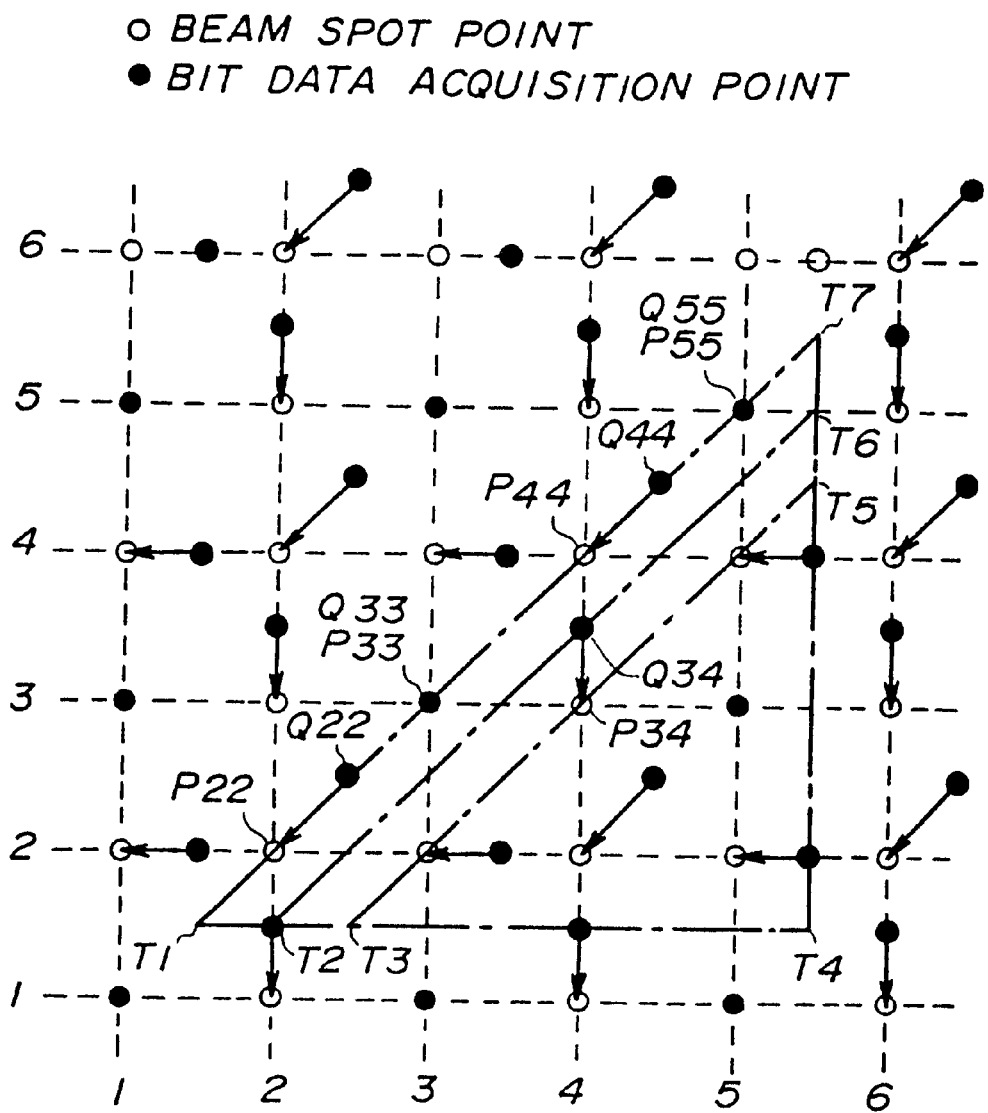
FIG. 36 is a map showing a part of FIG. 35 in an enlarged scale.

It should be noted that any pattern that is exposed on the substrate by the BAA exposure process can be decomposed into a rectangular pattern and a right-angled triangle. FIG. 36 shows the change of the exposure dots in the case of such a right-angled triangle pattern, when the size of the triangle pattern is increased gradually in the map of FIG. 35.

Referring to FIG. 36, there is a triangle defined by corners T3, T4 and T5, wherein the present embodiment set the exposure data for the point P34 to "0" in correspondence to the content of the data Q34. Otherwise, the exposure of the triangle is conducted similarly, and the points $P_{ij}$ inside the triangle are set to the logic value "1" indicating the exposure.

When the size of the triangle is increased such that the triangle is defined by the corners T2, T4 and T6, on the other hand, the data for the point Q34 is used for the exposure of the point P34. Thereby, the exposed pattern of the triangle increases slightly. In the conventional case, such a slight increase in the size of the triangular pattern is not possible.

With further increase of the triangle size as indicated by the pattern defined by the corners T1, T4 and T7, on the other hand, it will be noted that the number of the beam spots for exposing the triangular dot pattern increases by four, wherein this case is substantially identical with the conventional exposure of a triangular pattern.

Summarizing above, the present embodiment enables a fine adjustment of the exposure pattern by increasing or decreasing the exposure dots each time the size of an edge of the right-angled triangular pattern defining the right-angled corner, is changed by an amount of d/2. It should be noted that the conventional exposure process causes the desires change of the triangular pattern only when the size of the edge has changed by d. Further, the present embodiment eliminates the necessity of adjusting the pattern in view of the pattern width or processing along the contour of the pattern.

FIGS. 37A–37D show the foregoing effect visually, wherein FIGS. 37A–37D show the relationship between the translation of the pattern boundary and the bit data acquisition points for a cell C11 in FIG. 35.

Figure 37A:
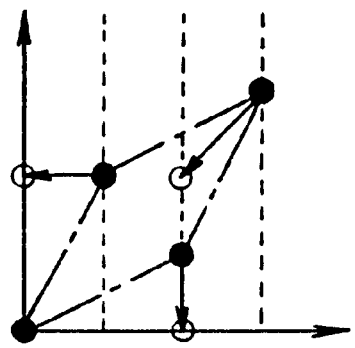
FIGS. 37A–37D are diagrams showing the relationship between the movement of a pattern boundary and the bit data acquisition points.

Referring to FIG. 37A, it will be noted that the bit data acquisition point increases one by one with the translation of the right edge of the pattern in the X-direction as X=0, 1, 3, 3, . . . , wherein the right edge is parallel to the Y-axis as indicated by broken lines. A similar situation occurs also for the left edge of the pattern.

Figure 37B:
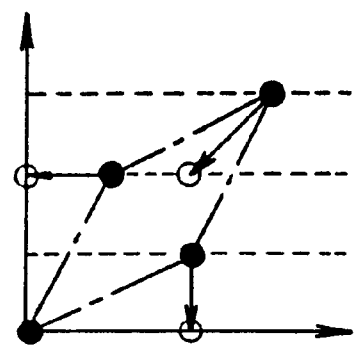
Figure 37C:
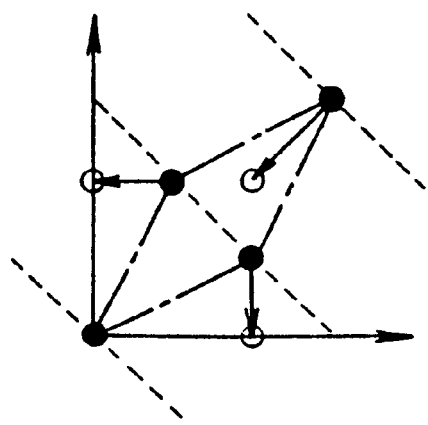
Figure 37D:
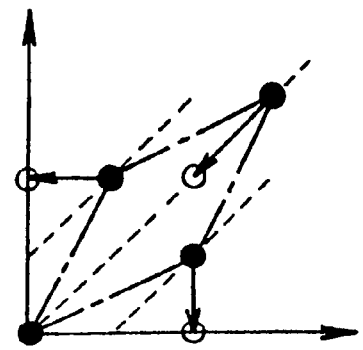

In the example of FIGS. 37B–37D, on the other hand, the number of the broken lines does not change with respect to the number of the lines (not illustrated), which lines are parallel to the broken lines and passing through the open circles, while the foregoing advantageous feature still holds in view of the surrounding cells shown in FIG. 35. Further, it should be noted that the exposure pattern used in the BAA exposure generally is primarily formed of rectangular patterns, with a small number of triangular patterns. Thus, the exposure process according to the present embodiment is extremely useful for exposing exact exposure patterns with high efficiency.

Figure 38:
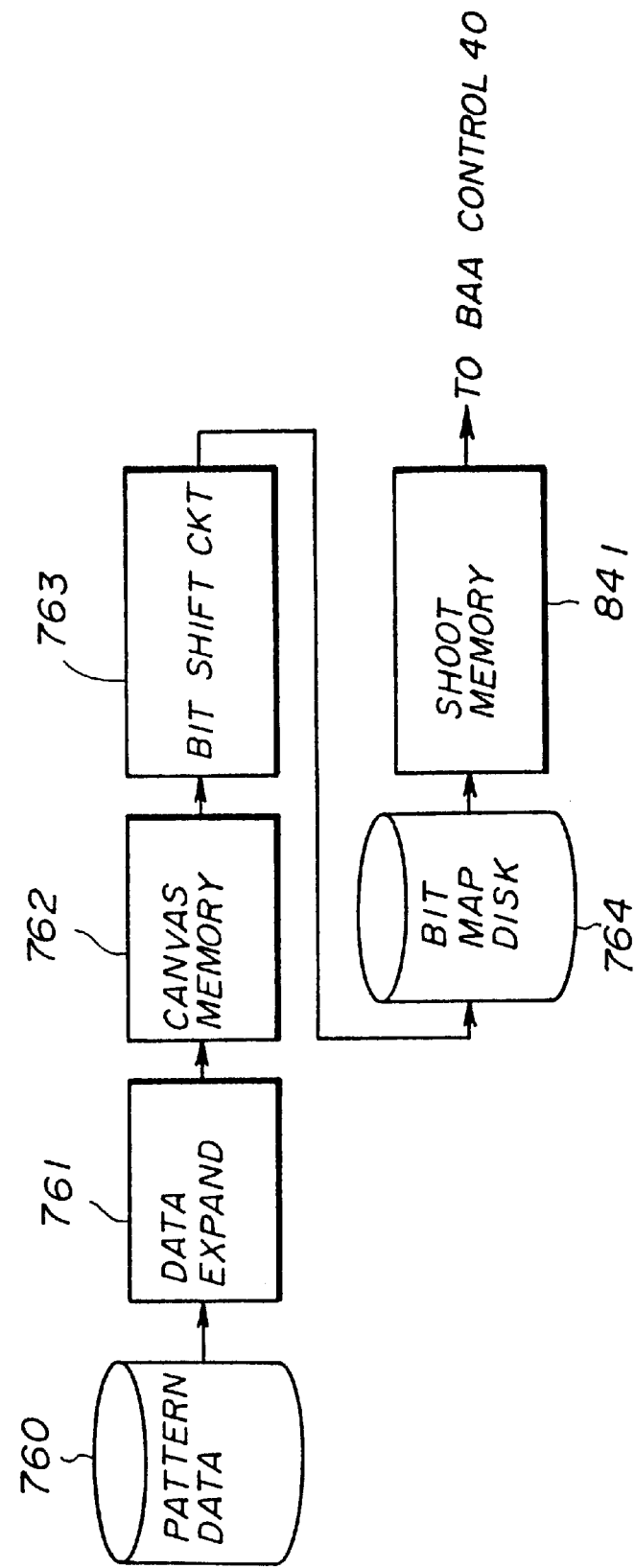
FIG. 38 is a block diagram showing the construction of the circuit used for implementing the fifth embodiment of the present invention.

FIG. 38 shows the construction of a data processing system used in the BAA exposure system that carries out the foregoing exposure.

Referring to FIG. 38, the data processing system includes a shoot memory 841 provided inside the main control circuit 724 of FIG. 24, wherein a pattern data disk 760, a data expansion unit 761, a canvas memory 762, a bit shift circuit 763 and a bit map disk 764 cooperate with the main control circuit 724. Thus, one can use a conventional bit map expansion unit provided in the system of FIG. 24, without substantial modification. Further, the pattern disk 760 and the bit map disk 764 have a storage capacity used conventionally in the BAA exposure system. The shoot memory 841 is a high speed bitmap memory typically formed of a dynamic random access memory.

It should be noted that the pattern data disk 760 includes fundamental pattern data including parameters and data that specifies the parameters, wherein the fundamental pattern data includes a code indicative of the pattern shape and size data indicative of the size of the pattern.

The data expansion unit 761 reads out the pattern data from the disk 760 and expands the same in the form of bit map, wherein the bit map thus expanded is stored in the canvas memory 762. The bit map data thus expanded assumes a logic value "1" when the data point falls inside the square pattern having a size of d/2 for each edge, while a logic value "0" when the data point falls outside the square pattern.

The bit shift circuit 763, on the other hand, decreases the bitmap data to ¼ by eliminating unnecessary data and further causes a shift of the bit indicated in FIG. 36 by a solid circle to the position of the corresponding open circle. The data thus shifted is stored in the bitmap disk 764.

The data thus stored in the bit map disk 764 is read out, upon exposure, one block by one block and is held in the shooting memory 841.

Figure 39A:
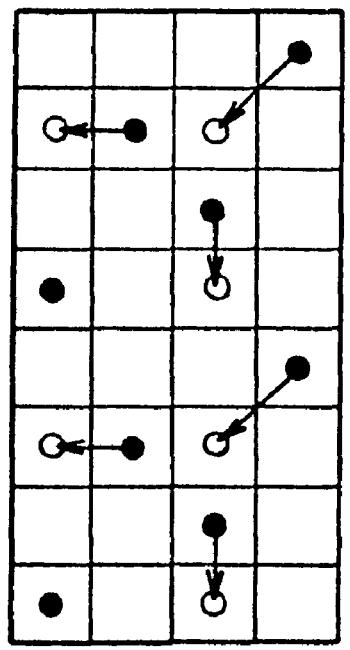
FIGS. 39A–39C are diagrams showing the construction and principle of the circuit of FIG. 38.

FIG. 39A shows the bit map for two cells, wherein each division or box in FIG. 39A corresponds to one bit of data. The data used for the actual exposure is stored in the box represented by a solid circle.

Figure 39B:
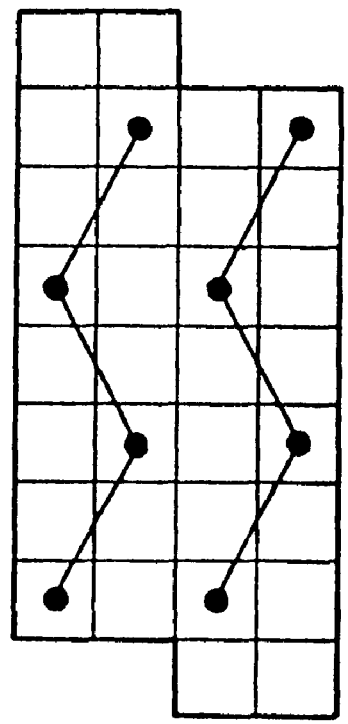

It will be noted that one obtains a symmetric bit map pattern shown in FIG. 39B by eliminating the data represented by the open circles, connecting a solid circle with a corresponding solid circle located at a lower left direction thereof to form dot pairs, and shifting the dot pairs located at the left side in the upward direction by one division.

Figure 39C:
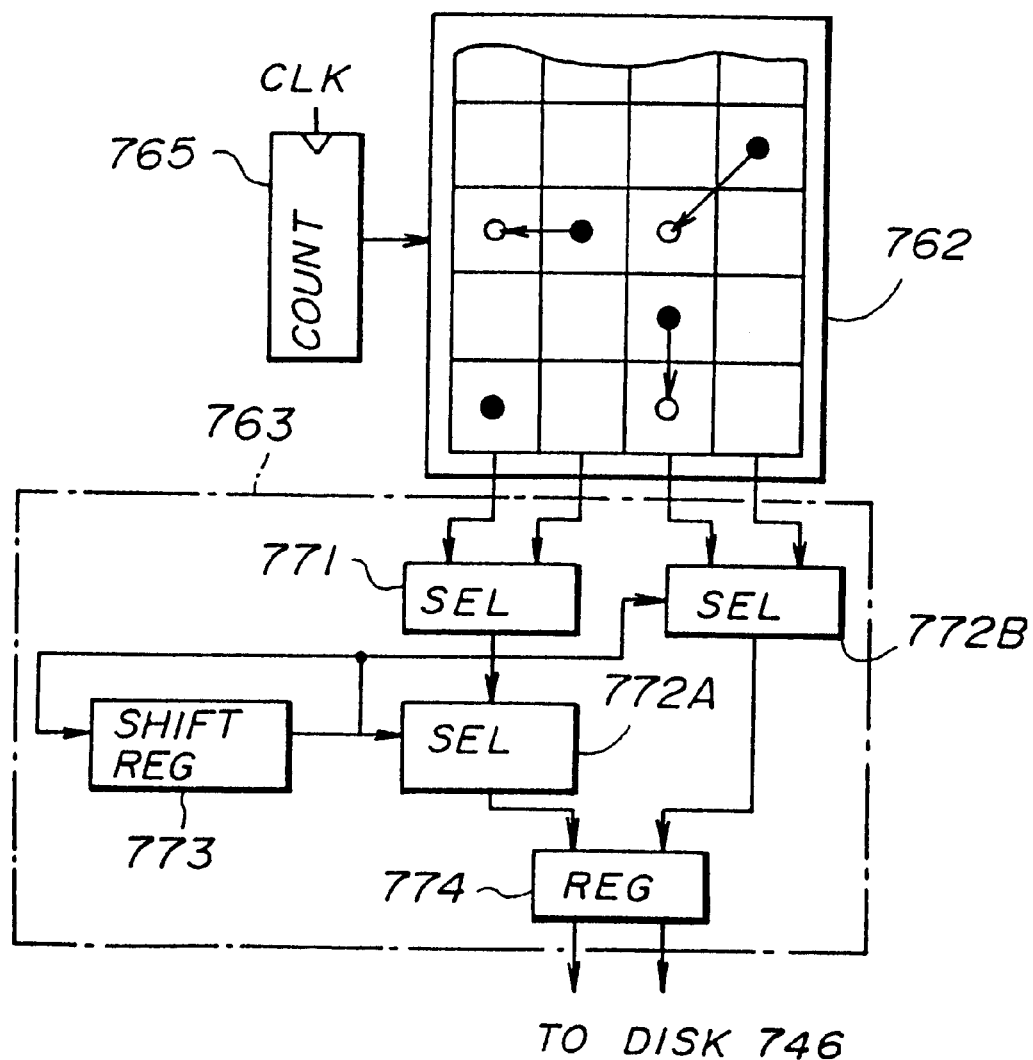

It should be noted that the bit shift circuit 763 utilizes the symmetric nature of the bit map shown in FIG. 39D and is constructed as indicated in FIG. 39C, wherein FIG. 39C shows a case wherein one word or the canvas memory 762 includes four bits in correspondence to the cell width, for the sake of simplicity. The canvas memory 762 is addressed by the clock count of a counter 765.

In FIG. 39C, it should be noted that there is provided a two-bit register 771 that causes the foregoing shift of the left side area of the bit map field in the upward direction by one bit. Further, there are provided selectors 772A and 772B, wherein the selectors 72A and 72B are used for selecting the data represented by the solid circles in FIG. 39H. The selectors 772A and 772B are supplied with respective control signals from a circulating shift register 73 running with a period of two bits, and the bit data selected by the selectors 772A and 772B is held in a two-bit register 774. It should be noted that the clock is supported to the shift register 773 and to the register 774 with a clock having a period twice as large as the clock supplied to the counter 765 and to the register 771.

By using the bit shift circuit 763 having such a simple construction, it is possible to cause a shift of the data for the bit data acquisition point indicated by the solid circles to the corresponding beam spot points represented by the open circles, at a high speed. Further, unnecessary data is eliminated, and one can reduce the amount of data to be ¼ as compared with the case where no such a process is employed.

[first modification of the fifth embodiment]

In the foregoing fifth embodiment of the present invention, the separation between the bit data acquisition points is set to d/2 for both the X- and Y-directions, while it is possible to reduce the separation further.

Figure 40:
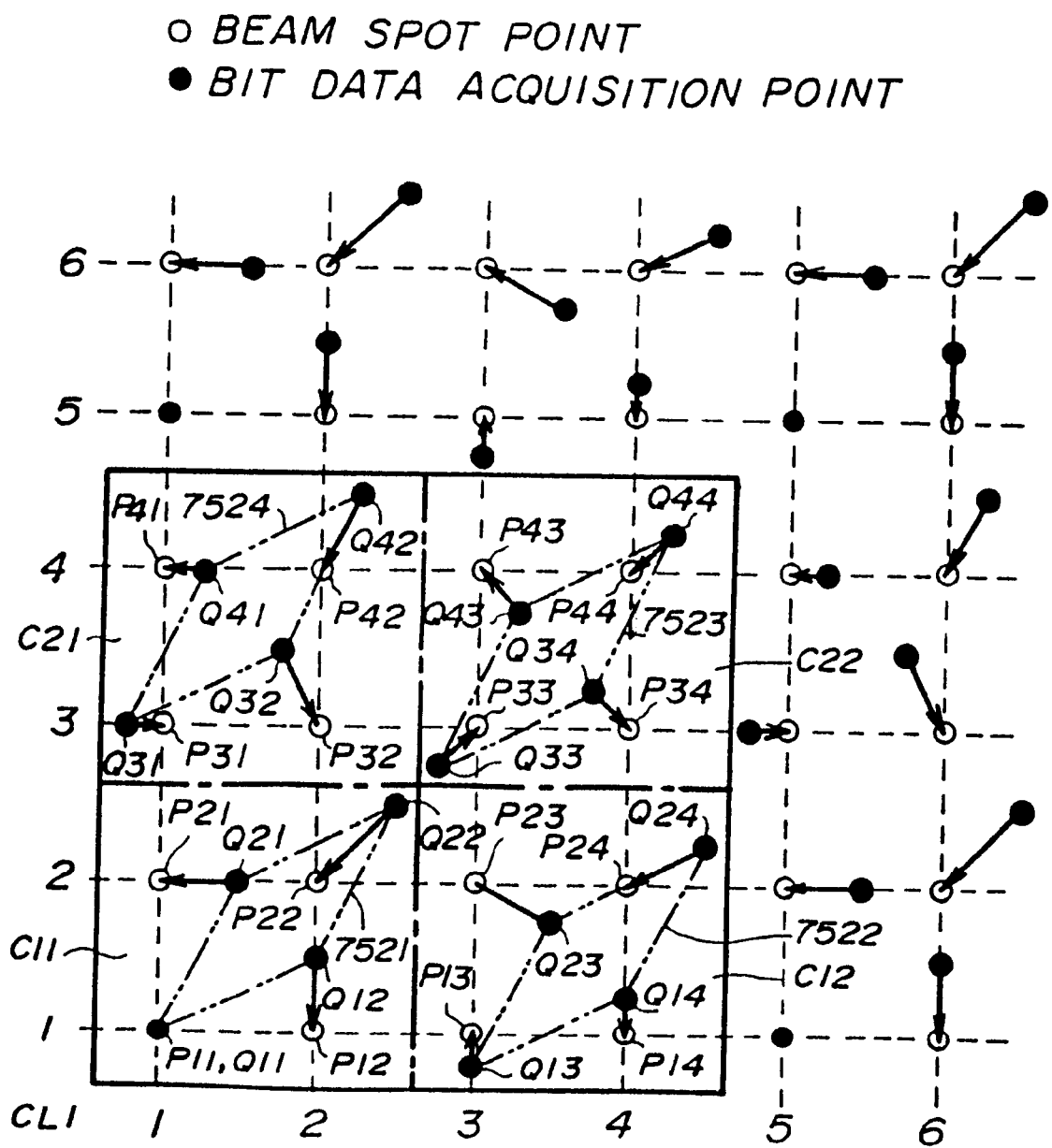
FIG. 40 is a map showing the relationship between a bit data acquisition point and a corresponding beam spot point according to a first modification of the fifth embodiment.

FIG. 40 shows the relationship between the bit data acquisition points and the corresponding beam spot points according to a first modification of the fifth embodiment.

Referring to FIG. 40, four different cells, C11, C12, C22 and C21 are grouped to form a cluster CL1, wherein the clusters thus defined are repeated in rows and columns. It should be noted that cell C11 is identical with the one shown in FIG. 35. Further, the bit data acquisition points are disposed at the corners of the rhomboids 7521–7524 that are identical in size and shape, wherein the rhomboid 7522 is formed with a shift of d/4 in the downward direction with respect to the rhomboid 7521, while the rhomboid 7524 is shifter to the left with respect to the rhomboid by a distance of d/4. Further, the rhomboid 7523 is shifted to the left with respect to the rhomboid 7522 with a distance of d/4.

Similarly as in the case of FIG. 35, the data for the points Q11–Q44 are used for the exposure of the points P11–P44, respectively.

Figure 41A:
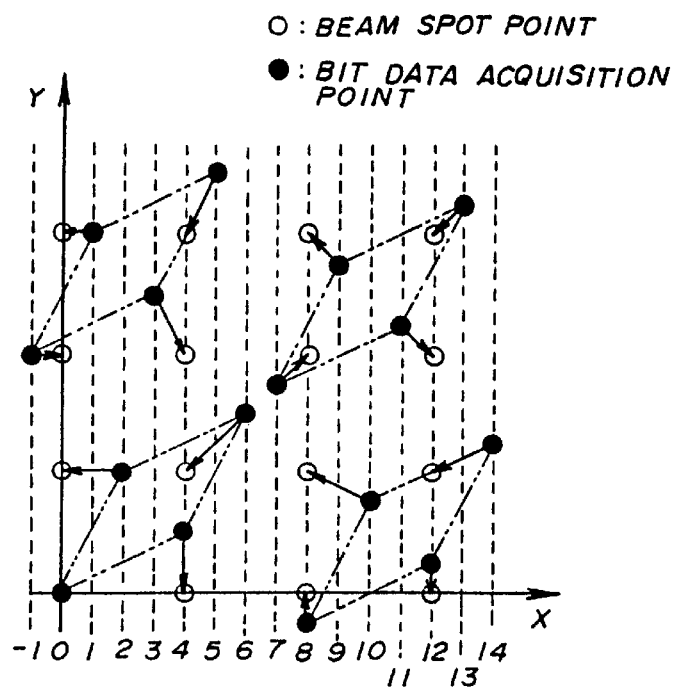
FIGS. 41A and 41B are diagrams showing the relationship between a movement of a pattern boundary and the bit data acquisition point in a cluster of FIG. 40 according to the first modification.
Figure 41B:
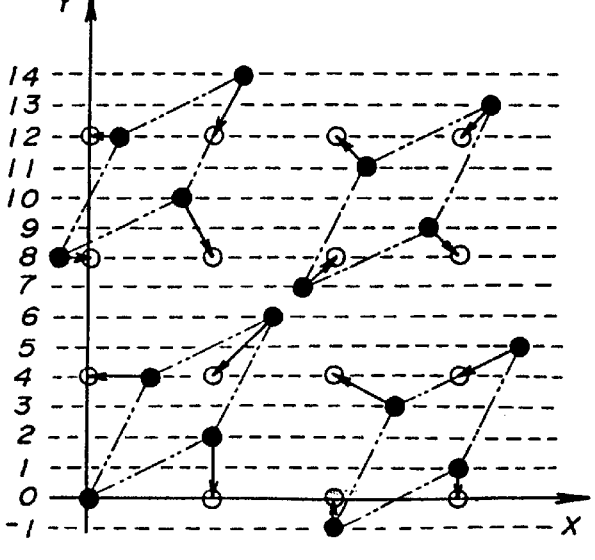
Figure 42A:
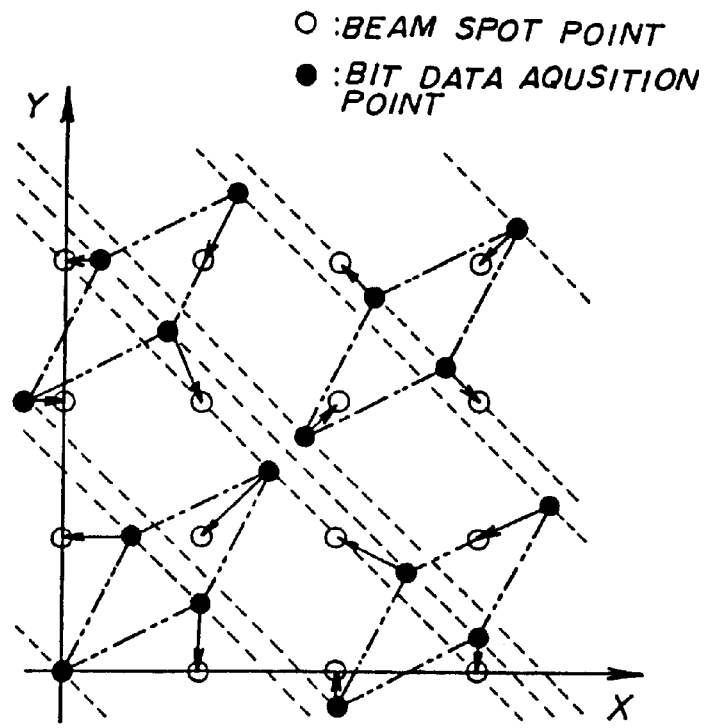
FIGS. 42A and 42B are diagrams showing other examples of the relationship between a movement of a pattern boundary and the bit data acquisition point in a cluster of FIG. 40.
Figure 42B:
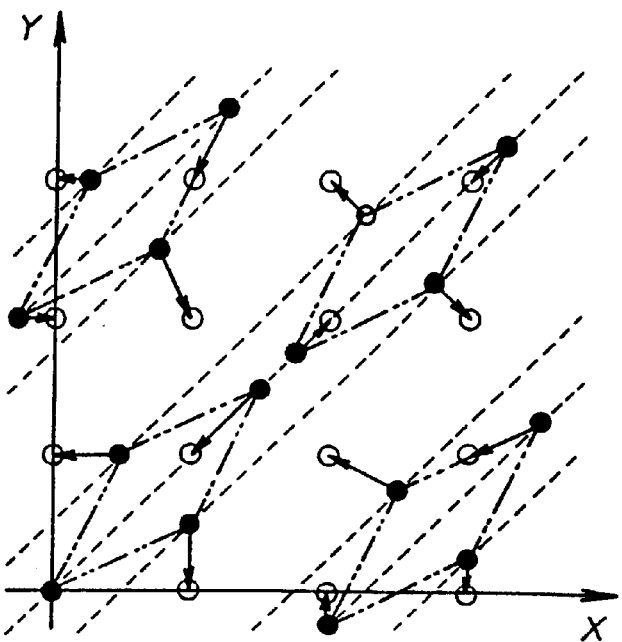

FIGS. 41A and 41B as well as FIGS. 42A and 42B show the relationship between the translation of the pattern boundary and the data acquisition point for one cluster shown in FIG. 40. As Will be apparent from FIGS. 41A and 41B, the number of the exposure dot increases in each of the clusters each time the pattern boundary, which is parallel to one of the Y- and X-axes, moves by a distance of d/4. Thereby, it is possible to achieve a fine adjustment of the boundary of the exposure pattern.

In the case of FIGS. 42A and 42B, too, it will be noted that there are nine dotted lines passing in parallel through the solid circles, in contrast to the case where there are seven lines passing through the open circles, wherein the representation of the seven lines are omitted from illustration. Thereby, one can achieve a fine adjustment of the pattern boundary. Although FIGS. 42A and 42B show non-uniform separation of the dotted lines, it should be noted that there exist other dotted lines when the effect of surrounding clusters is taken into consideration, and the wide gap of the dotted lines is substantially reduced.

Figure 43A:
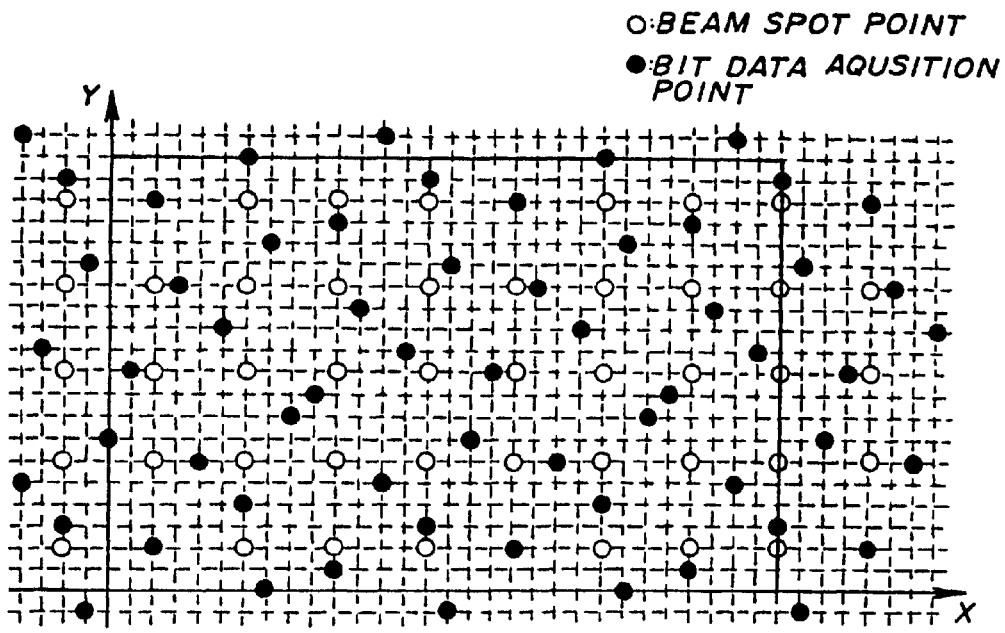
FIGS. 43A, 44A, 45A and 43B, 44B, 45B are diagrams showing various examples of modification of the rectangular pattern data and corresponding rectangular exposure patterns.
Figure 43B:
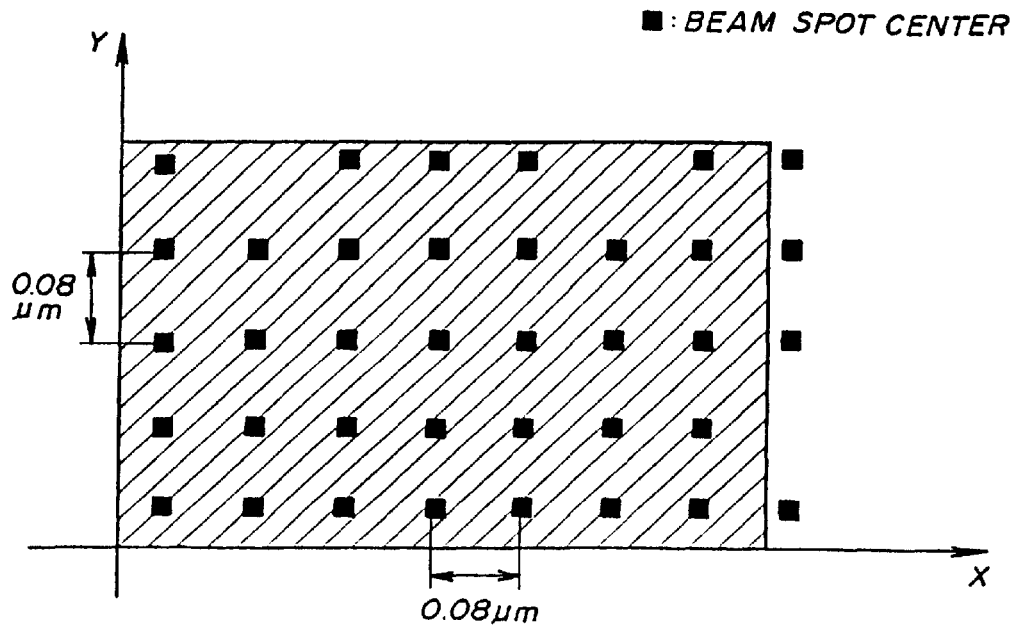
Figure 44A:
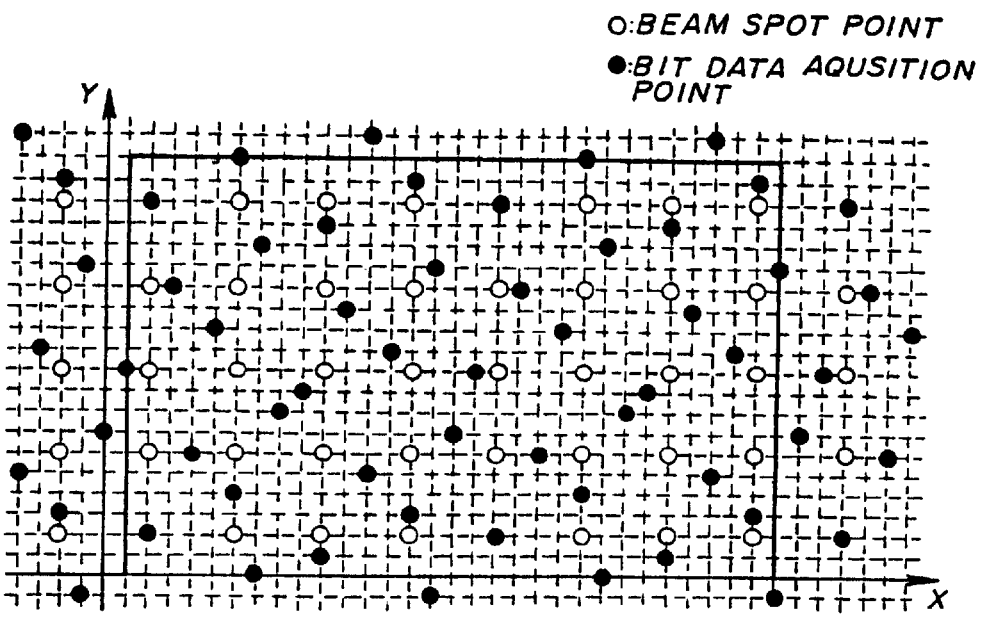
Figure 44B:
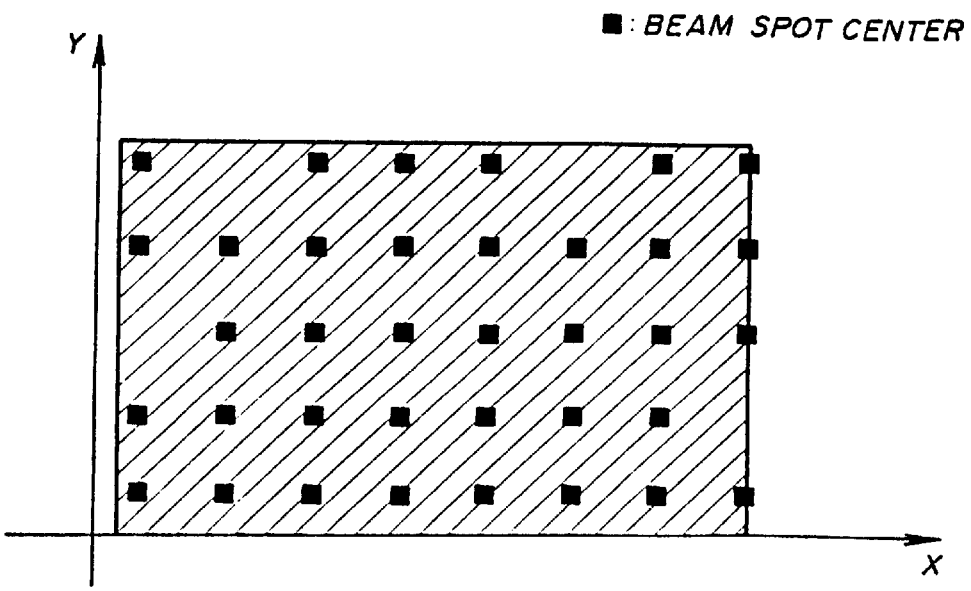
Figure 45A:
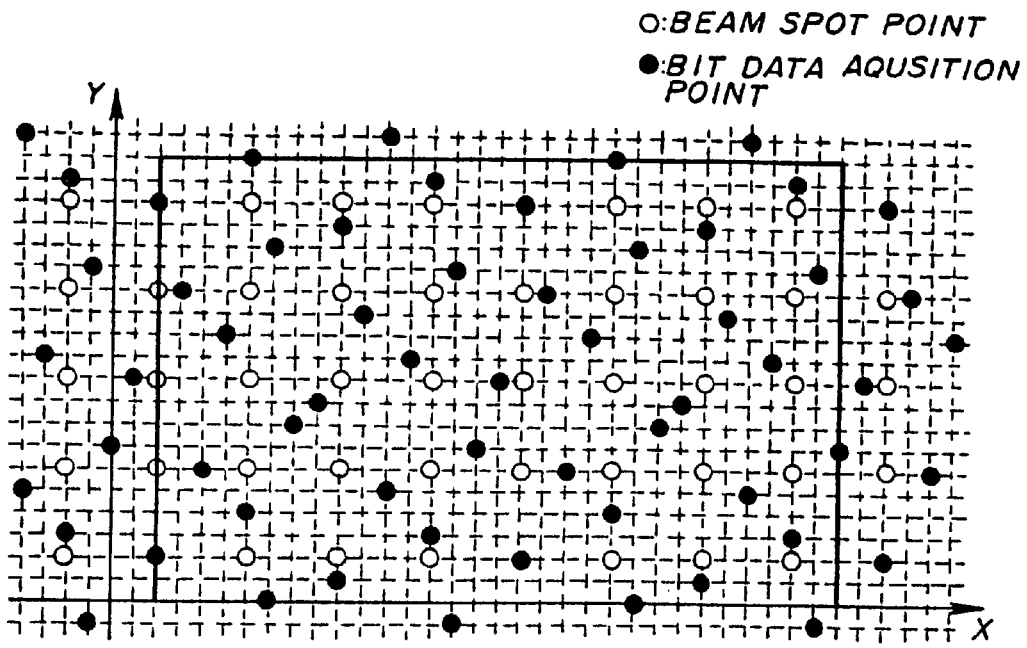
Figure 45B:
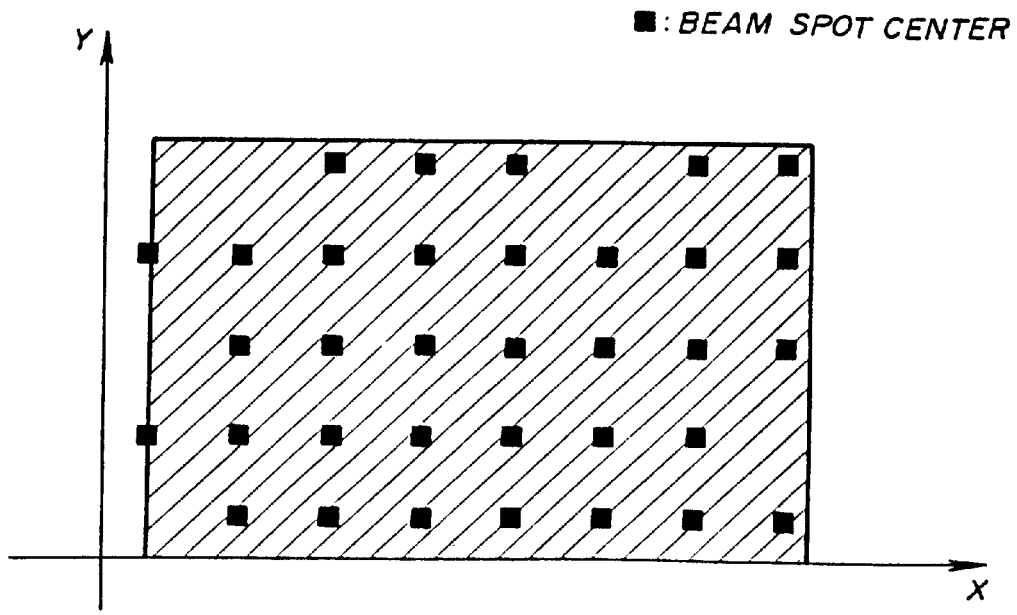

FIGS. 43A, 44A and 45A show rectangular patterns while FIGS. 43B, 44B and 45B show the corresponding exposure dots as well as the exposure pattern corresponding to the exposure dots.

Referring to FIGS. 43A and 44A, it will be noted that the pattern of FIG. 44A is obtained by shifting the pattern of FIG. 43 in the X-direction by a distance of d/4. Similarly, the pattern of FIG. 45A is obtained by shifting the pattern of FIG. 44A in the X-direction by the distance of d/4. From these drawings, it will be noted that the that the exposure pattern shifts by the distance of approximately d/4 each time the rectangular pattern is shifted by the distance of d/4.

Figure 46A:
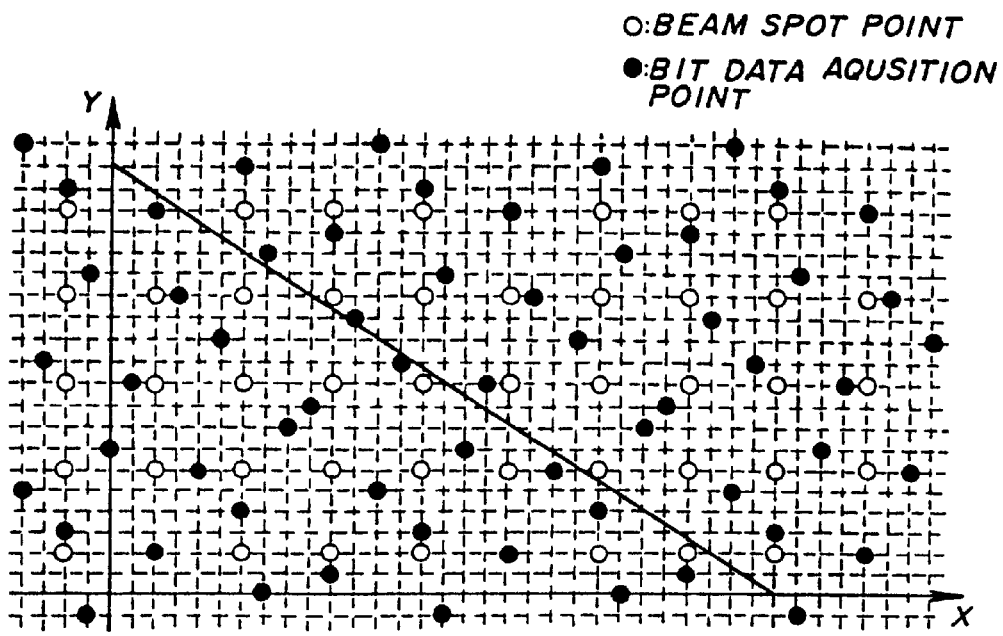
FIGS. 46A, 47A, 48A and 46B, 47B, 48B are diagrams showing various examples of modification of the triangular pattern data and corresponding triangular exposure patterns.
Figure 46B:
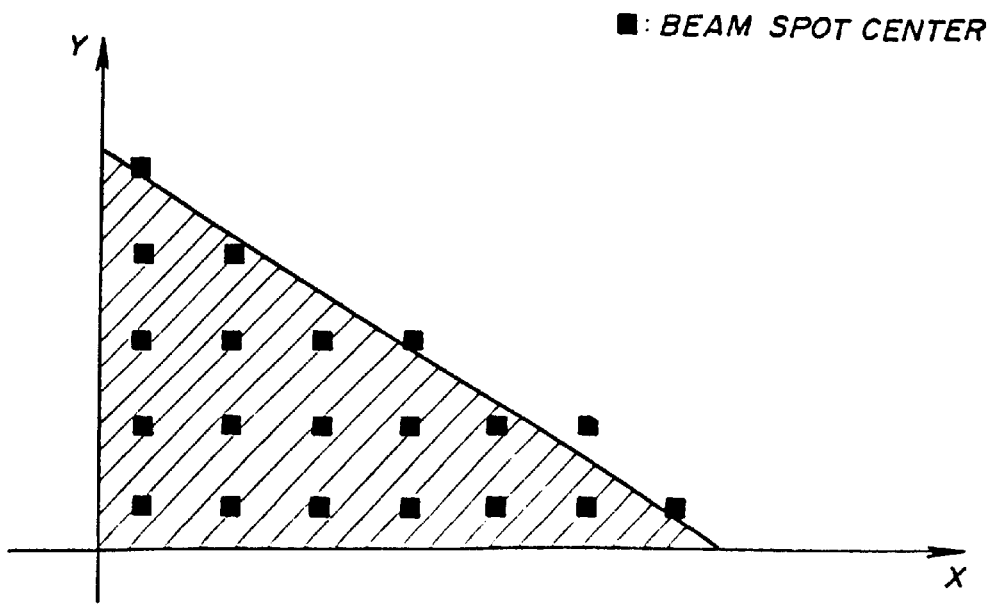
Figure 47A:
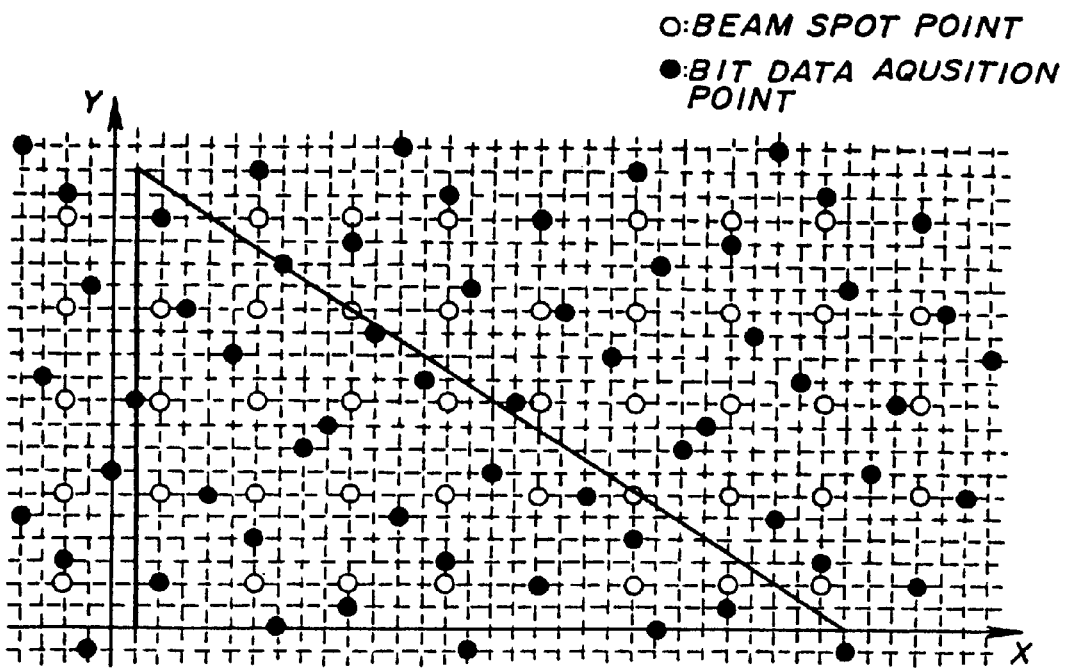
Figure 47B:
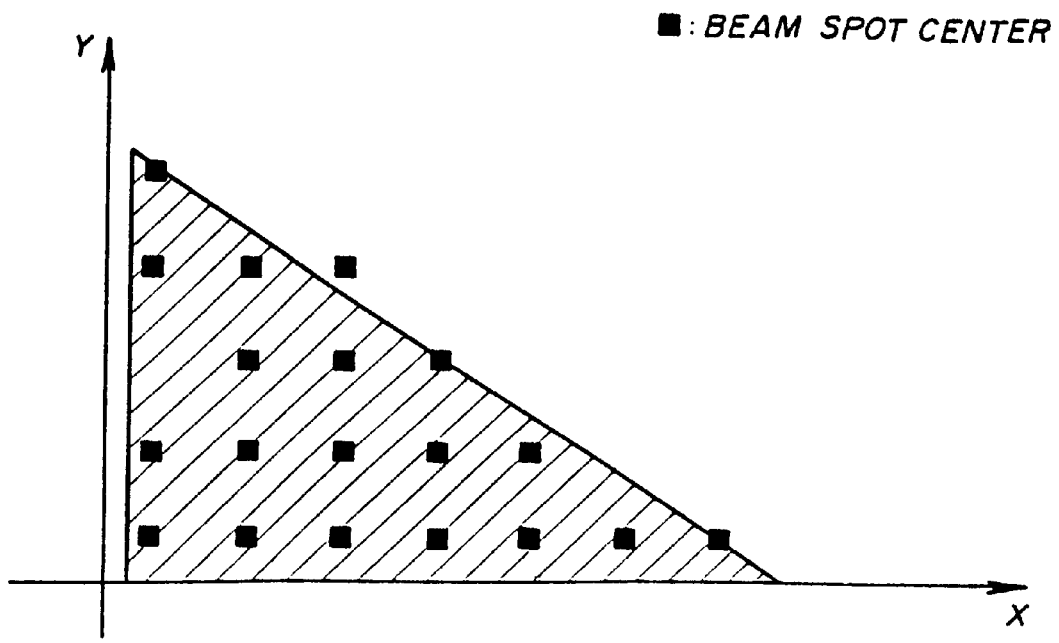
Figure 48A:
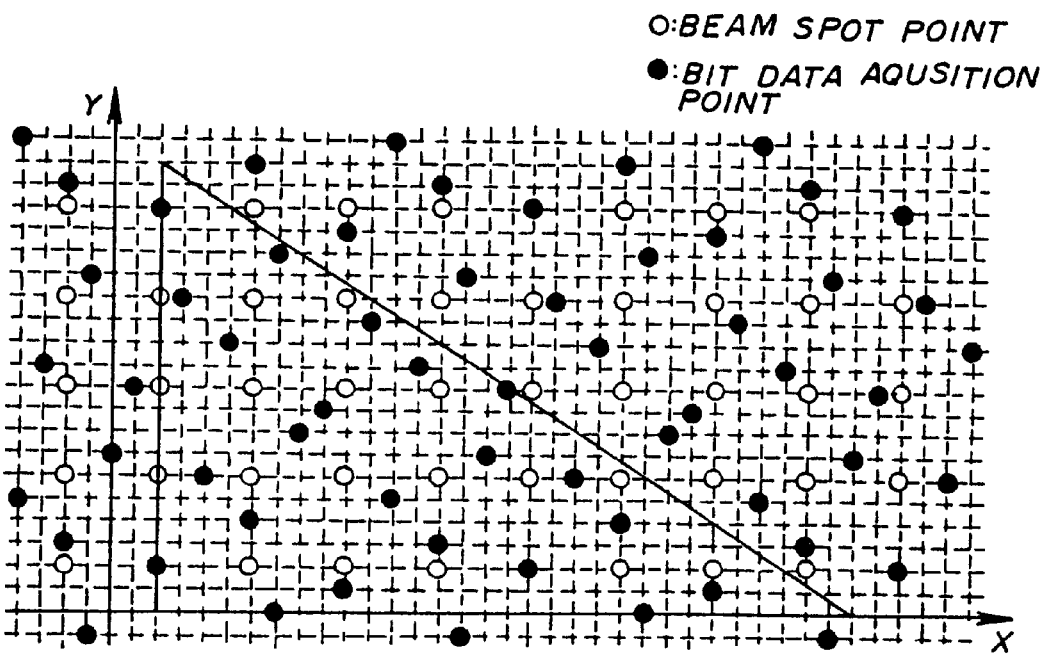
Figure 48B:
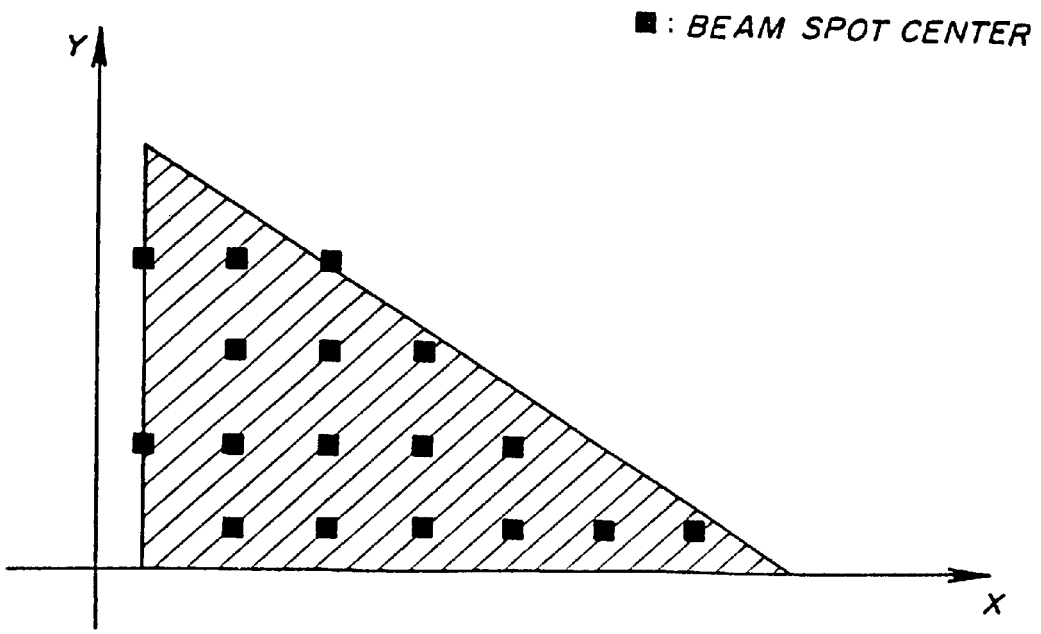

FIGS. 46A, 47A and 48A show the exposure of a triangular pattern, while FIGS. 46B, 47B and 48B show the corresponding exposure dots used for the exposure of the triangular patterns.

Referring to FIGS. 46A and 47A, it will be noted that the pattern of FIG. 47A is identical to the pattern of FIG. 46A except that the pattern of FIG. 47A is shifted in the X-direction by a distance of d/4. Similarly, the pattern of FIG. 48A is identical to the pattern of FIG. 47A except that the pattern of FIG. 48A is shifted in the X-direction by the distance of d/4. It will be noted that the exposure pattern shifts by approximately d/4 each time the rectangular pat tern is shifted by the distance of d/4.

Figure 49A:
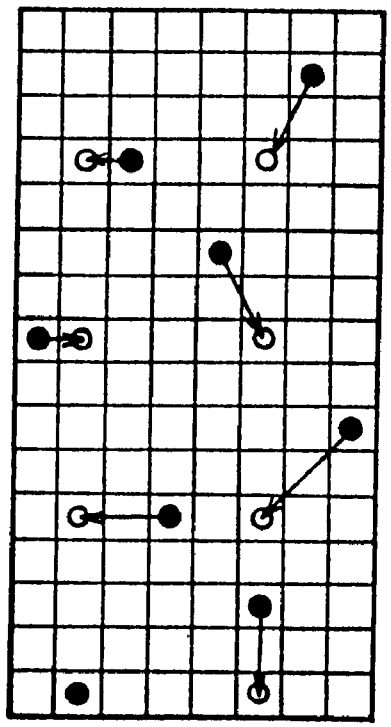
FIGS. 49A–49C are diagrams showing the construction and principle of the circuit of FIG. 38 according to the first modification of the fifth embodiment.

FIG. 49A shows a bit map corresponding to one half of the cluster CL1 of FIG. 40, wherein one division of FIG. 49A corresponds to one bit data. Similarly as before, the data actually used for the exposure is the bit marked by a solid circle.

Figure 49B:
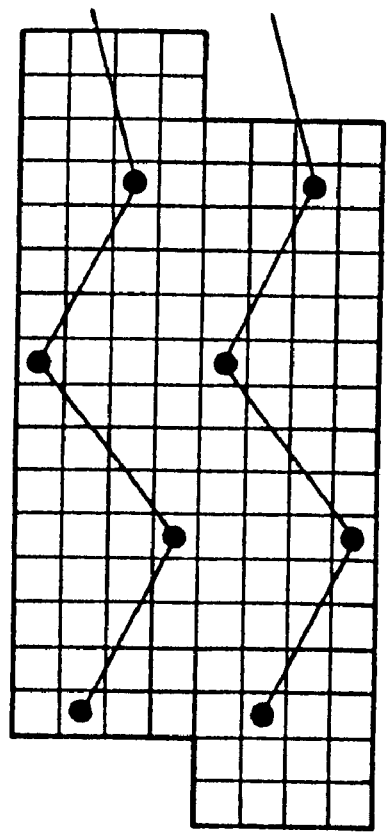

Referring to FIGS. 49A and 49B, one obtains the pattern of FIG. 49B by eliminating the open circles, connecting the solid circles generally aligned in the vertical direction by respective continuous lines, and shifting the solid circles connected by the continuous lines at the left side, in the upward direction by two bits. Thereby, a symmetrical pattern is obtained as indicated in FIG. 49B.

Figure 49C:
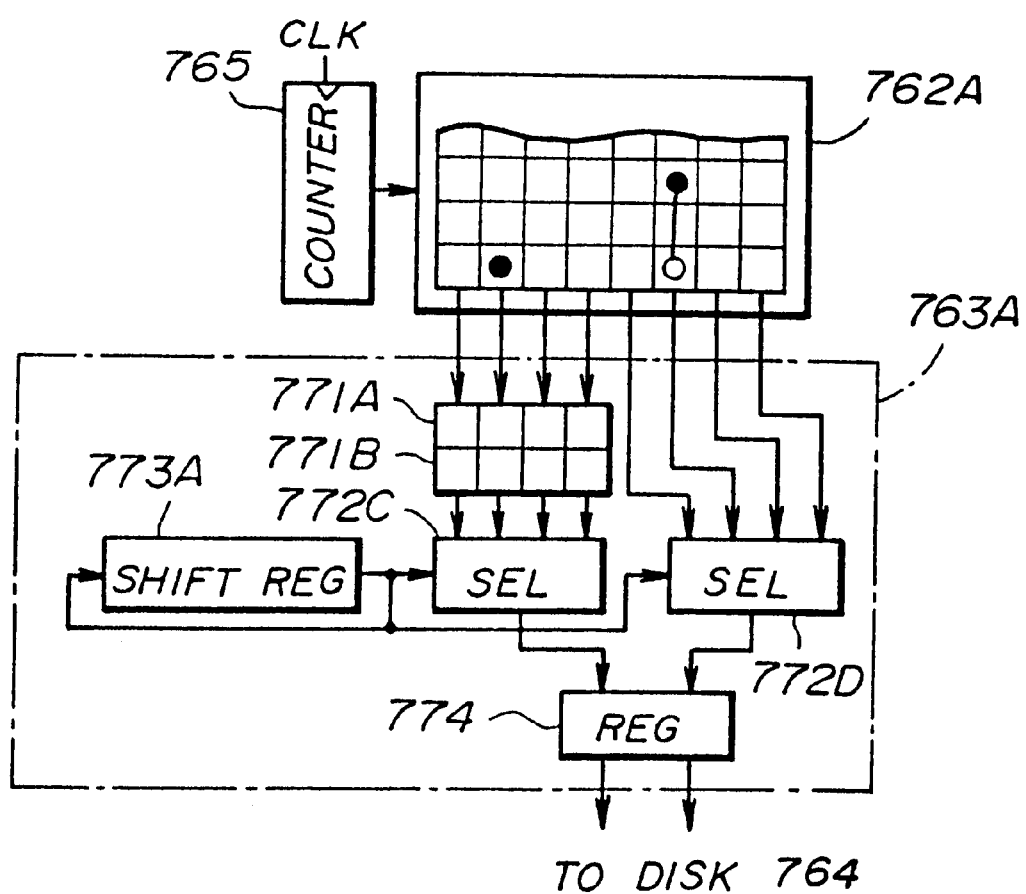

In this case, the construction shown in FIG. 49C is used, wherein the circuit of FIG. 49C has a similar construction as in FIG. 49 and includes a bit-shift circuit 63A in place of the bit-shirt circuit 63, wherein it is assumed in FIG. 49C that the one word of the bit map memory includes eight bit data in correspondence to the cell width, for the sake of simplicity.

Referring to FIG. 49C, there are provided four-bit registers 771A and 771B arranged in two stages, wherein the registers 771A and 771b causes the two-bit shift of the four-bit data corresponding to the left-half of the bit map field, in the upward direction. Further, there are provided selectors 772C and 772D for selecting the data designated by the solid circles, wherein the selectors 772C and 772D are controlled by a circulating shift register 773A running with the period of four bits. The data selected by the selectors 772C and 772D is held in a two-bit register 774.

The period of the clock supplied to the shift registers 73 and 74 is set four times as large as the period of the clock supplied to the address counter 765 of the canvas memory 762A or to the registers 771A and 771B.

By using the simple construction of FIG. 49C, it is possible to transfer the data of the bit data acquisition point to the point of actual exposure at a high speed. Further, such a process eliminates unnecessary data and the data is compressed by a factor of ⅟16.

It is of course possible to construct the two-stage registers 771A and 771B by using four two-bit shift registers. Further, one may use a quarternary counter and a detection circuit for detecting the count of the quarternary counter in place of the circulating shift register 773A.

[second modification of the fifth embodiment]

It should be noted that there are various selection of the clusters.

Figure 50:
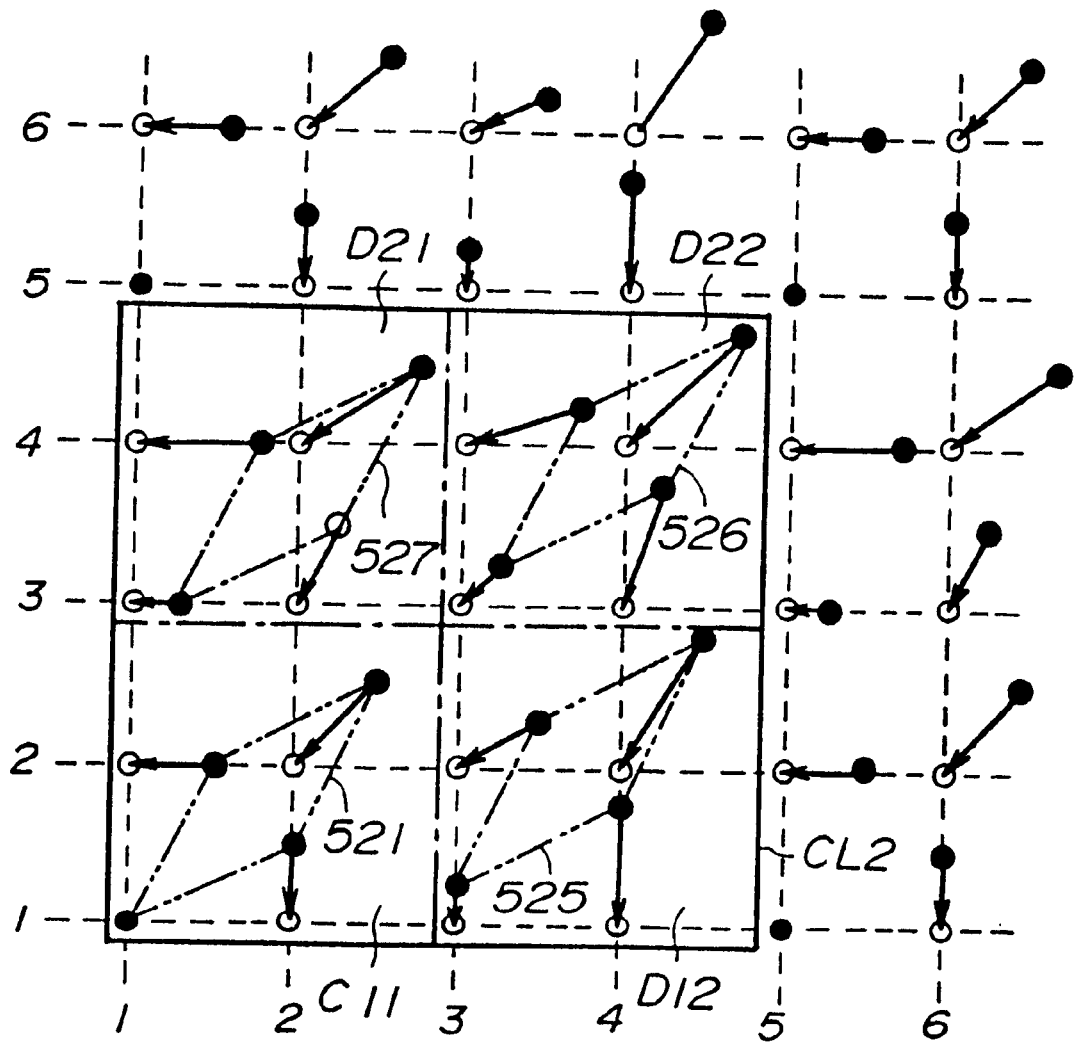
FIG. 50 is a map showing the relationship between a bit data acquisition point and a corresponding beam spot point according to a second modification of the fifth embodiment.

FIG. 50 shows the relationship between the bit data acquisition points and the beam spot points according to a second modification of the fifth embodiment.

Referring to FIG. 50, the cluster CL2 includes four different cells C11, D12, D22 and D21, wherein the cell C11 is identical to the one shown in FIG. 40. It should be noted that the bit data acquisition points are located, in each cell, at the corners of the rhomboids 7521, 7525–7527, wherein the rhomboids have an identical shape and size. It will be noted that the rhomboid 7525 is shifted with respect to the rhomboid 7525 in the upward direction by a distance d/4, the rhomboid 7527 is shifted with respect to the rhomboid 7521 to the right by a distance of d/4, and the rhomboid 7526 is shifted with respect to the rhomboid 7525 to the right by a distance of d/4.

Figure 51A:
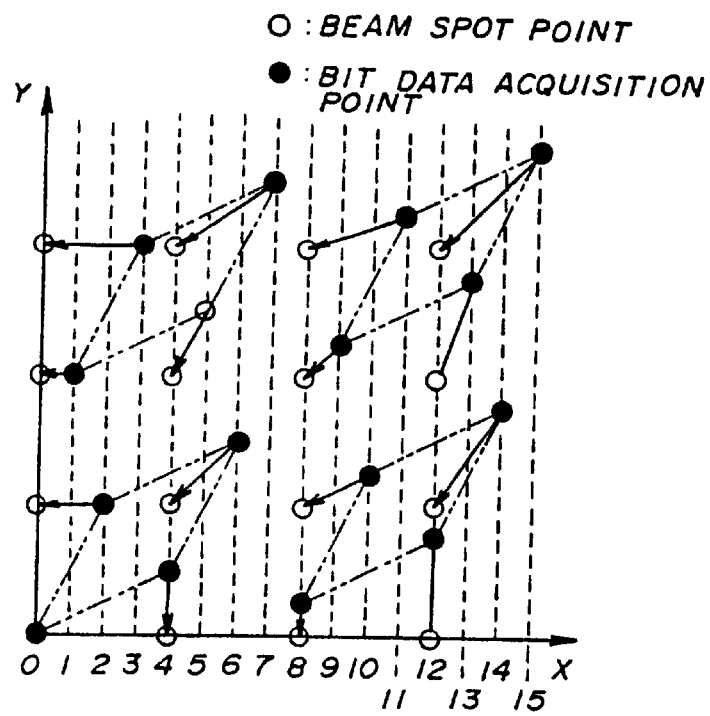
FIGS. 51A and 51B are diagrams showing the relationship between a movement of a pattern boundary and the bit data acquisition point in a cluster of FIG. 50 according to the first modification.
Figure 51B:
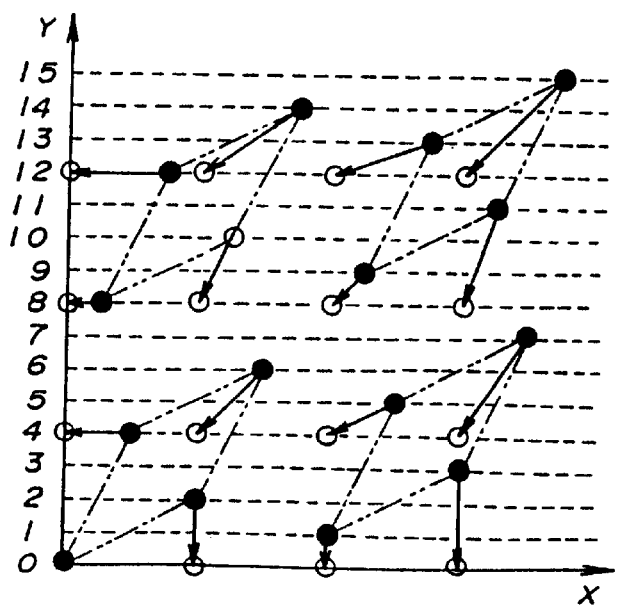
Figure 52A:
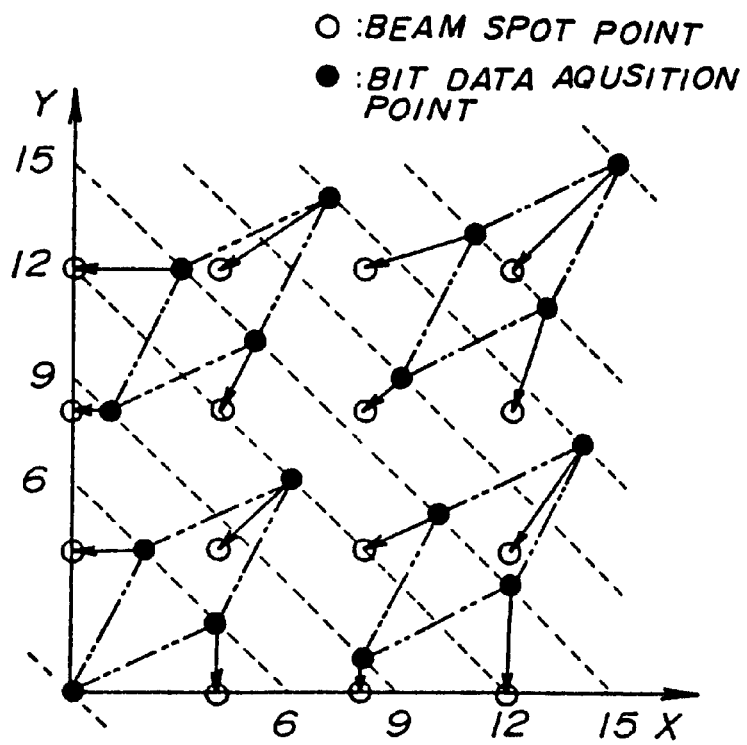
FIGS. 52A and 52B are diagrams showing other examples of the relationship between a movement of a pattern boundary and the bit data acquisition point in a cluster of FIG. 50.
Figure 52B:
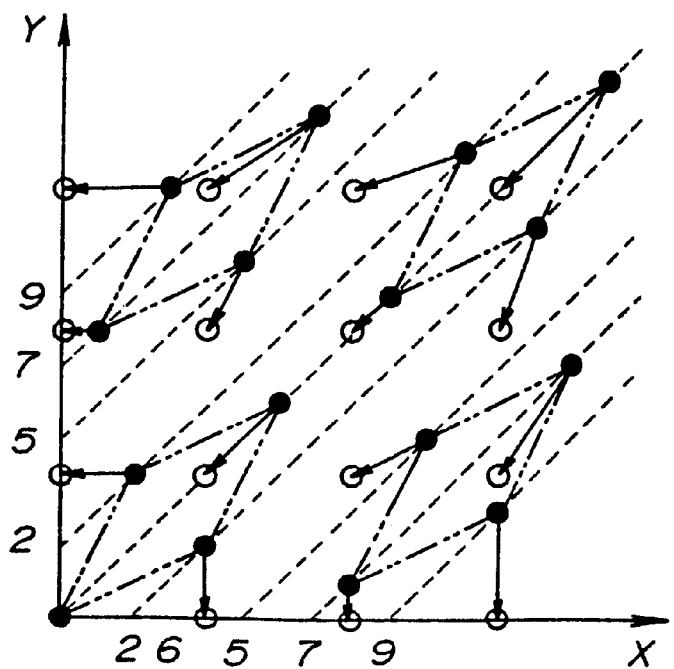

FIGS. 51A and 51B as well as FIGS. 52A and 52B show the relationship between the translation of the pattern boundary and the data acquisition points for one cluster in FIG. 50. As will be apparent from FIGS. 51A and 51B, the shift of pattern boundary parallel to the Y- or X-axis causes, in each cluster, an increase of the beam spots that actually causes the exposure of the dot pattern, Thereby, a fine adjustment of the exposure pattern becomes possible.

In the example of FIGS. 52A and 52B, the dotted lines are formed with a uniform separation. It should be noted that there are nine dotted lines passing through the solid circles while this number is larger than the number of the lines (not shown) passing through the open circles in the direction parallel to the dotted lines. This indicates the possibility of fine adjustment of the pattern boundary as compared with the conventional exposure process. It should be noted that the blank area between the dotted lines also includes similar dotted lines, though not illustrated, wherein such additional dotted lines appear when the effect of the surrounding clusters are taken into consideration.

Further, the present embodiment includes various modifications for the cells, clusters as well as for the construction of the bit shift circuit. on may employ a construction to read out the data 6f the memory cell for the bit data acquisition points two-dimensionally by a single reading step. Further, the construction of the present embodiment in effective to the exposure system that uses the BAA mask shown in FIG. 4 as well as the one shown in FIG. 5.

[sixth embodiment]

Figure 53:
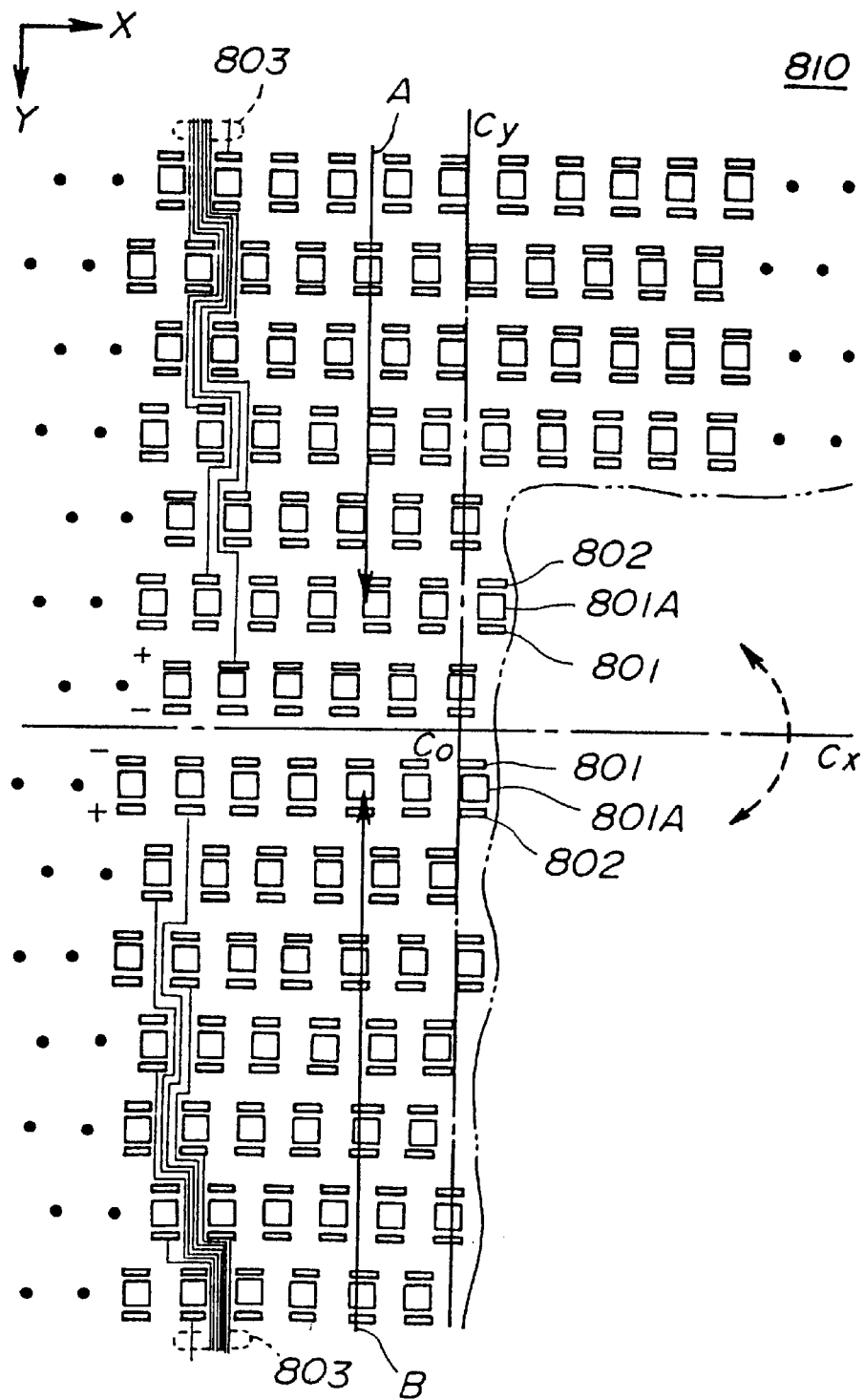
FIG. 53 is a diagram showing the construction of a BAA mask and a problem thereof addressed in a sixth embodiment of the present invention.

FIG. 53 shows a mask region 810 of a BAA mask 800 which is identical to the BAA mask shown in FIG. 5, wherein it will be noted that the BAA mask 800 carries thereon beam shaping apertures 801A arranged in rows and columns in the mask region 810, wherein a ground electrode 801 and a blanking electrode 802 are provided in each of the apertures 801A, similarly as before. The apertures 801A are grouped on the BAA mask region 810 into two groups, one locating above a center line Cx and the other locating below the center line Cx, wherein the BAA mask 800 is disposed so as to interrupt the electron beam emitted from the electron gun, and thus, the BAA mask region 800 is set in the BAA exposure system such that the optical axis of the electron optical system passes through a point co of the mask at which the foregoing center line Cx and a vertical center line Cy of the BAA mask cross with each other.

In the BAA exposure system that uses such a BAA mask 800, the apertures located above the center line Cx induce an electric field A represented by an arrow heading in the downward direction when turning off the electron beam elements formed by the apertures. On the other hand, the apertures located below the center line Cx induce an electric field A as represented by an arrow heading in the upward direction when turning off the pertinent electron beam elements.

Figure 54:
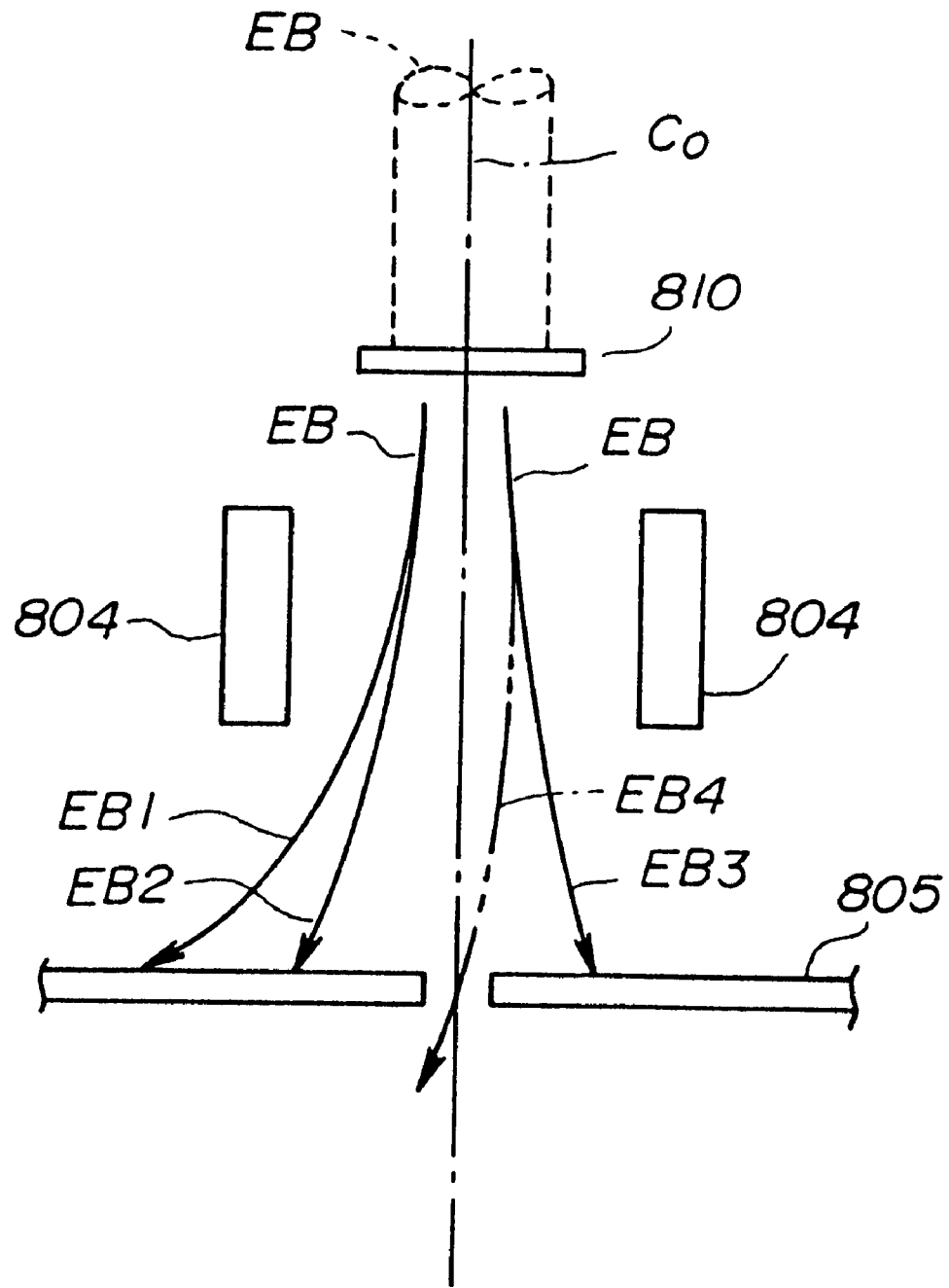
FIG. 54 is a diagram showing the problem caused in a BAA exposure system when the BAA mask of FIG. 53 is used.

In the exposure process using such a BAA mask, there can be a case in which some of the electron beam elements produced by the BAA mask may unwontedly pass through the round aperture when the electron beam elements are collectively deflected by a blanking deflector for turning off the electron beam elements collectively as indicated in FIG. 54.

Referring to FIG. 54, the electron beam element such as the beam element EB2 or EB3 produced as a result of shaping of an electron beam EB by the BAA mask region 810, misses the round aperture provided in a blanking plate 805, which corresponds to the blanking plate 113 of FIG. 3, upon energization of an electrostatic deflector 804 that corresponds to the blanking deflector 116 of FIG. 3. Thereby, the beam elements EB2 and EB3 are successfully turned off on the surface of a substrate that is subjected to the exposure.

On the other hand, when the electrostatic deflector 804 is not energized, the electron beam elements produced by the BAA mask region 810 travels along paths represented by EB1 or EB4, wherein the electron beam element EB1 misses the round aperture on the blanking plate 805 and is turned off. Only the electron beam element EB4 passes through the round aperture and reaches the substrate.

In such an on-off control of the electron beam elements by the electrostatic deflector 804, there some occurs a case in which an electron beam element such as the electron beam element EB3, deflected by the BAA mask region 810 so as to miss the round aperture in the blanking plate 805 is deflected back toward the optical axis Co as a result of energization of the deflector 804, and unwontedly pass through the round aperture in the plate 805. When such a leakage of the electron beam occurs, the exposure of desired pattern on the substrate is no longer possible.

Thus, the present embodiment addresses the problem set forth above and provides a BAA exposure system having a BAA mask wherein the deflection of the electron beam elements is made in the same direction throughout the BAA mask.

Further, the present invention provides, in the present embodiment, a BAA exposure system having a BAA mask wherein the resistance and capacitance of wiring used for carrying drive signals to the electrostatic deflectors provided on the BAA mask, are optimized with respect to the timing of turning on and turning off the apertures of the BAA mask.

More specifically, the present embodiment provides a charged particle beam exposure system for exposing a pattern on an object, comprising:

beam source means for producing a charged particle beam;

beam shaping means for shaping said charged particle beam to produce a plurality of charged particle beam elements in accordance with exposure data indicative of a dot pattern to be exposed on said object;

focusing means for focusing said charged particle beam elements upon a surface of said object; and deflection means for deflecting said charged particle beam elements over said surface of said object;

said beam shaping means comprising:

a substrate formed with a plurality of apertures for shaping said charged particle beam into said plurality of charged particle beam elements;

a plurality of common electrodes provided on said substrate respectively in correspondence to said plurality of apertures each of said plurality or common electrodes being provided in a first side of a corresponding aperture; and a plurality of blanking electrodes provided on said substrate respectively in correspondence to said plurality of apertures, each of said plurality of blanking electrodes being provided in a second, opposite side of a corresponding aperture on said substrate.

Alternatively, the present embodiment provides a beam shaping mask for shaping a charged particle beam into a plurality of charged particle beam elements, comprising:

a substrate formed with a plurality of apertures for shaping said charged particle beam into said plurality of charged particle beam elements;

a plurality of common electrodes provided on said substrate respectively in correspondence to said plurality of apertures, each of said plurality of common electrodes being provided in a first side of a corresponding apertures; and a plurality of blanking electrodes provided on said substrate respectively in correspondence to said plurality of apertures, each of said plurality of blanking electrodes being provided in a second, opposite side of a corresponding aperture on said substrate.

Further, the present embodiment provides a process for fabricating a beam shaping mask for shaping a charged particle beam into a plurality of charged particle beam elements, comprising the steps of:

providing a plurality of conductor patterns on a surface of a substrate with respective thicknesses such that at least one of said conductor patterns has a thickness that is different from the thickness of another conductor pattern; and providing a ground electrode and a blanking electrode on said substrate respectively in electrical contact with said conductor patterns, said ground electrode and said blanking electrode forming a deflector for deflecting said charged particle beam elements.

According to the present embodiment set forth above, the beam shaping mask causes a uniform deflection when turning off the charged particle beam, over entire area of the mask, and the problem of leakage of the deflected charged particle beam elements upon the reversal deflection upon the blanking of the charged particle beam is successfully eliminated. Further, by optimizing the thickness and hence the resistance of the conductor patterns on the beam shaping mask, it is possible to adjust the timing of activation of the individual electrostatic deflectors formed on the beam shaping means for selectively turning off the charged particle beam elements.

Figure 55:
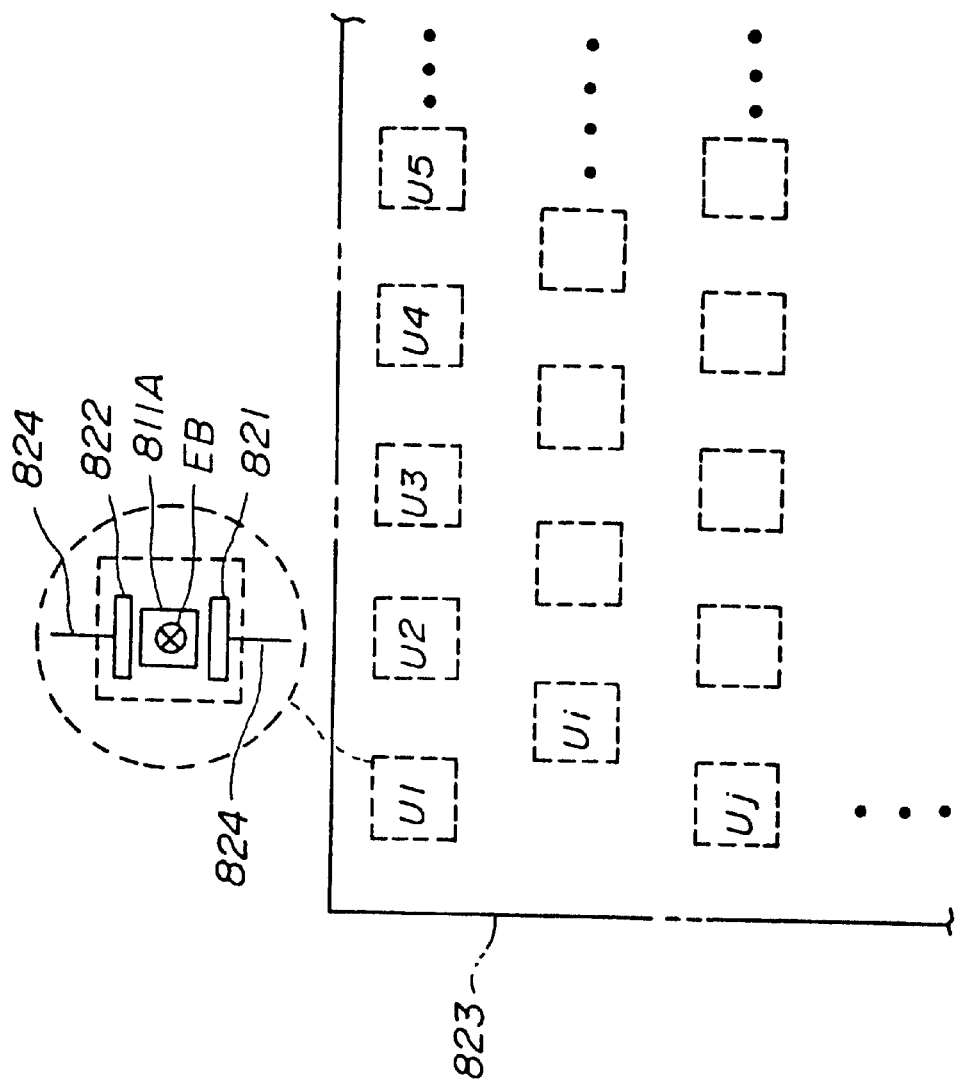
FIG. 55 is a diagram showing the principle of a sixth embodiment of the present invention.

FIG. 55 shows the principle of the BAA mask 800 according to the present embodiment.

Figure 65:
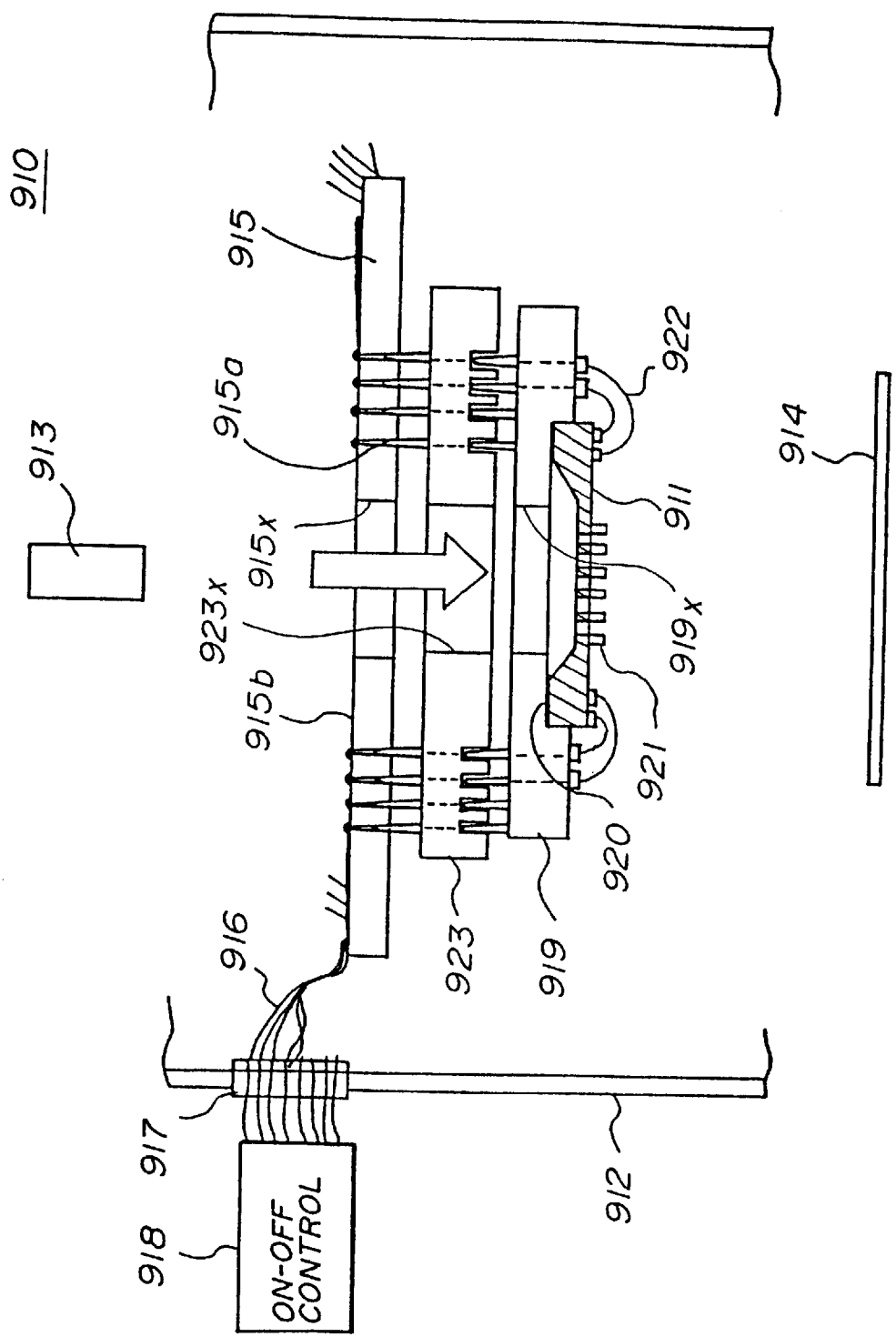
FIG. 65 is a diagram showing a conventional construction for detachably mounting a BAA mask on a BAA exposure system.

Referring to FIG. 65, the BAA mask 800 includes a substrate 823 formed with a number of apertures 811A together with a common, ground electrode 821 and an opposing blanking electrode 822, wherein the electrodes 821 and 822 oppose with each other across the aperture 811A. thereby, a number of deflection units $U_1, U_2, \ldots U_i$ (i=1−n) are formed on the substrate 823 in a row and column formation in correspondence to the region 810.

In order to drive the electrodes 821 and 822 on the BAA mask 800, there is provided a wiring pattern 824 on the surface of the substrate 823 such that the wiring pattern 824 extends toward the marginal part of the substrate 823, wherein the common electrode 821 and the blanking electrode 822 are so disposed that the electric field induced by the electrodes 821 and 822 acts in the same direction throughout the substrate 823 and hence the BAA mask. For this purpose, the electrodes 822 are disposed in the same direction with respect to the corresponding electrodes 821 throughout the BAA mask 800, wherein the cross section of the wiring patterns is optimized for adjusting the resistance and capacitance of the wiring pattern and hence the signal delay caused in the drive signals transmitted through the wiring pattern for activating the electrodes 822 of the apertures. It should be noted that the response time t of a circuit of finite length in given as $$t \propto RCl^2$$

wherein R represents the resistance of the circuit, C represents the capacitance of the circuit, and l represents the length of the circuit.

Figure 56:
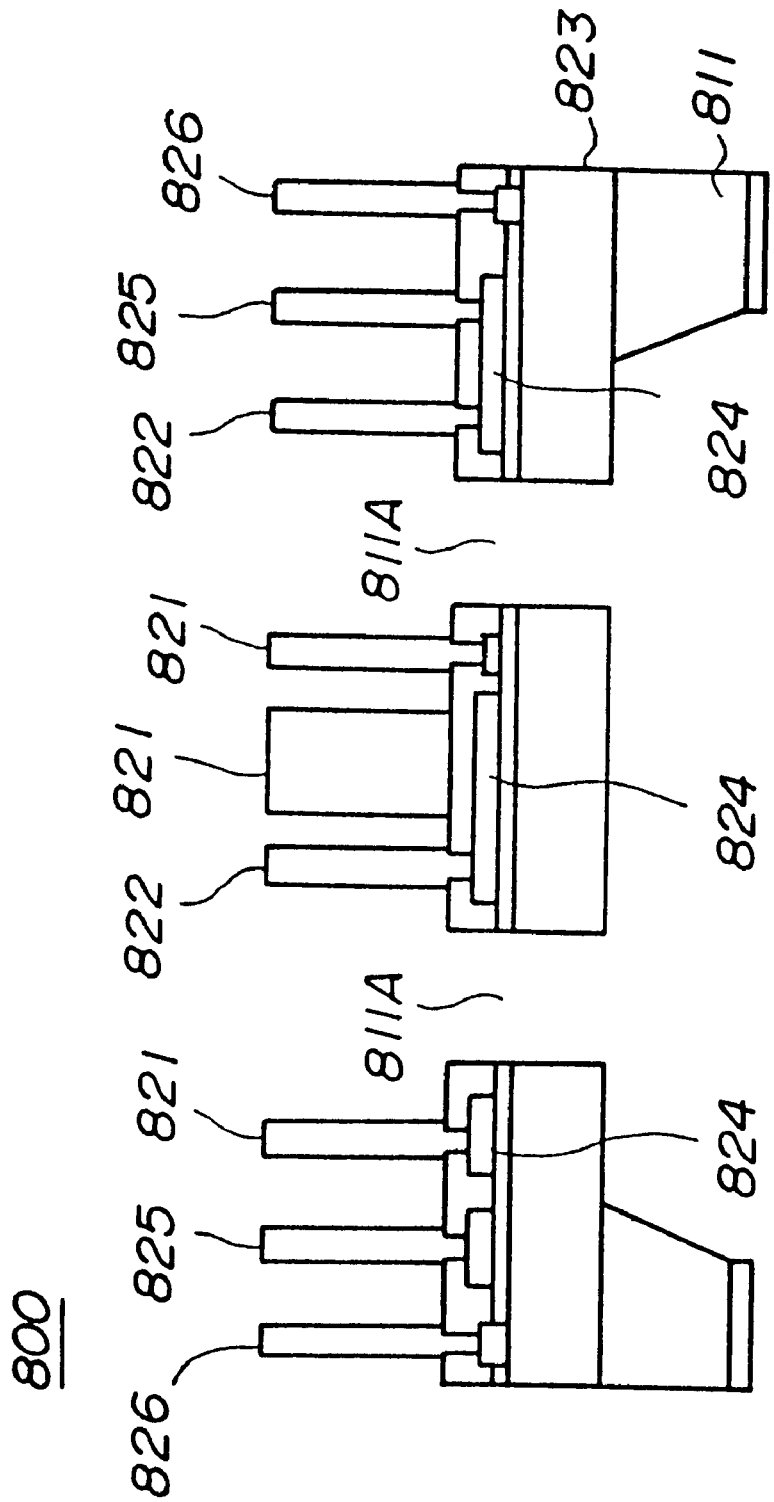
FIG. 56 is a diagram showing the construction of the BAA mask of the sixth embodiment of the Present invention in a cross sectional view.
Figure 57:
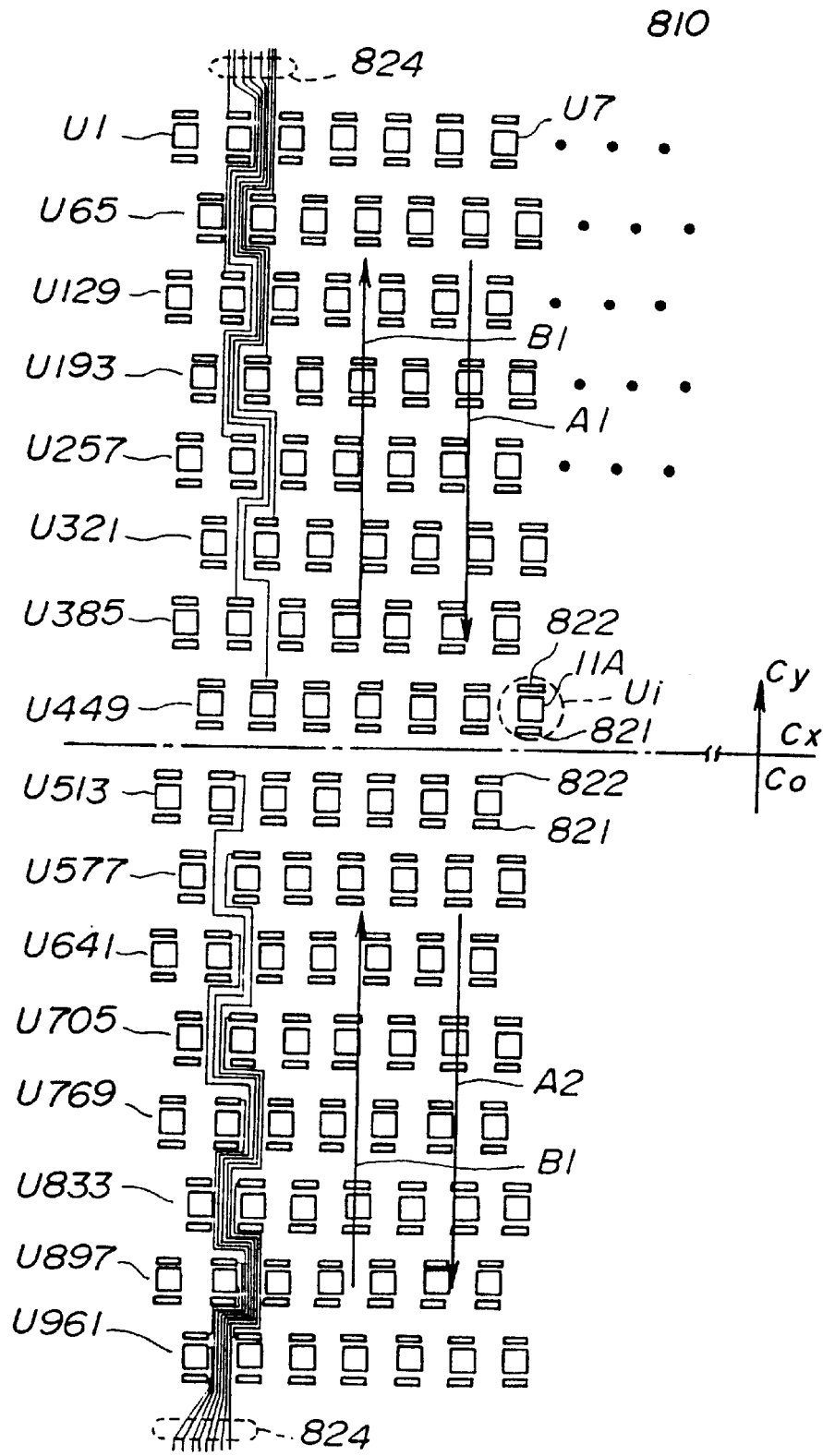
FIG. 57 is a diagram showing the construction of a BAA mask of FIG. 56.

FIG. 56 shows the construction of a BAA mask 800 of the present embodiment in a schematical cross sectional view, while the mask region 810 of the same BAA mask 800 is shown in FIG. 57 in a plan view.

Referring to FIG. 56, the BAA mask 800 is constructed on a boron-doped silicon substrate 823 that carries a surrounding rib or frame 811 for mechanical reinforcement, wherein the apertures 811A are formed on the substrate 823 together With the ground electrodes 821 and blanking electrodes 822 such that a ground electrode 821 faces a corresponding blanking electrode 822 across an aperture 811A.

Further, the substrate 823 carries a conductor pattern 824 for wiring as well as a signal pad 825 and a ground pad 926.

As indicated in the plan view of FIG. 57, the electrodes 821 and 822 are disposed so as to oppose with each other across each of the apertures on the substrate 823 to form a deflection unit Ui, wherein there are in all 1024 such deflection units Ui on the substrate 823. Typically, the substrate 823 may have a size of 3.2 mm×1.2 mm. The apertures 811A are formed on the substrate 823 in 64 columns in the direction of the Cy axis and in 16 rows in the direction of the Cx axis. It will be noted that there are in all 1024 apertures on the substrate 823.

In order to cause the desired deflection of the electron beam passing through the aperture 811A, the ground electrode 821 is connected commonly to the ground pad 826 shown in FIG. 56 together with other ground electrodes 821 on the substrate 823. Further, the blanking electrode 822 is connected to the electrode pad 825 on the substrate 823 via the conductor pattern 824 extending over the surface of the substrate 823.

In the present embodiment, the blanking electrode 822 is provided on the same side of the ground electrode 821 throughout the substrate 823. More specifically, each of the blanking electrodes 822 is disposed at the right hand side (or left hand side) of the corresponding ground electrode 821 throughout the substrate 823 and hence the BAA mask 800.

In much a construction of the BAA mask 800, it should be noted that the conductor pattern 824 is so formed that the signal delay caused in the drive signal as it is propagating through the conductor pattern 824 from the electrode pad 825 to the aperture 811A, is successfully compensated for.

In order to achieve such a compensation of the signal delay, the inventor of the present invention has conducted an experiment for measuring the resistance value of the conductor pattern 804 between the electrode pad 805 to the blanking electrode 822 for each of the apertures 811A.

TABLE I shows the result thus obtained for the resistance value of conductor patterns 824A provided on the BAA mask 800 in the region located above the center line Cx.

TABLE I

| electrode pad # | | resistance (kΩ) |
|---|---|---|
| | 0 | 0.4 |
| 824A | 1 | 17 |
| above | 2 | 17 |
| line Cx | 3 | 21 |
| | 4 | 24 |
| | 5 | 23 |
| | 6 | 21 |
| | 7 | 20 |
| | 8 | 16 |
| | 9 | 14 |
| | 10 | 17 |
| | 11 | 20 |
| | 12 | 21 |
| | 13 | 23 |

TABLE I-continued

| electrode pad # | resistance (kΩ) |
| --- | --- |
| 14 | 21 |
| 15 | 20 |
| 16 | 16 |
| 17 | 20 |
| 18 | 17 |

Similarly, the result of the following TABLE II was obtained for conductor patterns 824B provided on the area of the BAA mask 800 located below the line Cx.

TABLE II

| | electrode pad # | resistance (kΩ) |
| --- | --- | --- |
| | 0 | 0.41 |
| 824B | 1 | 16 |
| below | 2 | 20 |
| line Cx | 3 | 27 |
| | 4 | 23 |
| | 5 | 24 |
| | 6 | 22 |
| | 7 | 19 |
| | 8 | 14 |
| | 9 | 17 |
| | 10 | 20 |
| | 11 | 27 |
| | 12 | 25 |
| | 13 | 24 |
| | 14 | 26 |
| | 15 | 17 |
| | 16 | 14 |
| | 17 | 19 |
| | 18 | 20 |

Figure 58A:
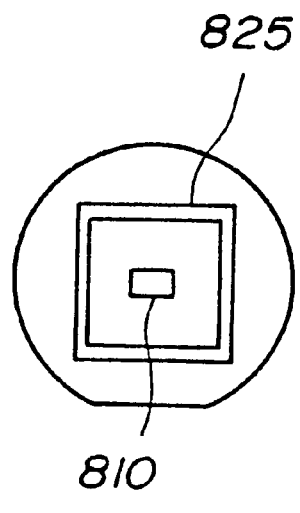
FIGS. 58A–58C are diagrams showing the measurement of the pattern resistance on the BAA mask.

It should be noted that the foregoing measurement of the resistance was made by forming a blanking aperture array corresponding to the BAA Mask 800 on a semiconductor wafer shown in FIG. 58A and by providing the pad electrodes 825 on the marginal part of the wafer.

Figure 58B:
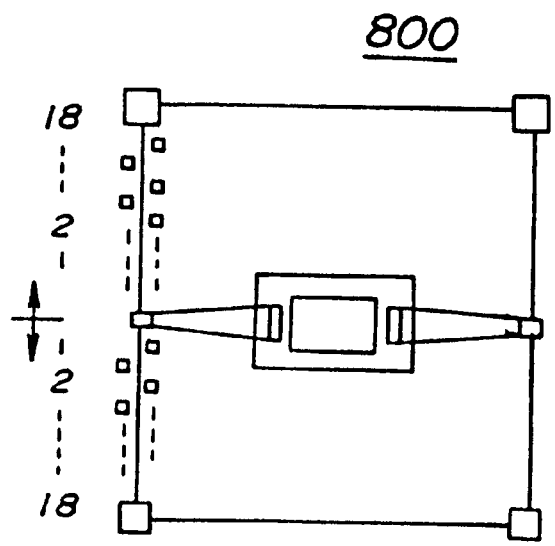

FIG. 58B shows the scheme of the foregoing resistance measurement, wherein there are in all 36 electrodes 825 on the upper and lower halves of the upper major surface of the wafer, wherein the electrodes 825 are aligned along the left edge of the area corresponding to the BAA mask 800, 18 of the electrodes being formed on the upper half region while the other 18 of the electrodes being formed on the lower half region. Further, the measurement of the resistance was made between an electrode 825 and a corresponding electrode 822, wherein the electrodes 825 in the upper half region are connected to the corresponding electrodes 822 by way of the conductor patterns 824A, while the electrodes 825 in the lower half region are connected to the corresponding electrodes 822 by way of the conductor patterns 824B.

FIGS. 59A and 59B show the conductor patterns 824A and 824B in detail, wherein it will be noted that the conductor patterns 824B extend to the respective electrodes 825 along a path that circumvents the apertures 811A, while the conductor patterns 824A extend to the respective electrodes 825 more or less directly.

Figure 58C:
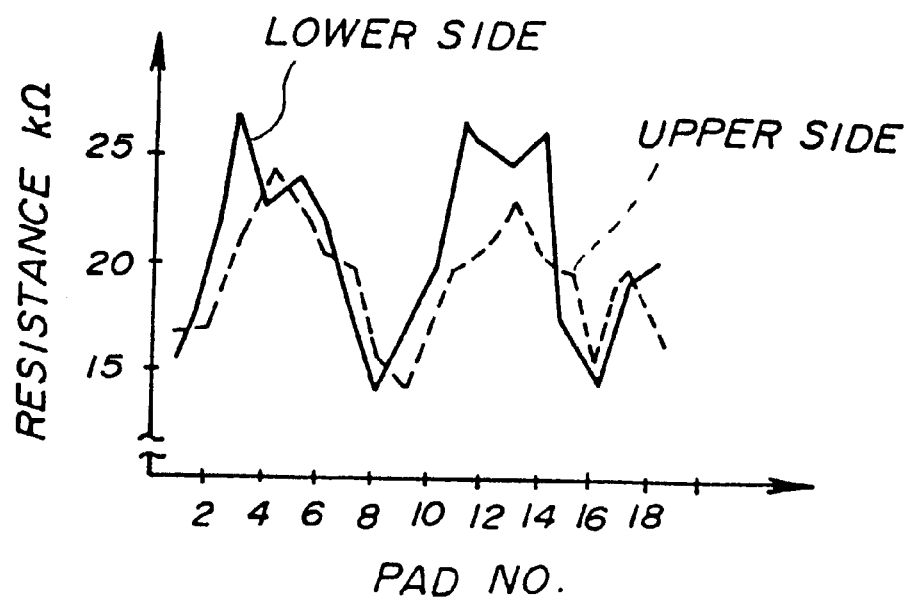

FIG. 58C shows the result of the resistance measurement thus conducted and represents the result of Tables I and II graphically, wherein the broken line corresponds to the result of Table I while the continuous line corresponds to the result of Table II.

As already noted, the present embodiment adjusts the timing of activating the deflectors Ui by adjusting the resistance and capacitance of the conductor pattern 824 that carries the drive signals to the electrode 822 from the electrodes 825, wherein it should be noted that the electrodes 825 are provided in the marginal region of the substrate 823 in correspondence to each of the deflectors Ui (i–1–1024). Each of the electrodes 821, 822, 825 and 826 is formed of a gold (Au) pattern formed on the substrate 823.

Next, the function of the BAA mask 800 according to the present embodiment will be described.

When an electron beam EB hits the lower major surface of the BAA mask 800, the electron beam is shaped by the aperture as it passes therethrough and experiences a deflection in response to the deflection voltage applied across the electrodes 821 and 822, similarly to the conventional BAA mask.

In the BAA mask 800 of the present embodiment, on the other hand, it should be noted that the electric field $A_1$, created by the deflectors $U_1$–$U_{512}$ located above the horizontal center line Cx, acts in the same direction as the electric field $A_2$ that is created in the deflectors $U_{513}$–$U_{1024}$, wherein the deflectors $U_{513}$–$U_{1024}$ are located in the region below the center line Cx. Thereby, the electron beam elements shaped by the BAA mask 800 is deflected in the same direction when the electron beams are turned off, and the problem shown in FIG. 54 does not occur. By forming the conductor pattern 824 to provide intentional signal delay, it is possible to align the timing of activation of the deflectors Ui on the BAA mask 800.

Next, the fabrication process of the BAA mask 800 will be described with reference to FIGS. 60A–60H.

Figure 60A:
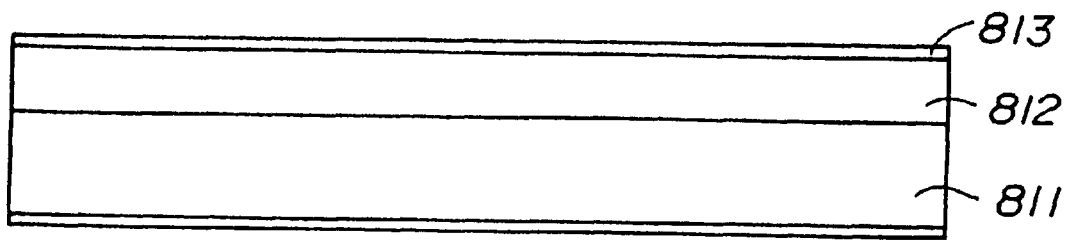
FIGS. 60A–60H are diagrams showing the fabrication process of the BAA mask of the sixth embodiment.

Referring to FIG. 60A, a doped silicon layer 812 and a silicon oxide film 813 are formed on a silicon substrate all of a predetermined thickness, wherein the doped layer 812 may be formed by diffusing boron atoms into the silicon substrate 812 by a suitable process such as the ion implantation process, typically for a thickness of about 15 μm. The silicon oxide film 813, on the other hand, may have a thickness of about 5000 Å and is formed by a thermal annealing process of the silicon substrate 811 conducted in an oxidizing atmosphere.

Figure 60B:
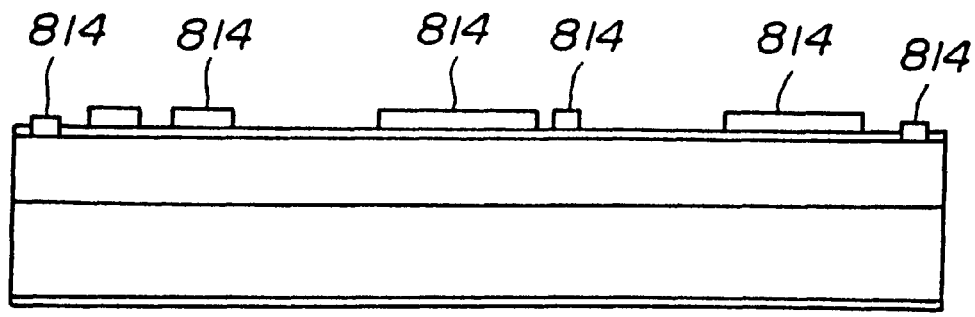

Next, in the step of FIG. 60B, a contact hole is formed in the silicon oxide film 813 in correspondence to the ground pad 826, and conductor patterns of Au are formed on the silicon oxide film including the foregoing contact hole for the ground pad 826. As will be described in detail later, the conductor patterns 814 may have various widths and thicknesses determined by the simulation about the signal delay caused therein.

In the structure of FIG. 60B, it should be noted that the conductor pattern 814 may be formed on a film of TaMo that covers the surface of the silicon oxide film 813 with a uniform thickness of about 500 Å, wherein the TaMo film is formed by an electron beam deposition process for improving the adherence of the conductor patterns 814 of Au on the silicon oxide film 813. The conductor pattern 814 is thereby formed by depositing a layer of Au upon the foregoing TaMo film by an electron beam deposition process with a thickness of about 4500 Å. Further, another TaMo film is deposited on the Au layer with a thickness of about 300 Å such that the foregoing Au layer is sandwiched vertically by a pair of TaMo films.

Figure 60C:
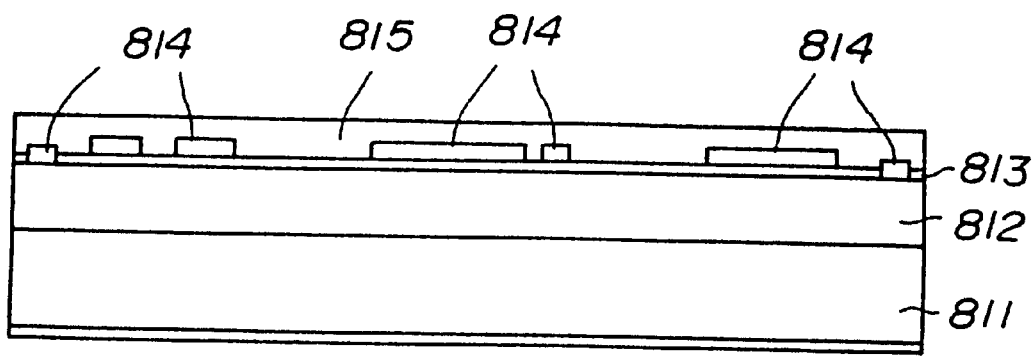
Figure 60D:
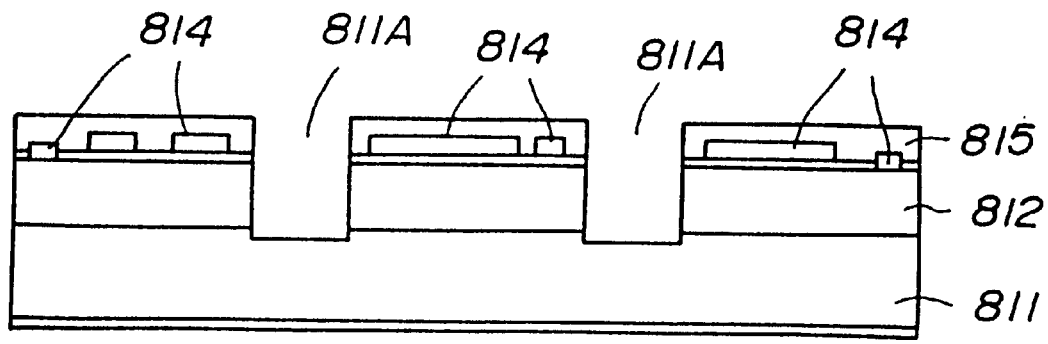

After the structure of FIG. 60B is thus formed, a silicon oxide layer 815 is deposited so as to bury the conductor patterns 814 underneath as indicated in FIG. 60C. Typically, the silicon oxide layer 815 is formed by a CVD process with a thickness of about 1500 Å. Further, the silicon oxide layer 815 as well as the silicon oxide layer 813 and the boron-doped layer 812 are subjected to a photolithographic patterning process in the step of FIG. 60D to form holes corresponding to the apertures 811A, wherein the holes are formed by an RIE (reactive ion etching) process with a depth of about 25 μm. Thereby, 1024 of such holes are formed on the silicon substrate 811 in 8 rows and 128 columns.

Figure 60E:
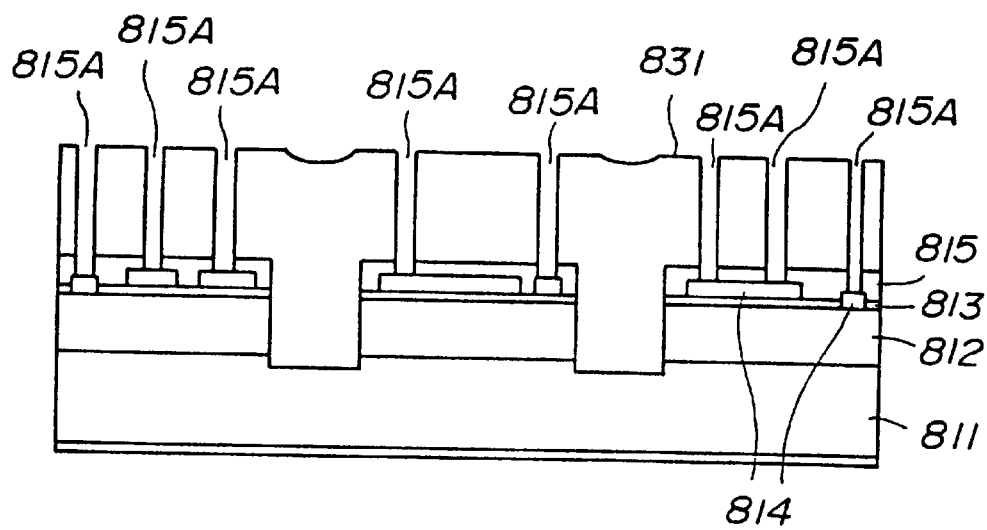
Figure 60F:
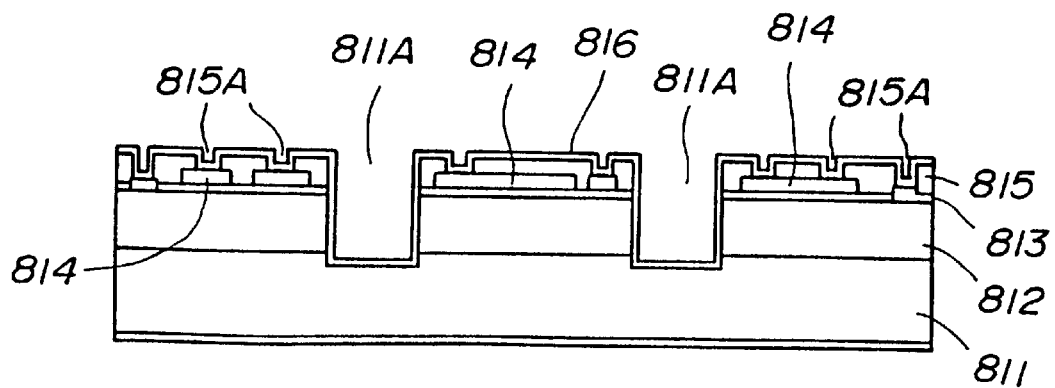

Further, in the step of FIG. 60E, a resist layer is applied on the structure of FIG. 60F, followed by a patterning of the same to form a resist pattern 831 that exposes the part of the silicon oxide layer 815 in which various electrodes are to be formed, Further, the silicon oxide layer 815 is patterned while using the resist pattern 831 as a mask, and a structure shown in FIG. 60E is obtained wherein the surface of the conductor pattern 814 is exposed in correspondence to contact holes 815A.

Further, in the step of FIG. 60F, the resist pattern 831 is removed, and a conductor film 816 of TaMo/Au is deposited on the entirety of the surface of the structure thus obtained, wherein the film 816 of formed of a TaMo layer and a AU layer thereon. The layer of TaMo is provided for improving adherence of the Au layer.

Figure 60G:
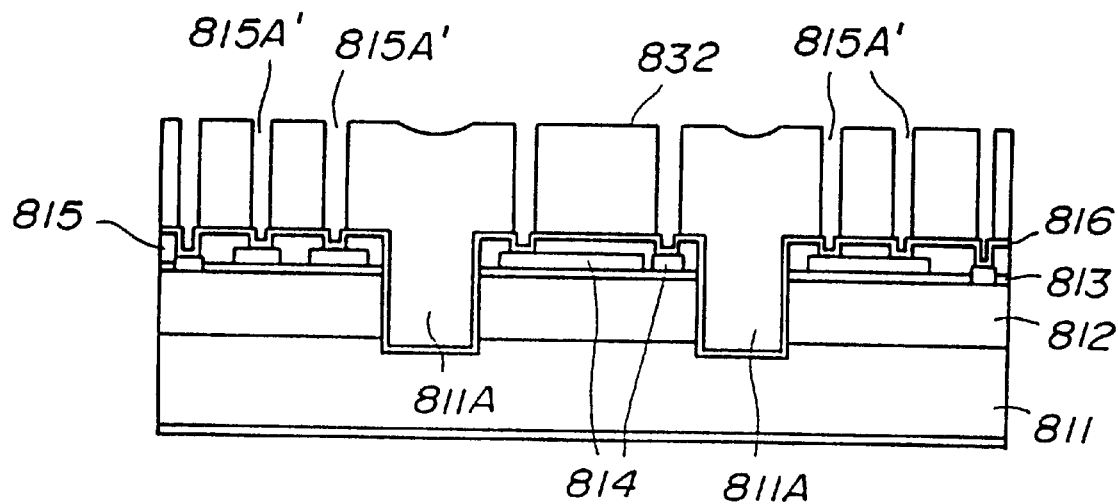

Next, in the step of FIG. 60G, another resist layer is applied on the structure of FIG. 60F, followed by a photolithographic patterning process to form a resist pattern 832, wherein it will be noted that the resist pattern 832 exposes the surface of the structure at contact holes 815A' corresponding to the contact holes 815A. Further, an electroplating process is conducted while using the conductor film 816 as an electrode in the step of FIG. 60G, and conductor patterns such as patterns 817A–817D are formed so as to fill the contact holes 815A'. Typically, the conductor patterns 817A–817D are formed by the electroplating of Au.

Figure 60H:
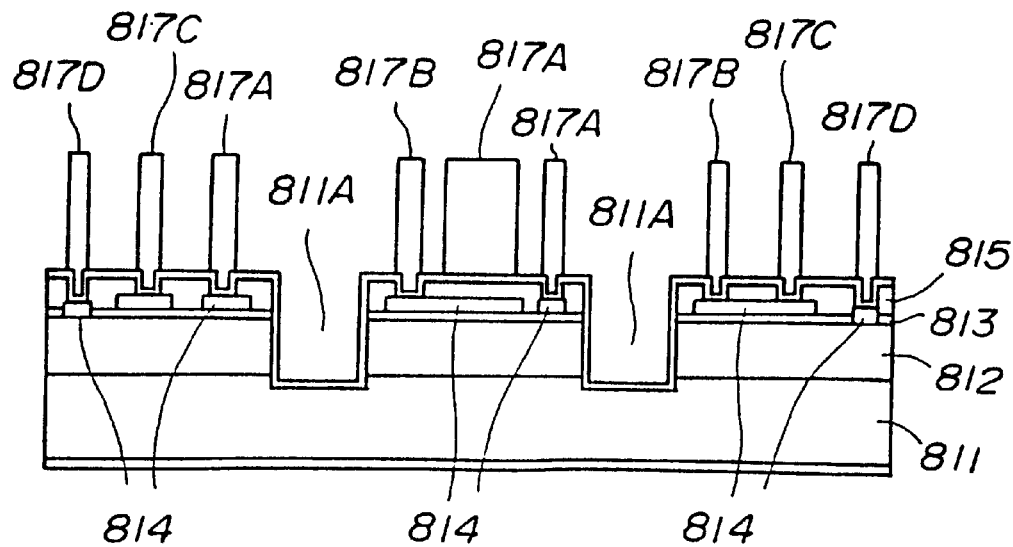

After removing the resist pattern 832, a structure shown in FIG. 60H is obtained, wherein it will be noted that the conductor pattern 817A corresponds to the ground electrode 921 of FIG. 56, the conductor pattern 817B corresponds to the blanking electrode 822, the conductor pattern 817C corresponds to the electrode pad 825, and the conductor pattern 827D corresponds to the ground pad 826. Further, the silicon substrate 811 is selectively removed with respect to the boron-doped layer 812 by an anisotropic etching process conducted by an EPW etchant, wherein the EPW etchant is an aqueous solution of ethylenediamine and pyrocatechol.

In the foregoing step of FIG. 60C, it should be noted that the conductor patterns 814 are formed with respective optimized width and thickness so as to optimize the timing of the signals carried by the conductor patterns 814. In order to adjust the thickness of the conductor patterns 814, the present embodiment employs the process shown in FIGS. 61A–61D.

Figures 61A, 61B:
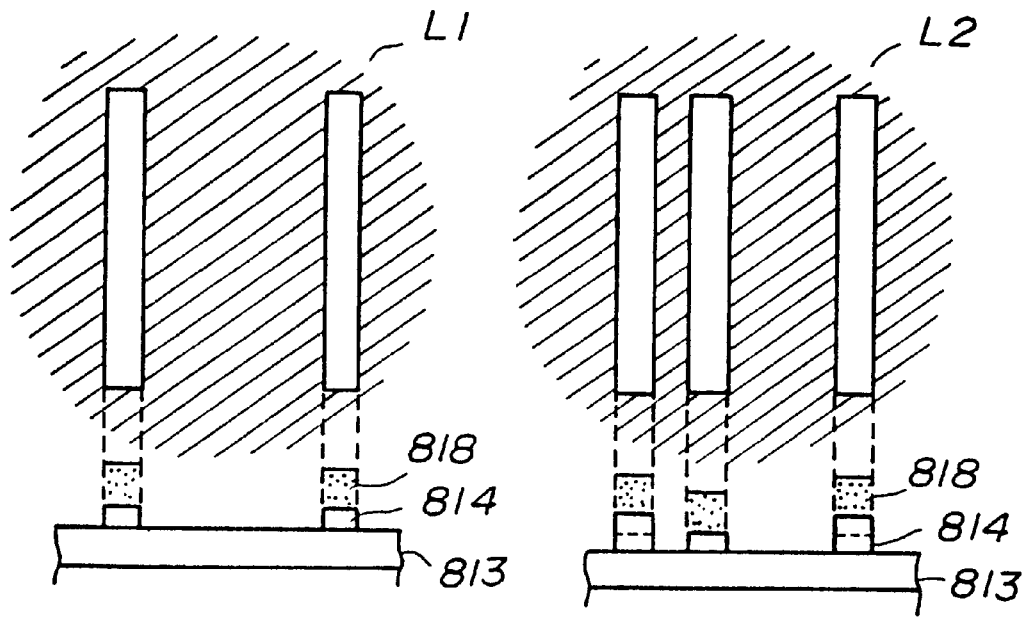
FIGS. 61A–61D are diagrams showing the fabrication process of the conductor patterns on the BAA mask of the sixth embodiment with optimization of the pattern thickness.

Referring to FIG. 61A, a resist pattern 818 is formed on a conductor layer, which forms the pattern 814 upon patterning, wherein the conductor layer may include an Au layer sandwiched vertically by a pair of TaMo films. Further, a resist layer is deposited on the conductor layer, followed by a patterning of the same by using a reticle L1 to form a resist pattern 818. Further, the conductor layer is patterned by using the resist pattern 818 as a mask to form the foregoing conductor patterns 814.

Next, in the step of FIG. 61B, the resist pattern 818 is removed and another conductor pattern also of an Au layer sandwiched by a pair of TaMo films is deposited on the silicon oxide film 813 so as to bury the conductor patterns 814 already formed in the step of FIG. 61A. Further, the conductor layer thus deposited is subjected to a photolithographic patterning process using a second reticle L2, therein a new conductor pattern 814 is formed on the surface of the silicon oxide film 813 as well as on the conductor patterns 814 already formed on the silicon oxide film 813.

Figures 61C, 61D:
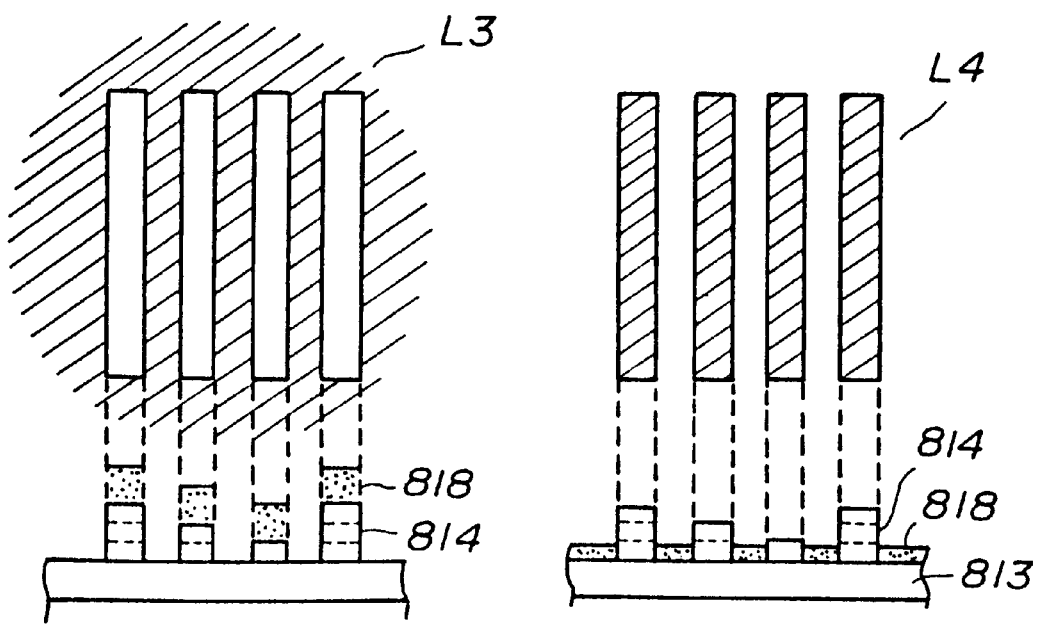

By repeating a similar step by using a third reticle L3, one obtains a structure of FIG. 61C wherein the patterns 814 on the silicon oxide film are formed with three, different thicknesses.

Further, in a step of FIG. 61D, are resist pattern 818 is formed so as to protect the exposed surface of the silicon oxide film 813 by a reticle L4, and the conductor patterns 814 are subjected to an ion milling process for fine adjustment of the thicknesses, such that the desired delay is guaranteed for the signals carried by the conductor patterns 814.

Figure 62A:
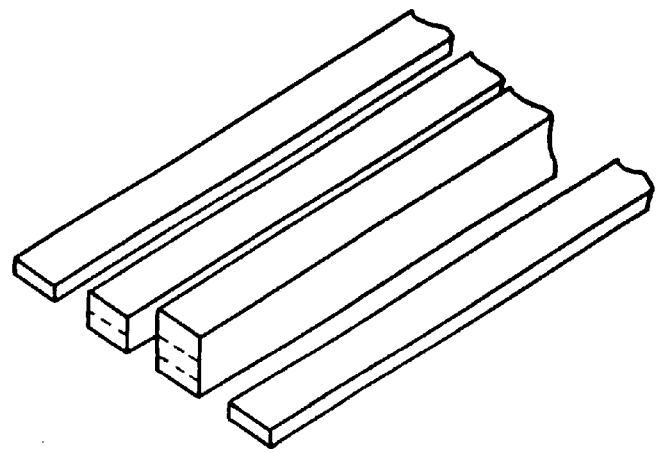
FIGS. 62A–62C are diagrams showing the process for changing the thickness of the conductor pattern partially.
Figure 62C:
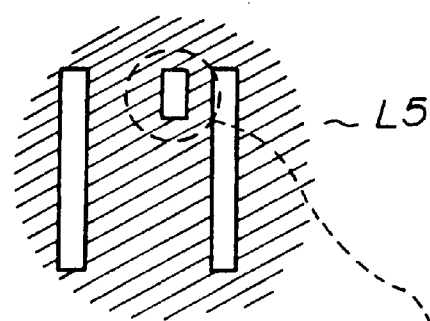
Figure 62B:
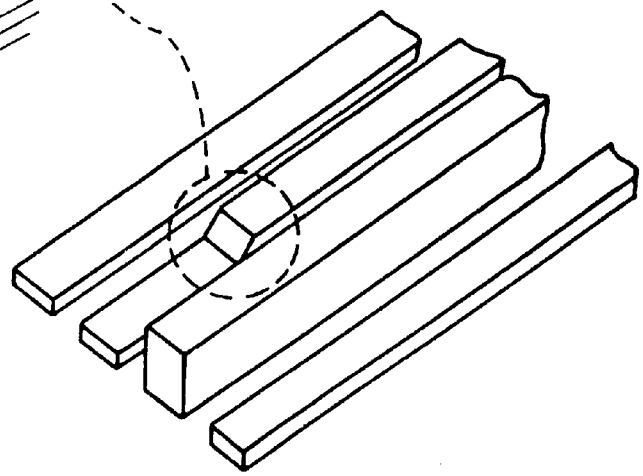

In such a process for changing the pattern thickness intentionally, it is also possible to change the pattern thickness in correspondence to a particular part of the pattern as indicated in FIGS. 62A and 62B, wherein FIG. 62A shows a part of the conductor pattern 824 formed with respective pattern thicknesses corresponding to the state of FIG. 61D, while FIG. 62B shows a state in which the thickness is changed for a part of one of the conductors by using a reticle L5. FIG. 62C shows a part of FIG. 62B in an enlarged scale.

Figure 63A:
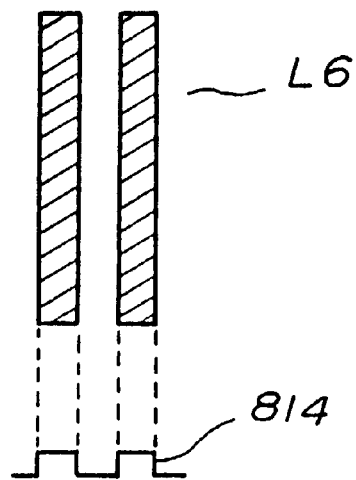
FIGS. 63A–63C are diagrams showing other processes for forming the conductor patterns with respective different thicknesses.
Figure 63B:
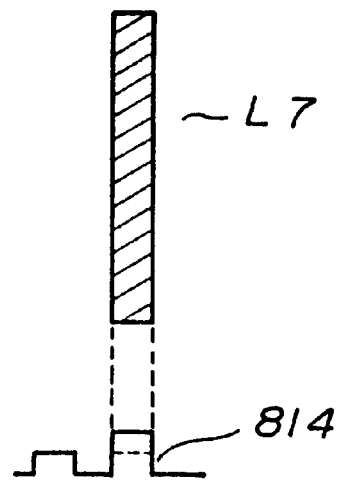
Figure 63C:
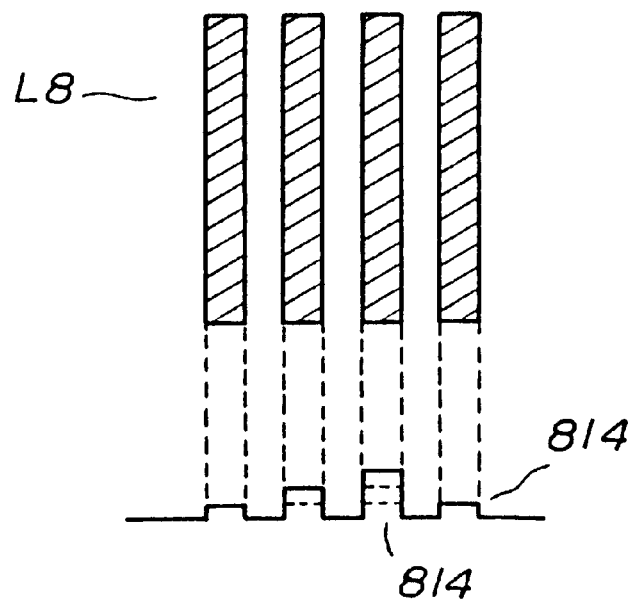

Further, one may form the conductor patterns 814 having different thicknesses according to the process of FIGS. 63A–63C, wherein reticles L6–L8 forming a negative mask are used. In such a case, patterns 814 are deposited on the silicon oxide film 813 in the step of FIG. 63A while using the reticle L6, followed by a process for depositing further conductor patterns 814 in the step of FIG. 63B, wherein the step of FIG. 63B is conducted by using the reticle L7 that causes a deposition of the conductor selectively on one of the conductor patterns already formed on the silicon oxide film 813. Further, by conducting the step of FIG. 63C by using the reticle L8, it is possible to form the conductor patterns 814 with three different thicknesses.

Figure 64:
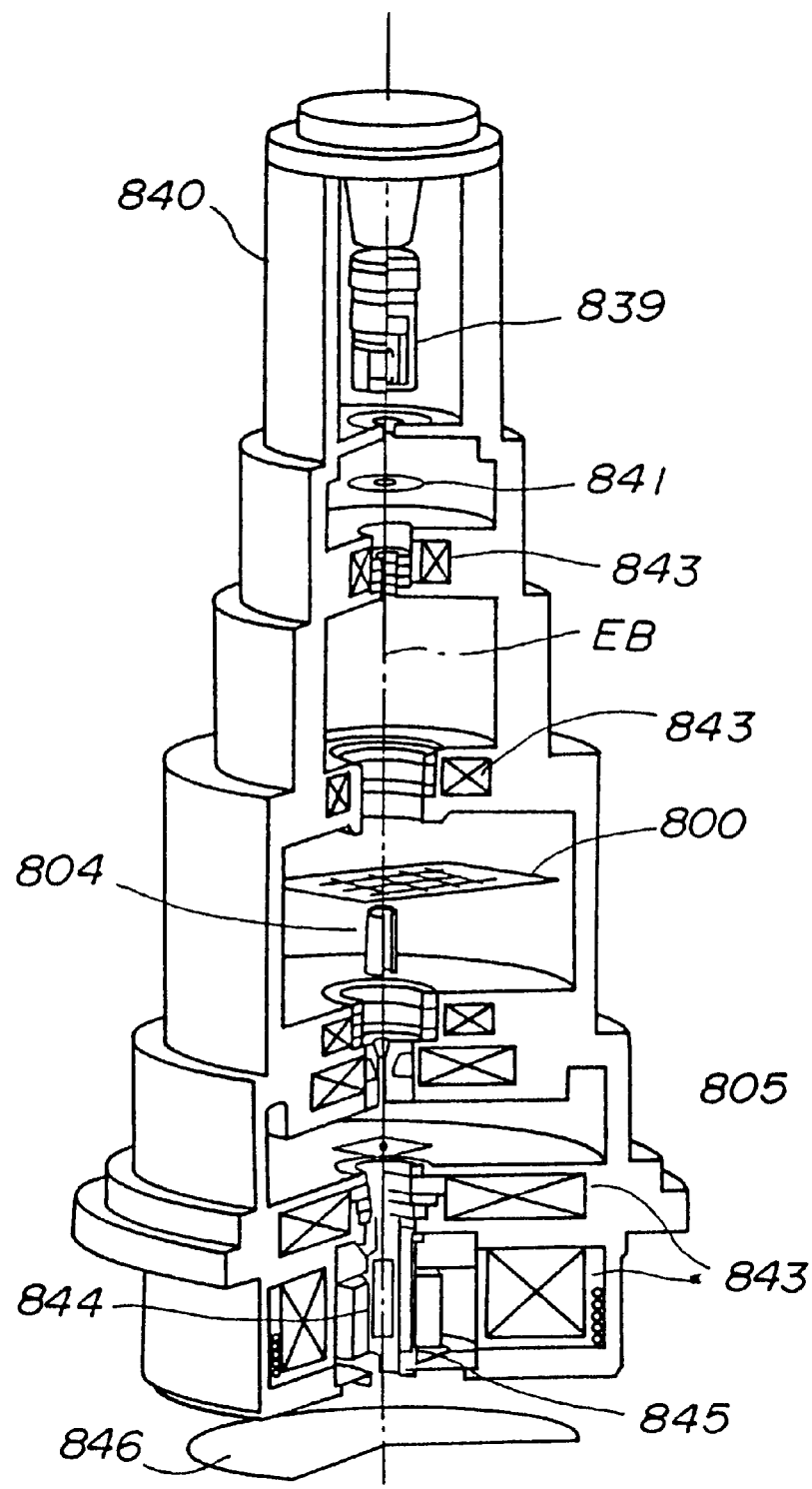
FIG. 64 is a diagram showing the construction of a BAA exposure system that uses the BAA mask of the sixth embodiment.

FIG. 64 shows a BAA exposure system that uses the BAA mask 800, wherein it will be noted that the BAA exposure system includes an electron gun 839 that produces an electron beam along an optical axis toward a substrate 846 held on a movable stage (not shown), wherein the BAA mask 800 is disposed so as to interrupt the path of the electron beam from the electron gun 839. Thereby, the BAA mask 800 produces a plurality of electron beam elements as a result of shaping of the electron beam, wherein the electron beam elements thus produced are focused upon the substrate 846 by means of electron lenses 843 forming a demagnification system. Further, the electron beam elements are moved over the surface of the substrate 846 by means of electrostatic as well as electromagnetic deflectors 844.

In order to turn off the electron beam elements collectively on the surface of the substrate 846, the BAA exposure system of FIG. 64 uses the blanking deflector 804, wherein the blanking deflector 804 deflects the electron beam elements collectively away from the optical axis passing through the round aperture formed on the blanking plate 805. Thereby, the BAA mask 800 is disposed with an orientation such that the electron beam elements are deflected at the deflectors on the BAA mask 800 in the same direction as the direction of beam deflection caused by the blanking electrode 804. Thereby, the problem of the turned-off electron beam elements leaking through the round aperture in the plate 805 upon the energization of the blanking electrode 804 is effectively eliminated.

[seventh embodiment]

In the BAA exposure system described heretofore, there sometimes occur a need for removing the BAA mask for inspection or maintenance. Thus, in order to hold the BAA mask removably, conventional BAA exposure systems generally employ the construction of FIG. 65.

Referring to FIG. 65, there is provided a printed circuit board 915 within an evacuated column 912 of the electron optical system so as to intersect with the path of the electron beam produced by an electron gun 913 and traveling toward a substrate 914, wherein the printed circuit board 915 is provided with a passage of the electron beam 915x. The printed circuit board 915 supports thereon a socket 923 having a similar passage 923x of the electron beam, wherein a package body 919 of a BAA mask 911 is mounted upon the socket 923.

Thus, the printed circuit board 915 is formed with a number of holes 915a for accommodating electrode pins of the socket 923, and conductor patterns 915b are provided on the upper major surface of the board 915 for connecting the foregoing holes 915a electrically to respective interconnection pads provided also on the upper major surface of the printed circuit board 915. In order to supply electrical signals to the BAA mask, a number of lead wires 916 are provided such that the wires 916 extend from a signal generator 918 outside the evacuated column 912 to the corresponding interconnection pads on the printed circuit board 915 via a hermetic seal 917 provided on the wall of the column 912.

The socket 923 is fixed upon the printed circuit board 915 by inserting the electrode pins thereof into corresponding holes 915a on the board 915 and soldering the electrode pins against the electrode patterns 915b, while the socket 923 in turn supports the package body 919 thereon removably such that electrode pins on the package body 919 are accepted removably into the corresponding holes on the socket 923. It should be noted that the holes on the socket 923 are connected electrically to respective electrode pins that project from the socket 923 for engagement with the corresponding holes 915a on the printed circuit board 915.

The package body 919 also has a passage 919x of the electron beam in alignment with the holes 915x and 923x, wherein the package body 919 carries a chip or substrate in which the BAA mask 911 is formed. Hereinafter, the chip of the BAA mask will be designated by the reference numeral 911. The chip 911 is bonded upon the lower major surface of the package body 919 by means of adhesives so as to intersect the path of the electron beam passing through the passage 919x. Thus, by activating electrostatic deflectors 921 provided in correspondence to a plurality of beam shaping apertures on the chip 911, the electron beam elements produced by shaping the electron beam by the beam shaping apertures, are selectively turned off. It should be noted that the electrostatic deflectors 921 on the chip 911 are connected electrically to corresponding electrode pads 920 provided on the package body 919 by means of bonding wires 922 such that the bonding wire connects an electrode pad on the BAA chip 911 to a corresponding electrode pad 920, which pad 920 in turn being connected electrically to a pin of the package body 919.

When dismounting the BAA chip 911 in such a construction of the BAA exposure system, it is necessary to remove the package body 919 from the socket 923, which is fixed upon the printed circuit board 915. On the other hand, because of the large number of pins of the package body 919 inserted into the socket 923 with a substantial force for reliable electrical contact, there is a substantial difficulty in such a process of dismounting. Particularly, the operation for mounting and dismounting the BAA package body 919 inside the evacuated column 912 is virtually impossible.

In view of such a situation, such a mounting/dismounting process has been conducted outside the evacuated electron beam column 912. More specifically, the vacuum inside the column 912 is broken, and the printed circuit board 915 is taken out from the column 912 within an allowable distance of the wires 916. Thus, the mounting and dismounting of the BAA package body 919 is carried out outside the column 912. On the other hand, such a process has an obvious drawback in that it is necessary to carry out the evacuation of the column 912 upon reassembly of the package body 919 on the socket 923, by activating a vacuum pump for a prolonged duration.

Thus, the present embodiment addresses this problem and has an object of providing a BAA exposure system in which the foregoing problems are eliminated.

More specifically, the present embodiment provides a BAA exposure system in which maintenance of the BAA mask is substantially facilitated.

Thus, the present embodiment provides a charged particle beam exposure system for exposing a pattern on an object by a charged particle beam, comprising:

beam source means for producing a charged particle beam, said beam source means emitting said charged particle beam toward an object on which a pattern is to be exposed, along an optical axis;

beam shaping means for shaping said charged particle beam to produce a plurality of charged particle beam elements in accordance with exposure data indicative of a dot pattern to be exposed on said object;

focusing means for focusing said charged particle beam elements upon a surface of said object; and deflection means for deflecting said charged particle beam elements over said surface of said object;

said beam shaping means comprising:

a beam shaping mask carrying thereon a plurality of apertures for producing a charged particle beam element by shaping said charged particle beam and a plurality of deflectors each provided in correspondence to one of said plurality of apertures, said beam shaping means further including a plurality of electrode pads each connected to a corresponding deflector on said beam shaping means;

a mask holder provided on a body of said charged particle beam exposure system for holding said beam shaping mask detachably thereon, said mask holder comprising: a stationary part fixed upon said body of said charged particle beam exposure system; a movable part provided movably upon said stationary part such that said movable part moves in a first direction generally parallel to said optical axis and further in a second direction generally perpendicular to said optical axis, said movable part carrying said beam shaping mask detachably; a drive mechanism for moving said movable part in said first and second directions; and a contact structure provided on said body of said charged particle beam exposure system for contacting with said electrode pads on said beam shaping mask, said contact structure including a base body and a plurality of electrode pins extending from said base, said of said electrode pins having a first end connected to said base body or said contact structure and a second, free end adapted for engagement with said electrode pads on said beam shaping mask.

According to the construction of the present embodiment, particularly the construction of the beam shaping mask held on the mask holder and the construction of the cooperating contact structure, it is possible to dismount the BAA mask easily, without breaking the vacuum inside the electron beam column. Thus, the time needed for maintenance of the BAA mask is substantially reduced, and the throughput of exposure increases substantially. Further, the BAA exposure system of the present embodiment is advantageous in the point that one can use various beam shaping masks by simply dismounting an old mask and replacing with a new mask. Thereby, the charged particle beam exposure system of the present invention is not only useful in the BAA exposure system but also in the block exposure system.

Figure 66:
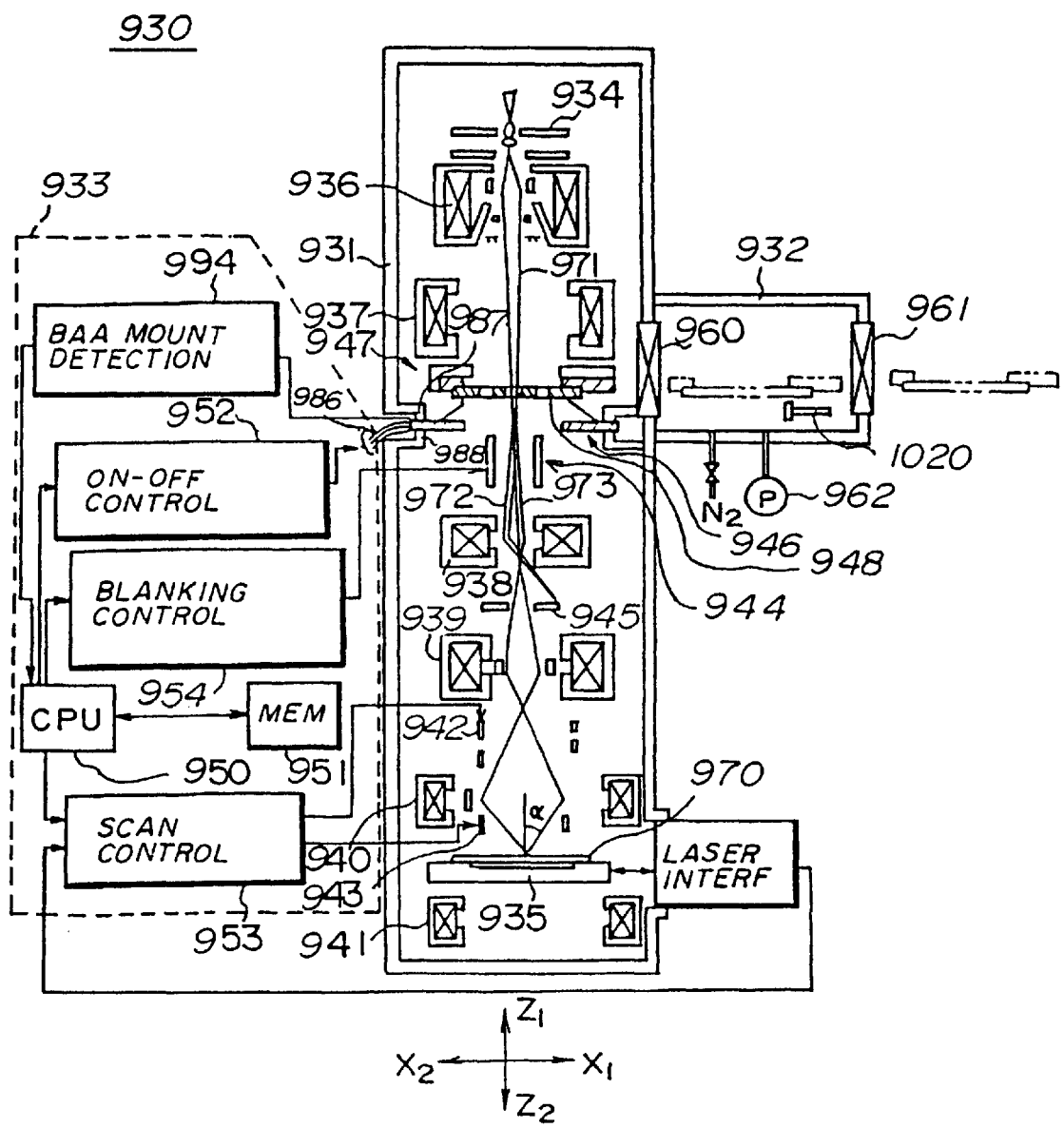
FIG. 66 is a diagram showing the overall construction of the BAA exposure system according to a seventh embodiment of the present invention.

FIG. 66 shows the overall construction of a BAA exposure system 930 of the present embodiment.

Referring to FIG. 66, the BAA exposure system 930 includes an electron gun 934 provided in an evacuated electron beam column 931 for emitting an electron beam, wherein the electron beam thus produced is focused, by electron lenses 936 and 937, upon a BAA mask 948 mounted detachably on a probe fixture 948 provided inside the column 931. As will be described in detail later, the BAA mask 948 is held movably by a mounting mechanism 947.

The BAA mask 948 produces a plurality of electron beam elements similarly as other BAA exposure systems by shaping the incident electron beam by the beam shaping apertures provided thereon, wherein the electron beam elements thus produced are focused upon a substrate 970 held on a movable state 935 by electron lenses 938–940 forming a demagnifying optical system. Further, there is provided a deflector 943 inside the column 931 for causing a deflection of the electron beam elements over the surface of the substrate 970 on the stage 935.

In order to turn of f the electron beam elements on the surface of the substrate 970, there is provided a blanking plate 945 formed with a round aperture or blanking aperture in cooperation with a blanking deflector 944 that deflects the electron beam elements away from the round aperture on the blanking plate 945 when turning off the electron beam elements collectively on the surface of the substrate 970.

In order to control the BAA exposure system 930 of FIG. 66, there is provided a control system 933 that includes a control circuit 952 for producing a drive signal for each of the beam deflectors provided on the BAA mask 948 in correspondence to the apertures thereon. Upon energization of the beam deflector on the BAA mask 948, the electron beam element shaped by an aperture on the BAA mask 948 is deflected away from the optical axis and misses the round aperture on the blanking plate 945 as indicated by a beam 972. When the beam deflector on the BAA mask 948 is not energized, on the other hand, the electron beam element passes through the round aperture and forms an image of the aperture of the BAA mask 948 on the substrate 970 with a demagnification. Further, there is provided a blanking control circuit 954 for turning off the electron beam elements collectively by supplying a drive signal to the blanking-electrode 944. Furthermore, the control system 933 includes a scanning controller 953 that controls the deflector 943 as well as the movable stage 935 for causing the electron beam elements to scan over the surface of the substrate 970. In order to control the foregoing various circuits, there is provided a central processing unit (CPU) 950 that cooperates with a memory 951.

Figure 67:
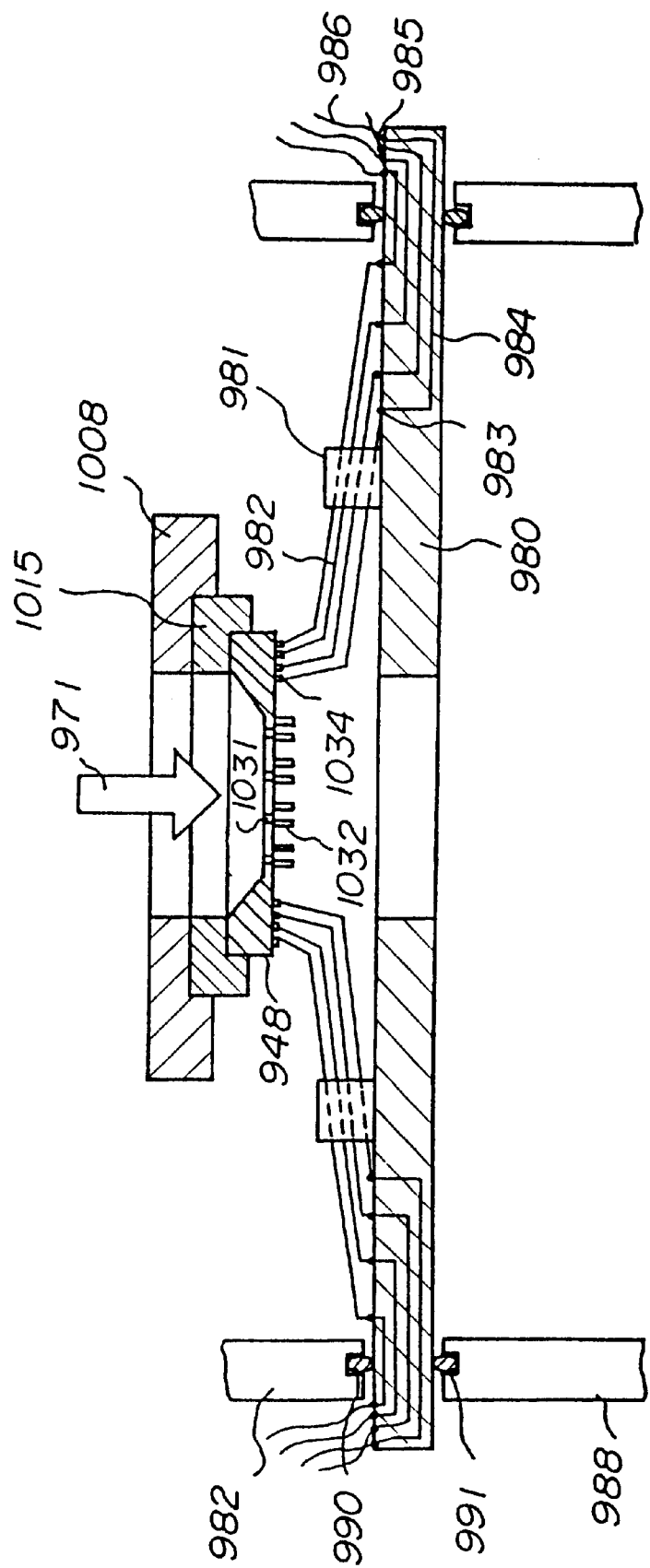
FIGS. 67 and 68 are diagrams showing the detachable mounting of the BAA mask employed in the BAA exposure system of FIG. 66.
Figure 68:
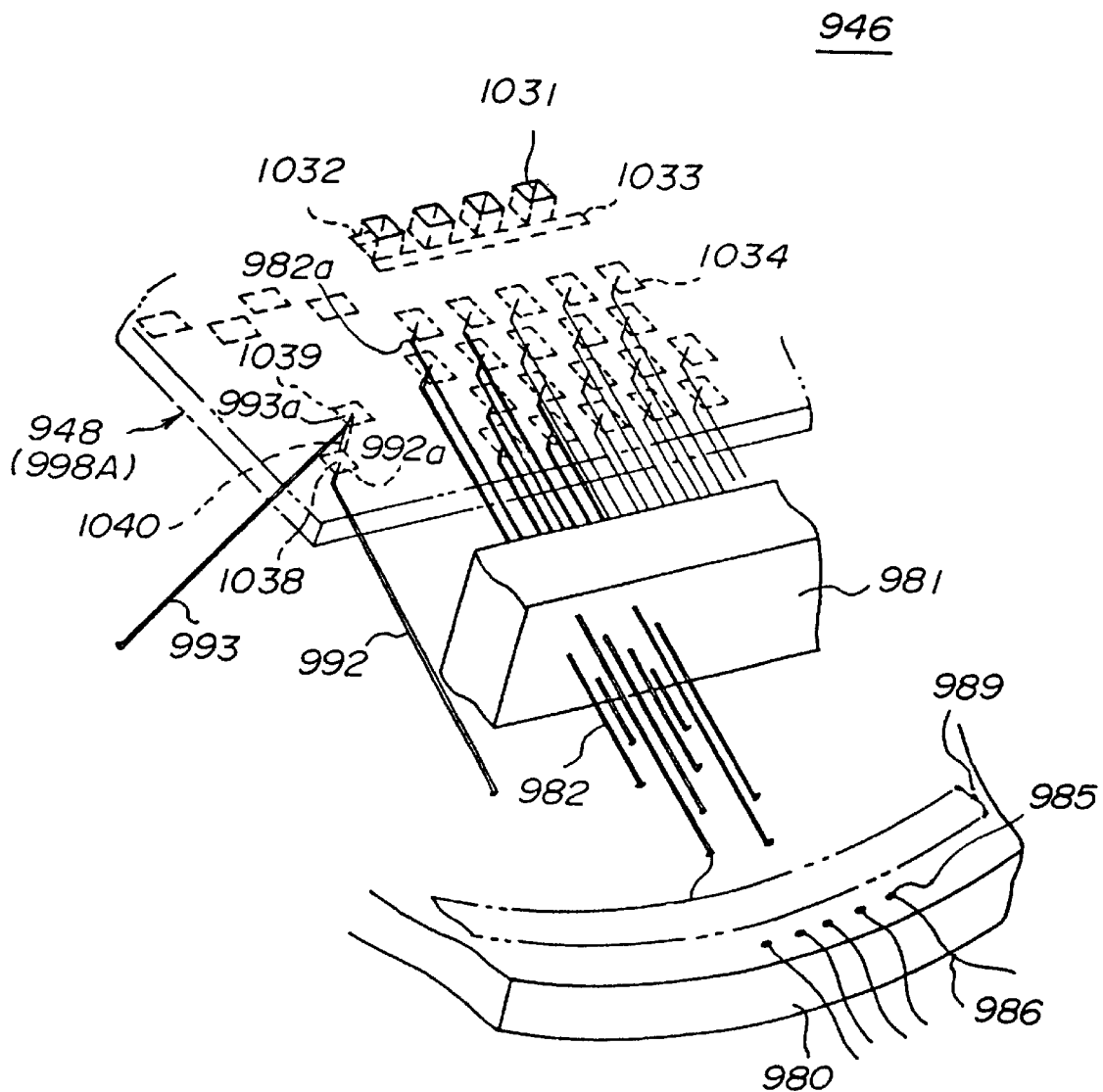

FIGS. 67 and 68 show the construction of the probe assembly 946 shown in FIG. 66.

Referring to FIGS. 67 and 68, it will be noted that the probe assembly 946 includes an annular base 980 of a multilayer substrate held upon a wall 987 forming a part of the electron beam column 930 with hermetic seal provided by seal elements 990 and 991.

The annular base 980 carries thereon a number of probe electrodes 982 each having an end soldered upon a corresponding electrode pad 983 provided on the upper major surface of the base 980, wherein the probe electrodes 982 extend, via a support member 981, generally in a direction toward a central axis of the annular base 980 to form collectively a conical surface. Thereby, each of the probe electrodes 982 has a free and 982a at an end opposite to the end soldered upon the electrode pat 983 as indicated in FIG. 68, wherein the free ends 982a of the probe electrodes 982 support the BAA mask 948 mechanically by engaging with corresponding electrode pads 1034 that are provided on a lower major surface of the BAA mask 948.

Further, there are provided additional probe electrodes 992 and 993 for detecting the proper mounting of the mask 48, wherein the probe electrodes 992 and 993 have respective ends 992a and 993a engaging with corresponding electrode pads 1038 and 1039. It should be noted that the electrode pads 1038 and 1039 are connected with each other electrically by a bridging pattern 1040 provided on the lower major surface of the BAA mask 948. In FIG. 68, it will be noted that the BAA mask 948 carries apertures 1031 with corresponding blanking electrodes 1032 and a common ground electrode 1033. Further, FIG. 68 shows a marginal region 989 of the annular base 980 that engages with the seal members 990 and 991. It will be noted that there are bonding pads 985 disposed outside the foregoing region 989, for connection to lead wires 986 extending to the control circuit 952.

Figure 69:
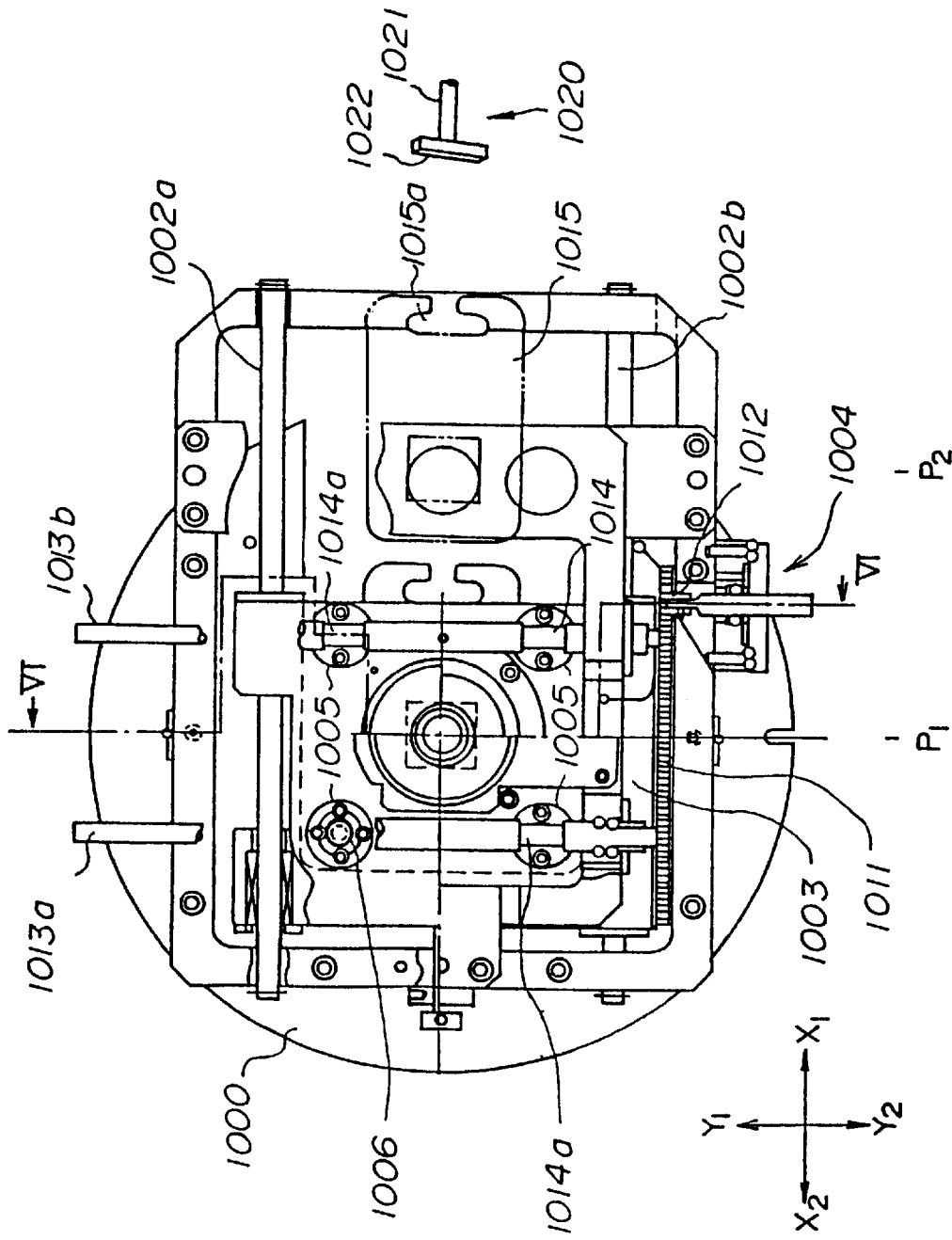
FIGS. 69–72 are diagrams showing the construction of a mask holder mechanism for holding the BAA mask movably and detachably in the BAA exposure system of FIG. 66.
Figure 70:
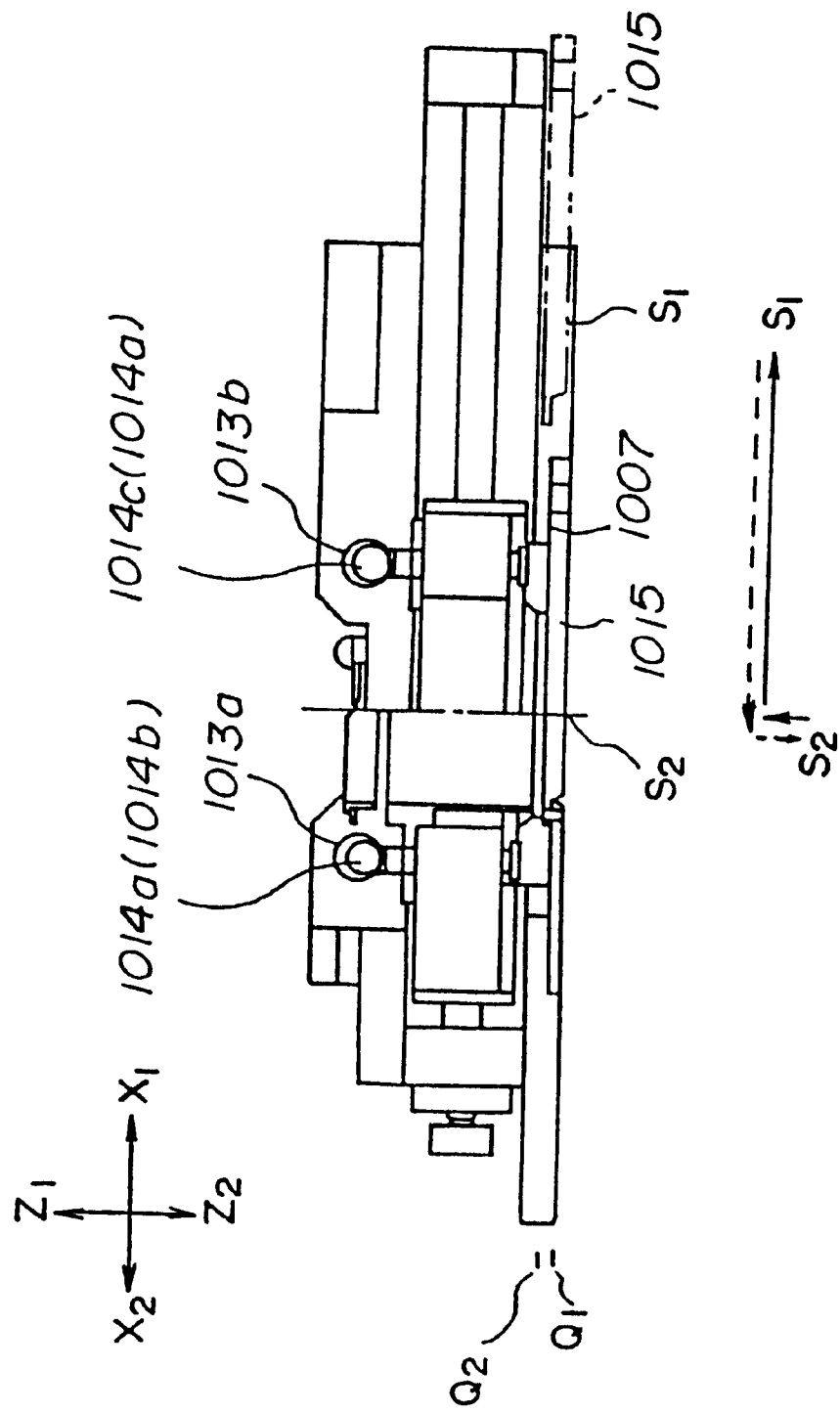
Figure 71:
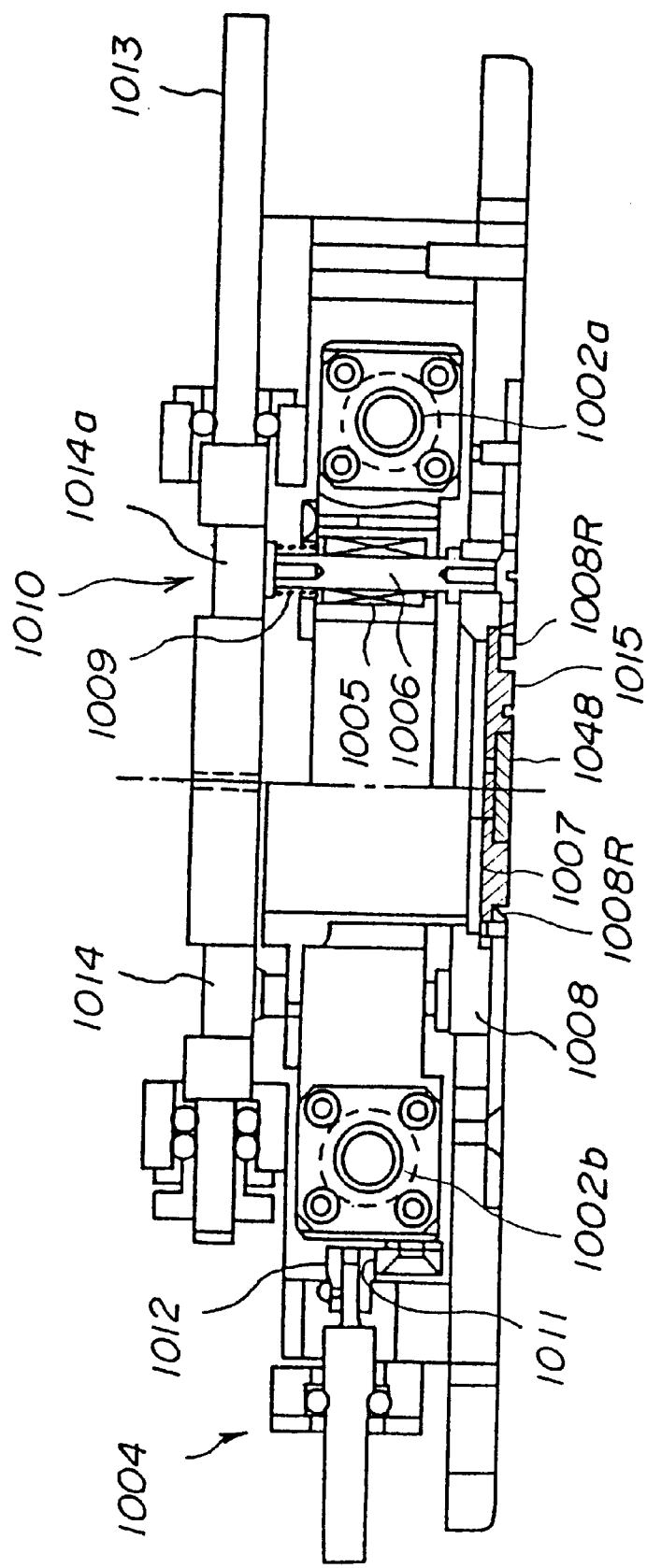
Figure 72:
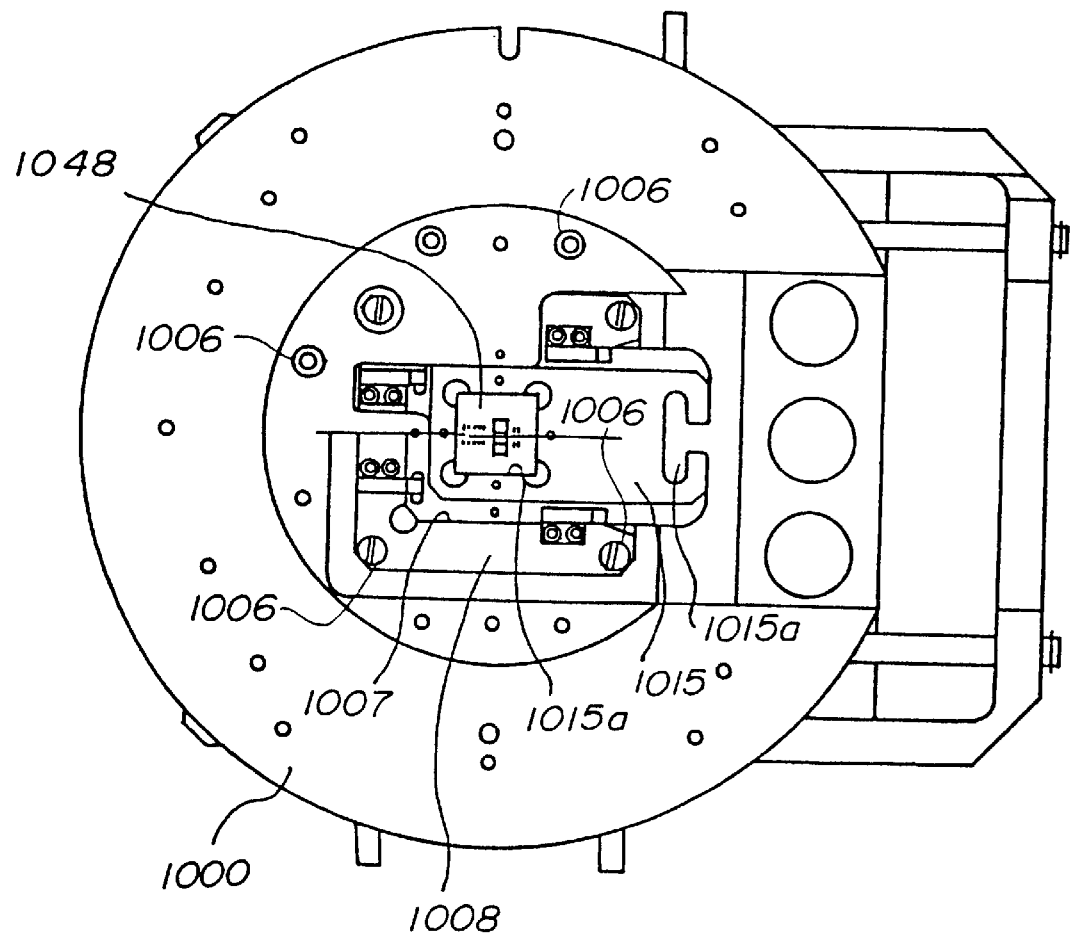

FIGS. 69–72 show the construction of the mounting mechanism 947 in detail, wherein FIG. 69 shows the mechanism 947 in a plan view, FIG. 70 shows the same mechanism 947 in a side view as viewed from the direction $Z_1$–$Z_2$. Further, FIG. 71 shows the same mechanism in a side view as viewed in a direction perpendicular to the direction of FIG. 70, while FIG. 72 shows the mechanism 947 in a bottom view.

Referring to FIGS. 69–72, it will be noted that the mounting mechanism 947 is constructed upon a base body 1000 fixed upon the column 931 of the BAA exposure system 930, wherein the base body 1000 carries thereon a rectangular frame 1003 on which a pair of guide rods 1002a and 1002b are provided to extend in the X-direction, wherein the guide rode 1002a and 1002b carry thereon a first movable stage 1003 such that the stage 1003 is movable, upon energization of a drive mechanism 1004, in the $X_1$- and $X_2$-directions within a range between a position $P_1$ and a position P2. Further, the movable stage 1003 carries thereon four bearing mechanisms 1005 each including a vertical shaft 1006 that passes through the bearing mechanism 1005 wherein the shafts 1006 are movable in the $Z_1$- and $Z_2$-directions.

On the lower end of the foregoing shafts 1006, a second stage 1008 is fixed such that the stage 1008 is movable in the $Z_1$- and $Z_2$ directions together with the shafts 1006, wherein the stage 1008 carries on a lower major surface thereof a shallow depression 1007 for accommodating a holder 1015 of the BAA mask 948. It should be noted that the holder 1015 holds the BAA mask 948 unitarily. Further, a return spring 1009 is provided on each of the shafts 1006 for urging the stage 1008 in the downward direction. The stage 1008 moves thereby between a lowermost position $Q_1$ and an uppermost position $Q_2$ shown in FIG. 70, wherein such a movement of the stage 1008 is caused by a vertical drive mechanism 1010.

It should be noted that the drive mechanism 1004 for driving the stage 1003 in the X-direction includes a rack 1011 formed on the X-stage 1003 as indicated in FIG. 69 as well as a pinion gear 1012 engaging with the rack 1011, wherein the pinion gear 1012 is driven by a motor not illustrated. On the other hand, the drive mechanism 1010 for the stage 1008 includes eccentric cams 1014*a* and 1014*b* formed on a shaft 1013*a* as well as eccentric cams 1014*c* and 1014*d* formed on a shaft 1013*b*, wherein the cams 1014*a*–1014*d* cooperate with the corresponding shafts 1006 respectively and causes the same to move in the upward and downward directions. The illustration of the drive motor for driving the shafts 1006 will be omitted for the sake of simplicity.

Thus, in the construction of the BAA exposure system 930 of the present embodiment, it will be noted that the BAA mask 948 is movable in the vertical as well as lateral directions together with the stage 1008 of the mounting mechanism 947, wherein the mask 948 engages with the probe electrodes 982 provided inside the column 931 when the BAA mask 948 is moved to the position $P_1$ at the center of the column 931 as a result of energization of the drive shafts 1002*a* and 1002*b* and is fully lowered to the level $Q_1$ as a result of energization of the drive shafts 1013*a* and 1013*b*.

In the BAA exposure system 930 of FIG. 66, it will be noted that the stage 1008 and hence the BAA mask 948 mounted thereon is lifted up, together with the holder 1015, to the level of $Q_2$ and is moved further to the position $P_2$ close to a sub-chamber 932, wherein the sub-chamber 1032 is separated from the column 931 by a gate valve 960. It should be noted that the BAA mask 948 is disengaged from the probe electrodes 982 on the base 980 upon lifting from the level $Q_1$ to the level $Q_2$, wherein the level $Q_2$ is about 2 mm higher than the level $Q_1$. Further, the sub-chamber 932 is separated from the surroundings by another gate valve 961.

Thus, the dismounting of the BAA mask 948 is conducted in the BAA exposure system 930 of the present embodiment by moving the stage 1008 to the level $Q_2$ and the position $P_2$ shown in FIG. 69 by first activating the drive shafts 1013*a* and 1013*b* of FIG. 70, followed by activating the pinion gear 1012 shown in FIG. 69. In this state, the holder 1015 moves from a position $S_2$ to a position shown in FIG. 70 by $S_1$. It should be noted that the stage 1008, on which the holder 1015 is mounted detachably, is formed with a rail portion 1008R for holding a rim part of the holder 1015 as indicated in FIG. 71, wherein it should be noted that FIG. 71 is a arose section of the structure of FIG. 69 taken along a line VI—VI and viewed from the direction of the arrows. Thus, the holder 1015 is held on the stage 1008 movably in the X-direction and hence can be pulled out in the $X_1$ direction or inserted in the $X_2$ direction by using a suitable jig 1020. The jig 1020 has a rod 1021 on which an actuation head 1022 is formed and is provided in the sub-chamber 932 such that the jig 1020 can be inserted into the interior of the column 931 upon release of the gate valve 960. In order to engage with the actuation head 1022 of the jig 1020, the holder 1015 is formed with a cutout 1015*a* corresponding in size and shape with the actuation head 1022.

Thus, when replacing the BAA mask 948 in the BAA exposure system 930 of FIG. 66 with another similar BAA mask, the sub-chamber 932 is first evacuated to the degree of vacuum comparable to the interior of the column 931. Simultaneously, the stage 1003 as well as the stage 1008 are activated such that the stage 1008 moves from the level $Q_1$ to the level $Q_2$ and such that the stage 1003 is moved from the position P1 to the position $P_2$. As a result, the BAA mask 948 moves, together with the unitary holder 1015, from the position $S_1$ to the position $S_2$.

Next, the gate valve 960 is opened, and the jig 1020 is inserted to the interior of the column 931, such that the head 1022 engages with the corresponding cutout 1015*a* on the holder 1015. Further, by pulling the jig 1020, the BAA mask 48 is removed, together with the holder 1015, from the stage 1008. In the state that the jig 1020 and the holder 1015 are held in the sub-chamber 932, the gate valve 960 is closed, and the vacuum of the sub-chamber 932 is broken. After the pressure inside the sub-chamber 932 has reached the environmental pressure, the gate valve 961 is opened, and the BAA mask 948 is taken out to the environment together with the holder 1015.

When replacing the old BAA mask 948 with a new one, a new holder 1015 holding a new BAA mask 948 is mounted upon the jig 1020 inside the sub-chamber 932. After closing the gate valve 961, the sub-chamber 932 is evacuated by activating a pump 962 while maintaining the closed state of the gate valve 960. After the pressure inside the sub-chamber 932 is equilibrated with the internal pressure of the column 931, the gate valve 960 is opened and the holder 1015, held on the end of the jig 1020, is inserted to the column 931 such that the holder 1015 is inserted into the holder 1008 that is already moved to the position $P_1$ and is held at the level $Q_1$. Thereby, the holder 1015 engages with the rail part 1008R of the stage 1008 and is held at the position $S_1$. Further, the pinion gear 1012 is activated to drive the stage 1003 to the position $P_2$, followed by the activation of the drive shafts 1013*a* and 1013*b* to cause a lowering of the stage 1008 to the level $Q_2$.

In this process, it should be noted that the high quality vacuum is maintained in the column 931 throughout the process for replacing the BAA mask, and the maintenance of the BAA exposure system is completed with a substantially reduced time. Upon lowering of the BAA mask 948 to the level $S_1$, the probe electrodes 982 establish an engagement with corresponding pads 1034 on the mask 948 with reliability. Further, any abnormality in the mounting state of the BAA mask 948 is immediately detected checking the conductance between the probe electrode 992 and the probe electrode 993. The number of such detection electrodes 992 and 993 is of course not limited to two but three or more electrodes may be formed.

Figure 73:
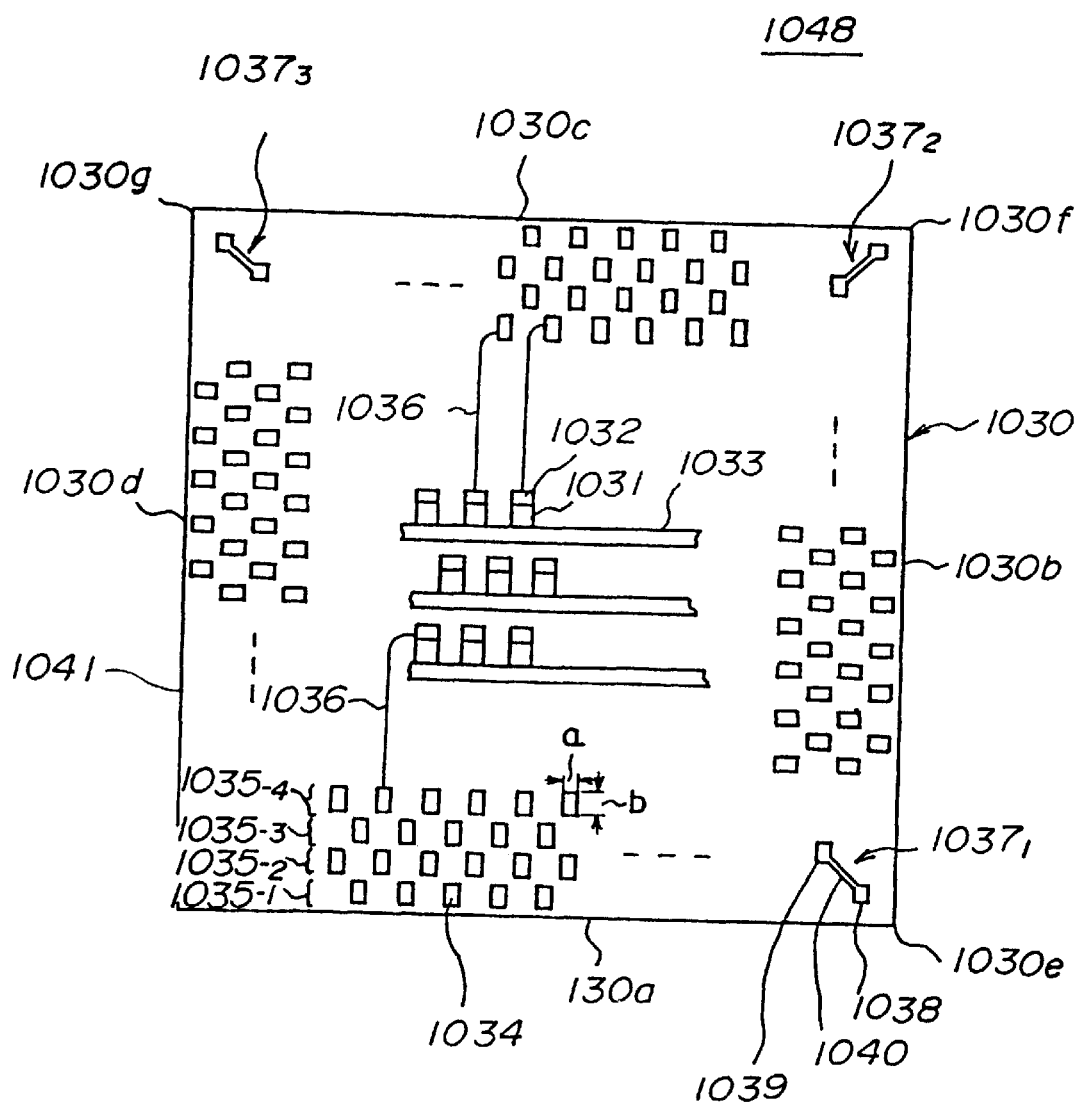
FIG. 73 is a diagram showing an example of the BAA mask used in the BAA exposure system of FIG. 66.

FIG. 73 shows the construction of the BAA mask 948 used in the present embodiment in a bottom view.

Referring to FIG. 73, it will be noted that the BAA mask 948 includes a number of rectangular beam shaping apertures 1031 formed on a substrate 1030 in rows and columns with a predetermined pitch, wherein the substrate 1030 is defined by edges 1030*a*–1030*d*, and there are provided a number of electrode pads 1034 on the lower major surface of the substrate 1030 such that the electrode pads 1034 surround the region wherein the apertures 1031 are formed. Typically, the electrode pads 1034 are formed with a staggered relationship, wherein the illustrated example uses four rows $1035_1$–$1035_4$ of the electrode pads 1034 along each of the edges 1030*a*–1030*d*. Each of the electrode pads 1034 are connected to a corresponding blanking electrode 1032 by a conductor pattern 1036, wherein the blanking electrodes 1032 are disposed so as to face a common ground electrode 1033 across a pertinent aperture 1031.

It should be noted that each of the pads 1034 has a size a of 0.2 mm in the direction of the pertinent edge such as the edge 1030*a* and a size b of 0.3 mm in the direction perpendicular to the edge 1030*a*, wherein the size of the edge b is set larger than the size of the edge a in view of the elastic deformation or bending of the electrode probes 982 when lowering the mounting of the BAA mask 948 from the level $Q_2$ to $Q_1$. Further, the substrate 1030 carries on the lower major surface thereof test patterns $1037_1$–$1037_3$ respectively on corners 1030*a*–1030*g* for detecting anomalous mounting state of the BAA mask 948. Each of the test patterns such an the test pattern 1037$_1$ includes a pair of electrode pads 1038 and 1039 connected by a bridging pattern 1040. On the other hand, no such a test pattern is formed on a corner 1030*h*, wherein the corner 1030*h* is used for handling the BAA mask 948.

[modification of the seventh embodiment]

Figure 74:
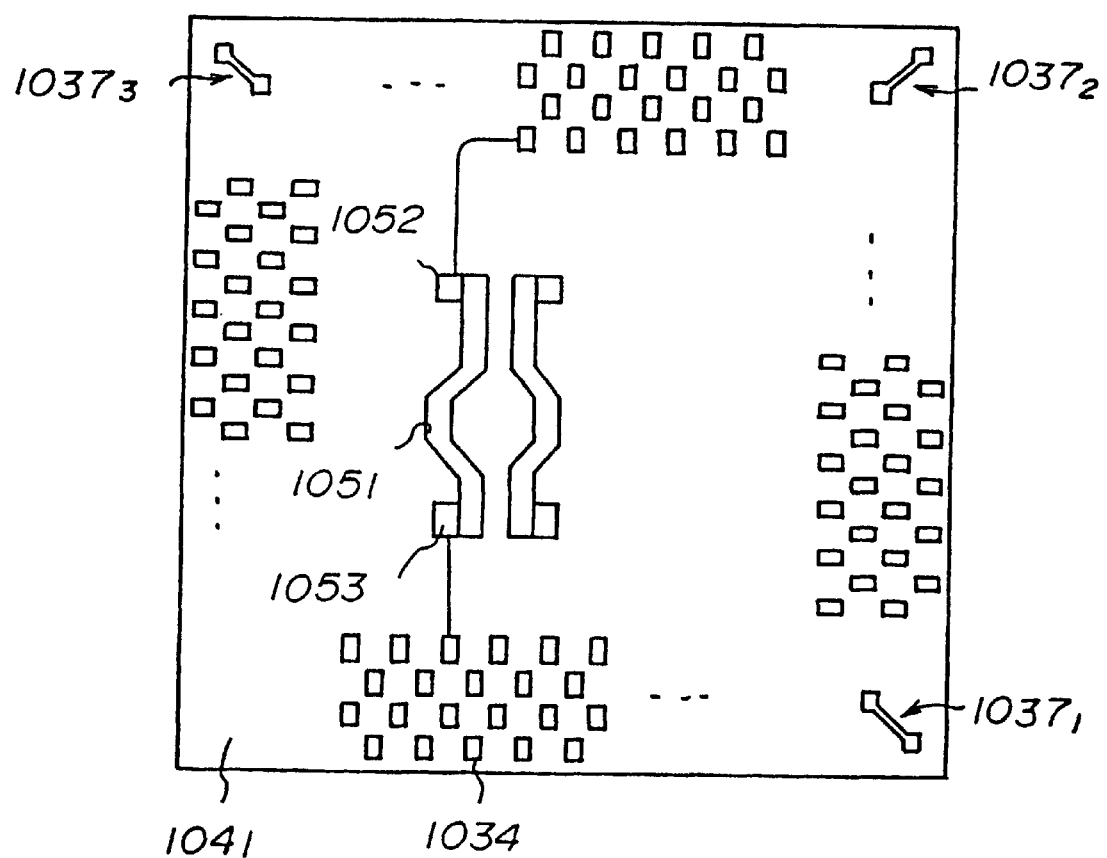
FIG. 74 is an example of a beam shaping mask that can be used in the exposure system of FIG. 66.

It should be noted that the present embodiment is by no means limited to the BAA mask 948 of FIG. 73 but may be applied to other beam shaping masks such as a mask 1050 shown in FIG. 74.

Referring to FIG. 74, the beam shaping mask 1050 is formed on a silicon substrate 1041 and includes generally C-shaped openings 1051 in place of the array of the square apertures 1031, wherein the mask 1050 includes electrostatic deflectors 1052 and 1053 provided adjacent to the C-shaped opening 1051 on the surface of the silicon substrate 1041, such that the electrostatic deflectors 1052 and 1053 are connected to respective electrode pads 1034 formed on the marginal part of the substrate 1041.

FIGS. 75A–75D show the examples of the pattern exposed on a substrate by the electron beam shaped by the opening 1051 for various combination of the drive signals supplied to the electrostatic deflectors 1052 and 1053. It will be noted from FIGS. 75A–75D that one obtains various patterns 1055$_1$–1055$_4$ by using the same mask 1050, by merely changing the combination of the drive signals supplied to the electrostatic deflectors.

It should be noted that beam shaping mask of FIG. 74 has various advantageous features over the beam shaping masks used in the conventional BAA exposure process or block exposure process in that:

(a) versatile patterns can be produced from a single beam shaping aperture;

(b) switching of the patterns from one pattern to a next pattern can be achieved in the order of several nanoseconds. Thus, one can achieve exposure of versatile patterns with a high throughput;

(c) fine patterns can be formed with higher precision as compared with the BAA process.

Figure 76:
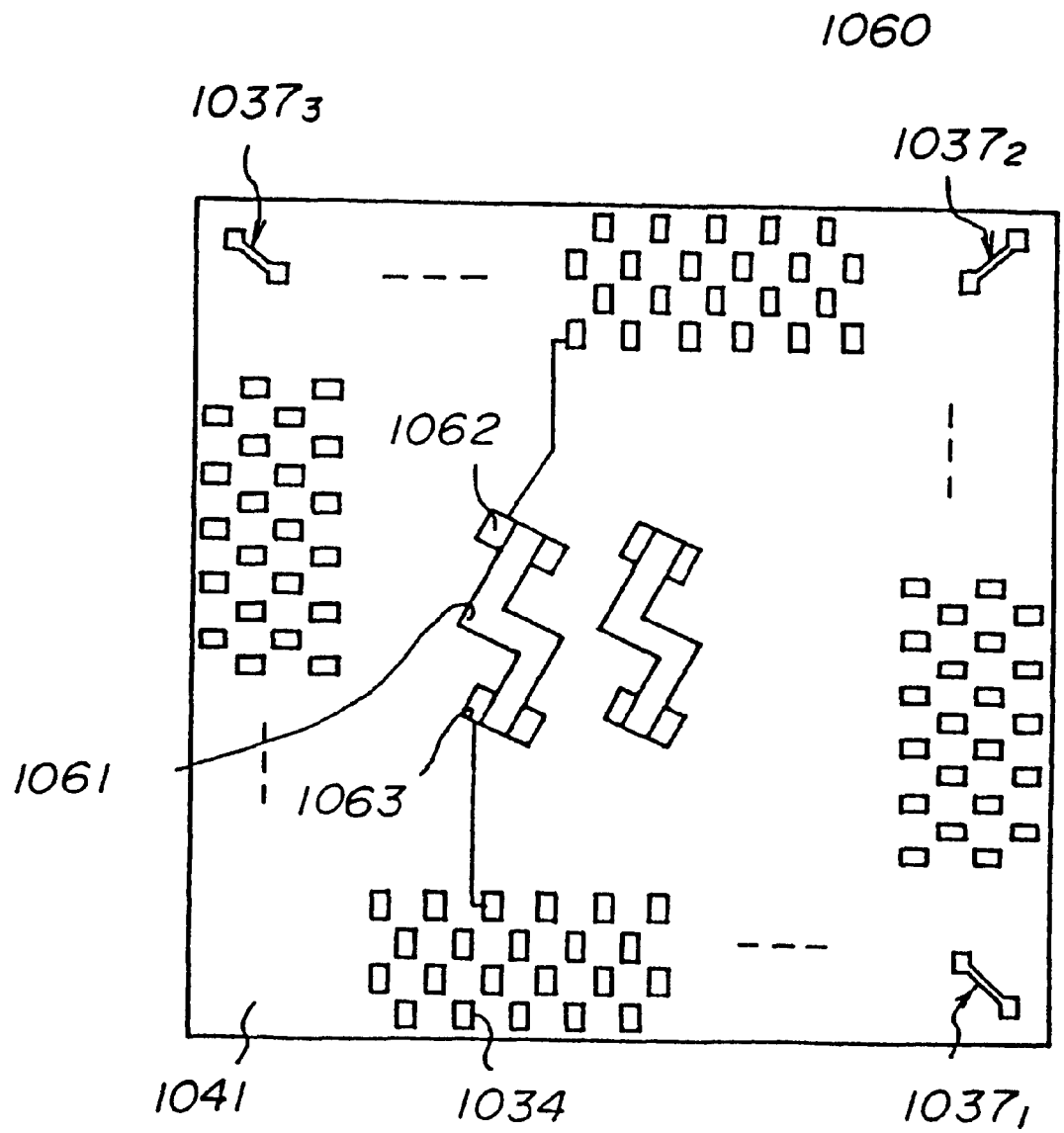
FIG. 76 is a diagram showing another beam shaping mask.

FIG. 76 shows a beam shaping mask 1060 as another example of the foregoing modification, wherein it will be noted that the mask 1060 includes a beam shaping aperture 1061 having a zigzag form. The aperture 1061 is provided with electrostatic deflectors 1062 and 1063, wherein each of the deflectors is connected to a corresponding electrode pad 1034 formed on the marginal area of the beam shaping mask 1060 so as to surround the apertures on the central part.

Next, a description will be given on the electron beam exposure system that is suitable for use in combination with the beam shaping mask of FIG. 74 or FIG. 76, particularly the mask 1060 of FIG. 76. In the description hereinafter, those parts described previously with reference to preceding embodiments are designated by the identical reference numerals and the description thereof will be omitted.

When using the beam shaping mask 1060 of FIG. 76 in the BAA exposure system of FIG. 66, it will be noted that the direction of the beam deflection caused by the mask 1060 is different from the case in which the beam shaping mask 948 of FIG. 73 or the beam shaping mask 1050 of FIG. 74 is used. Thus, there can be a case similar to the one discussed previously with reference to FIG. 54 in which the electron beam deflected by the beam shaping mask 1060 may experience unwanted deflection for deflecting back the electron beam, shaped by the beam shaping mask 1060, toward the optical axis. In such a case, the electron beam deflected by the electrostatic deflector on the beam shaping mask 1060 may not be completely interrupted by the blanking plate 945.

Figure 77:
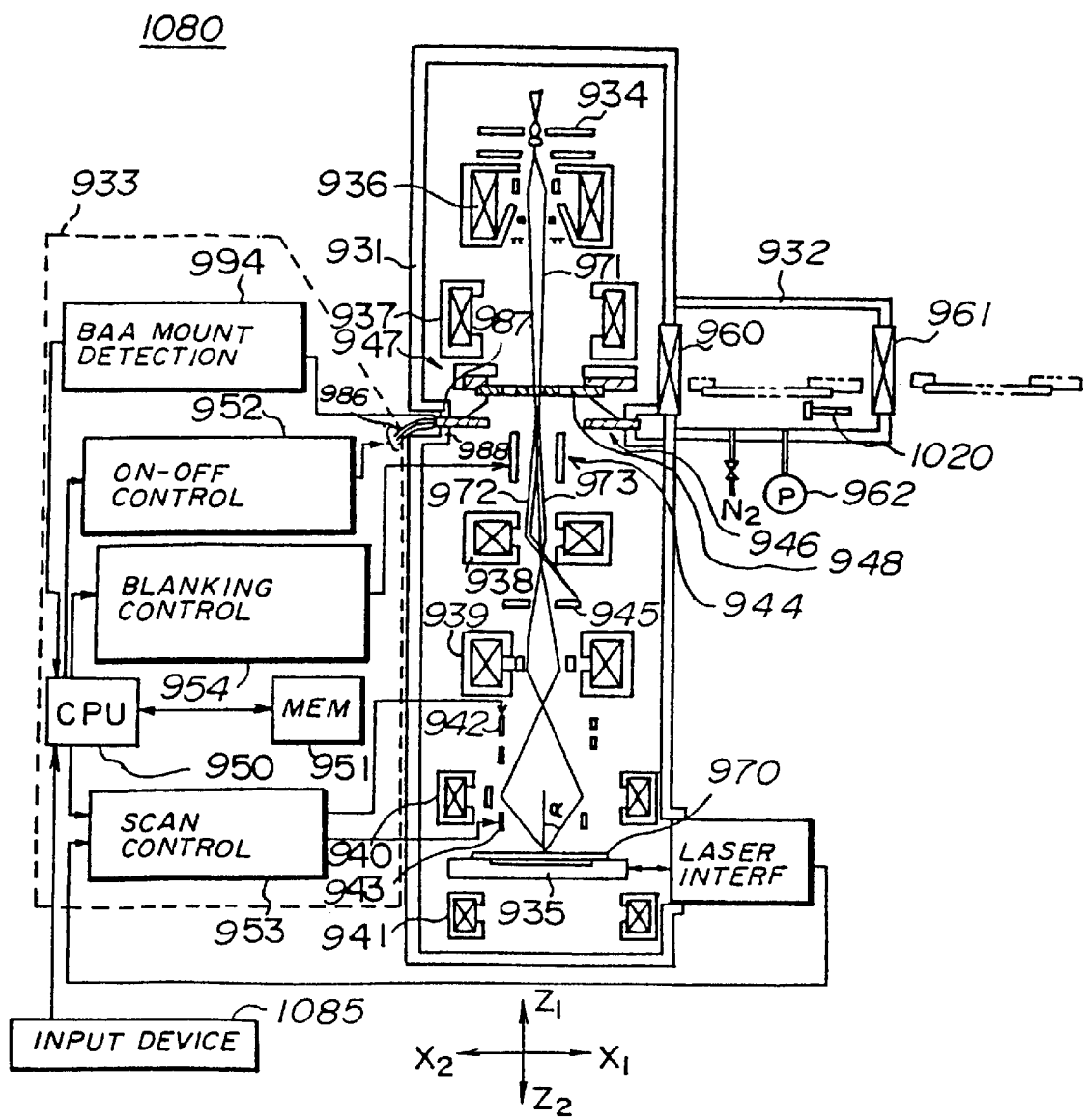
FIG. 77 is a diagram showing the construction of a charged particle beam exposure system that uses the beam shaping mask of FIG. 76 as a modification of the seventh embodiment.
Figure 78:
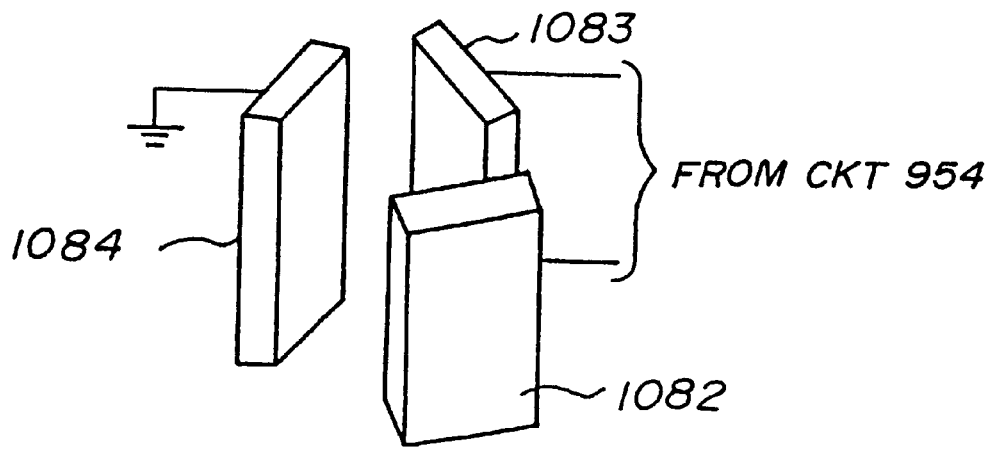
FIG. 78 is a diagram showing the construction of a beam blanking unit used in the charged particle beam exposure system of FIG. 77.

In order to avoid this problem in the BAA exposure system of FIG. 66, which is designed to use various beam shaping masks, the present modification uses an electron beam exposure system of FIG. 77 which is similar to the BAA exposure system of FIG. 66 except that it uses a blanking fixture 1081 shown in FIG. 78.

Referring to FIG. 78, there are three blanking electrodes 1082–1084 in the blanking fixture 1081 for deflecting the electron beam away from the round aperture provided in the blanking plate 945. In the blanking fixture of 1081 of FIG. 78, it will be noted that the electrode 1084 is grounded while the electrodes 1082 and 1083 are supplied with respective drive signals from the blanking control circuit 954, such that the blanking fixture 1081 causes the deflection of the electron beam in an optimum direction for interrupting the electron beam, which has already been deflected by the beam shaping mask 1060, positively by the blanking plate 946.

Figure 79:
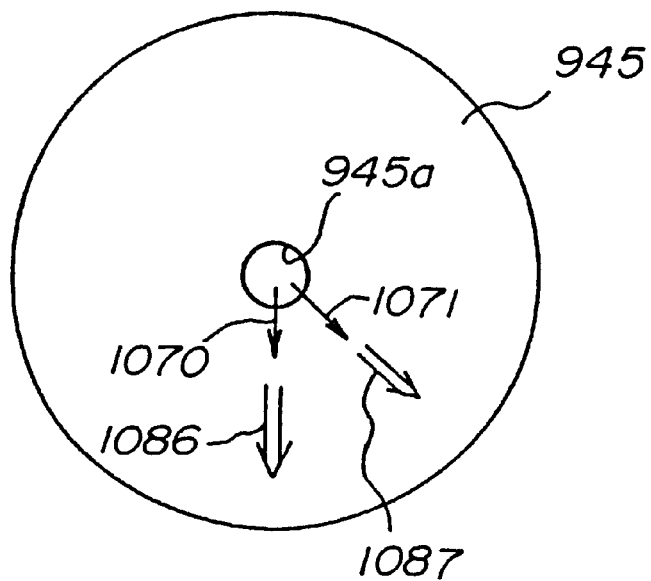
FIG. 79 is a diagram showing the deflection of the charged particle beam caused by the beam blanking unit of FIG. 78.

FIG. 79 shows the deflection of the electron beam in the electron beam exposure system of FIG. 77 on the blanking plate 945, wherein the blanking plate 945 carries a round aperture 945*a* coincident to the optical axis of the electron optical system of the electron beam exposure system. Referring to FIG. 79, it will be noted that the electron beam, deflected by the beam shaping mask 1050 of FIG. 74 in the direction of an arrow 1071, is further deflected in the same direction as represented by an arrow 1087, by optimizing the drive voltages applied to the electrodes 1082 and 1083. Similarly, the electron beam deflected by the beam shaping mask 1060 of FIG. 76 in the direction of an arrow 1070, is further deflected in the same direction as represented by an arrow 1086, by optimizing the drive voltages applied to the electrodes 1082 and 1083.

In order to indicate the direction of the beam deflection caused by the beam shaping mask, the electron beam exposure system of FIG. 77 uses an input device 1085 that provides information about the direction of the beam deflection caused by the beam shaping mask to the CPU 950. The CPU 950 in turn controls the blanking control circuit 954 such that the electron beam deflected by the beam shaping mask is further deflected by the blanking electrode 944 in the same direction. Thereby, the blanking control circuit 954 changes the ratio of the voltages a plied to the electrodes 1082 and 1083 in response to the specified direction of the beam deflection.

[eighth embodiment]

Next, an eighth embodiment of the present invention will be descried.

In order to reduce the fabrication cost of semiconductor devices, it is advantageous to form the semiconductor devices on a large diameter wafer. This principle applies also to the BAA exposure system.

Figure 80:
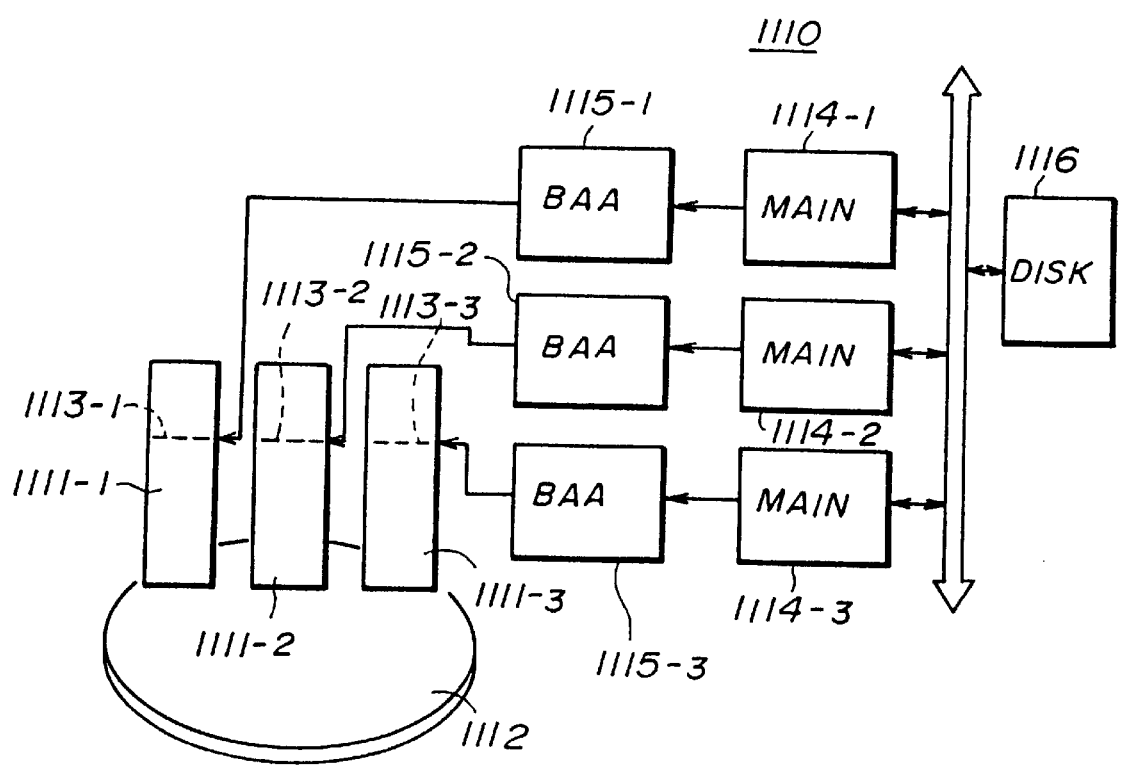
FIG. 80 is a diagram showing a conventional BAA exposure system for exposing a large diameter wafer.

Thus, in order to expose a large diameter substrate such as a wafer of 1112 inches diameter, there is proposed a BAA exposure system 1110 shown in FIG. 80 that uses three electron beam columns 1111$_1$–1111$_3$ disposed such that the electron beam columns 1111$_1$–1111$_3$ expose together a single substrate 1112. The electron beam columns 1111$_1$–1111$_3$ include respective electron guns and electron optical systems including deflection systems, in addition to respective BAA masks 1113$_1$–1113$_3$, wherein a plurality of BAA controllers 1115$_1$–1115$_3$ are provided for controlling the BAA masks 1113$_1$–1113$_3$ respectively. Further, the BAA controllers 1115$_1$–1115$_3$ cooperate with corresponding control systems 1114$_1$–14$_3$, wherein the control systems $1114_1$–$1114_3$ expand and supply dot pattern data indicative of the exposure dots to be formed on the substrate 1112, to respective BAA controllers $1115_1$–$1115_3$, based upon the exposure data from an external control system 1116.

In such a construction of the BAA exposure system, it should be noted that the each of the controllers $1115_1$–$1115_3$ has a construction such as the one described already with reference to FIG. 3. Similarly, each of the control systems $1114_1$–$1114_3$ has a construction shown also in FIG. 3. Thus, the BAA exposure system of FIG. 80 inevitably has a large and complex construction, which is disadvantageous for fabricating semiconductor devices with low cost. It should be noted that the BAA exposure system having a single column and hence using a single BAA mask already requires about 4000 DRAM modules each of 16 Mbits for holding the expanded dot pattern data of a 6-inch wafer. Thus, the system that uses such a BAA column in plural numbers such as four for the exposure of 12-inch wafer, requires enormous memory capacity and hence a BAA control circuit of enormous size. Such a system is deemed unrealistic and inappropriate for the exposure system used for mass production of low cost semiconductor devices.

Thus, the object of the present embodiment is to provide a BAA exposure system wherein the foregoing problems are effectively eliminated.

More specifically, the present embodiment provides a BAA exposure system capable of exposing a pattern on a large diameter substrate without increasing the size of the control system excessively.

Another feature of the present embodiment is to provide a BAA exposure system including a plurality of electron optical systems for exposing respective patterns on respective regions of a common subs rate, wherein the alignment of the patterns exposed by the different electron optical systems is achieved exactly.

Thus, the present embodiment provides a charged particle beam exposure system for exposing a pattern on an object, comprising:

a base body for accommodating an object to be exposed;

a plurality of electron optical systems provided commonly on said base body, each of said electron optical systems including:

beam source means for producing a charged particle beam, said beam source means emitting said charged particle beam toward an object on which a pattern is to be exposed, along an optical axis;

beam shaping means for shaping said charged particle beam to produce a plurality of charged particle beam elements in accordance with exposure data indicative of a dot pattern to be exposed on said object, said beam shaping means comprising a beam shaping mask carrying thereon a plurality of apertures for producing a charged particle beam element by shaping said charged particle beam;

focusing means for focusing said charged particle beam elements upon a surface of said object;

deflection means for deflecting said charged particle beam elements over said surface of said object; and a column for accommodating said beam source means, said beam shaping means, said focusing means, and said deflection means;

said electron optical system thereby exposing said charged particle beam element upon said object held in said base body;

exposure control system supplied with exposure data indicative of a pattern to be exposed on said object and expanding said exposure data into dot pattern data corresponding to a dot pattern to be exposed on said object, said exposure control system being provided commonly to said plurality of electron optical systems and including memory means for holding said dot pattern data;

said exposure control system supplying said dot pattern data to each of said plurality of electron optical systems simultaneously, such that said pattern is exposed on said object by said plurality of electron optical systems simultaneously.

According to the foregoing embodiment of the present invention, the size of the BAA exposure system is substantially reduced, even when exposing a large diameter wafer by using a plurality of electron optical systems simultaneously.

Figure 81:
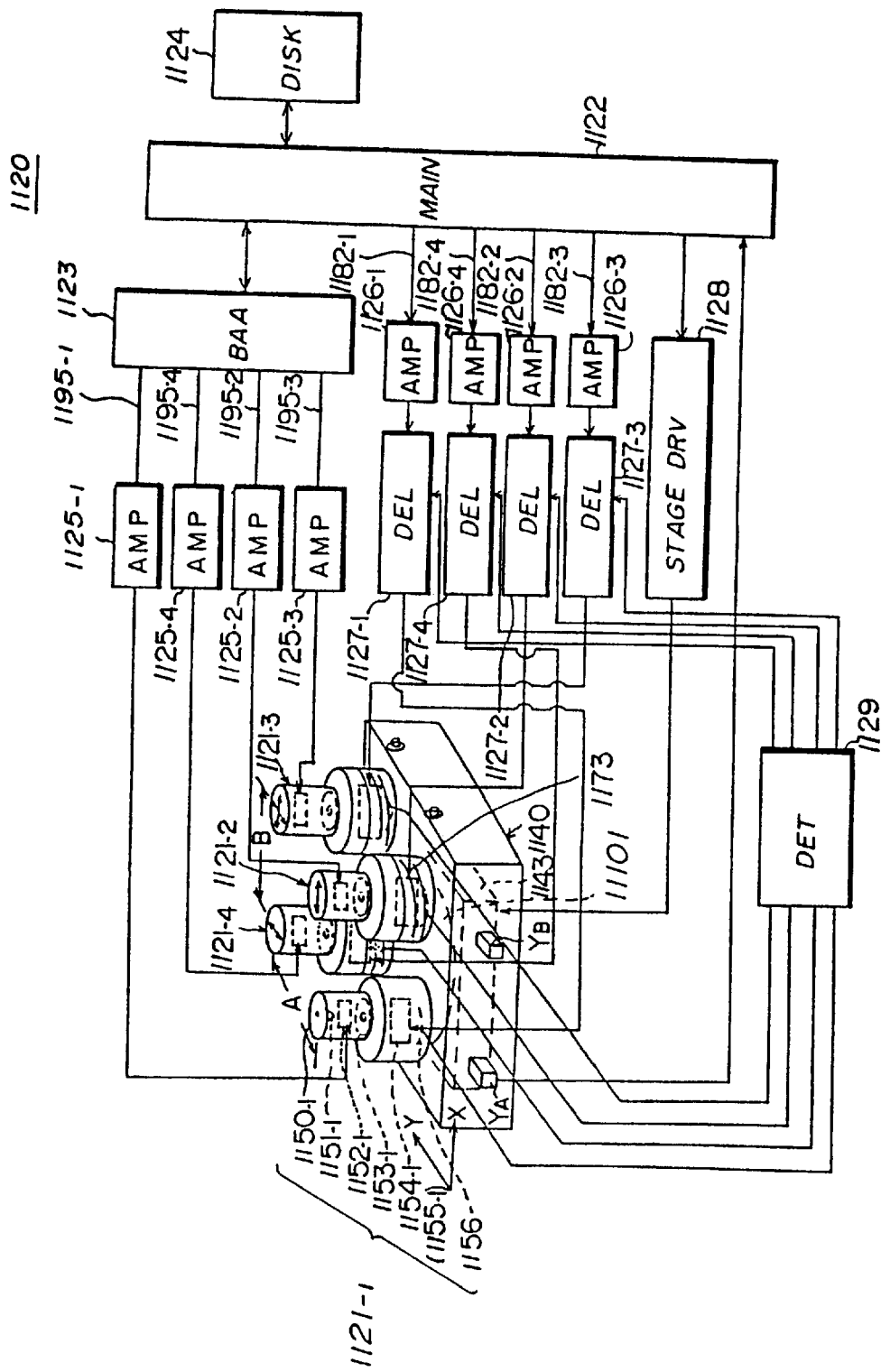
FIG. 81 is a diagram showing the overall construction of the BAA exposure system according to an eighth embodiment of the present invention.

FIG. 81 shows the construction of a BAA exposure system 1120 according to the present embodiment.

Referring to FIG. 81, the BAA exposure system 1120 includes four electron optical systems $1121_1$–$1121_4$ for exposing a large diameter wafer such as the wafer of 12 inches diameter, wherein each of the electron optical systems $1121_1$–$1121_4$ is capable of exposing a substrate for an area corresponding to the 6-inch wafer. The electron optical systems $1121_1$–$1121_4$ are controlled by a single, common main controller 1122 of which construction will be described later in detail. The main controller 1122 cooperates with an external storage device 1124 that stores the exposure data, and supplies dot pattern data $1195_1$–$1195_4$ corresponding to the exposure dots to be formed on the substrate, to each of the electron optical systems $1121_1$–$1121_4$ for controlling BAA masks provided therein. It should be noted that each of the electron optical systems $1121_1$–$1121_4$ includes an evacuated column $1150_1$, while the evacuated column $1150_1$ accommodates therein an electron gun $1151_1$, a BAA mask $52_1$, a blanking plate $1153_1$ formed with a round aperture, a sub-deflector $54_1$ and a main-deflector $55_1$. Further, the electron optical systems $1121_1$–$1121_4$ are provided on a common, hollow base body 1140, in which a stage 1143 is provided for holding a wafer 1101 of a large diameter such as 12 inches. A similar construction of the electron optical system $1121_1$ is provided also on other electron optical systems $1121_2$–$1121_4$.

It should be noted that the BAA mask 1152 produces a plurality of electron beam elements simultaneously by shaping an electron beam produced by the electron gun 1151 similarly to other BAA masks described before, and includes a plurality of deflectors provided in correspondence to the beam shaping apertures on the BAA mask. Further, the sub-deflector 1154 cooperates with the main deflector 1155 to cause the electron beam elements produced by the BAA mask 1152 to scan over the surface of the substrate 1160 similarly as before. Further, there is provided a reflection electron detector 1156 for detecting reflected electrons produced as a result of irradiation of the electron beam elements. In FIG. 81, the electron lenses are omitted from illustration for the sake of clarity of the drawing.

In the construction of FIG. 81, it should be noted that the dot pattern data $1195_1$–$1195_4$ produced by the BAA controller 1123 under control of the main controller 1122, are supplied to the respective electron optical systems $1121_1$–$1121_4$ via corresponding amplifiers $1125_1$–$1125_4$. Similarly, the main controller 1122 controls the sub-deflectors 54 of the electron optical systems $1121_1$–$1121_4$ via respective amplifiers $1126_1$–$1126_4$ and corresponding variable delay lines $1127_1$–$1127_4$. Further, the main controller 1122 controls the movable stage 1143 via a stage drive circuit 1128.

In the system of FIG. 81, it should be noted that there is provided a timing detection circuit 1129 for detecting the timing of operation of the BAA masks 1152, wherein the timing detection circuit 1129 is supplied with output signals from the reflection electron detectors 1156 of all of the electron optical systems $1121_1$–$1121_4$ and controls the variable delay lines $1127_1$–$1127_4$ such that the timing of beam deflection or scanning is aligned for all of the electron optical systems $1121_1$–$1121_4$. Further, there is provided a laser interferometer 1144 in the base body 1140 for detecting the position of the movable stage 1143. The output of the laser interforometer 1144 is fed back to the main controller 1122.

Figure 82:
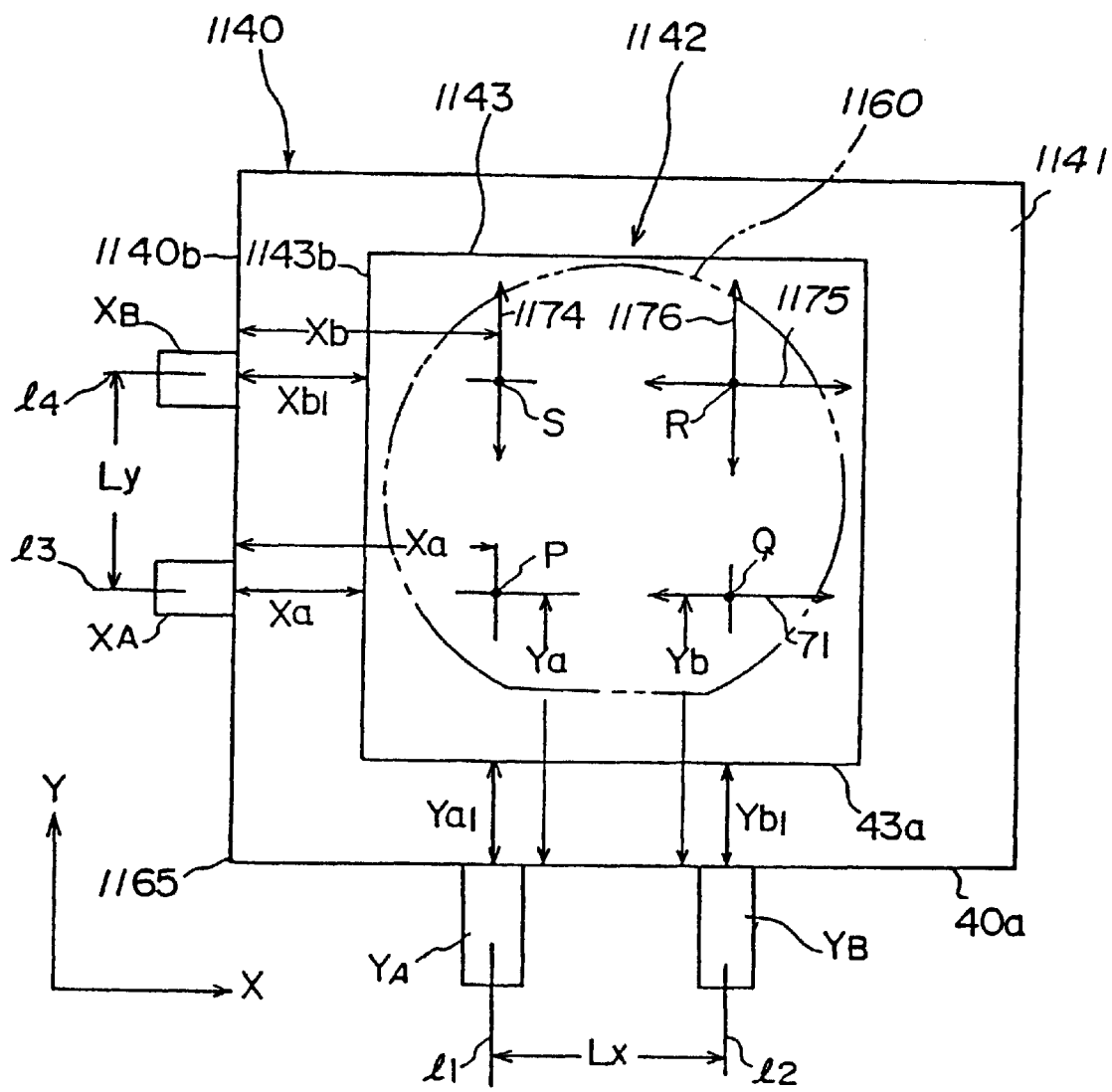
FIG. 82 is a diagram showing a part of the BAA exposure system in detail.

FIG. 82 shows the construction or the base body 1140 on which the electron optical systems $1121_1$–$1121_4$ are provided.

Referring to FIG. 82, the base body 1140 defines therein a hermetically sealed space 1141 in which the foregoing movable stage 1143 of a square form is provided. The stage 1143 forms, together with a drive mechanism not illustrated and moving the stage 1143 in the X- and Y-directions, a stage assembly 1142.

The stage 1143 is defined by side walls 1143a and 1143b each forming a mirror surface, and laser interferometers $Y_A$ and $Y_B$ are disposed so as to face the mirror surface 1143a for measuring distances $Ya_1$ and $Yb_1$, wherein the distances $Ya_1$ and $Yb_1$ represent the distances, measured in the Y-direction, between the laser interforometer $Y_A$ and the mirror surface 1140a and between the laser interferometer $Y_B$ and the mirror surface 1140a, respectively. similarly, laser interferometers $X_A$ and $X_B$ are formed so as to face the mirror surface 1140b for measuring distances $Xb_1$ and $Xa_1$ in the X-direction, respectively. It should be noted that the two laser interferometers $Y_A$ and $Y_B$ have respective optical axes $1_1$ and $1_2$ and are disposed with a mutual separation of Lx in the X-direction. similarly, the two laser interferometers $X_A$ and $X_B$ have respective optical axes $1_3$ and $1_4$ and disposed with a mutual separation of Ly in the Y-direction.

Thus, the first electron optical system $1121_1$ having an electron beam column $1150_1$ is provided on the base body 1140 such that the optical axis of the electron optical system $1121_1$ coincides with the intersection of the optical axis $1_1$ of the laser interferometer $Y_A$ and the optical axis $1_3$, wherein the foregoing intersection is represented in FIG. 82 by a point P. It should be noted that the point P has a coordinate $(X_a, Y_a)$ with respect to an origin 1165 set at the lower left corner of the base body 1140.

On the other hand, the second electron optical system $1121_2$ is provided on the base body 1140 generally in correspondence to an intersection of the axes $1_2$ and $1_3$ represented by a point Q, wherein the electron optical system $1121_2$ has a corresponding electron beam column $1150_2$ mounted on a movable stage provided on the base body 1140 in optical alignment with the axis $1_3$ so as to be movable in the X-direction as indicated by an arrow 1171.

Further, the third electron optical system $1121_3$ is mounted upon the base body 1140 generally in correspondence to the intersection of the axes $1_2$ and $1_4$ represented by a point R, wherein the electron optical system 11213 has a corresponding column $1150_3$ mounted on a movable stage provided on the base body 1140 so as to be movable in the X-direction as indicated by an arrow 1175 as well as in the Y-direction as indicated by an arrow 1176. Similarly, the fourth electron optical system $1121_4$ is mounted upon the base body 1140 generally in correspondence to the intersection of the axes $1_1$ and $1_4$ represented by a point S, wherein the electron optical system $1121_4$ has a corresponding column $1150_4$ mounted upon a movable stage provided on the base body 1140 in optical alignment with the axis $1_1$ so as to be movable in the Y-direction as indicated by an arrow 1174.

Figure 83:
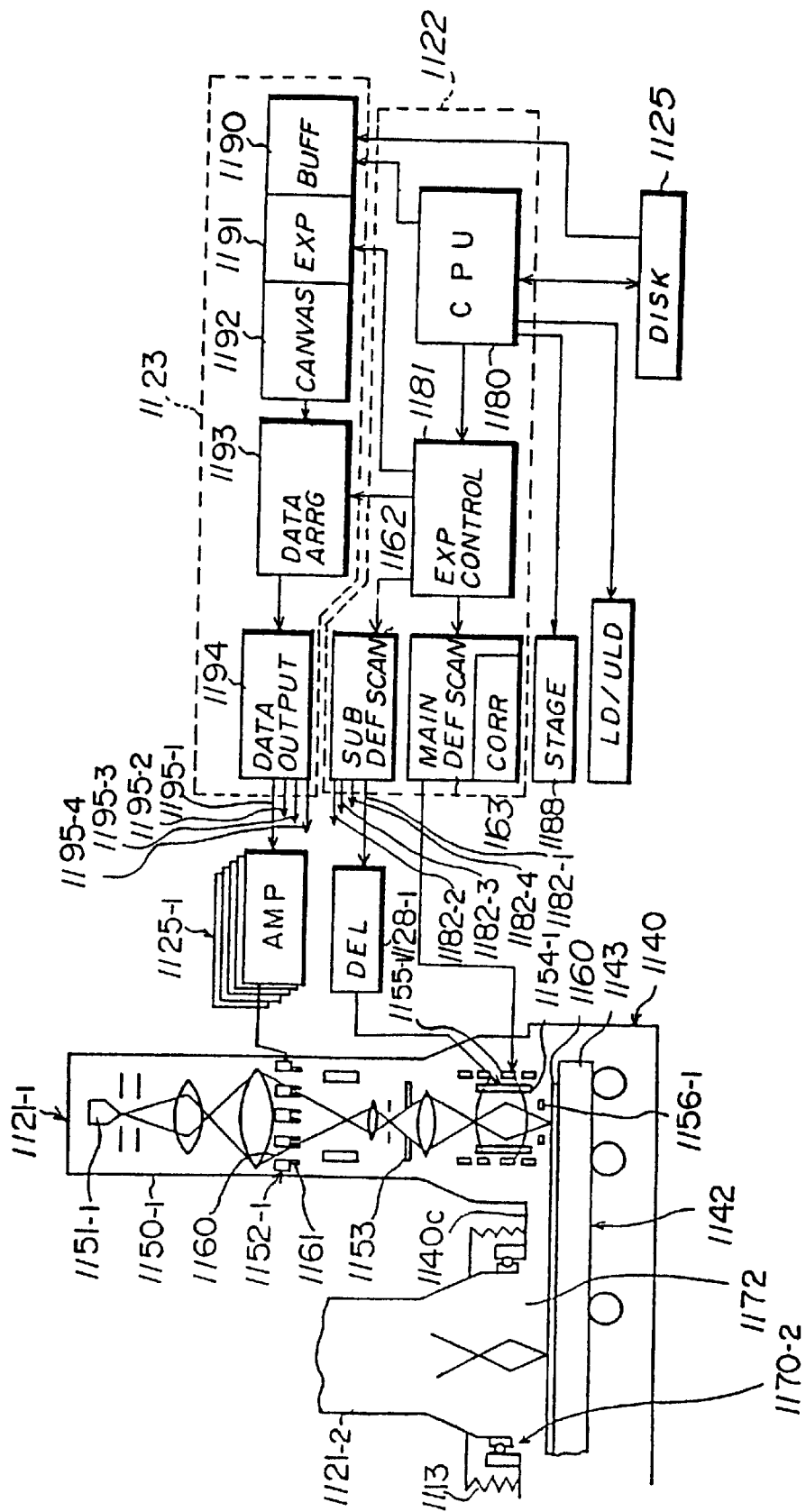
FIG. 83 is a diagram showing the BAA exposure system of FIG. 81 in more detail.

FIG. 83 shows a detailed construction of the BAA exposure system of FIG. 83, wherein only a part of the structure will be shown for the same of simplicity.

Referring to FIG. 83, it will be noted that the base body 1140 accommodates therein the stage mechanism 1142, wherein the stage mechanism includes the movable stage 1143 carrying thereon the substrate 1160 as already noted. The base body 1140 further supports the electron optical systems $1121_1$–$1121_4$ on an upper major surface 1140c thereof, wherein only the electron optical systems $1121_1$ and $1121_2$ are illustrated for the sake of simplicity. It should be noted that the electron optical system $1121_1$ is fixed upon the base body 1140 in optical alignment with the point P shown in FIG. 84, while the electron optical system $1121_2$ is provided on a movable stage mechanism $1172_2$ that holds the column $1150_2$ of the electron optical system $1121_2$ movably in the X-direction. The stage mechanism $1172_2$ includes a drive shaft 1172a and a correspondingly guide 1172b and is covered by a flexible seal 1113 of bellows.

FIG. 83 shows the control system of the BAA exposure system 1120 in detail, wherein the control system of FIG. 83 is similar to the one described previously in FIG. 3 with reference to the prior art.

More specifically, a CPU 1180, forming a part of the main controller 1122, reads out the pattern data to be exposed and supplies the same to a data expansion unit 1191 of the BAA controller 1123 via a buffer memory 1190 also forming a part of the BAA controller 1123, wherein the data expansion unit 1191 expands the exposure data into dot pattern data and stores the same in a canvas memory 1192, which is formed of an extensive array of DRAMs. The canvas memory 1192 in turn supplies the dot pattern data to a data rearrange circuit 1193, of which construction is described in detail in the U.S. patent application Ser. No. 08/241,409, op. cit., and the exposure dot data is supplied from the data rearrange circuit 1193 to a data output circuit 1194 included also in the BAA controller 1123 together with the canvas memory 1192 and the data rearrange circuit 1193, wherein the data output circuit 1194 supplies the exposure dot data $1195_1$–$1195_4$ for the electron optical systems $1121_1$–$1121_4$, respectively via corresponding amplifiers $1125_1$–$1125_4$.

In the construction of the BAA controller 1123 above, it will be noted that the extensive memory array forming the canvas memory 1192 is used commonly by the electron optical systems $1121_1$–$1121_4$ and the BAA exposure system is constructed with a substantially reduced size and hence cost.

The main controller 1122 includes an exposure controller 1181 that controls the data expansion unit 1191 and the data arranging circuit 1193 similarly as the conventional system of FIG. 3. The exposure controller 1181 further controls the main and sub-deflectors $1154_1$ and $1155_1$ provided in the electron optical system $1121_1$ by way of deflection controllers 1162 and 1163 for causing the electron beam elements, shaped by the BAA mask $1152_1$, to scan over the surface of the substrate 1101, wherein the deflection controller 1162 produces the deflection control signals $1192_1$–$1182_4$ respectively in correspondence to the electron beam optical systems $1121_1$–$1121_4$ for controlling the sub-deflectors $1154_1$–$1154_4$. In order to adjust the timing of the beam scanning, the deflection control signals $1182_1$–$1182_4$ are supplied to the corresponding sub-deflectors $1154_1$–$1154_4$ via the delay lines $1127_1$–$1127_4$ as described previously.

Thereby, the delay of the delay lines $1127_1$–$1127_4$ is set by detecting the difference in the timing of the turning on and turning off of the electron beam elements in the electron optical systems $1121_1$–$1121_4$ by means of the reflection electron detectors $1156_1$–$1156_4$.

In order to conduct the exposure of large diameter wafer such as a wafer of 12 inches diameter, it should be noted that electron optical systems $1121_1$–$1121_4$ have to be aligned with each other exactly. Hereinafter, the procedure for aligning the electron optical systems will be described with reference to FIG. 84.

Figure 84:
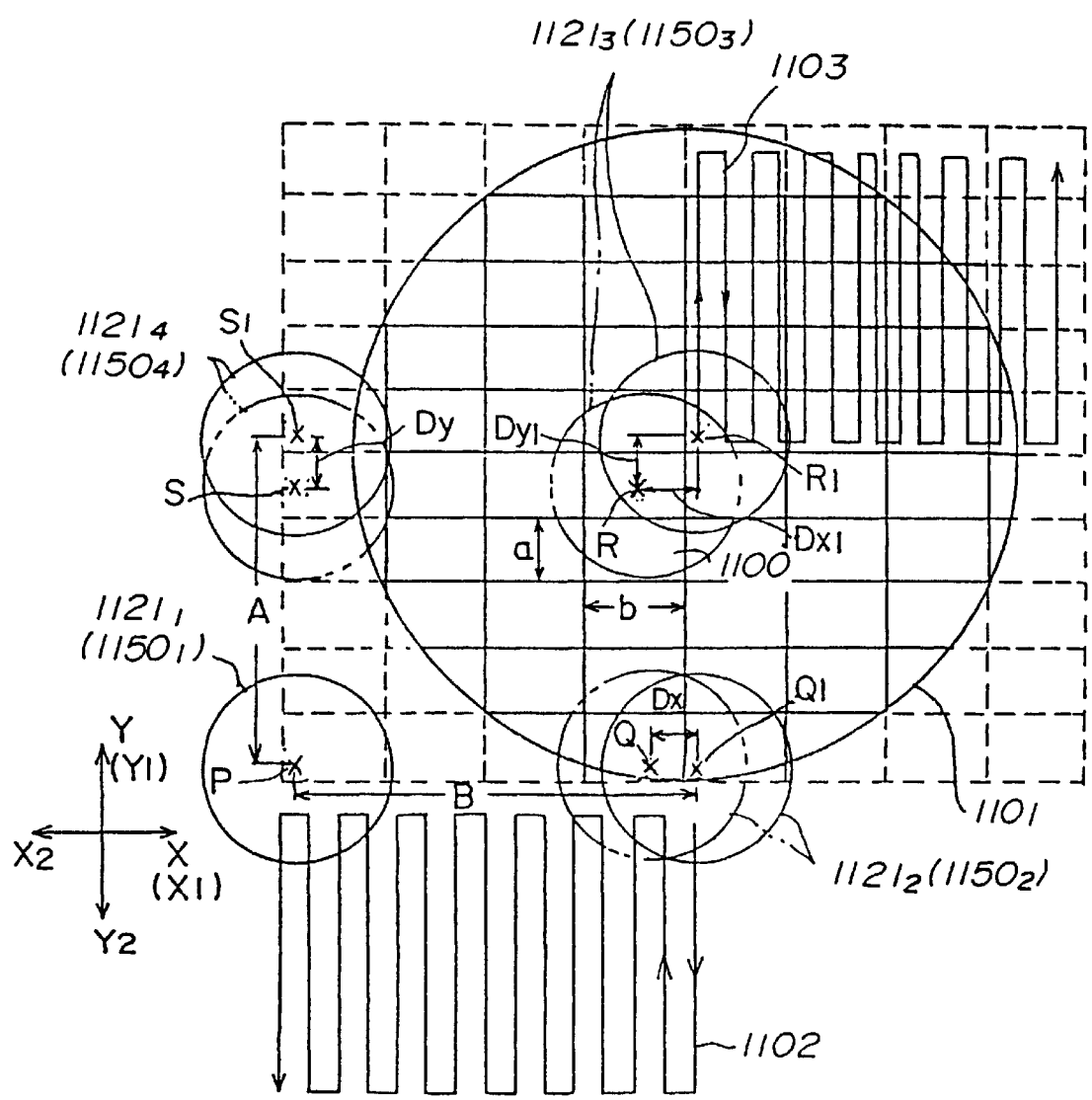
FIG. 84 is a diagram showing the adjustment employed in the BAA exposure system of FIG. 81.

Referring to FIG. 84, it will be noted that the surface of the substrate 1101 is divided into a number of chip areas 1100, wherein the electron optical system $1121_1$ is used for exposing the chips on the lower left quadrant of the wafer 1101, the electron optical system $1121_2$ is used for exposing the chips on the lower right quadrant of the wafer 1101, the electron optical system $1121_3$ is used for exposing the chips on the upper right quadrant of the wafer 1101, and the electron optical system $1121_4$ is used for exposing the chips on the upper left quadrant of the wafer 1101. In such a case, it is desired to set the interval between the electron optical systems $1121_1$–$1121_4$ to be a multiple integer of the size of the chip 1100 to be exposed on the substrate 1101, for the efficient use of the substrate 1101. For example, the distance A between the electron optical systems $1121_1$ and $1121_4$ or $1121_2$ and $1121_3$ may be set five times as large as the size a of the chip 1100 in the Y-direction. Similarly, the distance B between the electron optical system $1121_1$ and $1121_2$ or $1121_3$ and $1121_4$ may be set four times as large as the size b of the chip 1100 in the X-direction.

In order to achieve such an optimization of the electron optical systems, the stage mechanisms 1172 that carries the columns of the electron optical systems $1121_2$–$1121_4$ are activated such that the electron optical system $1121_2$ is moved, with respect to the reference optical system $1121_1$, in the $X_1$-direction with a distance of Dx. Thereby, the optical system $1121_2$ moves from the position Q to a new position $Q_1$. Similarly, the electron optical system $1121_3$ is moved, from the original position R, in the $X_1$ direction with a distance of $Dx_1$ and in the Y direction with a distance of $Dy_1$, to reach a new position $R_1$. Further, the electron optical system $1121_4$ is moved, from the original position S, in the $Y_1$ direction with a distance of Dy, to reach a new position $S_1$.

As a result of the shifting of the position of the electron optical systems $1121_1$–$1121_4$, the position of the electron optical systems has to be corrected in the main controller 1122 for each of the electron optical systems $1121_1$–$1121_4$. It should be noted that the laser interferometers used for detecting the stage position and hence the wafer position cannot be moved together with the electron optical systems.

Figure 85:
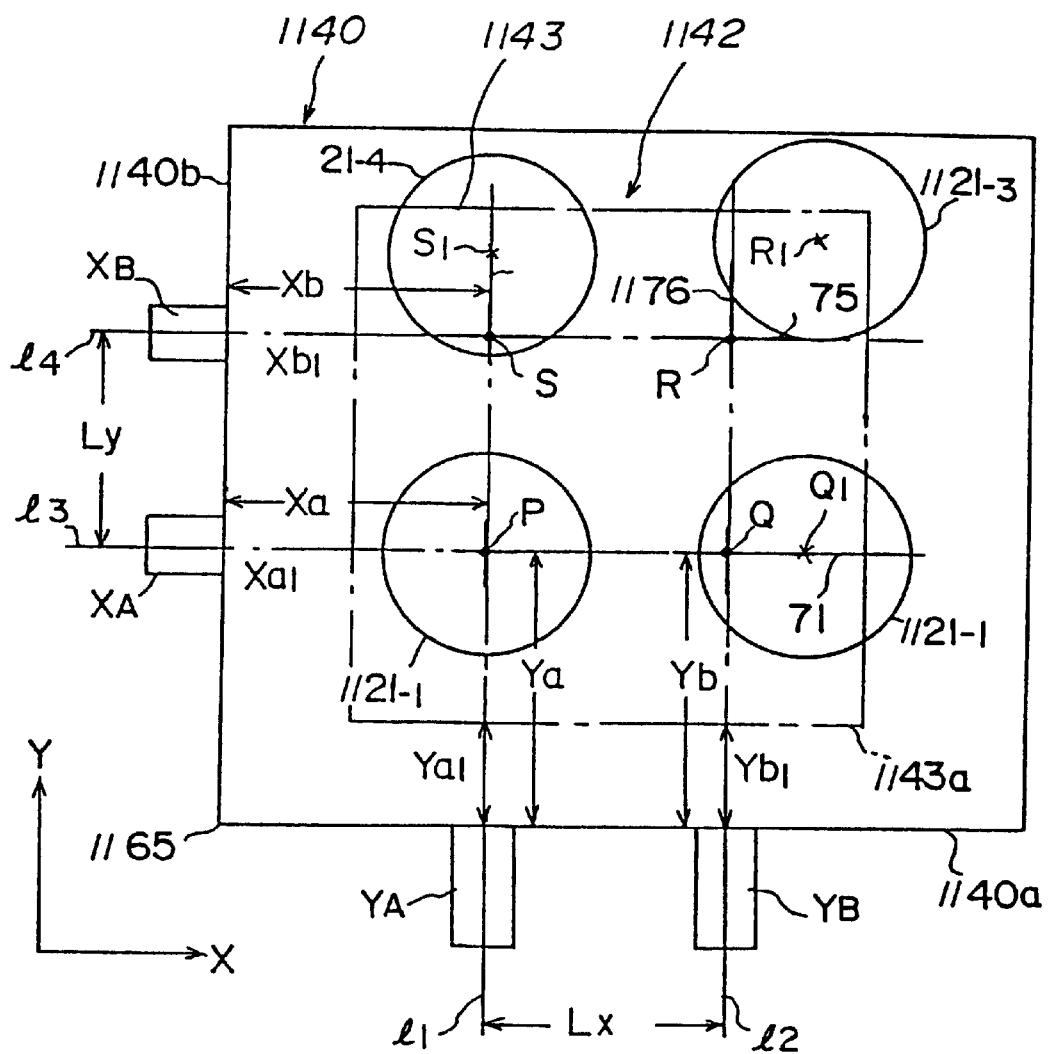
FIG. 85 is a diagram showing the correction of the position of the electron optical system associated with the adjustment of FIG. 84.

Such a correction is easily achieved by adding the amount of the shift such as Dx and Dy to the original coordinate of the electron optical systems as indicated in FIG. 85. For example, the position of the optical axis of the electron optical system 11211 does not change and is given an $X_1$=Xa, $Y_1$=Ya, while the position of the optical axis of the electron optical system $1121_2$ is given as $X_2$=Xa+Lx+Dx, $Y_2$=Ya+Ly+Dy.

Further, the position of the optical axis of the electron optical system $1121_3$ is given as $X_3$=Xa+Lx+Dx+Dy(Xb−Xa)/Ly, $Y_3$=Ya+Ly+Dy+Dx(Yb−Ya)/Lx.

The position of the optical axis of the electron optical system $1121_4$ is given as $X_4$=Xa+Dy(Xb−Xa)/Ly $Y_4$=Ya+Ly+Dy.

By employing the construction of the BAA exposure system of the present embodiment, it is possible to expose a wafer of 12 inches diameter with the time needed for exposing a wafer of 6 inches diameter. It should be noted that each of the electron optical systems $1121_1$–$1121_4$ exposes only one-quarter of the 12 inches wafer, and it is possible to obtain a throughput of about 30 wafers per hour.

When exposing semiconductor devices having a different size for the edges a and b, the setting of the electron optical systems $1121_1$–$1121_4$ is changed, and the exposure is conducted similarly. Typically, the X-Y stage mechanism 1172 can cover a range of 15 mm. Thus, the BAA exposure system of the present embodiment can expose the integrated circuit chips of various sizes.

[ninth embodiment]

In the conventional BAA exposure system described heretofore such as the one described with reference to FIG. 3, the objective lens 107 is provided above the substrate 115 and there has been no substantial leakage of the magnetic field of the electron lens 107 to the substrate 115.

On the other hand, there is a different type of electron lens called immersion lens that is promising for the objective lens 107 of the BAA exposure system. In immersion lenses, an object or substrate is placed within the magnetic field created by the lens, and the focusing of the electron beam is achieved in such a magnetic field. The immersion lens is advantageous for the BAA exposure system in the point that it causes little aberration in the electron beam.

Meanwhile, most of the conventional electron beam exposure systems, including the BAA exposure systems described heretofore, carry out the exposure of patterns while moving the substrate continuously, for improved throughput of exposure. Thus, use of the foregoing immersion electron lens in combination with such a conventional electron beam exposure systems is thought a promising approach for realizing high resolution and high throughput electron beam exposure systems.

However, such a combination of the immersion lens and the electron beam exposure system causes a problem in that an eddy current is induced in a conductor layer or pattern formed on the substrate as the substrate is moved continuously through the magnetic field created by the immersion lens. As such an eddy current produces a magnetic field, there inevitably occurs a deviation in the beam position as compared with the intended beam position.

Figure 86:
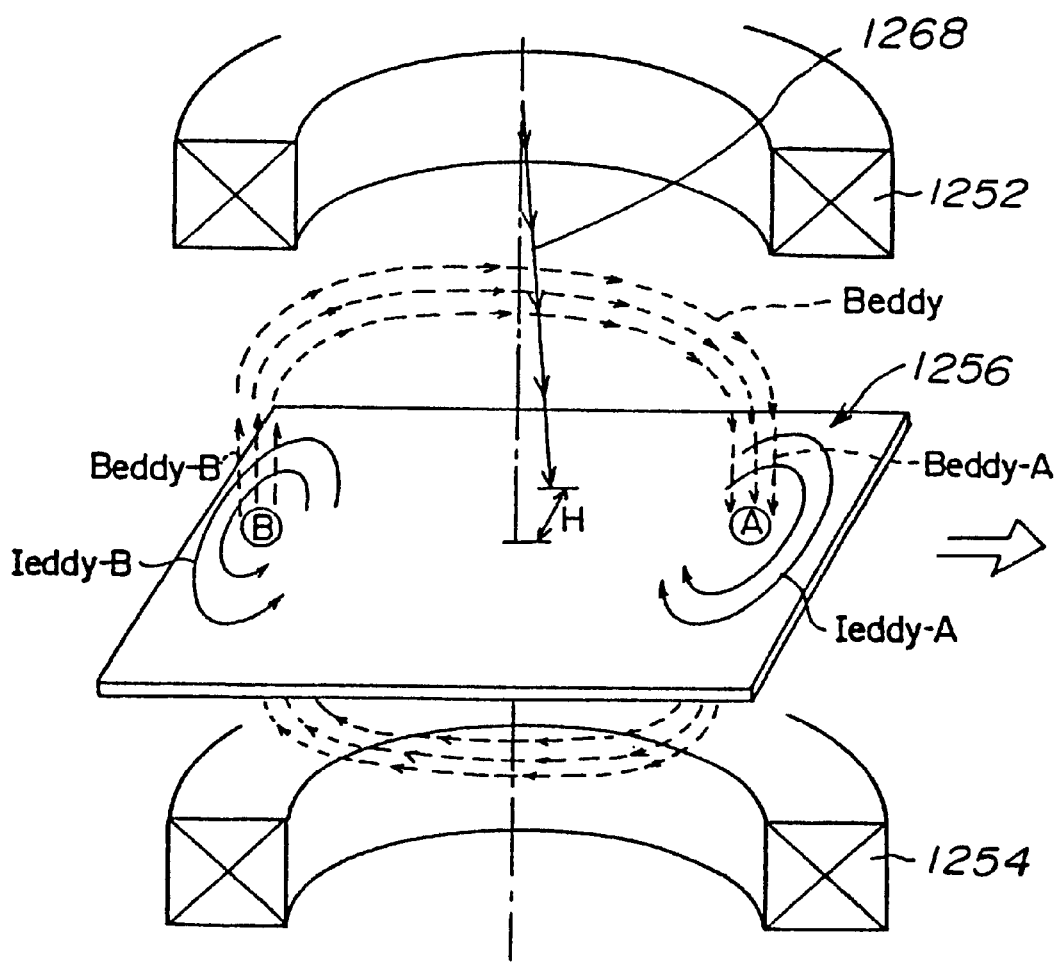
FIG. 86 is a diagram showing the construction of an immersion lens and the problem occurring in an electron beam exposure system associated with the use of such an immersion lens.

FIG. 86 shows a conventional immersion lens 1250 in an enlarged scale.

Referring to FIG. 86, the immersion lens 1250 is formed of a first objective lens 1252 and a second objective lens 1254, in which the lens 1252 is provided in the upstream side of the lens 1254. Further, a substrate 1256 is disposed between the lens 1252 and the lens 54. In FIG. 86, it is assumed that the substrate 1256 is moved in the direction to the right as indicated by an arrow by means of a drive mechanism not illustrated.

It should be noted that the substrate 1256 carries thereon a number of conductor patterns and/or semiconductor elements that form a conductive part. Thus, the magnetic field created between the two opposing lenses 1252 and 1254 inevitably interlines with the substrate 1256, and an eddy current flows as the substrate 1254 moves in the direction shown in the arrow. It should be noted that such a motion of the conductive part in the magnetic field induces a voltage V represented as V=−dφ/dt, wherein φ represents the magnetic flux, and the voltage thus induced causes the foregoing eddy current.

The eddy current flows through the substrate 1256 in the direction so as to oppose the magnetic field created by the lenses 1252 and 1254. Assuming that the magnetic flux caused by the lenses 1252 and 1254 is directed in the upward direction, an eddy current $I_{eddy-A}$ flows in a region A of the substrate 1256 in a clockwise direction when viewed from the upward direction of the substrate 1256, so as to oppose the increasing magnetic flux. It should be noted that the region A is the region that is entering the magnetic field created by the lenses 1252 and 1254 and experiences an increase in the magnetic field. On the other hand, in a region B of the substrate 1256 that is exiting from the lens magnetic field, the eddy current flows in a counter clockwise direction as viewed from the upward direction of the substrate 1256 as indicated by a current $I_{eddy-B}$, so as to prevent the decrease or the magnetic flux.

As a result of the eddy currents $I_{eddy-A}$ and $I_{eddy-B}$ thus induced, there is formed a magnetic flux $B_{eddy}$ as indicated in FIG. 86, wherein the magnetic flux $B_{eddy}$ thus created crosses the electron beam 1268 and causes a deviation H as indicated in the beam position.

Figure 87:
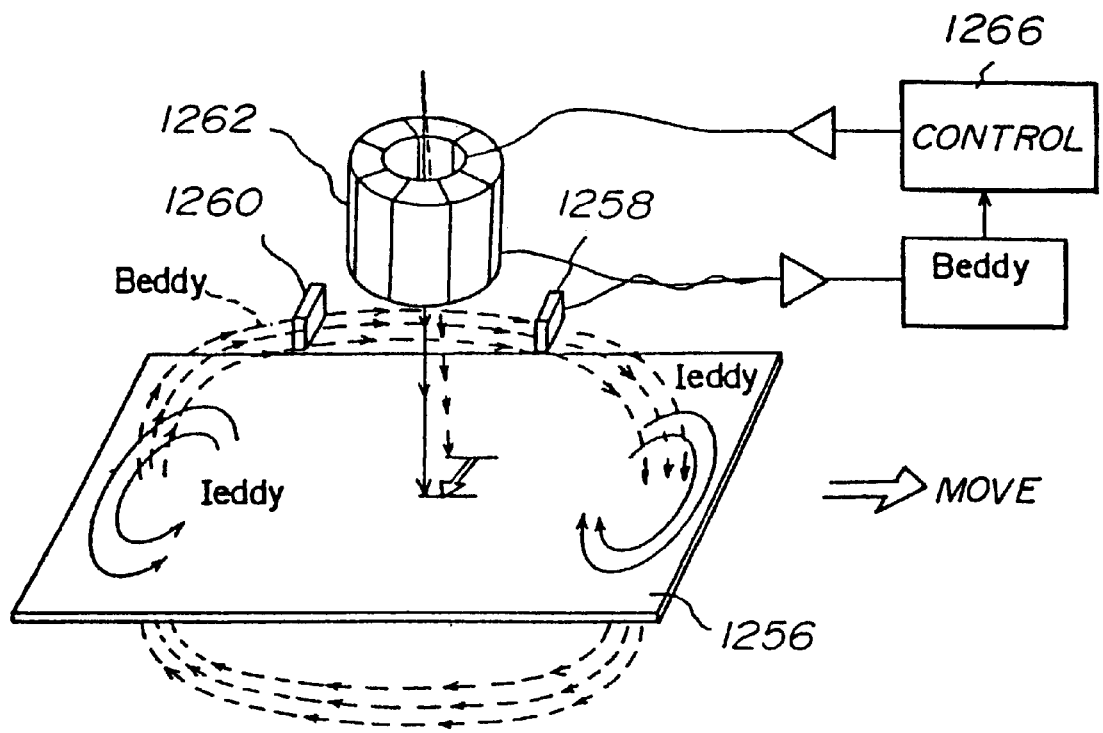
FIG. 87 is a diagram showing the construction used conventionally for eliminating the problem of beam offset in the electron beam exposure system that uses an immersion lens.

Thus, conventional electron beam exposure system that uses the immersion lens has corrected the beam deviation H by disposing hole sensors 1258 and 1260 in the area where the eddy magnetic flux $B_{eddy}$ is expected as indicated in FIG. 87. Thus, the beam correction is achieved by evaluating the beam deviation H by a control unit 1266 based upon the output of the hole sensors 1258 and 1260 and by providing a counter-acting beam deflection to the electron beam 1268 by energizing an electrostatic deflector 1262. It should be noted that the hole sensors 1258 and 1260 are fixed against the body of the electron beam exposure system. As the magnetic field of the lens is set constant, it is possible to evaluate the magnetic field $B_{eddy}$ in terms of deviation or the magnetic field strength.

In such a construction, however, exact detection of the magnetic field of the eddy current by means of the hole sensors 1259 and 1260 is difficult, as the magnitude of such an eddy magnetic field is very small, less than 1 mGauss. Further, it is difficult to mount the tiny hole sensors 1258 and 1260 upon the electron optical system of the exposure system with necessary precision.

Figure 88:
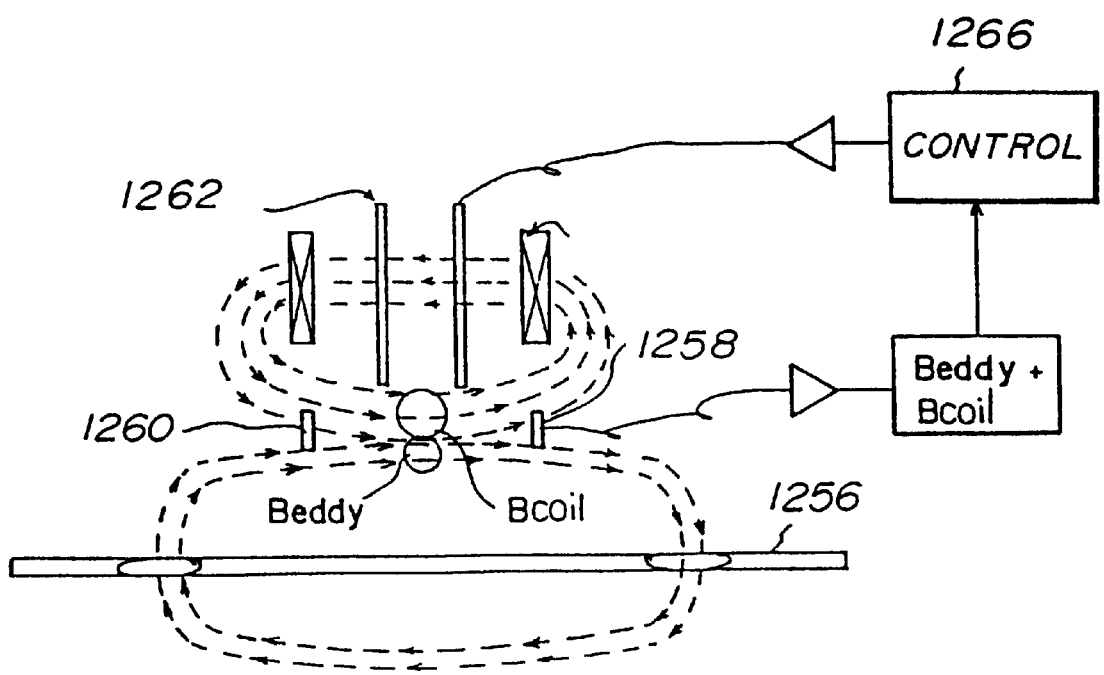
FIG. 88 is a diagram showing the problem occurring in the conventional system of FIG. 87.

In addition, such a construction has another drawback in the point that a magnetic field $B_{coil}$ created by the electromagnetic deflector 1264, which are used in the electron beam exposure systems for deflecting the electron beam over the surface of the substrate 11256, may provide unwanted interference upon the hole sensors 1258 and 1260 as indicted in FIG. 88. When such a jamming is caused by the electromagnetic deflectors, the desired correction of the beam position is no longer possible. Further the construction of FIG. 87 is disadvantageous in view of complexity of the electron optical system that requires a number of hole elements to be provided in the vicinity of the area of exposure.

Thus, the object of the present embodiment is to provide a charged particle beam exposure system that uses an immersion electron lens, wherein the compensation of beam offset caused by the eddy current is successfully achieved with a simple construction of the electron optical system.

More specifically, the present embodiment provides a charged particle beam exposure system for exposing a pattern on an object by a charged particle beam, comprising:

a stage for holding an object movably;

beam source means for producing a charged particle beam and emitting said charged particle beam toward said object held on said stage along an optical axis; and a lens system for focusing said charged particle beam upon said object held on said stage;

said lens system including an immersion lens system comprising: a first electron lens disposed at a first side of said object closer to said beam source means, a second electron lens disposed at a second, opposite side of said object, said first and second electron lenses creating together an axially distributed magnetic field penetrating through said object from said first side to said second side, and a shield plate of a magnetically permeable conductive material disposed between said object and said first electron lens, said shield plate having a circular central opening in correspondence to said optical axis of said charged particle beam.

According to the present embodiment as set forth above, the electric field inducted as a result of the eddy current is successfully captured by the magnetic shield plate and guided therealong while avoiding the region in which the electron beam passes through. Thereby, adversary effects upon the electron beam by the eddy current is effectively eliminated.

First, the overall construction of an electron beam exposure system 1201 according to the present embodiment will be described with reference to FIG. 89.

Figure 89:
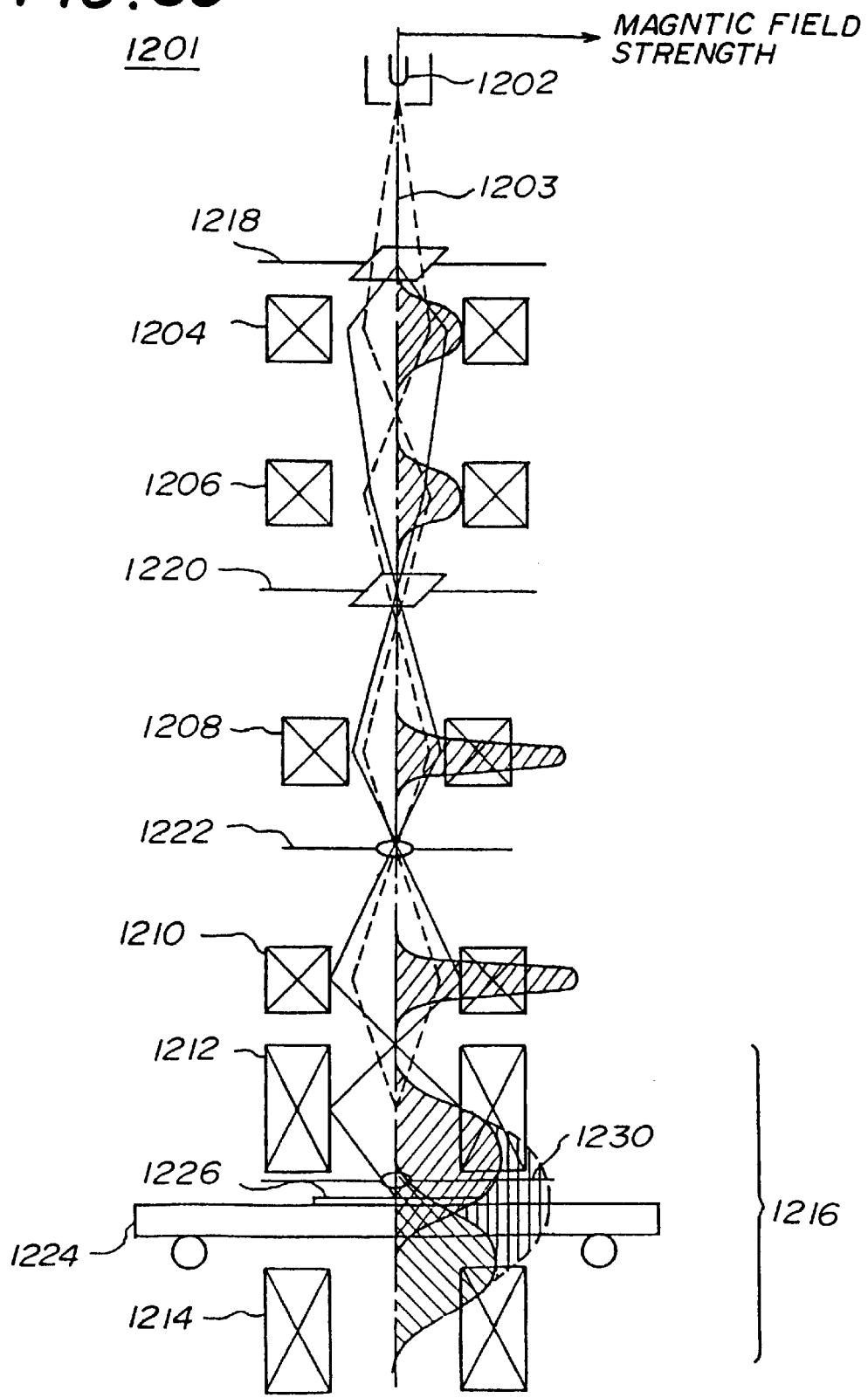
FIG. 89 is a diagram showing an electron beam exposure system according to an eighth embodiment of the present invention.

Referring to FIG. 89, the electron beam exposure system 1201 includes an electron gun 1202 for emitting an electron beam toward a substrate 1226 held on a movable stage 1224, along an optical axis 1203. The electron beam thus emitted is then focused upon the substrate 1226 by means of electron lenses 1204, 1206, 1208, 1210, 1212 and 1214, wherein the foregoing electron lenses have respective intensities controlled by a control system omitted from illustration. Further, the electron beam exposure system 1201 includes a beam shaping mask 1218 for shaping the electron beam emitted from the electron gun 1202 to have a predetermined shape such a a rectangular shape, and another beam shaping mask 1220 for shaping the electron beam already shaped by the mask 1218 to have a predetermined beam shape to be exposed on the substrate 1226. Furthermore, in order to turn on and turn off the electron beam on the substrate 1226, a blanking plate having a round aperture 1222 is provided. When the electron beam is deflected away from the round aperture 1222, the electron beam is turned off from the surface of the substrate 1226.

FIG. 89 further shows a cross over image corresponding to the electron beam as emitted by the electron gun 1202 by a broken line and a shaped image corresponding to the image of the beam shaping mask 1218 by a continuous line. The intensity of the respective electron lenses is indicated in FIG. 89 by a hatching. Thus, it will be noted that the foregoing shaped image is focused upon the surface of the substrate 1226, after further being shaped by the beam shaping mask 1220, by the electron lenses 1204, 1206, 1208, 1210, 1212 and 1214 forming together a demagnifying electron optical system. Thereby, the lenses 1212 and 1214 form together an immersion lens 1216 acting as an objective lens.

Hereinafter, the construction of the immersion lens 1216 formed by the foregoing electron lenses 1212 and 1214 will be described with reference to FIG. 90.

Figure 90:
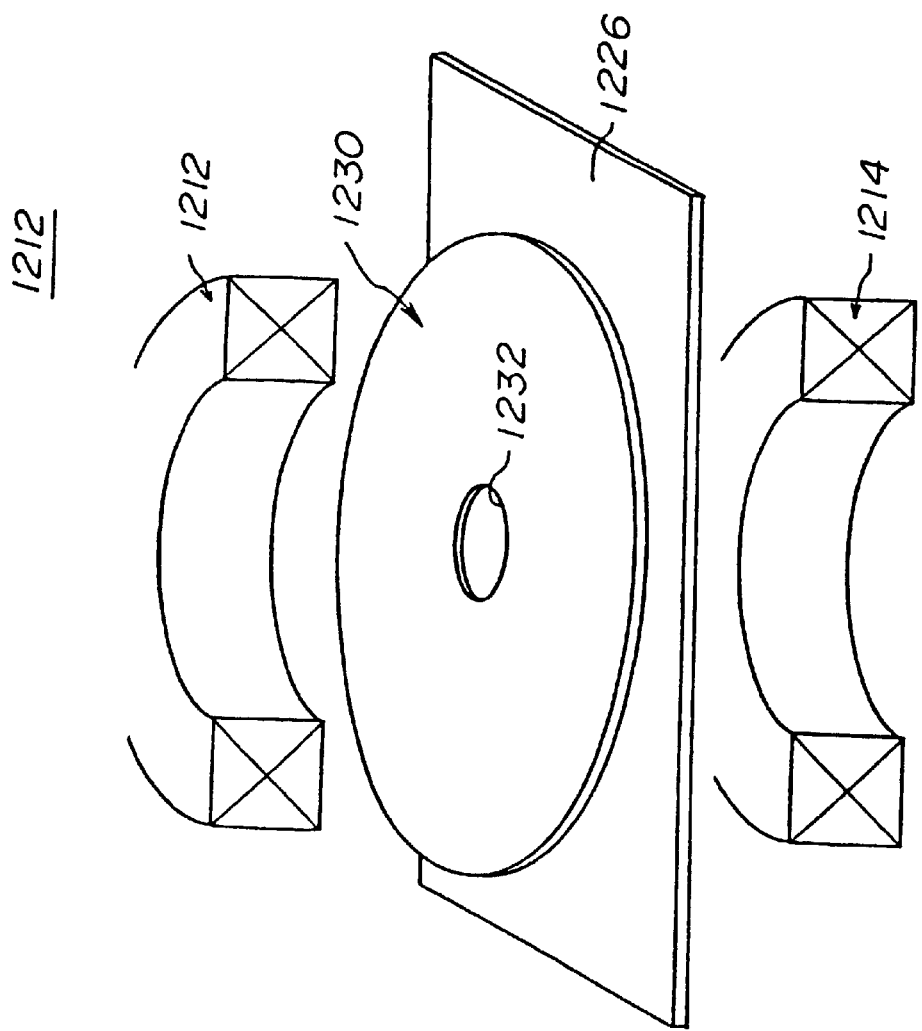
FIG. 90 is a diagram showing the essential part of the electron beam exposure system of FIG. 89.

Referring to FIG. 90, the immersion lens 1216 is formed of the first electron lens 1212 and the second electron lens 1214 disposed so as to face with each other across the substrate 1226, wherein the lens 1212 is disposed in the upstream side of the substrate 1226 while the lens 1214 is disposed in the downstream side thereof. Thereby, the lenses 1212 and 1214 form a magnetic field in the vicinity of the surface of the substrate 1226, wherein the magnetic field thus induced focuses the electron beam emitted from the electron gun 1202 upon the surface of the substrate 1226. As already noted, the immersion lens having such a construction has an advantageous feature of very small aberrations as compared with conventional electron lenses.

Figure 91:
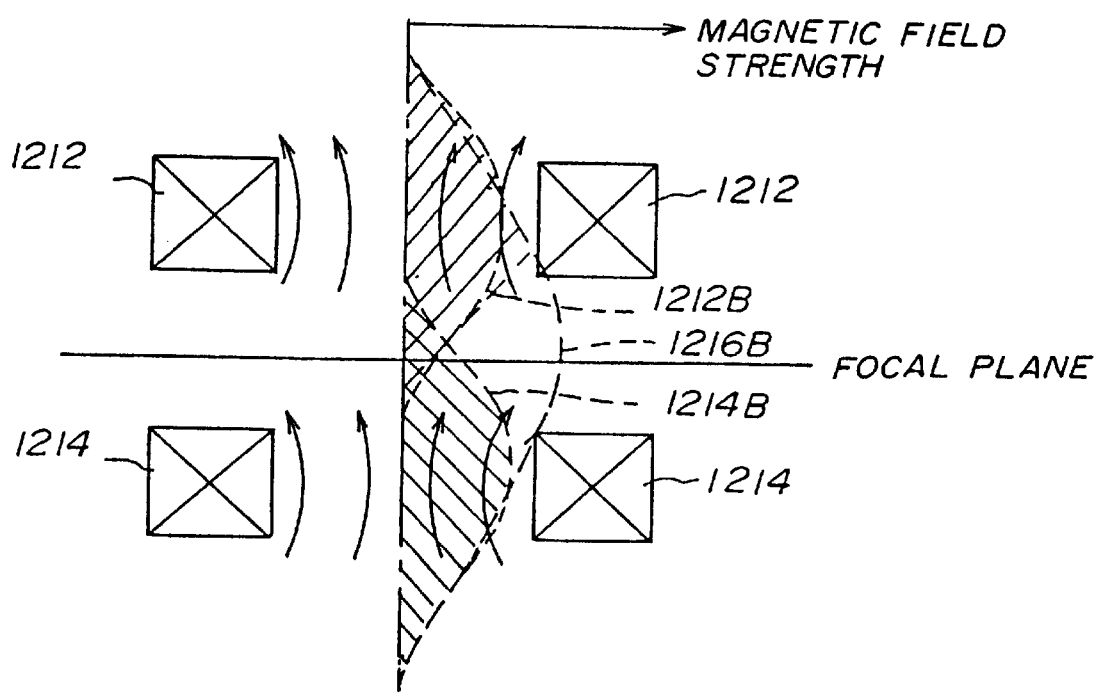
FIG. 91 is a diagram showing the axial distribution of the electric field strength of the immersion lens system of FIG. 90.

FIG. 91 shows the magnetic field induced in the immersion lens 1216 by the electron lenses 1212 and 1214. It will be noted that the lenses 1212 and 1214 create respective magnetic fields 1212B and 1214B acting in the upward direction, of which intensities are represented by respective hatchings. Further, there is formed a synthetic magnetic field 1216B as a sum of the magnetic fields 1212B and 1214B.

In the immersion lens 1216 of FIG. 90, it should be noted that there is provided a shield plate 1230 of a magnetically permeable conductor, wherein the shield plate 1230 has a central opening 1232 in correspondence to the passage of the electron beam and is disposed between the upper lens 1212 and the substrate 1226. Typically, the shield plate 1230 is formed of permalloy. Although not illustrated in FIG. 90, the shield plate 1230 is fixed in the electron optical system of the exposure system 1201 such that the plate 12030 does not move even when the substrate 1226 is moved by the stage 1224. Thus, no eddy current occurs even when the substrate 1226 is moved in the magnetic field created by the electron lenses 1212 and 1214.

Next, the principle of the present embodiment will be described with reference to FIG. 92. Similarly as before, it is assumed that the substrate 1226 is moving to the right in the direction of arrow while interlining with the synthetic magnetic flux of the lens 1216 that corresponds to the magnetic field 1216B.

Figure 92:
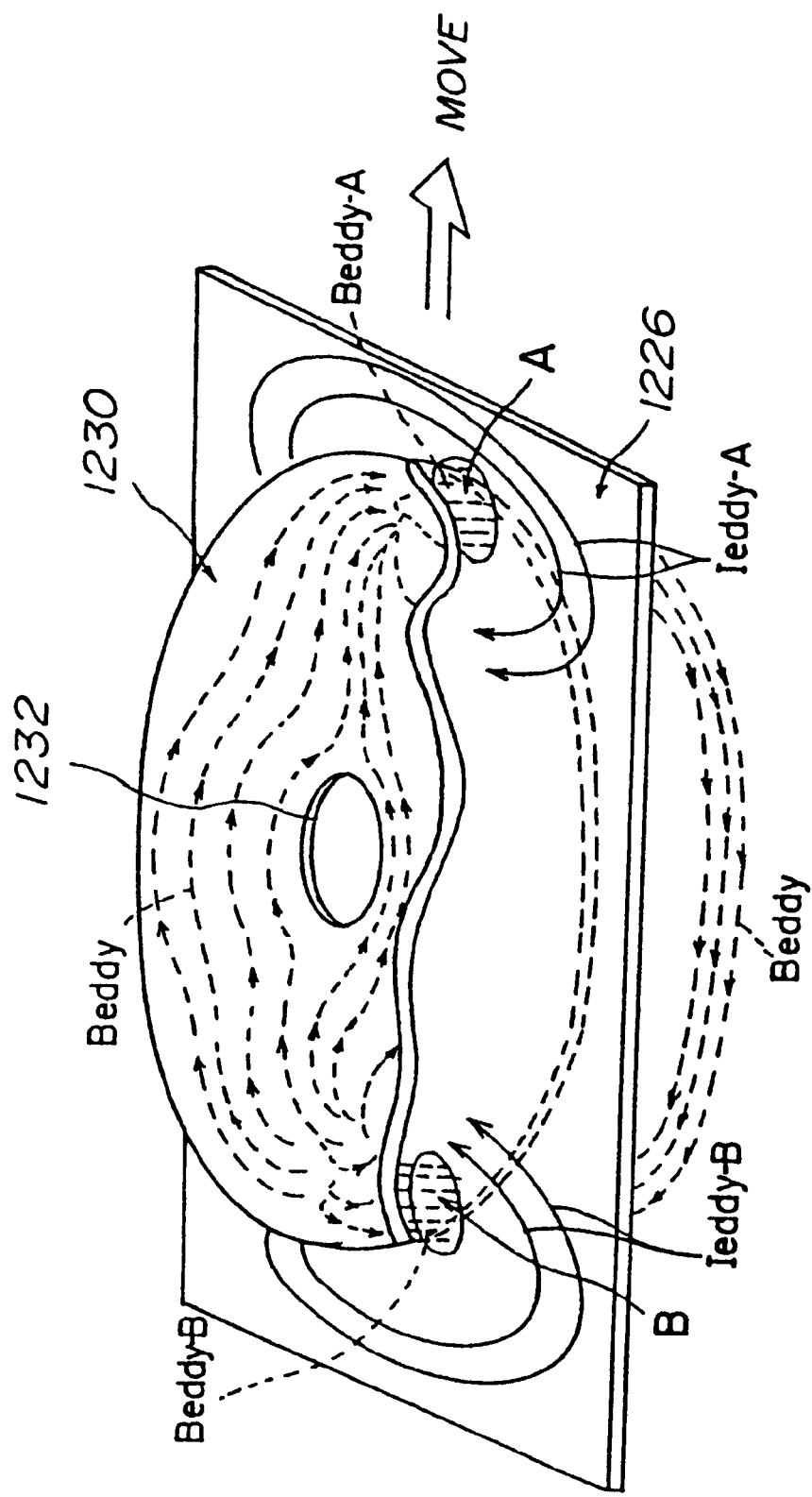
FIG. 92 is a diagram explaining the function of a shield plate used in the immersion lens system of the present embodiment.

Referring to FIG. 92, it will be noted that there is induced an eddy current $I_{eddy\text{-}A}$ in the substrate 1226 in correspondence to the region A in which the interlining magnetic flux is increasing, wherein the eddy current $I_{eddy\text{-}A}$ flows in the clockwise direction in the vicinity of the region A. On the other hand, in the vicinity of the region B where the interlining magnetic flux of the immersion lens 1216 is decreasing, the eddy current flows in the counter clockwise direction as indicated by a current $I_{eddy\text{-}B}$.

Thus, there is formed more or less constantly a magnetic field $B_{eddy}$ as a result of the magnetic fields associated with the respective eddy currents $I_{eddy\text{-}A}$ and $I_{eddy\text{-}B}$, although the magnitude of the magnetic field $B_{eddy}$ may change depending upon the speed of movement of the substrate 1226. It should be noted that the regions A and B are determined with respect to the magnetic field 1216B of the immersion lens and are more or less stationary even when the substrate 1226 is moved by the stage 1224.

In the present embodiment, most of the eddy magnetic field $B_{eddy}$ thus induced in captured by the permeable shield plate 1230 disposed above the substrate 1226 and is guided therealong. Thereby, the magnetic field $B_{eddy}$ positively avoids the aperture 1232 provided in the shield plate 1230 as the electron beam passage, and the electron beam passing through the aperture 1232 experiences little influence by such eddy magnetic field 1216B.

In the exposure of actual semiconductor substrate that may include a complex conductor pattern, the eddy current induced therein may fluctuate with time and create a high frequency magnetic field. As such a high frequency magnetic field not only passes through the shield plate 1230 but induces an eddy current in the shield plate 1230 itself, it is necessary to evaluate the effect of such a high frequency magnetic field induced by the eddy current $I_{eddy\text{-}A}$ and $I_{eddy\text{-}B}$.

Figure 93:
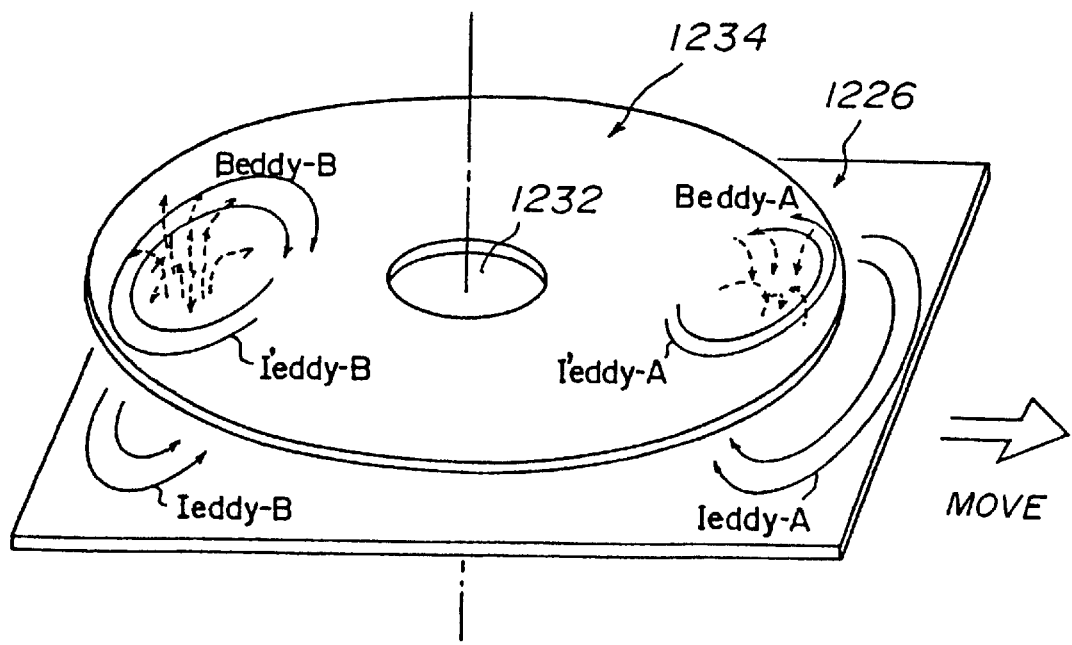
FIG. 93 is another diagram explaining the function of the magnetic shield plate.

FIG. 93 shows such a case in which the high frequency magnetic fields $B_{eddy\text{-}A}$ and $B_{eddy\text{-}B}$ induce corresponding high frequency eddy currents $I'_{eddy\text{-}A}$ and $I'_{eddy\text{-}B}$ in the shield plate 1230, wherein the eddy currents $I'_{eddy\text{-}A}$ and $I'_{eddy\text{-}B}$ act to oppose the magnetic fields $B_{eddy\text{-}A}$ and $B_{eddy\text{-}B}$. In such a case, the energy of the high frequency magnetic fields $B_{eddy\text{-}A}$ and $B_{eddy\text{-}B}$ is absorbed by the shield plate 1230 as a result of induction of the corresponding eddy currents $I'_{eddy\text{-}A}$ and $I'_{eddy\text{-}B}$. Thus, the shield plate 1230 is also effective for eliminating the unwanted magnetic field from the passage region 1232 of the electron beam even in such a case.

Figure 94:
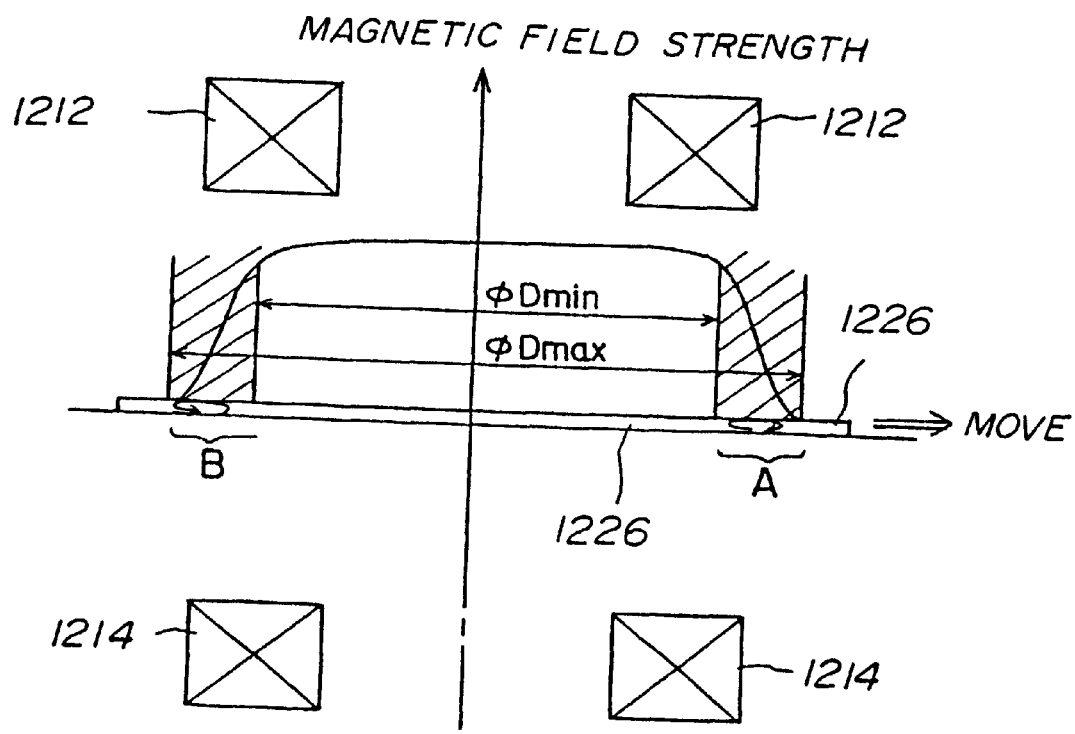
FIG. 94 is a diagram showing the lateral distribution of the electric field strength of the immersion lens system of FIG. 90.
Figure 96:
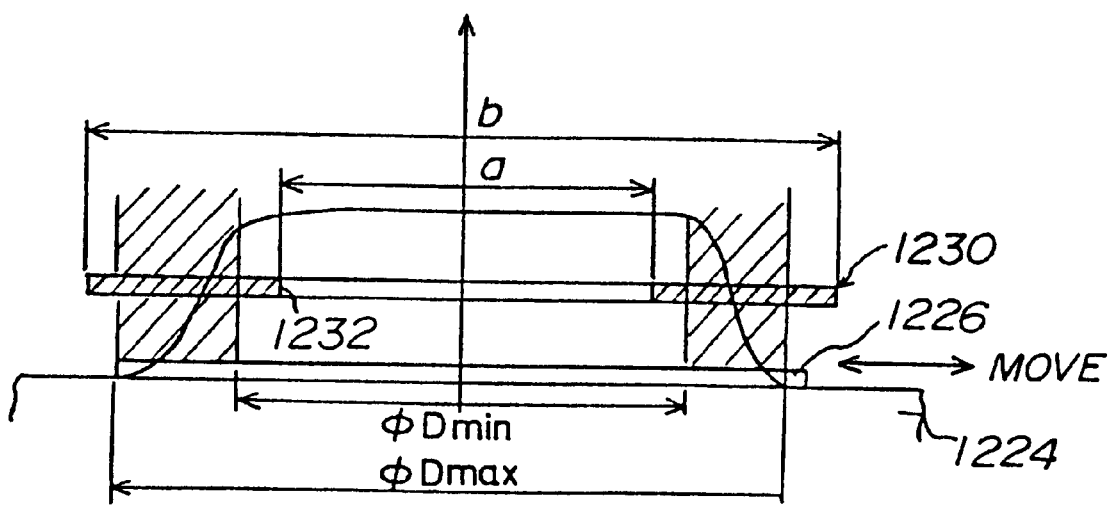
FIG. 96 is a diagram showing the determination of optimum size of the shield plate of the present embodiment.

Next, the shape of the shield plate 1230 will be considered with reference to FIGS. 94 and 96.

Figure 95:
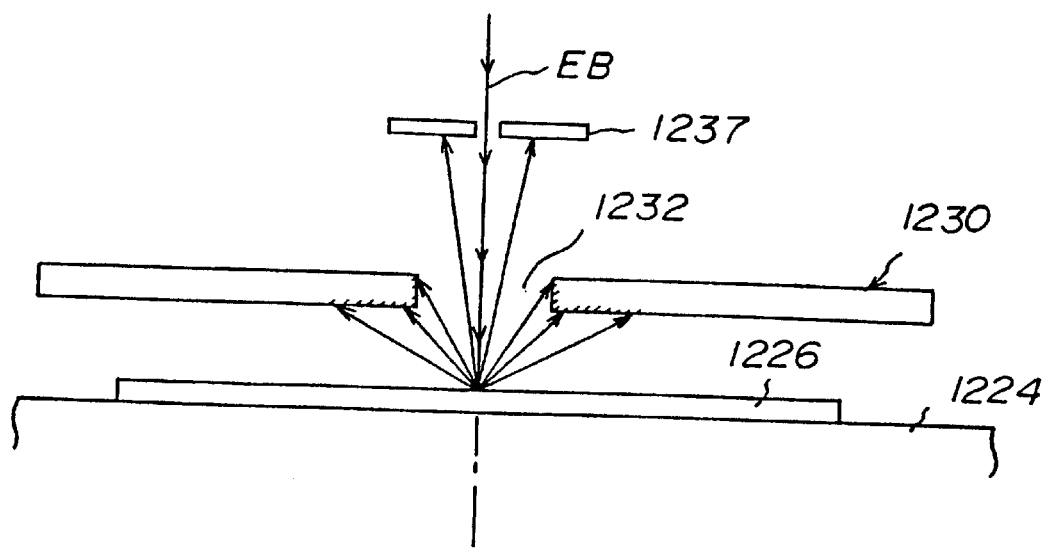
FIG. 95 is a diagram showing the reflection of electrons occurrent in the electron beam exposure system of FIG. 90.

In the shield plate 1230 for use in the electron optical system of the electron beam exposure system, it is necessary that the shield plate 1230 has a symmetricity about the electron beam path. Thus, the central opening 1232 of the shield plate 1230 should have a circular shape. Further, the central opening 1232 should have a sufficient size for allowing the reflected electrons to pass therethrough and reach a detector 1237 provided above the shield plate 1230 as indicated in FIG. 95. Further, it should be noted that excessively small central aperture 1232 may invite unwanted deposition of C on the shield plate 1230 as indicated in FIG. 95 by a hatched region, while such a deposition of C tends to invite a problem of charge up that causes an unwanted deflection of the electron beam.

FIG. 94 shows the intensity profile of the magnetic field 1216B of the immersion lens 1216 taken along the plane of the substrate 1226.

Referring to FIG. 94, it should be noted that there exist regions A and B wherein the change of the magnetic field 1216B is steep. The regions A and B actually form an annular region defined by an outer diameter of $\phi_{Dmax}$ and an inner diameter of $\phi_{Dmin}$, wherein the foregoing regions A and B are mostly responsible for the formation of the eddy current in the substrate 1226.

Thus, in order to intercept the magnetic field $B_{eddy}$ efficiently by the shield plate 1230, it is necessary to form the shield plate 1230 such that the shield plate 1230 has an inner diameter A smaller than the foregoing inner diameter $\phi_{Dmin}$ and an outer diameter smaller than the foregoing outer diameter $\phi_{Dmax}$ as indicated in FIG. 96.

Figure 97A:
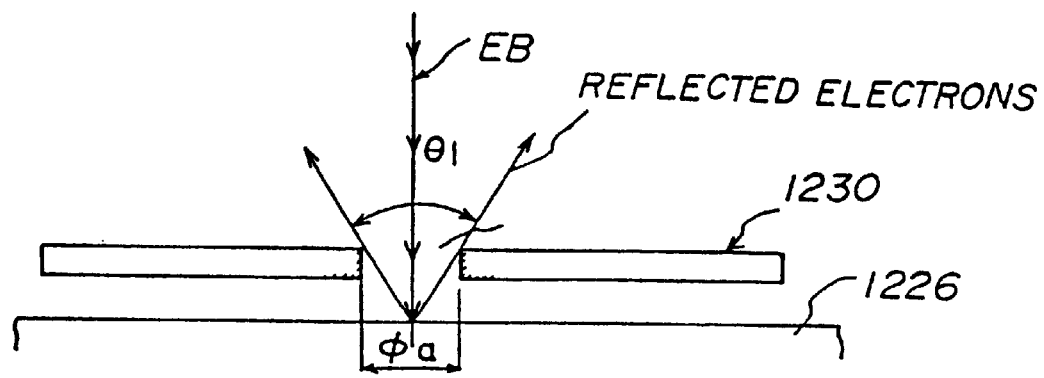
FIGS. 97A and 97B are diagrams showing the optimization of the opening provided in the shield plate of the present embodiment.
Figure 97B:
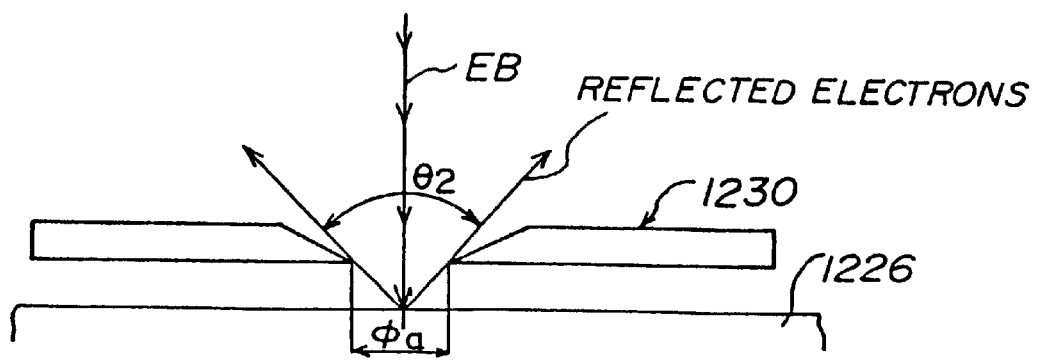

With such an optimization of the shield plate 1230 with respect to the inner diameter a and an outer diameter b, one obtains a structure shown in FIG. 97A which corresponds to the structure of FIG. 95, wherein, in the structure of FIG. 97A, it will be noted that the exit angle of the reflected electron beam through the central opening 1232 is limited to $\Theta_1$ by the upper rim or edge of the opening 1232. Associated with this, there occurs a substantial deposition on the lower major surface of the shield plate 1230 as well as on the inner wall of the opening 1232. It should be noted that the deposition of C on the inner wall of the opening 1232 is most harmful in the electron beam alignment.

In order to improve the foregoing problems, the present embodiment provides a taper on the upper major surface of the shield plate 1230 in correspondence to the central opening 1232, such that the exit angle of the reflection electrons increases from $\Theta_1$ to $\Theta_2$. Thereby, the problem of carbon deposition on the inner wall of the central opening 1233 is also eliminated.

It should be noted that the electron optical system that uses the immersion lens of the present embodiment is applicable to the BAA exposure system described heretofore with various embodiments as well as to a block exposure system such as the one described in the U.S. Pat. Nos. 5,051,556 and 5,173,582, which are incorporated herein as reference.

[tenth embodiment]

In the BAA exposure system described heretofore, the desired pattern is exposed on a substrate in the form of aggregation of exposure dots. By turning on and turning off the exposure dots by controlling the BAA mask in response to dot pattern data, it is possible to expose versatile semiconductor patterns as in the case of microprocessors. On the other hand, there frequently occurs a need to expose a semiconductor pattern having both irregular patterns and regularly repeated patterns, as in the case of forming a memory together with a microprocessor.

Conventionally, exposure of such a regularly repeated patterns is advantageously conducted by the so-called block exposure process, wherein the block exposure process decomposes the pattern to be exposed into limited numbers of fundamental patterns. By shaping an electron beam by a so-called block mask that carries thereon such fundamental patterns in the form of stencil pattern, it is possible to expose the desired pattern with high efficiency and high resolution. In the block exposure process, it is possible to expose a pattern having a line width of 0.1 $\mu$m with reliability. About the block exposure process, reference should be made to the U.S. Pat. Nos. 5,051,556 and 5,173,552, op cit.

On the other hand, the block exposure system has a drawback in that the pattern that can be exposed is limited to a small number of the fundamental patterns on the block mask or their combinations. In order to expose versatile patterns by means of the block exposure system, it is necessary to replace the block mask with another one, while such a process is cumbersome and decreases the throughput.

Thus, it is thought promising to construct an electron beam exposure system that is capable of exposing a pattern both in the BAA exposure process that uses a BAA mask and in the block exposure process that uses a block mask.

Accordingly, the present embodiment has an, object to provide a charged beam exposure process capable of exposing both a BAA exposure process and a block exposure process on a common substrate.

More specifically, the present embodiment provides a charged particle beam exposure system for exposing a pattern on an object, comprising:

a stage for holding an object thereon;

beam source means for producing a charged particle beam such that said charged particle beam is emitted toward said object on said stage along a predetermined optical axis;

a blanking aperture array provided in the vicinity of said optical axis for shaping an electron beam incident thereto, said blanking aperture array including a mask substrate, a plurality of apertures of identical size and shape disposed in rows and columns on said mask substrate and a plurality of deflectors each provided in correspondence to an aperture on said mask substrate;

a block mask provided in the vicinity of said optical axis, said block mask carrying thereon a plurality of beam shaping apertures of different shapes for shaping an electron beam incident thereto;

selection means for selectively deflecting said electron beam from said beam source means to one of said blanking aperture array and said block mask;

focusing means for focusing an electron beam shaped by any of said blanking aperture array and said block mask upon said object on said stage.

According to the construction of the present embodiment set forth above, it is possible to switch the BAA exposure and block exposure by using the single electron exposure system. Thereby, the addressing deflector, used in the block exposure process for selecting an aperture on the block mask, is used also as the selection beams for selecting the BAA exposure process and the block exposure process. Thereby, no extraneous fixture is needed for implementing the selection of the exposure mode.

Figure 98:
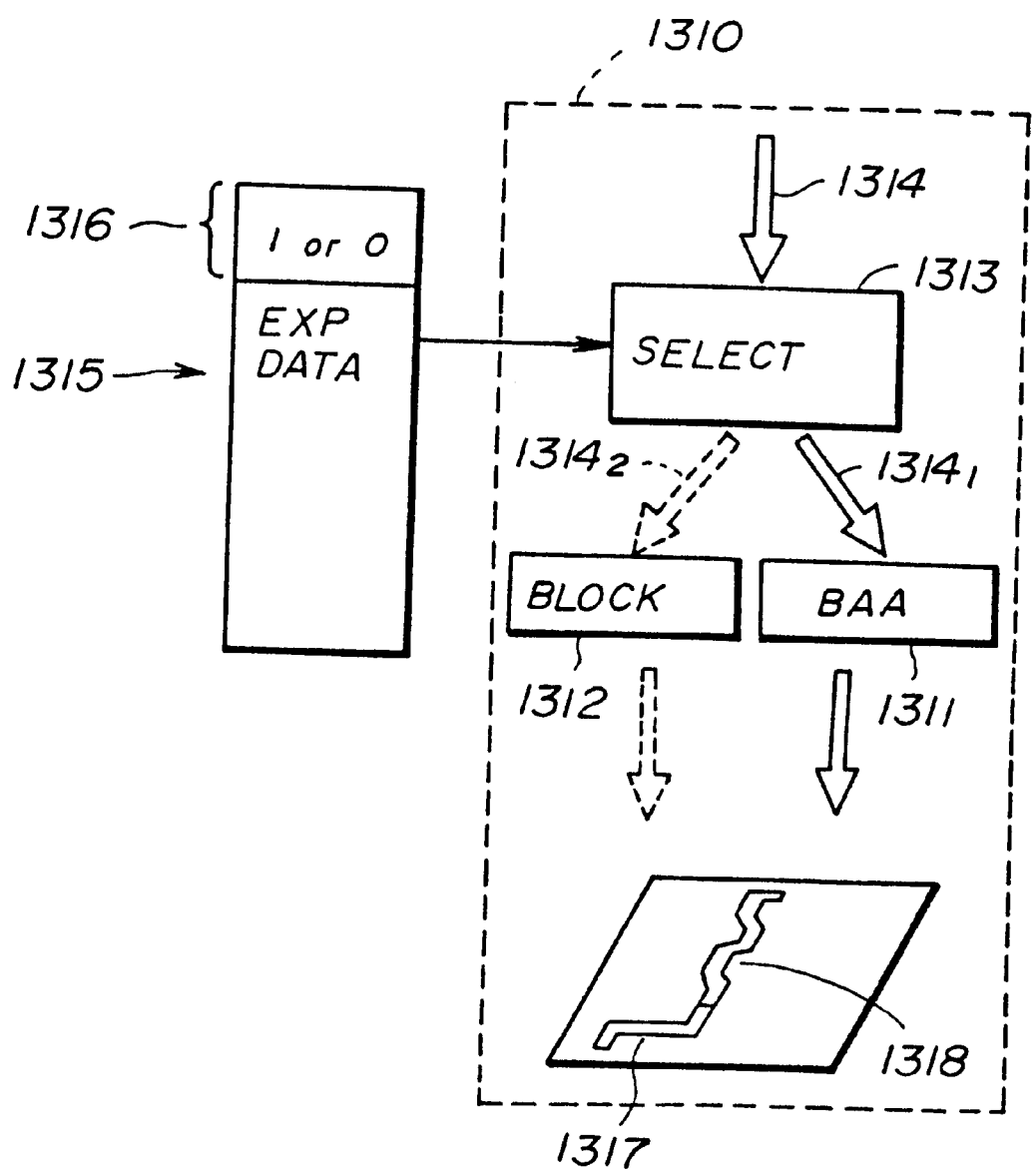
FIG. 98 is a diagram showing the principle of a tenth embodiment of the present invention.

FIG. 98 shows the principle of the present invention schematically.

Referring to FIG. 98 showing an electron beam exposure system 1310 according to the present embodiment, the electron beam exposure system 1310 includes selection means 1313, supplied with selection data 1316 from an external control system as a part of exposure data 1315, for selecting one of a BAA mask 1311 and a block mask 1312 for shaping an electron beam 1314 produced by an electron gun not illustrated. The BAA mask 1311 carries thereon a number of apertures of the same size and shape as well as corresponding deflectors, in a row and column formation for shaping the electron beam 1314 into a number of electron beam elements forming collectively an electron beam bundle. Thus, by selecting the BAA mask 1311, the electron beam 1314 hits the BAA mask 1311 as indicated by an arrow 13114$_1$, and the exposure of the electron beam bundle formed as a result of beam shaping in the BAA mask 1311, is made upon the surface of the substrate as a pattern 1317. Similarly, by selecting the BAA chip 1311 that carries thereof fundamental patterns of the pattern to be exposed, the electron beam 1314 hits the blanking mask 1312 and a pattern 1318 is exposed on the same substrate as indicated in FIG. 98.

Figure 99:
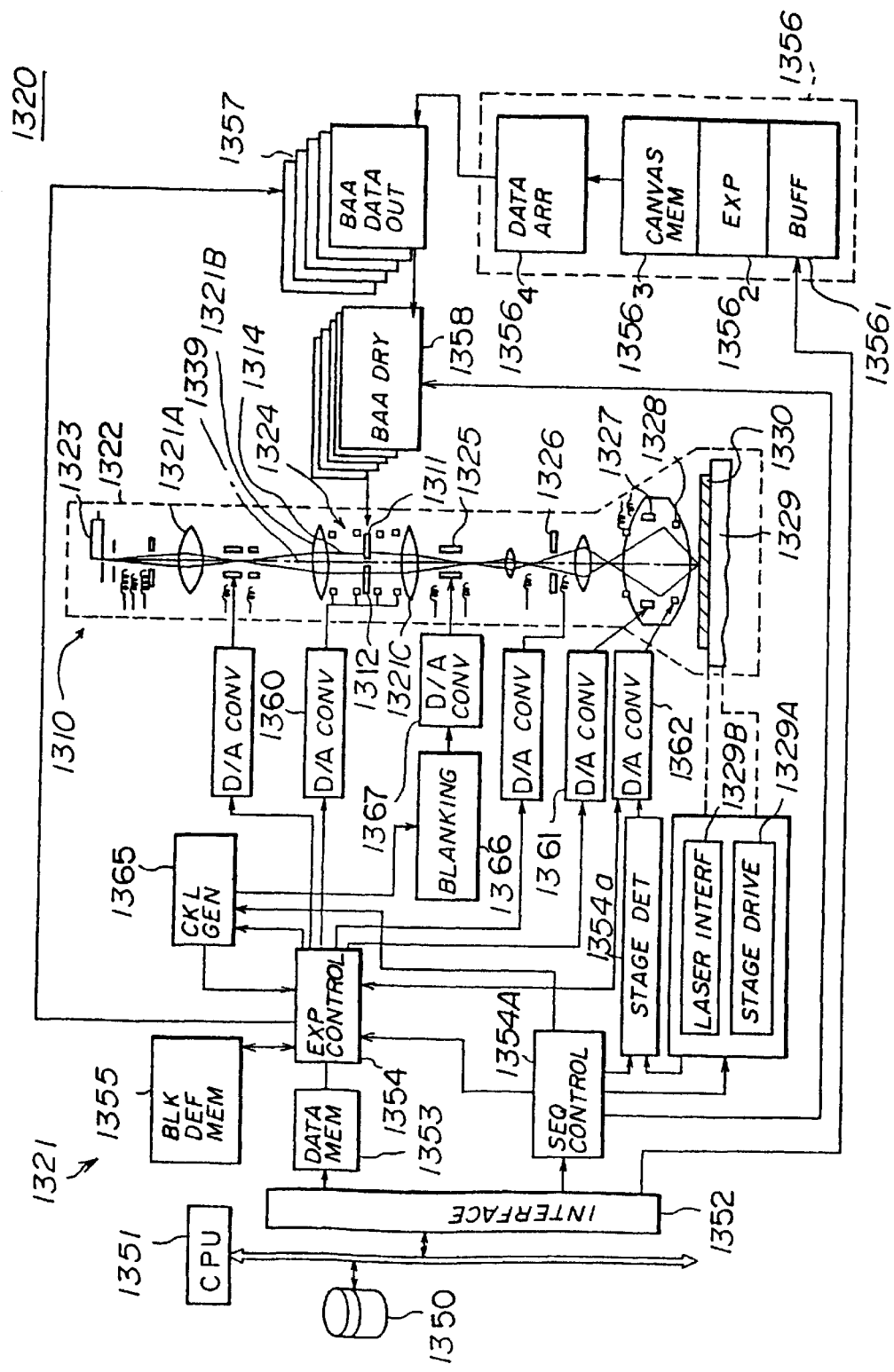
FIG. 99 is a diagram showing the overall construction of the electron beam exposure system of the tenth embodiment.

FIG. 99 shows the construction of an electron beam exposure system 1320 according to the present embodiment in detail.

Referring to FIG. 99, the electron beam exposure system 1320 includes an electron optical system 1310 corresponding to the system of FIG. 98 and a control system 1321 for controlling the electron optical system 1321.

The electron optical system 1310 has a construction similar to the one described already with reference to FIG. 3 and includes an electron beam column that accommodates therein an electron gun 1323 for emitting an electron beam toward a substrate 1330 held on a movable stage 1329, an addressing deflector 1324 to be described later in detail, a beam shaping mask assembly including a BAA mask 1311 and a block mask 1312, a blanking deflector 1325 and a corresponding blanking plate 1326 for selectively turning off the electron beam or electron beam element on the surface of the substrate 1330, and various electron lenses for focusing the electron beam upon the surface of the substrate 1330 with demagnification. Further, main and sub-deflectors 1327 and 1328 are provided in the vicinity of the substrate 1330 for moving the electron beam over the surface of the substrate 1330.

In FIG. 99, it should further be noted that the electron beam exposure system includes a CPU 1351 and a data storage device 1350 such as a magnetic disk device or a magnetic tape device, wherein the devices 1350 is used to store pattern data corresponding to a device pattern of a semiconductor device to be written on a substrate. The CPU 1351 and the magnetic disk device 1352 are connected commonly to a system bus 1350$a$, and the CPU 1351 reads out the pattern data from the magnetic disk 1352 via the system bus 1350$a$. The pattern data thus read out on the system bus 1350$a$ is then transferred via an interface circuit 1352 to a data memory unit 1353 and simultaneously to a stage controller 1354A.

The electron beam exposure system further includes an evacuated column 1322 as usual, and there in provided an electron gun 1323 at the top part of the column 1322 for producing an electron beam, The electron beam thus produced by the electron gun 1323 is focused on a substrate 1330 that is held on a movable stage 1329 after passing through various electron lenses 1321A, 1321B, 1321C, 1321D and 1321E as well as after being deflected by an addressing deflector assembly 1324 to be described later in detail and a blanking deflector 1325, wherein the electron lens 1321E acts as the objective lens for focusing the electron beam on the surface of the substrate 1330. The deflector 1325 is used for a blanking control together with the electron lens 1321C and a blanking aperture provided in a blanking plate 1326, and controls the turning-on and turning-off of the electron beam on the substrate 1330. The electron lens 1321B on the other hand is used in combination with the addressing deflector assembly 1324 and a beam shaping masks 1311 and 1312 for shaping the electron beam into a desired beam shape.

The electron beam thus shaped is deflected by the electrostatic sub-deflector 1328 and is moved over the surface of the substrate 1330 when focused thereon by the electron lens 1321E. Further, there is provided an electromagnetic main deflector 1327 for deflecting the focused electron beam over a wide range of the substrate surface. It should be noted that the electrostatic deflector 1328 provides the deflection of the electron beam over a limited area that is smaller than about 100 $\mu$m×100 $\mu$m, with a high speed of about 0.6 $\mu$s/3 $\mu$m. On the other hand, the electromagnetic deflector 1327 provides the deflection over a large area as large as 1 mm×1 mm though with a limited speed of about 2–30 $\mu$s/100 $\mu$m.

In operation, the pattern data stored in the data memory unit 1353 is read out by an exposure controller 1354. The pattern data thus produced is then supplied to a blanking control circuit 1366 that extracts a blanking control signal from the pattern data and supplies the same to the electrostatic deflector 1325 via a D/A converter 1367. Simultaneously, the exposure controller 1354 produces beam shape control data specifying the beam shape that is to be used in the block exposure process.

It should be noted that the beam shape control data is produced consecutively in correspondence to the shot and are supplied to the addressing electrostatic deflector assembly 1324 after a conversion to an analog signal in a D/A converter 1360. More specifically, the exposure controller 1354 produces deflection control data in correspondence to each shot by referring to a deflection data memory 55 that stores the energization to be applied to the deflector assembly 1324 as a function of the deflection data, and supplies the energization thus read out to the electrostatic deflector assembly 1324. Further, the pattern exposure controller 1354 produces other deflection control data for the main and sub-deflectors and supplies the same to the main deflector 1327 as well as to the sub-deflector 1328 after a conversion to an analog signal in respective D/A converters 1361 and 1362. Further, the sub-deflector 1328 is controlled in response to the movement of the stage 1329 and hence the substrate 1330 by the sequence controller 1354A that controls the sub-deflector 1328 via a positional detection circuit 1354a that supplies digital output to the D/A converter 1362. The sequence controller 1354A further controls the stage 1329 via a stage drive mechanism 1329A while monitoring the stage position by a laser interferometer 1329B.

Thus, in the block exposure mode, the electron beam is shaped by a selected aperture on the block mask 1321 in response to the addressing control data supplied from the exposure controller 1354 to the addressing deflector assembly 1324 and is exposed on the surface of the substrate 1330 as usual in the block exposure process.

In the BAA exposure mode, on the other hand, the exposure data is supplied from the interface circuit 1352 to a buffer memory $1356_1$ forming a part of a data expansion circuit $1356_1$, wherein the exposure data held in the buffer memory $1356_1$ is supplied to a data expansion unit $1356_2$, included also in the data expansion circuit $1356_1$, for expansion into dot pattern data corresponding to the bitmap of the exposure pattern. The dot pattern data thus obtained is held in a canvas memory $1356_3$.

The dot pattern data in the canvas memory $1356_3$ is read out by a data arrangement circuit $1356_4$ and is supplied to a plurality of data output circuits 1357 provided in correspondence to a plurality of apertures on the BAA mask 1311, wherein the data output circuits 1357 controls the deflectors on the BAA mask 1311 via corresponding driver circuits 1358. Thus, the construction of the circuits $1356_1$–$1356_4$ as well as the construction of the circuits 1357 and 1358 are known from the conventional example such as the one described already with reference to FIG. 100.

Figure 100:
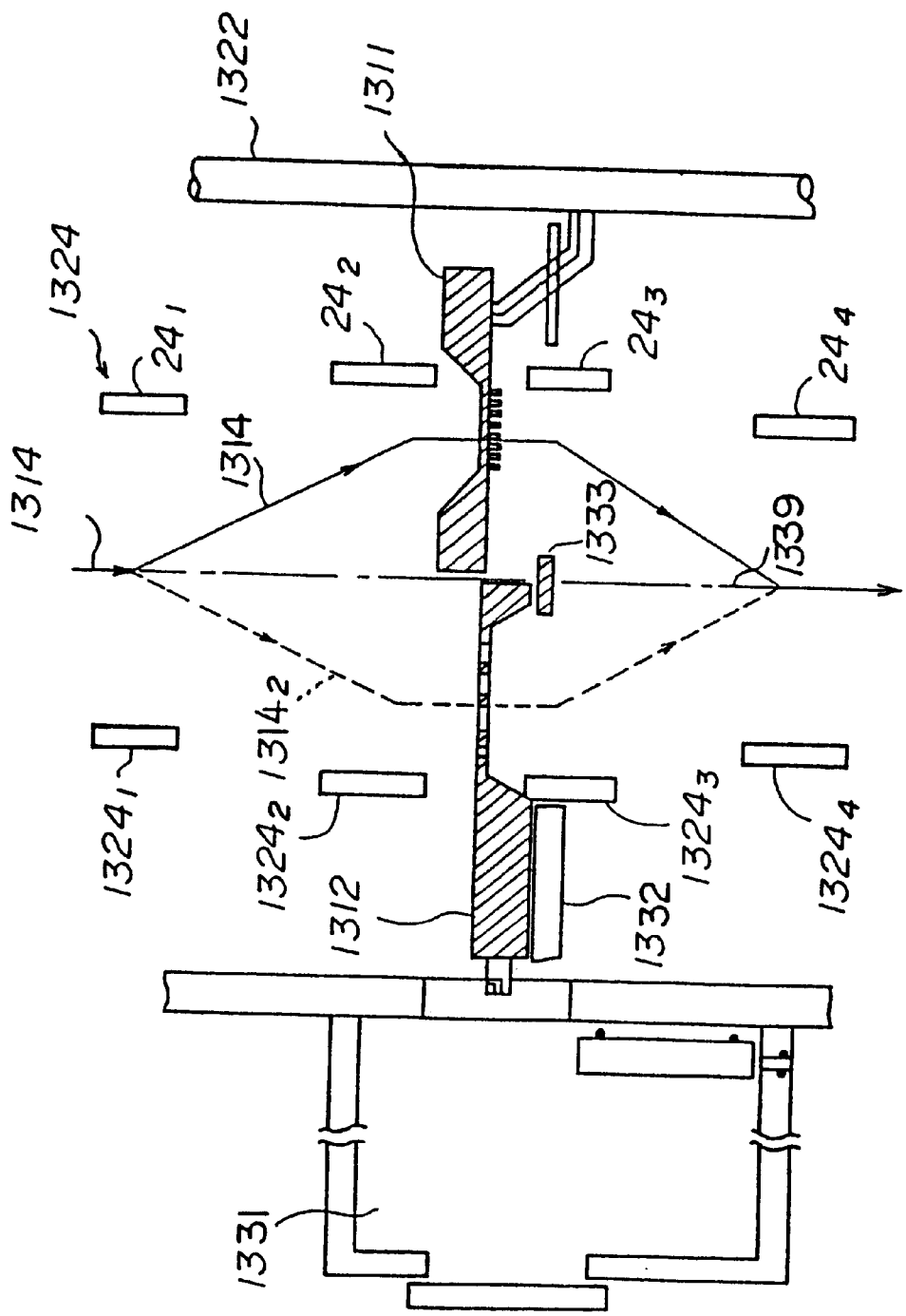
FIG. 100 is a diagram showing the essential part of the electron beam exposure system of FIG. 99.

FIG. 100 shows the construction of the beam shaping masks 1311 and 1312 as well as cooperating electrostatic deflector assembly 1324 in detail.

Referring to FIG. 100, the deflector assembly includes electrostatic deflectors $1324_1$–$1324_4$, wherein the deflector $1324_1$ deflects the electron beam 1314 away from an optical axis 1339 set so as to pass through the round aperture on the blanking plate 1326, while the deflector $1324_2$ deflects back the electron optical beam $1314_1$ or $1314_2$ thus deflected, such that the electron beam passes through a path parallel to but offset from the optical axis 1339. Thereby, the electron beam hits, if deflected as indicated by the beam 13141, the BAA mask 1311 perpendicularly and experiences a beam shaping according to the apertures formed on the BAA mask 1311. After passing through the mask 1311, the electron beam is deflected by the deflector $1324_3$ toward the optical axis and is further deflected by the deflector $1324_4$ such that the electron beam travels along a path coincident to the optical axis 1339.

On the other hand, in the block exposure mode, the electron beam 1314 is deflected by the deflector $1324_1$ as indicated by the beam $1314_2$, wherein the electron beam $1314_2$ is deflected further by the deflector $1324_2$ and hits the block mask 1312 perpendicularly. Upon passage through the block mask 1312, the beam $1314_2$ experiences a beam shaping according to the selected aperture, and the electron beam thus shaped is deflected toward the optical axis 1339 by the deflector $1324_3$ and further by the deflector $1324_4$, wherein the electron beam travels along a path, after deflection by the deflector 1324 which is coincident to the optical axis 1339.

In the construction of FIG. 100, it will be noted that the BAA mask 1311 is fixed inside the column 1322 of the electron optical system while the block mask 1312 is held movable for allowing replacement of the block mask. For this purpose, the block mask 1312 is held on a movable stage 1332 that retracts the mask 1312 into a sub-chamber 1331 formed on the electron beam column 1322 when replacing the mask 1312.

Further, in order to prevent the leakage of the electron beam at a gap formed between the fixed BAA mask 1311 and the movable blanking mask 1312, there is provided a shielding member 1333 below the mask 1312 for interrupting the leakage electron beam.

Figure 101:
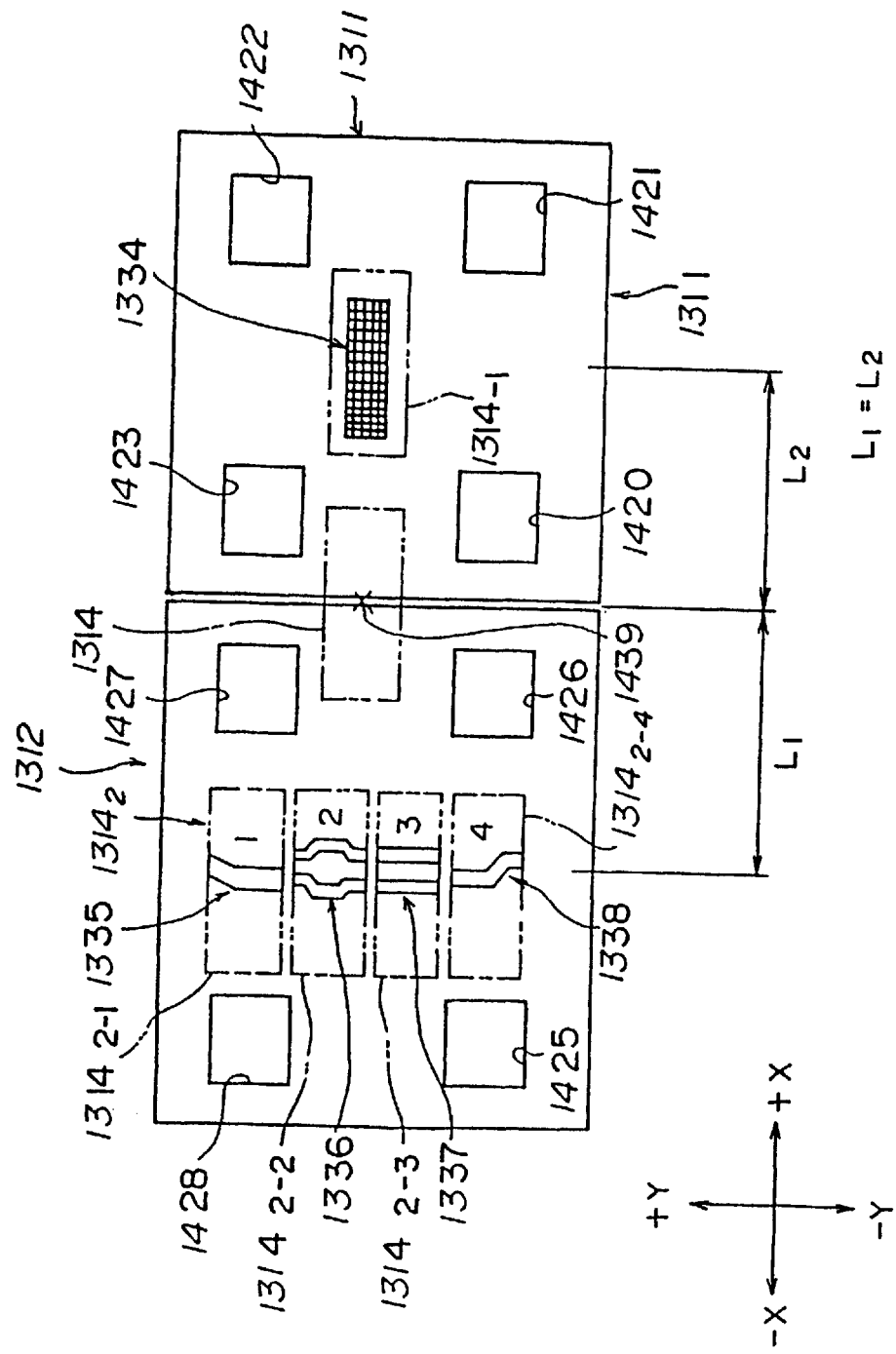
FIG. 101 is a diagram showing the construction of the beam shaping mask used in the electron beam exposure system of FIG. 99.

FIG. 101 shows the construction of the BAA mask 1311 and the block mask 1312.

Referring to FIG. 101, the BAA mask 1311 carries a blanking aperture array 1334 on a central part thereof as usual, while the block mask 1312 carries a plurality of block patterns 1335–1338 each of different shape. Further, the masks 1311 and 1312 have rectangular openings 1420–1423 and 1425–1428 at respective corners. Thereby, the electron beam $1314_1$ has a rectangular shape as indicated in FIG. 101, while the electron beam $14_2$ have a similar rectangular shape and addresses one 13 of the block patterns 1335–1338 as indicated by numerals $1314_{2\text{-}2}$, $1314_{2\text{-}3}$ and $1314_{2\text{-}4}$.

It should be noted that the masks 1311 and 1312 are disposed in the column of the electron beam exposure system such that the optical axis 1339 passes through the boundary between the masks 1311 and 1312. Further, it will be noted that the blanking aperture array 1334 is disposed at a central part of the mask 1311 offset from the optical axis 1339 in the X-direction by a distance $L_2$. Similarly, the center of the mask 1312 is offset from the optical axis in the -X direction by a distance $L_1$, while the distance $L_1$ is equal to the distance $L_2$.

Figure 102:
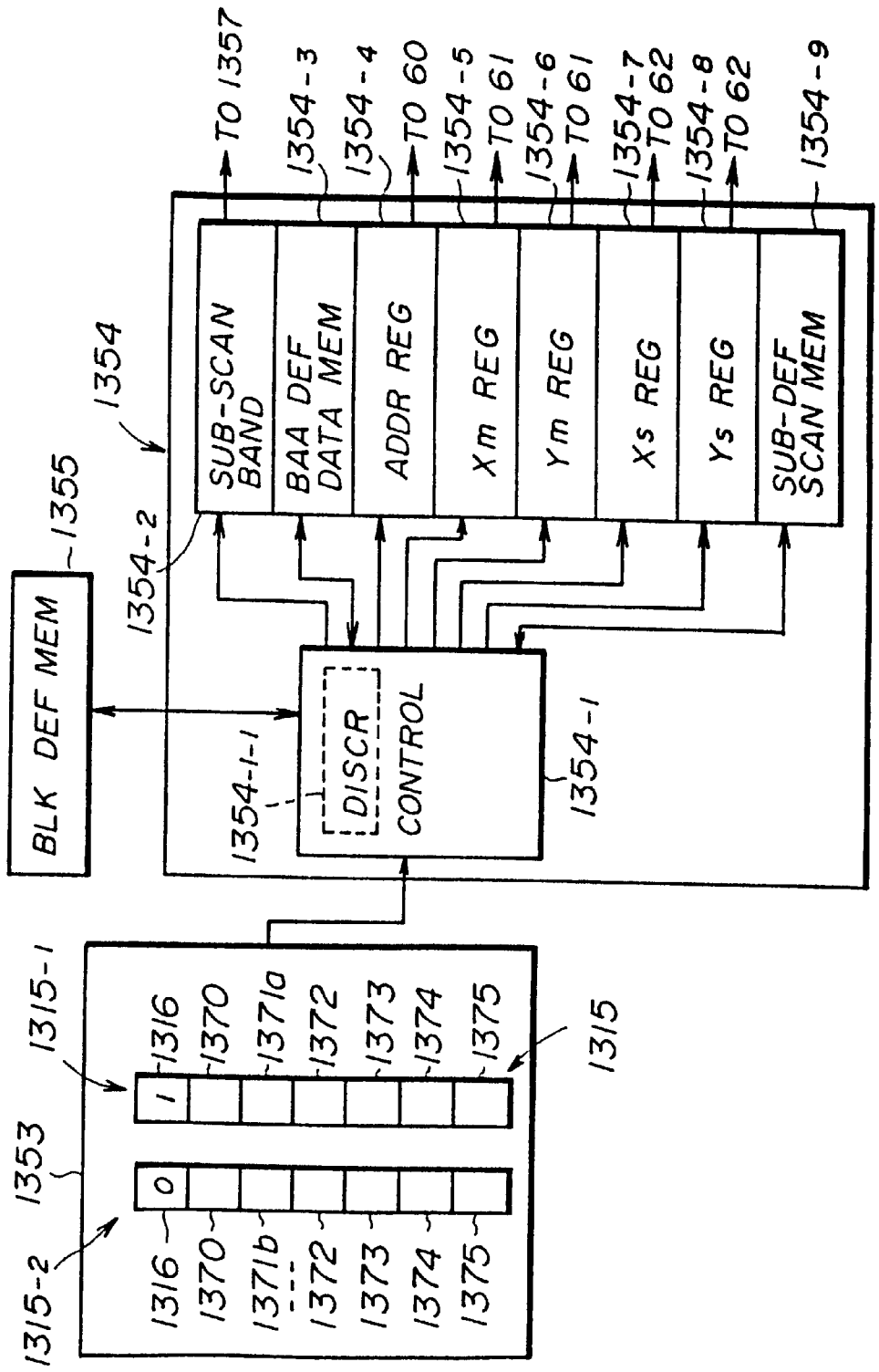
FIG. 102 is a diagram showing the construction of the exposure controller used in the electron beam exposure system of FIG. 99.

FIG. 102 shows the construction of the exposure controller 1354, wherein the controller 1354 includes a control unit $1354_1$ cooperating with the data memory 1353. In the present embodiment, the data memory 1353 stores exposure data 15 such as data $1315_1$ and $1315_2$, wherein each of the exposure data $1315_1$ and $1315_2$ in the data memory 1353 includes a first data block 1316 for holding single bit data indicative of whether the exposure data is the data for the BAA exposure process or the block exposure process. Further, the data $1315_1$ for the BAA exposure process includes a second data block 1370 containing an identification number of a scanning band in the sub-field by the sub-deflector, and a third data block 1371a containing pattern data to be exposed in the form bitmap data. On the other hand, the data $1316_2$ for the block exposure process includes the same second data block 1370 and a third data block 1371b, wherein the third data block 1371b contains the code number of the pattern attached to the patterns $1314_2$–$1314_4$ as indicated in FIG. 101. Further, in any of the data $1315_1$–$1315_2$, it should be noted that there are blocks 1372–1375 for storing the deflection data Xm and Ym for the main deflector 1327 and the deflection data Xs and Ys for the sub-deflector 1328.

The control unit $1354_1$ includes a discrimination unit $1354_{1\text{-}1}$ for discriminating the content of the data block 1316. Thus, when the content of the data block 1316 is set "1," indicative of the BAA exposure, the control unit $1354_1$ supplies the data of the block 1370 indicative of the identification number of the sub-scan band of the sub-field, to a register $1354_2$, while the register $1354_2$ supplies an output to the data output circuit 1357. Further, the control unit $13154_1$ transfers the content of the data block 1371a to a addressing register $1354_4$ so as to drive the deflector assembly 1324 based upon the deflection data stored in a BAA deflection memory $1354_3$, which forms a part of the exposure controller 1354, provided that the data block 1316 contains data "1." Thereby, the content of the data blocks 1372–1375 are supplied respectively to an Xm register $54_5$, a Ym register $1354_6$, an Xs register $11354_7$ and a Ys register $1354_8$, wherein the registers $1354_5$ and $1354_6$ drives the main deflector 1361, while the registers $1354_7$ and $1354_8$ drives the sub-deflector 1362 by referring to the content of a memory $1354_9$ that stores the energization of the sub-deflector 1362 as a function of the deflection data. As a result of energization of the deflectors $1324_1$–$1324_4$, the electron beam $1314_1$ selects the blanking aperture array 1334 formed on the BAA mask 1311 as indicated in FIG. 101.

In the event the content of the data field 1316 is "0," on the other hand, the control unit $1354_1$ reads out the content of the memory 1355 for a given pattern code held in the data block 1371b, and transfers the energization data thus read out to the addressing register $1354_3$. Thereby, the electron beam $1314_2$ in deflected to a selected block aperture on the mask 1312 such as the aperture $1314_{2\text{-}2}$ bearing the pattern code "2."

Figure 103A:
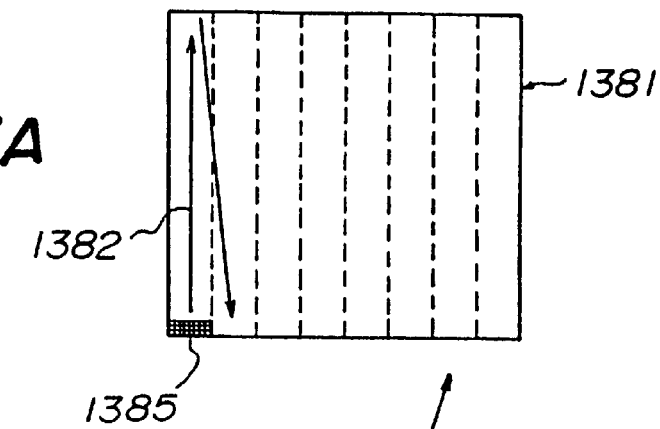
FIGS. 103A–103C are diagrams showing the scanning of the substrate by the electron beam.
Figure 103B:
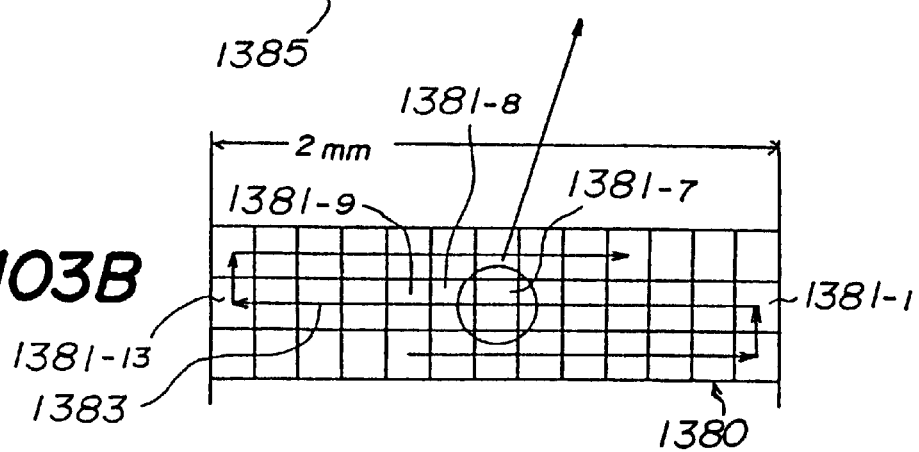
Figure 103C:
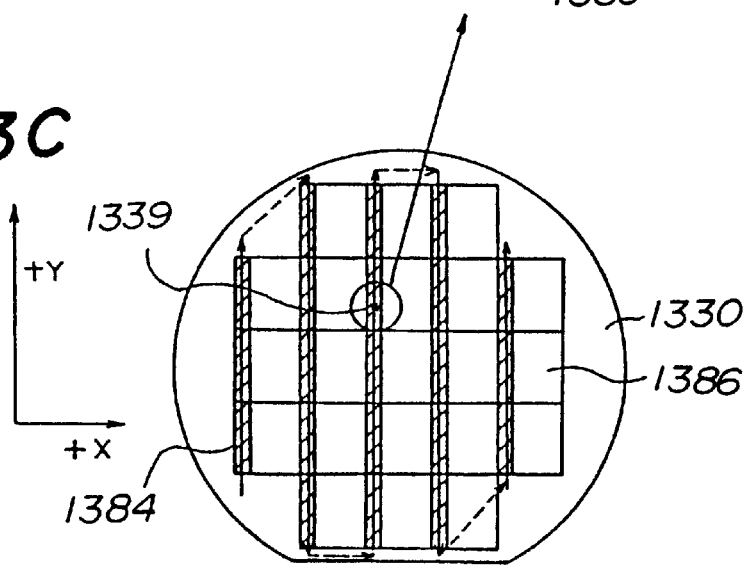

FIGS. 103A–103C show the scanning caused on the substrate 1330 by the electron beam exposure system of FIG. 99.

Referring to FIG. 103A showing the scanning of a sub-field 1381 by an electron beam bundle 1385 formed by the BAA mask 1311, the scanning is achieved along a path 1382 by energizing the sub-deflector 1362, wherein each path defines a band. The sub-field 1381 of FIG. 103B, on the other hand, forms another band formed of a number of such sub-fields $1381_1$–$1381_{13}$ in a main-deflection field 1380 covered by the main deflector 1861, wherein the scanning is achieved along a zig-zag path 1883. Further, the main deflection field 1380 of FIG. 103B forms a band 1384 on a wafer as indicated in FIG. 103C, wherein the surface of the wafer 1330 is divided into a number of chips 1386.

In the present embodiment, it should be noted that the foregoing scanning of the wafer occurs similarly in the BAA exposure mode and in the block exposure mode as indicated in FIGS. 104A and 104B, wherein FIG. 104A shows examples of exposure data $1315_{91}$–$1315_{95}$ and FIG. 104B shows the corresponding pattern formed on a sub-field $1381_7$ of the wafer or substrate.

Referring to FIG. 104A, the exposure data $1315_{91}$ for the sub-scan band 1391 of the BAA exposure mode includes the digit "1" in the data block 1316 and digit "91" indicative of the sub-scan band in the data block 1370. As a result of the exposure, patterns 1400, 1401 and 1402 are exposed. Similarly, the exposure data $1315_{92}$ corresponds to the sub-scan band 1392 and exposes the patterns 1403 and 1404 in the BAA exposure mode. The exposure data $1315_{93}$ exposes A pattern 1405 similarly in the sub-scan band 1393.

On the other hand, the exposure data $1315_{94}$ corresponds to a sub-scan band 1394 and exposes a pattern 1406 designated in the data block 1371b according to the block exposure process. similarly, the exposure data $1315_{95}$ corresponds to a sub-scan band 1395 and exposes a pattern 1407 designated in the data block 1371b according to the block exposure process.

Figure 105:
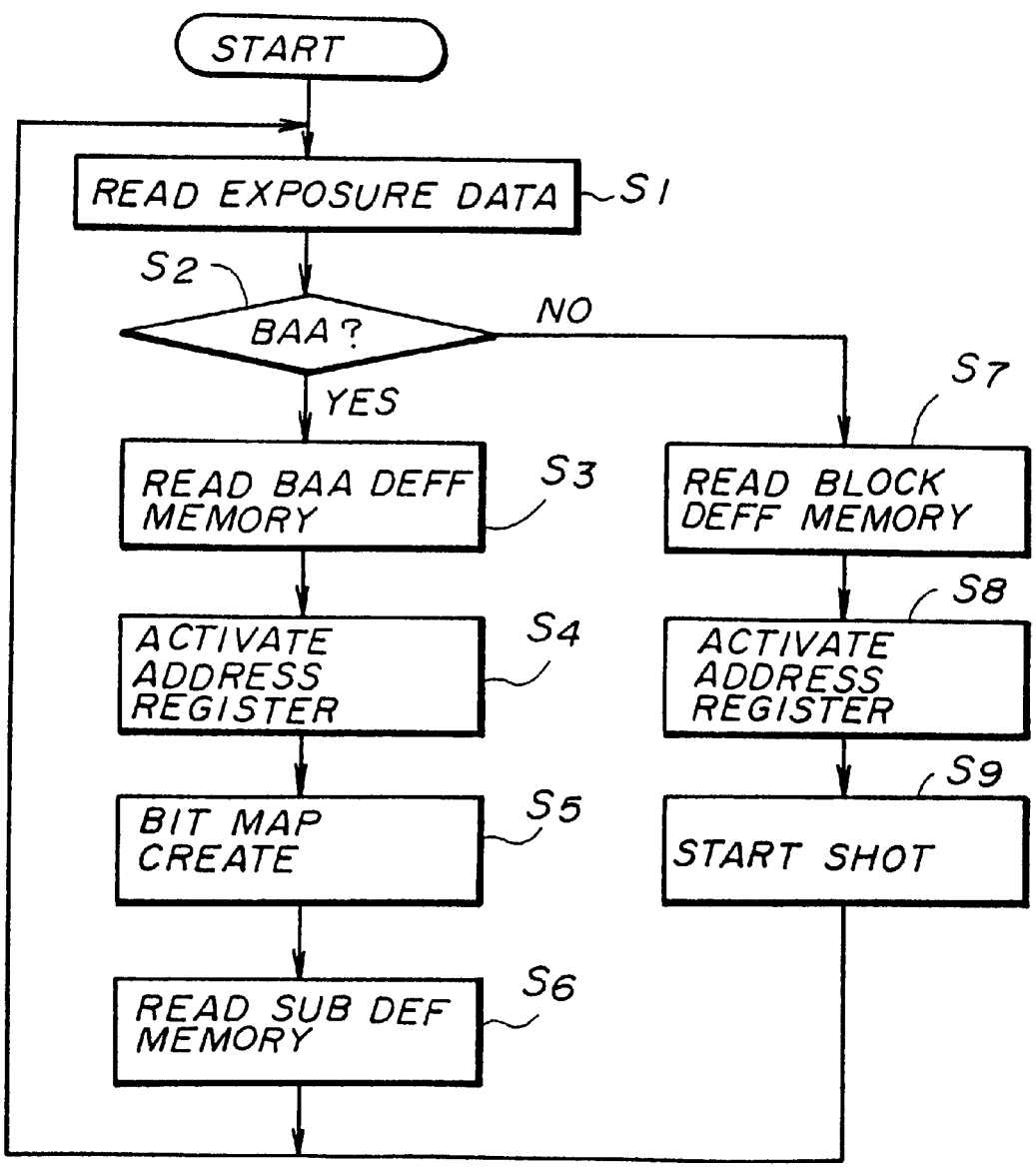
FIG. 105 is a flowchart showing the operation of the electron beam exposure system of FIG. 99.

FIG. 105 shows the exposure operation of the present embodiment conducted in the exposure controller 1354 in the form of a flowchart.

Referring to FIG. 105, the exposure data is read out from the data memory 1353 in a step S1, wherein a discrimination is made in a step S2 about the first data block in a step S2, whether the exposure is to be made in the BAA exposure mode or in the block exposure mode. If the BAA exposure mode is selected, the memory $1354_3$ for the BAA deflection data memory is referred to in a step S3, and the addressing register $1354_4$ is driven in a step S4. Further, in a step S5, the dot pattern data for the selected sub-deflection band is obtained by conducting a data expansion in the data expansion circuit 1356.

Further, the scanning of the sub-deflector 1368 is carried out by reading the content of the sub-deflector memory $1354_9$ in a step S6.

When the exposure is to be achieved in the block exposure mode, on the other hand, a step S7 is conducted wherein the memory 1355 is referred to for the necessary deflection of the addressing deflector 1324, and a step S8 is conducted subsequently wherein the addressing register 1354$_4$ is driven with the output of the addressing deflector 1324. Further, a step S9 is conducted wherein deenergization of the blanking deflector 1325 is made for carrying out a shot.

Figure 106A:
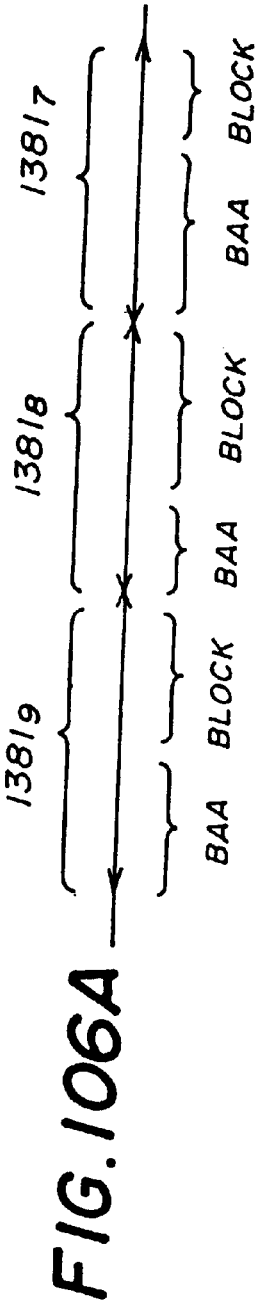
FIGS. 106A–106C are diagrams showing various modifications of the exposure sequence of the electron beam exposure system of FIG. 99.

Further, there can be various schemes for conducting the exposure an indicated in FIGS. 106A–1406C, wherein FIG. 1406A indicates that each of the sub-fields 1381$_9$–1381$_7$ includes both the BAA and block patterns.

Figure 106B:

In the scheme of FIG. 106B, the exposure is made one sub-deflection band by one sub-deflection band consecutively from a band 1381$_9$ to a band 1381$_8$, and from the band 1381$_9$ to a band 1381$_7$, wherein both the BAA exposure and block exposure are carried out in each of the bands. Thus, the scheme of FIG. 106B corresponds to the exposure scheme of FIGS. 104A and 104B.

Figure 106C:
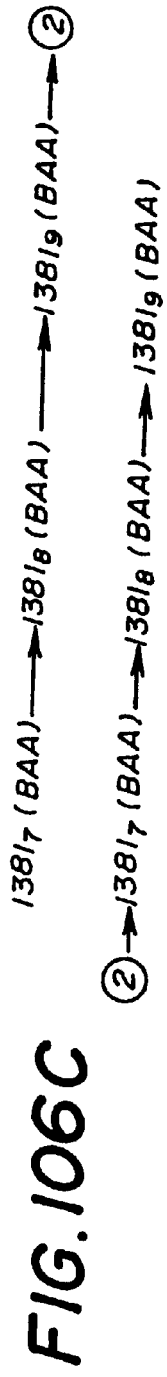

In the scheme of FIG. 106C, on the other hand, the BAA patterns are exposed preferentially for all of the sub-fields 1381$_7$–1381$_9$, followed by the exposure of the block patterns for all of the sub-fields 1381$_7$–1381$_9$.

Further, the present invention is not limited to the embodiments described heretofore, but various variations and modifications may be made without departing from the scope of the invention.

What is claimed is:

1. A method for exposing a pattern on an object by means of a charged particle beam, comprising the steps of:

producing a plurality of charged particle beam elements in the form of dot pattern data, said plurality of charged particle beam elements being produced simultaneously as a result of shaping of a single charged particle beam by a mask, said mask carrying a plurality or beam shaping apertures arranged in rows and columns on a mask area;

focusing said plurality of charged particle beam elements upon an object; and scanning a surface of said object by means of said plurality of charged particle beam elements in a first direction;

said step of producing the plurality of charged particle beam elements includes the steps of:

dividing said dot pattern data into a plurality of data blocks each corresponding to a rectangular area on said beam shaping mask, said rectangular area having a size in a second direction perpendicular to said first direction such that said size is smaller than a size of said mask area in said second direction;

providing identification codes to said data blocks for discriminating said data blocks from each other, such that identical data blocks have an identical identification code;

storing said data blocks respectively in corresponding dot memories, together with said discrimination codes corresponding to said data blocks;

reading out said data blocks from said dot memories consecutively by specifying said identification codes consecutively; and shaping said single charged particle beam by said beam shaping mask into said plurality of beam shaping beam elements in response to said data blocks read out from said dot memories.

2. A method as claimed in claim 1, wherein said step of dividing said dot pattern data into said plurality of data blocks includes the step of setting invalid data that prohibits formation of said charged particle beam element for those area falling outside said mask area in said second direction, and wherein said step of storing said data blocks includes a step for storing said invalid data.

3. A method as claimed in claim 1, wherein said step of reading out said data blocks includes the step of setting said dot data included in said data blocks and corresponding to a dot falling outside said mask area to be invalid, such that formation of a charged particle beam element by said dot data is prohibited.

4. A method as claimed in claim 1, wherein said step of dividing said dot pattern data into a plurality of data blocks is conducted such that each or said rectangular area has a longitudinal size in said first direction, when projected upon said surface of said object, said longitudinal size being a multiple integer fraction of a scanning length of said charged particle beam elements on said surface of said object.

5. A method as claimed in claim 4, wherein said step of dividing said dot pattern data includes a step or dividing said dot pattern data into a plurality of data blocks, includes a step of dividing said dot pattern data into a plurality of super-blocks each corresponding to an area covered by a plurality of scannings conducted in said first direction, and wherein said integer fraction is determined for each of said super-blocks.

6. A method as claimed in claim 1, wherein said step of scanning is conducted by energizing an electromagnetic deflector while moving simultaneously and continuously said object in said second direction; said step of scanning further includes a step of energizing an electrostatic deflector such that said charged particle beams elements deflect in said second direction so as to follow a movement of said object in said second direction.

7. A method as claimed in claim 1, wherein a first address of the dot pattern data of said blocks is used as said identification code.

8. A method as claimed in claim 7, wherein said step of storing said data blocks is conducted such that a predetermined number of said identification codes are stored in said dot memory consecutively for each scanning and such that said first address in which said identification code is stored, is stored in another memory, and wherein said step of reading out said data blocks is conducted such that said first address is read out consecutively from said another memory and such that said predetermined number of said identification codes are read out from said dot memory in response to each reading of said first address from said another memory.

9. A method as claimed in claim 1, wherein said first address is represented as A·N+B, wherein N represents said identification code, A represents the number of dots aligned in said first direction in said rectangular area, and B represents a base address.

10. A method as claimed in claim 9, wherein said step of storing said data blocks is conducted such that said data block is stored in one of a plurality of memory areas defined in each of said dot memories; said step of storing said data blocks and said step of reading out said data block are conduced such that said dot pattern data is read out from one of said plurality of memory areas and such that dot pattern data from an external storage device is stored in the other of said plurality of memory areas;

wherein said memory area to which writing of said dot pattern data is completed is changed to an area from which said dot pattern data is to be read out, by changing the value of said base address B.

11. A method as claimed in claim 1, wherein said step or reading out said data blocks from said dot memories is conducted such that y bits of data are read out in parallel in the form of u-bit parallel data; said step of reading out further includes a step of converting said u-bit parallel data into serial data.

12. A method as claimed in claim 11, wherein the number of bits, q, of said dot pattern data of said rectangular area for said first scanning direction, is expanded, in the event said number of bits q is not an integer multiple of u, to ([q/u]+k) bits by a linear interpolation, wherein [q/u] represents the integer part of the quantity q/u and k represents an integer, and wherein a quantity (speed of reading the dot pattern data)/(electron beam scanning speed) is set ([q/u]+k)u/q times.

13. A charged particle beam exposure system for exposing a pattern on an object, comprising:

beam source means for producing a charged particle beam and for emitting the same along an optical axis in the form of a charged particle beam toward an object;

beam shaping means disposed on said optical axis so as to interrupt said primary charged particle beam, said beam shaping means carrying on a mask area thereof a plurality of apertures each supplied with exposure dot data representing a dot pattern to be exposed on said object, said apertures thereby shaping said charged particle beam into a plurality of charged particle beam elements in response to said exposure dot data, said plurality of charged particle beam elements as a whole forming a charged particle beam bundle;

focusing means for focusing each of said charged particle beam elements in said charged particle beam bundle upon said object with a demagnification;

scanning means for scanning a surface of said object by said charged particle beam elements in a first direction;

a dot memory for storing dot pattern data for data blocks each corresponding to a group of exposure dots to be formed on a rectangular area on said object, said rectangular area having a size on said object, in a second direction perpendicular to said first direction, to be equal to or smaller than a size of said mask area projected upon said object and measured in said second direction;

a code memory for storing codes each specifying one of said data blocks;

block addressing means for addressing, based upon said codes read out from said code memory, said dot memories consecutively from a first address to a last address of a data block specified by said code; and code memory control means for reading said codes from said code memory consecutively in the order of exposure.

14. A charged particle beam exposure system as claimed in claim 13, wherein said block addressing means includes:

a first register for storing data A corresponding to a length of said rectangular area in said first direction;

a second register storing a base address B;

an operational circuit for calculating said first address of said block corresponding to said code N as A·N+B; and a counter loaded with said first address for counting a clock until a count thereof indicative of the address of said block, reaches said last address.

15. A charged particle beam exposure system as claimed in claim 13, wherein said code memory control means includes:

an address memory for storing the address of said code corresponding to the first data block included in a super-block, said super-block including a plurality of said first data blocks and corresponding to a super area of rectangular shape on said object that includes a plurality of said rectangular areas;

an up/down counter for counting a clock and for reading said code address of said address memory in response to a count in said up/down counter, consecutively in the order of exposure; and a clock counter loaded with said code address read out from said address memory, for counting a clock, until a count held therein reaches a last value of said super-block.

16. A charged particle beam exposure system as claimed in claim 13, wherein said dot memory outputs, upon reading thereof, the dot pattern data of u-bit in parallel from an address thereof;

wherein there is provided a parallel-to-serial converter for converting said u-bit parallel data into serial data.

17. A charged particle beam exposure system as claimed in claim 13, wherein said scanning means includes:

a movable stage for holding said objects magnetic and electrostatic deflectors for deflecting said charged particle beam elements produced by said beam shaping means; and scanning control means for energizing said magnetic deflector such that said charged particle beam elements are deflected in said first direction while moving said movable stage in said second direction, said scanning control means further energizing said electrostatic deflector such that said charged particle beam elements are deflected in said second direction to as to follow a movement of said object on said movable stage.

* * * * *